US012765222B2

(12) United States Patent
Kozuma et al.

(10) Patent No.: US 12,765,222 B2
(45) Date of Patent: Oct. 13, 2026

(54) DISPLAY APPARATUS AND ELECTRONIC DEVICE

(71) Applicant: Semiconductor Energy Laboratory Co., Ltd., Atsugi (JP)

(72) Inventors: Munehiro Kozuma, Atsugi (JP); Tatsuya Onuki, Atsugi (JP); Hidetomo Kobayashi, Isehara (JP); Yuki Okamoto, Ebina (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 337 days.

(21) Appl. No.: 18/704,237

(22) PCT Filed: Oct. 31, 2022

(86) PCT No.: PCT/IB2022/060448
§ 371 (c)(1),
(2) Date: Apr. 24, 2024

(87) PCT Pub. No.: WO2023/084356
PCT Pub. Date: May 19, 2023

(65) Prior Publication Data

US 2025/0040397 A1 Jan. 30, 2025

(30) Foreign Application Priority Data

Nov. 12, 2021 (JP) ................................. 2021-184634
Nov. 30, 2021 (JP) ................................. 2021-194490

(51) Int. Cl.
*H10K 59/65* (2023.01)
*G02B 27/01* (2006.01)
(Continued)

(52) U.S. Cl.
CPC ......... *H10K 59/65* (2023.02); *G02B 27/0172* (2013.01); *H10K 50/19* (2023.02);
(Continued)

(58) Field of Classification Search
CPC .... H10K 59/65; H10K 50/19; H10K 59/1213; H10K 59/1315; H10K 59/60;
(Continued)

(56) References Cited

U.S. PATENT DOCUMENTS 5,926,238 A 7/1999 Inoue et al.
9,836,165 B2 * 12/2017 Nho ........................ G06F 3/042
(Continued)

FOREIGN PATENT DOCUMENTS

CN 106782268 A 5/2017
CN 109074774 A 12/2018
(Continued)

OTHER PUBLICATIONS

International Search Report (Application No. PCT/IB2022/060448) Dated Jan. 24, 2023.
(Continued)

*Primary Examiner* — Victor A Mandala
(74) *Attorney, Agent, or Firm* — Eric J. Robinson; Robinson Intellectual Property Law Office, P.C.

(57) ABSTRACT

An object of the present invention is to provide a display apparatus that reduces the amount of image data transmitted and maintains high-level display quality, which is a display apparatus (Dp) including a display portion (DIS), a light-emitting portion (SHB), and a light-receiving portion (SJB). The display portion includes a first display region (ALP) and a first circuit region that overlap with each other. The first display region includes a plurality of first display pixels and the first circuit region includes a first driver circuit (DRV). The first driver circuit is electrically connected to the plurality of first display pixels through a plurality of first wirings extended in the first display region. The light-emitting portion has a function of emitting first light, and the light-receiving portion has a function of receiving second
(Continued)

light that is reflected by irradiation of an object with the first light and a function of generating information based on the second light. The first driver circuit has a function of, in accordance with the information, one of transmitting a plurality of image signals to the plurality of first wirings and transmitting the same image signal to two or more consecutive adjacent wirings among the plurality of first wirings.

12 Claims, 49 Drawing Sheets

(51) Int. Cl.
*H10K 50/19* (2023.01)
*H10K 59/121* (2023.01)
*H10K 59/131* (2023.01)

(52) U.S. Cl.
CPC ..... *H10K 59/1213* (2023.02); *H10K 59/1315* (2023.02); *G02B 2027/0178* (2013.01)

(58) Field of Classification Search
CPC .... H10K 50/00; H10K 59/00; G02B 27/0172; G02B 2027/0178; G02B 27/0093; G02B 27/017; G09F 9/00; G09F 9/30; G09G 3/20; G09G 3/3225; G09G 3/3233; G09G 3/3266; G09G 3/3275; G09G 5/00; G09G 2310/0264; G09G 2320/0261; G09G 2340/0435
See application file for complete search history.

(56) References Cited

U.S. PATENT DOCUMENTS

| | | | | |
|---|---|---|---|---|
| 10,475,370 | B2 | 11/2019 | Spitzer et al. | |
| 10,901,213 | B2 | 1/2021 | Yamaguchi | |
| 11,423,844 | B2 | 8/2022 | Ikeda et al. | |
| 11,755,905 | B2 | 9/2023 | Yamazaki et al. | |
| 11,798,491 | B2 | 10/2023 | Ikeda et al. | |
| 2002/0067419 | A1 | 6/2002 | Inoue et al. | |
| 2006/0238707 | A1 | 10/2006 | Elvesjo et al. | |
| 2016/0018918 | A1* | 1/2016 | Chen | G06F 3/0412 345/175 |
| 2017/0236466 | A1 | 8/2017 | Spitzer et al. | |
| 2018/0366068 | A1 | 12/2018 | Liu et al. | |
| 2018/0373917 | A1* | 12/2018 | Sheik-Nainar | G06V 40/13 |
| 2019/0180074 | A1* | 6/2019 | Ding | H10K 59/65 |
| 2019/0310475 | A1 | 10/2019 | Yamaguchi | |
| 2020/0111851 | A1* | 4/2020 | Park | G06F 21/32 |
| 2020/0294752 | A1 | 9/2020 | Sun et al. | |
| 2021/0210543 | A1* | 7/2021 | Hseih | G01S 17/86 |
| 2021/0295780 | A1 | 9/2021 | Ikeda et al. | |
| 2023/0238405 | A1* | 7/2023 | Shimada | H10F 39/199 257/431 |
| 2023/0368022 | A1* | 11/2023 | Yamazaki | G06N 3/08 |
| 2024/0038913 | A1* | 2/2024 | Tanaka | G01S 17/931 |
| 2024/0062724 | A1 | 2/2024 | Ikeda et al. | |
| 2024/0213281 | A1* | 6/2024 | Shimada | H10F 39/80 |

FOREIGN PATENT DOCUMENTS

| | | | |
|---|---|---|---|
| CN | 109360838 | A | 2/2019 |
| CN | 112119446 | A | 12/2020 |
| EP | 0602895 | A | 6/1994 |
| EP | 0851272 | A | 7/1998 |
| JP | 06-342146 | A | 12/1994 |
| JP | 2010-072188 | A | 4/2010 |
| JP | 2017-215875 | A | 12/2017 |
| JP | 2019-507380 | | 3/2019 |
| JP | 2019-184830 | A | 10/2019 |
| KR | 2018-0074785 | A | 7/2018 |
| KR | 2021-0007989 | A | 1/2021 |
| WO | WO-2017/142613 | | 8/2017 |
| WO | WO-2017/208957 | | 12/2017 |
| WO | WO-2018/126654 | | 7/2018 |
| WO | WO-2019/220278 | | 11/2019 |
| WO | WO-2019/243955 | | 12/2019 |
| WO | WO-2020/063608 | | 4/2020 |

OTHER PUBLICATIONS

Written Opinion (Application No. PCT/IB2022/060448) Dated Jan. 24, 2023.

* cited by examiner

DISPLAY APPARATUS AND ELECTRONIC DEVICE

TECHNICAL FIELD

One embodiment of the present invention relates to a display apparatus and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an image capturing apparatus, a memory device, a signal processing device, a processor, an electronic device, a system, a driving method thereof, a manufacturing method thereof, and a testing method thereof.

BACKGROUND ART

Display apparatuses included in electronic devices for XR (Extended Reality or Cross Reality) such as VR (Virtual Reality) or AR (Augmented Reality), mobile phones such as smartphones, tablet information terminals, notebook PCs (personal computers), and the like have undergone various improvements in recent years. For example, display apparatuses have been developed aiming for higher screen resolution, higher color reproducibility (NTSC ratio), a smaller driver circuit, lower power consumption, and the like.

In particular, for XR electronic devices, improvement in the pixel density (definition) and the color reproducibility of the display apparatus enables an image to be displayed more clearly and to have enhanced sense of reality. Patent Document 1 discloses a display apparatus with a large number of pixels and high resolution, which includes a light-emitting device containing an organic EL.

In particular, eye tracking technology for XR electronic devices has been attracting attention. Eye tracking, a method in which the movement of an eyeball of a user is measured and a gaze destination of the user is tracked, is expected to be applied to a user interface for sports, education, marketing, danger sensing, health management, and an electronic device, for example. Thus, in recent years, a variety of gaze tracking methods have been proposed. For example, Patent Document 2 discloses a technique obtained by improving a cornea reflection method (a PCCR method), in which a cornea is irradiated with light and the movement of the eyeball is calculated from a captured image of the pupil and the reflection point of the light.

Development has also been conducted on display apparatuses having novel functions by providing circuits other than display pixel circuits in display regions of the display apparatuses. For example, Patent Document 3 discloses a display apparatus including an image capturing pixel circuit in addition to a display pixel circuit in its display region and a method for detecting an eye or the periphery of the eye as an image by using the display apparatus.

REFERENCES

Patent Documents

[Patent Document 1] PCT International Publication No. 2019/220278
[Patent Document 2] United States Patent Application Publication No. 2006/0238707
[Patent Document 3] PCT International Publication No. 2019/243955

SUMMARY OF THE INVENTION

Problems to be Solved by the Invention

A display apparatus with an increased resolution includes a larger number of pixels. Furthermore, a larger number of image signals including image data input to the display apparatus are required because image data is written to each pixel included in the display apparatus for image display on the display apparatus. That is, as the number of pixels in a display apparatus increases, the amount of image data transmitted for input to the display apparatus increases, and a load of an interface that inputs the image data to the display apparatus might increase.

An object of one embodiment of the present invention is to provide a display apparatus having high display quality. Another object of one embodiment of the present invention is to provide a display apparatus capable of reducing the amount of image data transmitted. Another object of one embodiment of the present invention is to provide an electronic device including the above display apparatus. Another object of one embodiment of the present invention is to provide a novel display apparatus or a novel electronic device.

Note that the objects of one embodiment of the present invention are not limited to the objects listed above. The objects listed above do not preclude the existence of other objects. Note that the other objects are objects that are not described in this section and will be described below. The objects that are not described in this section can be derived from the description of the specification, the drawings, or the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a display apparatus that includes a display portion, a light-emitting portion, a light-receiving portion, and a control portion. The display portion includes a first display region and a first circuit region, and the first display region is in a region overlapping with the first circuit region. The first display region includes a plurality of first display pixels, and the first circuit region includes a first driver circuit. The first driver circuit is electrically connected to a plurality of first wirings extended in the first display region, and the plurality of first display pixels are electrically connected to the plurality of first wirings. The light-receiving portion is electrically connected to the control portion, and the control portion is electrically connected to the first driver circuit. The light-emitting portion has a function of emitting first light. The light-receiving portion has a function of detecting second light that is reflected by irradiation of an object with the first light and a function of generating information based on the second light and transmitting the information to the control portion. The control portion has a function of generating a first signal based on the information and transmitting the first signal to the first driver circuit. The first driver circuit has a function of, in accordance with the first signal, one of transmitting a plurality of image signals to the plurality of first wirings and transmitting the same image signal to two or more consecutive adjacent wirings among the plurality of first wirings.

(2)

Another embodiment of the present invention may be a structure where, in the above (1), the display portion includes a second display region and a second circuit region. In particular, the second display region is preferably in a region overlapping with the second circuit region. Preferably, the second display region includes a plurality of second display pixels, and the second circuit region includes a second driver circuit. Preferably, the second driver circuit is electrically connected to a plurality of second wirings extended in the second display region, the plurality of second display pixels are electrically connected to the plurality of second wirings, and the control portion is electrically connected to the second driver circuit. Preferably, the control portion has a function of generating a second signal based on the information and transmitting the second signal to the second driver circuit. Preferably, the second driver circuit has a function of, in accordance with the first signal, one of transmitting a plurality of image signals to the plurality of second wirings and transmitting the same image signal to two or more consecutive adjacent wirings among the plurality of second wirings. Note that the number of first display pixels to which one image signal is written in the first display region is different from the number of second display pixels to which one image signal transmitted to the second display region is written.

(3)

Another embodiment of the present invention is a display apparatus that includes a display portion, a light-emitting portion, a light-receiving portion, and a control portion. The display portion includes a first display region and a first circuit region, and the first display region is in a region overlapping with the first circuit region. The first display region includes a plurality of first display pixels, and the first circuit region includes a first driver circuit. The first driver circuit is electrically connected to a plurality of first wirings extended in the first display region, and the plurality of first display pixels are electrically connected to the plurality of first wirings. The light-receiving portion is electrically connected to the control portion, and the control portion is electrically connected to the first driver circuit. The light-emitting portion has a function of emitting first light. The light-receiving portion has a function of detecting second light that is reflected by irradiation of an object with the first light and a function of generating information based on the second light and transmitting the information to the control portion. The control portion has a function of generating a first signal based on the information and transmitting the first signal to the first driver circuit. The first driver circuit has a function of transmitting an image signal to each of the plurality of first wirings at a first frame frequency corresponding to the first signal.

(4)

Another embodiment of the present invention may be a structure where, in the above (3), the display portion includes a second display region and a second circuit region. In particular, the second display region is preferably in a region overlapping with the second circuit region. Preferably, the second display region includes a plurality of second display pixels, and the second circuit region includes a second driver circuit. Preferably, the second driver circuit is electrically connected to a plurality of second wirings extended in the second display region, the plurality of second display pixels are electrically connected to the plurality of second wirings, and the control portion is electrically connected to the second driver circuit. Preferably, the control portion has a function of generating a second signal based on the information and transmitting the second signal to the second driver circuit. Preferably, the second driver circuit has a function of transmitting an image signal to each of the plurality of second wirings at a second frame frequency corresponding to the second signal. Note that the first frame frequency is different from the second frame frequency.

(5)

Another embodiment of the present invention may be a structure where, in any one of (1) to (4) above, the first driver circuit includes a transistor including silicon in a channel formation region and the first display pixels includes a transistor including a metal oxide in a channel formation region.

(6)

Another embodiment of the present invention may be a structure where, in any one of (1) to (5) above, the first display pixels include a light-emitting device including an organic EL material.

(7)

Another embodiment of the present invention may be a structure where, in any one of (1) to (6) above, the first light and the second light are visible light or the first light and the second light are infrared rays.

(8)

Another embodiment of the present invention is an electronic device including the display apparatus in any one of (1) to (7) above and a housing. In addition, the housing is shaped to be capable of being worn on a head of a user.

Effect of the Invention

According to one embodiment of the present invention, a display apparatus having high display quality can be provided. According to another embodiment of the present invention, a display apparatus capable of reducing the amount of image data transmitted can be provided. According to another embodiment of the present invention, an electronic device including the display apparatus can be provided. According to another embodiment of the present invention, a novel display apparatus, or a novel electronic device can be provided.

Note that the effects of one embodiment of the present invention are not limited to the effects listed above. The effects listed above do not preclude the existence of other effects. Note that the other effects are effects that are not described in this section and will be described below. The effects that are not described in this section can be derived from the description of the specification, the drawings, or the like and can be extracted as appropriate from the description by those skilled in the art. Note that one embodiment of the present invention has at least one of the effects listed above and the other effects. Accordingly, depending circumstances, one embodiment of the present invention does not have the effects listed above in some cases.

MODE FOR CARRYING OUT THE INVENTION

Figure 1A:
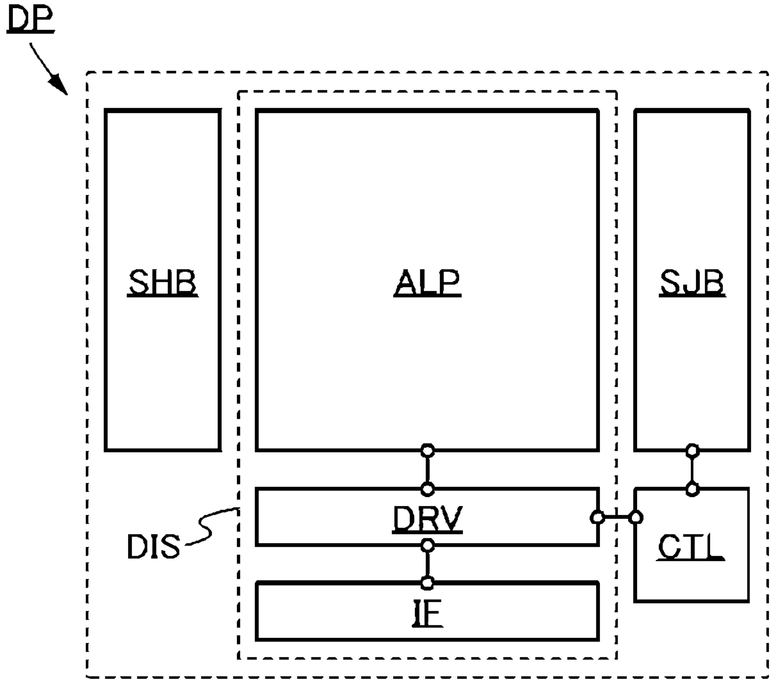
FIG. 1A and FIG. 1B are block diagrams illustrating configuration examples of a display apparatus.

In this specification and the like, a semiconductor device refers to a device that utilizes semiconductor characteristics, and means a circuit including a semiconductor element (e.g., a transistor, a diode, and a photodiode), a device including the circuit, or the like. The semiconductor device also means all devices that can function by utilizing semiconductor characteristics. For example, an integrated circuit, a chip including an integrated circuit, and an electronic component including a chip in a package are each an example of the semiconductor device. For example, a memory device, a display apparatus, a light-emitting apparatus, a lighting device, and an electronic device themselves are semiconductor devices in some cases and include a semiconductor device in other cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit such as a step-up circuit or a step-down circuit, or a level shifter circuit for changing the potential level of a signal); a voltage source; a current source; a switching circuit; an amplifier circuit (e.g., a circuit that can increase signal amplitude, the amount of current, or the like, an operational amplifier, a differential amplifier circuit, a source follower circuit, or a buffer circuit); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit structure in which a plurality of elements are electrically connected to a wiring (a wiring for supplying a constant potential or a wiring for transmitting a signal). For example, in the case where X is directly connected to a wiring and Y is directly connected to the wiring, this specification may describe that X and Y are directly electrically connected to each other.

The expression "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order" can be used, for example. Alternatively, the expression "a source of a transistor is electrically connected to X; a drain of the transistor is electrically connected to Y; and X, the source of the transistor, the drain of the transistor, and Y are electrically connected to each other in this order" can be used. Alternatively, the expression "X is electrically connected to Y through a source and a drain of a transistor, and X, the source of the transistor, the drain of the transistor, and Y are provided in this connection order" can be used. When the connection order in a circuit structure is defined by an expression similar to the above examples, a source and a drain of a transistor can be distinguished from each other to specify the technical scope. Note that these expressions are examples and the expression is not limited to these expressions. Here, each of X and Y denotes an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be sometimes replaced with the terms "resistance", "load", "region having a resistance value", or the like. Conversely, the term "resistor", "load", "region having a resistance value", or the like can be sometimes replaced with the term "resistor element". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. For another example, the resistance value may be higher than or equal to 1Ω and lower than or equal to $1\times10^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The terms "capacitor", "parasitic capacitance", "gate capacitance", and the like can be replaced with the term "capacitance" in some cases. Conversely, the term "capacitance" can be replaced with the term “capacitor”, “parasitic capacitance”, “gate capacitance”, or the like in some cases. In addition, a “capacitor” (including a “capacitor” with three or more terminals) includes an insulator and a pair of conductors between which the insulator is interposed. Thus, the term “pair of conductors” of “capacitor” can be replaced with the term “pair of electrodes”, “pair of conductive regions”, “pair of regions”, “pair of terminals”, or the like. In addition, the terms “one of a pair of terminals” and “the other of the pair of terminals” are referred to as a first terminal and a second terminal, respectively, in some cases. Note that the electrostatic capacitance value can be higher than or equal to 0.05 fF and lower than or equal to 10 pF, for example. For another example, the electrostatic capacitance value may be higher than or equal to 1 pF and lower than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms “source” and “drain” can sometimes be replaced with each other in this specification and the like. In this specification and the like, expressions “one of a source and a drain” (or a first electrode or a first terminal) and “the other of the source and the drain” (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms “gate” and “back gate” can be replaced with each other in one transistor in some cases. In the case where a transistor includes three or more gates, the gates may be referred to as a first gate, a second gate, a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the breakdown voltage of the transistor can be increased (the reliability can be improved). Alternatively, with the multi-gate structure, drain-source current does not change very much even if drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

In this specification and the like, circuit elements such as a “light-emitting device” and a “light-receiving device” sometimes have polarities called an “anode” and a “cathode”. In the case of a “light-emitting device”, the “light-emitting device” can sometimes emit light when a forward bias is applied (a positive potential with respect to a “cathode” is applied to an “anode”). In the case of a “light-receiving device”, current is sometimes generated between an “anode” and a “cathode” when a zero bias or a reverse bias is applied (a negative potential with respect to a “cathode” is applied to an “anode”) and the “light-receiving device” is irradiated with light. As described above, an “anode” and a “cathode” are sometimes regarded as input/output terminals of the circuit elements such as a “light-emitting device” and a “light-receiving device”. In this specification and the like, an “anode” and a “cathode” of the circuit element such as a “light-emitting device” or a “light-receiving device” are sometimes called terminals (a first terminal, a second terminal, and the like). For example, one of an “anode” and a “cathode” is called a first terminal and the other of the “anode” and the “cathode” is called a second terminal in some cases.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, or an impurity region depending on the circuit structure and the device structure. Furthermore, a terminal or a wiring can be referred to as a node.

In this specification and the like, “voltage” and “potential” can be replaced with each other as appropriate. “Voltage” refers to a potential difference from a reference potential, and when the reference potential is a ground potential, for example, “voltage” can be replaced with “potential”. Note that the ground potential does not necessarily mean 0 V. Moreover, potentials are relative values, and a potential supplied to a wiring, a potential applied to a circuit or the like, and a potential output from a circuit or the like, for example, change with a change of the reference potential.

In this specification and the like, the terms “high-level potential” and “low-level potential” do not mean a particular potential. For example, in the case where two wirings are both described as “functioning as a wiring for supplying a high-level potential”, the levels of the high-level potentials supplied from the wirings are not necessarily equal to each other. Similarly, in the case where two wirings are both described as “functioning as a wiring for supplying a low-level potential”, the levels of the low-level potentials supplied from the wirings are not necessarily equal to each other.

“Current” means a charge transfer phenomenon (electrical conduction); for example, the description “electrical conduction of positively charged particles occurs” can be rephrased as “electrical conduction of negatively charged particles occurs in the opposite direction”. Therefore, unless otherwise specified, “current” in this specification and the like refers to a charge transfer phenomenon (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with positive charge moves, and the amount of current is expressed as a positive value. In other words, the direction in which a carrier with negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A". The description "current is input to element A" can be rephrased as "current is output from element A".

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relationship between components with reference to drawings. The positional relationship between components is changed as appropriate in accordance with the direction in which the components are described. Thus, the positional relationship is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B. Similarly, for example, the expression "electrode B above insulating layer A" does not necessarily mean that the electrode B is formed over and in direct contact with the insulating layer A, and does not exclude the case where another component is provided between the insulating layer A and the electrode B. Similarly, for example, the expression "electrode B under insulating layer A" does not necessarily mean that the electrode B is formed under and in direct contact with the insulating layer A, and does not exclude the case where another component is provided between the insulating layer A and the electrode B.

In this specification and the like, components arranged in a matrix and their positional relationship are sometimes described using terms such as "row" and "column". The positional relationship between components is changed as appropriate in accordance with the direction in which the components are described. Thus, the positional relationship is not limited to the terms described in the specification and the like, and can be described with another term as appropriate depending on the situation. For example, the term "row direction" can be replaced with the term "column direction" when the direction of the diagram is rotated by 90°.

In this specification and the like, wirings electrically connect components arranged in a matrix can be extended in a row direction or a column direction. For example, in this specification and the like, in the case of description a "wiring A is extended in a row direction," the wiring A can also be extended in a column direction in some cases. Similarly, in the case where the "wiring A is extended in the column direction," the wiring A can also be extended in the row direction in some cases. That is, the direction in which the wirings that electrically connect components arranged in a matrix are extended is not limited to the direction described in this specification and the like, and can be the row direction or the column direction in some cases.

In this specification and the like, the terms "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the terms "film" and "layer" are not used and can be interchanged with another term depending on circumstances or conditions. For example, the term "conductive layer" or "conductive film" can be changed into the term "conductor" in some cases. For another example, the term "insulating layer" or "insulating film" can be changed into the term "insulator" in some cases.

In this specification and the like, the terms "electrode", "wiring", "terminal", and the like do not limit the functions of such components. For example, an "electrode" is used as part of a "wiring" in some cases, and vice versa. Furthermore, the term "electrode", "wiring", or the like also includes, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", or "terminals" are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" or the like depending on circumstances.

In this specification and the like, the terms "wiring", "signal line", "power supply line", and the like can be interchanged with each other depending on circumstances or conditions. For example, the term "wiring" can be changed into the term "signal line" in some cases. For another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on circumstances or conditions. Conversely, the term "signal" or the like can be changed into the term "potential" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, an impurity in a semiconductor refers to, for example, an element other than a main component of a semiconductor layer. For example, an element with a concentration lower than 0.1 atomic % is an impurity. When an impurity is contained, for example, at least one of an increase in the density of defect states in a semiconductor, a decrease in carrier mobility, and a decrease in crystallinity occurs in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. In the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to control whether current flows or not. Alternatively, a switch has a function of selecting and changing a current path. Thus, a switch may include two or three or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited or a state where current can be made to flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. When white light emission is obtained using two light-emitting layers, the two light-emitting layers are selected such that emission colors of the light-emitting layers are complementary colors. For example, when an emission color of a first light-emitting layer and an emission color of a second light-emitting layer are complementary colors, a light-emitting device can be configured to emit white light as a whole. When white light emission is obtained using three or more light-emitting layers, a light-emitting device is configured to emit white light as a whole by combining emission colors of the three or more light-emitting layers.

A device with a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. To reduce power consumption, the light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10° Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 60° and less than or equal to 120°.

In this specification and the like, the structure described in each embodiment can be combined with the structures described in the other embodiments as appropriate to constitute one embodiment of the present invention. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might be omitted for clarity of the drawings.

In this specification, a plan view is sometimes used to explain a structure in each embodiment. A plan view is, for example, a diagram showing a plane of a structure seen in a direction perpendicular to a horizontal plane or a diagram showing a plane (section) of a structure cut in a horizontal direction (any of the planes is sometimes referred to as a plan view). Hidden lines (e.g., dashed lines) in a plan view can indicate the positional relationship between a plurality of components included in a structure or the overlapping relationship between the plurality of components. In this specification and the like, the term "plan view" can be replaced with the term "projection view", "top view", or "bottom view". A plane (section) of a structure cut in a direction other than the horizontal direction may be referred to as a plan view depending on conditions.

In this specification, a cross-sectional view is sometimes used to explain a structure in each embodiment. A cross-sectional view is, for example, a diagram showing a plane of a structure seen in a direction perpendicular to a horizontal plane or a diagram showing a plane (section) of a structure cut in a direction perpendicular to a horizontal plane (any of the planes is sometimes referred to as a cross-sectional view). In this specification and the like, the term "cross-sectional view" can be replaced with the term "front view" or "side view". A plane (section) of a structure cut in a direction other than the perpendicular direction may be referred to as a cross-sectional view depending on conditions.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a display apparatus of one embodiment of the present invention is described.

<Configuration Example of Display Apparatus>

FIG. 1A is a block diagram illustrating a configuration example of a display apparatus DP of one embodiment of the present invention.

The display apparatus DP includes, for example, a display portion DIS, a light-emitting portion SHB for image capturing, a light-receiving portion SJB for image capturing, and a control portion CTL.

The display portion DIS includes a pixel array ALP, a driver circuit region DRV, and an interface IF, for example.

The pixel array ALP is electrically connected to the driver circuit region DRV. The driver circuit region DRV is electrically connected to the interface IF and the control portion CTL. The light-receiving portion SJB for image capturing is electrically connected to the control portion CTL.

The pixel array ALP includes, for example, a plurality of display pixels (e.g., a display pixel PX[1,1] to a display pixel PX[m,n] in FIG. 5 described later).

The driver circuit region DRV includes, for example, a driver circuit for driving the plurality of display pixels included in the pixel array ALP. Note that a specific configuration example of the driver circuit region DRV will be described later.

The interface IF has a function for taking, into the driver circuit region DRV, image data for displaying an image on the display apparatus DP output from a device located outside the display apparatus DP, for example. Examples of the device located outside include a recording media player and a nonvolatile memory device such as an HDD (Hard Disk Drive) or an SSD (Solid State Drive).

In addition, a GPU (Graphics Processing Unit) may be provided between the driver circuit region DRV and the device located outside. Note that the GPU may be provided inside the display apparatus DP or provided outside the display apparatus DP. When the GPU is provided inside the display apparatus DP, the GPU may be incorporated into the interface IF.

The light-receiving portion SIB for image capturing has a function of capturing an image of an object, for example. Thus, the light-receiving portion SJB for image capturing includes a light-receiving device such as a photoelectric conversion element (a pn-type or pin-type photodiode). Specifically, an eye of a user wearing the electronic device can be applied to the object in the case where the display apparatus DP is employed for an electronic device for XR. Thus, the light-receiving portion SJB for image capturing has a function of taking an image of a user's eye. The light-receiving portion SJB for image capturing also has a function of transmitting information on a captured image (e.g., a current amount or a potential) to the control portion CTL. For example, the light-receiving device of the light-receiving portion SJB for image capturing generates charge corresponding to the amount of light incident on the light-receiving device so that current, the amount of which corresponds to the charge, is transmitted to the control portion CTL.

The light-emitting portion SHB for image capturing functions as, for example a light source for emitting light so that the object of the light-receiving portion SJB for image capturing is irradiated with the light. Thus, the light-emitting portion SHB for image capturing includes a light-emitting device.

Light emitted by the light-emitting portion SHB for image capturing may be visible light or infrared rays (referred to as IR in some cases). The light-receiving device included in each of the light-receiving portion SJB for image capturing can be chosen in accordance with the light emitted by the light-emitting device of the light-emitting portion SIB for image capturing. For example, the light-receiving device is a light-receiving device capable of receiving visible light in the case where visible light is emitted from the light-emitting device of the light-emitting portion SHB for image capturing. For example, the light-receiving device is a light-receiving device capable of receiving infrared rays in the case where infrared rays are emitted from the light-emitting device of the light-emitting portion SHB for image capturing.

The control portion CTL has a function of performing an image analysis on an image (user's eye) captured by the light-receiving portion SJB for image capturing, for example. This image analysis can determine which part of the pixel array ALP the user is looking at because the image shows one or more of the crystalline lens, the pupil, the cornea, the macula, and the fovea centralis.

Note that an example of a method for determining the point of the user's gaze through the image analysis is a PCCR method.

The control portion CTL has a function of obtaining a region or an address of the user's gaze point in the pixel array ALP (sometimes rephrased as "region that the user is looking at"). The control portion CTL has a function of generating a signal corresponding to the region or the address of the user's gaze point and transmitting the signal to the driver circuit region DRV.

By receiving the signal transmitted from the control portion CTL, a circuit included in the driver circuit region DRV changes a method for writing image data to the plurality of display pixels included in the pixel array ALP in accordance with the content of the signal (the point of the user's gaze). Specifically, the circuit included in the driver circuit region DRV changes a method for writing image data to the plurality of display pixels included in the pixel array ALP so that the display quality of the region of the user's gaze point in the pixel array ALP can be improved.

Figure 1B:
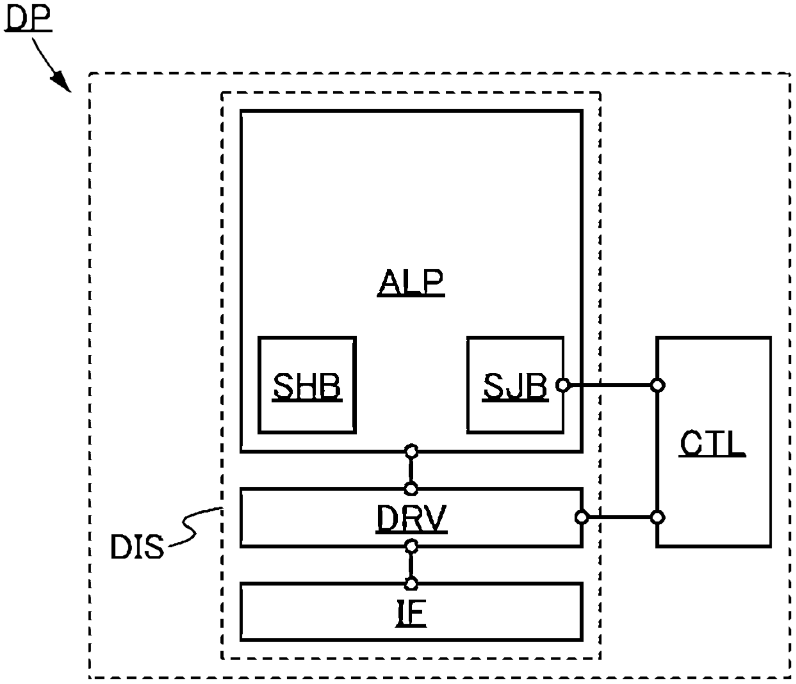

Although the display apparatus DP in FIG. 1A has a configuration in which the light-emitting portion SI-TB for image capturing and the light-receiving portion SJB for image capturing are provided outside the display portion DIS, one embodiment of the present invention is not limited to this. For example, the display apparatus of one embodiment of the present invention may have a configuration in which the light-emitting portion SHB for image capturing and the light-receiving portion SJB for image capturing are provided in the pixel array ALP, as illustrated in FIG. 1B. In the display apparatus DP in FIG. 1B, the light-emitting portion SHB for image capturing can be, for example, a light-emitting pixel for image capturing included in the pixel array ALP, for example. In addition, the light-receiving portion SJB for image capturing can be, for example, an image capturing pixel included in the pixel array ALP. In other words, as illustrated in FIG. 1B, the display apparatus DP may have a configuration in which the pixel array ALP may include the light-emitting pixel for image capturing and the image capturing pixel described above in addition to the display pixels for image display.

Figure 2A:
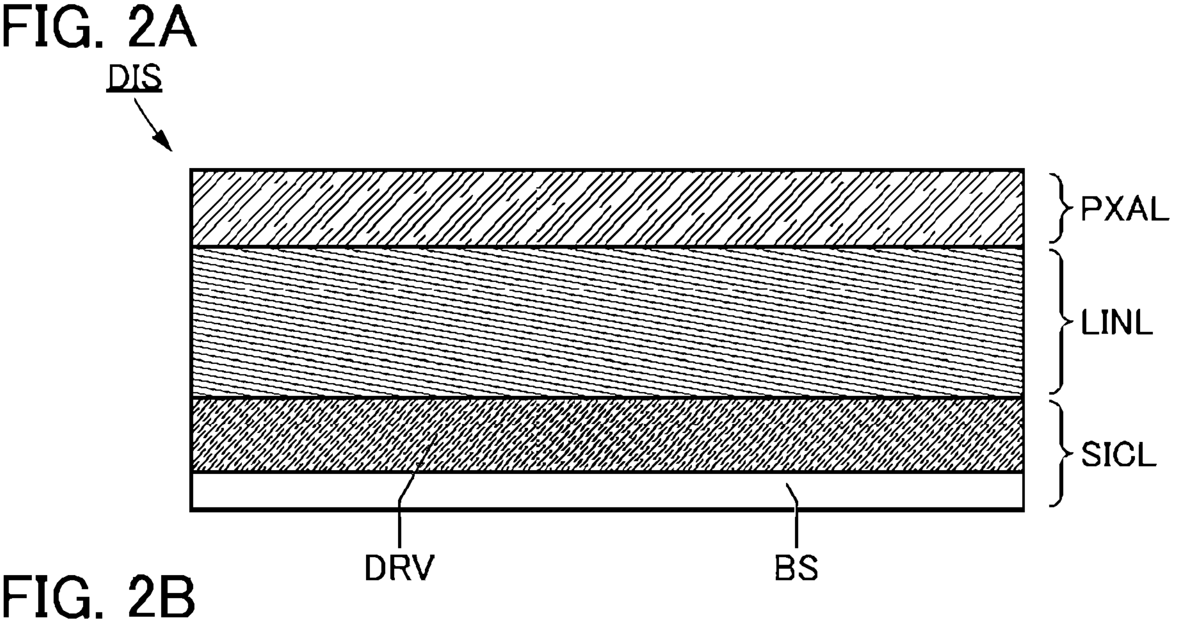
FIG. 2A to FIG. 2C are schematic cross-sectional views illustrating structure examples of a display portion of a display apparatus.

Next, a specific structure example of the display portion DIS is described. FIG. 2A is a schematic cross-sectional view illustrating a structure example of the display portion DIS. The display portion DIS includes a pixel layer PXAL, a wiring layer LINL, and a circuit layer SICL, for example.

The wiring layer LINL is provided over the circuit layer SICL, and the pixel layer PXAL is provided over the wiring layer LINL. Note that the pixel layer PXAL overlaps with a region including the driver circuit region DRV.

The circuit layer SICL includes a substrate BS and the driver circuit region DRV.

As the substrate BS, a semiconductor substrate (e.g., a single crystal substrate containing silicon or germanium as a material) can be used, for example. Besides the semiconductor substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, or paper or a base material film containing a fibrous material can be given as the substrate BS. Examples of the glass substrate include barium borosilicate glass, aluminoborosilicate glass, and soda lime glass. As examples of the flexible substrate, the attachment film, and the base material film, plastics typified by polyethylene terephthalate (PET), polyethylene naphthalate (PEN), polyether sulfone (PES), and polytetrafluoroethylene (PTFE) can be given. Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus DP includes heat treatment, a highly heat-resistant material is preferably selected for the substrate BS.

In the description of this embodiment, the substrate BS is a semiconductor substrate containing silicon as a material. Therefore, a transistor included in the driver circuit region DRV can be a transistor including silicon in a channel formation region (hereinafter referred to as a Si transistor).

The driver circuit region DRV is provided over the substrate BS.

A wiring is provided in the wiring layer LINL, for example. The wiring included in the wiring layer LINL functions as, for example, a wiring that electrically connects the driver circuit included in the driver circuit region DRV provided below the wiring layer LINL and the circuit included in the pixel layer PXAL provided above the wiring layer LINL.

The pixel layer PXAL includes the above-described pixel array ALP, for example.

Figure 3A:
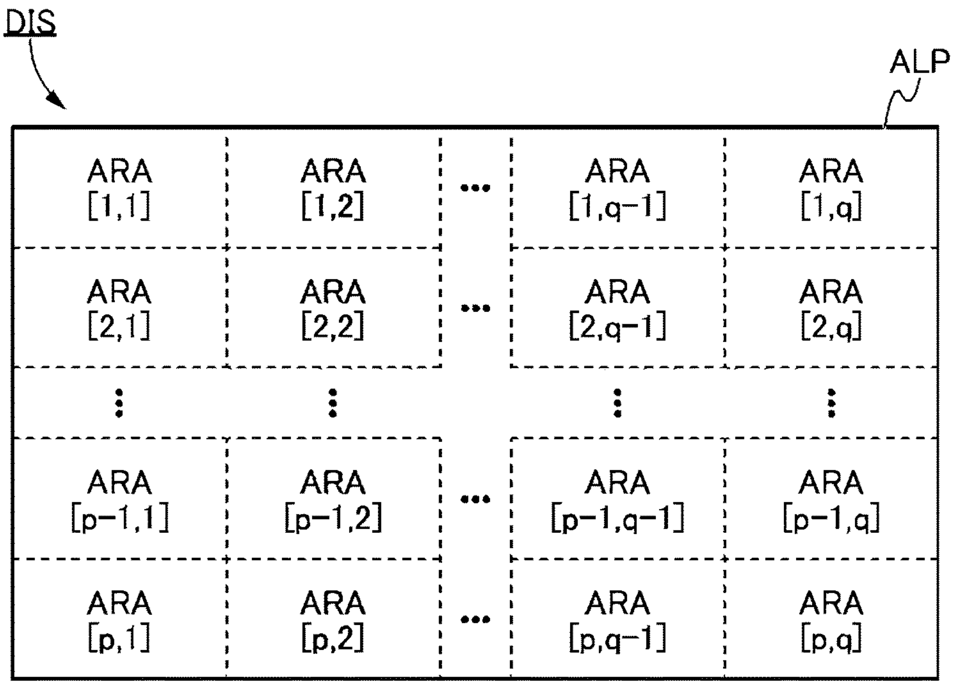
FIG. 3A is a schematic plan view illustrating an example of a display portion of a display apparatus.

FIG. 3A is an example of a plan view of the display portion DIS. Note that the display portion DIS illustrated in FIG. 3A is a plan view of the pixel layer PXAL, which can be regarded as a plan view of the pixel array ALP.

The pixel array ALP in FIG. 3A is divided into region of p rows and q columns (p is an integer greater than or equal to 1, and q is an integer greater than or equal to 1), for example. Thus, the display portion DIS includes a display region ARA[1,1] to a region display ARA[p,q]. Note that FIG. 3A selectively illustrates the display region ARA[1,1], the display region ARA[2,1], the display region ARA[p−1, 1], the display region ARA[p,1], the display region ARA[1, 2], the display region ARA[2,2], the display region ARA [p−1,2], the display region ARA[p,2], the display region ARA[1,*q*−1], the display region ARA[2,*q*−1], the display region ARA[p−1,q−1], ARA[p,q−1], the display region ARA[1,*q*], the display region ARA[2,*q*], the display region ARA[p−1,q], and the display region ARA[p,q], as an example.

For example, in the case where the pixel array ALP is desired to be divided into 32 regions, p=4 and q=8 may be substituted into FIG. 3A. In the case where the display portion DIS has a display definition of 8K4K, the number of display pixels is 7680×4320. In the case where the colors of sub-display pixels included in the display pixel are three colors, red (R), green (G), and blue (B), the total number of sub-display pixels included in the pixel array ALP is 7680×4320×3. Here, in the case where the pixel array ALP of the display apparatus DP with a display definition of 8K4K is divided into 32 regions, the number of display pixels per region is 960×1080, and the number of sub-display pixels per region is 960×1080×3 when the colors of the sub-display pixels included in the pixel are three colors, red (R), green (G), and blue (B).

Here, the driver circuit region DRV included in the circuit layer SICL of the case where the pixel array ALP in FIG. 3A is divided into p rows and q columns of regions is considered.

Figure 3B:
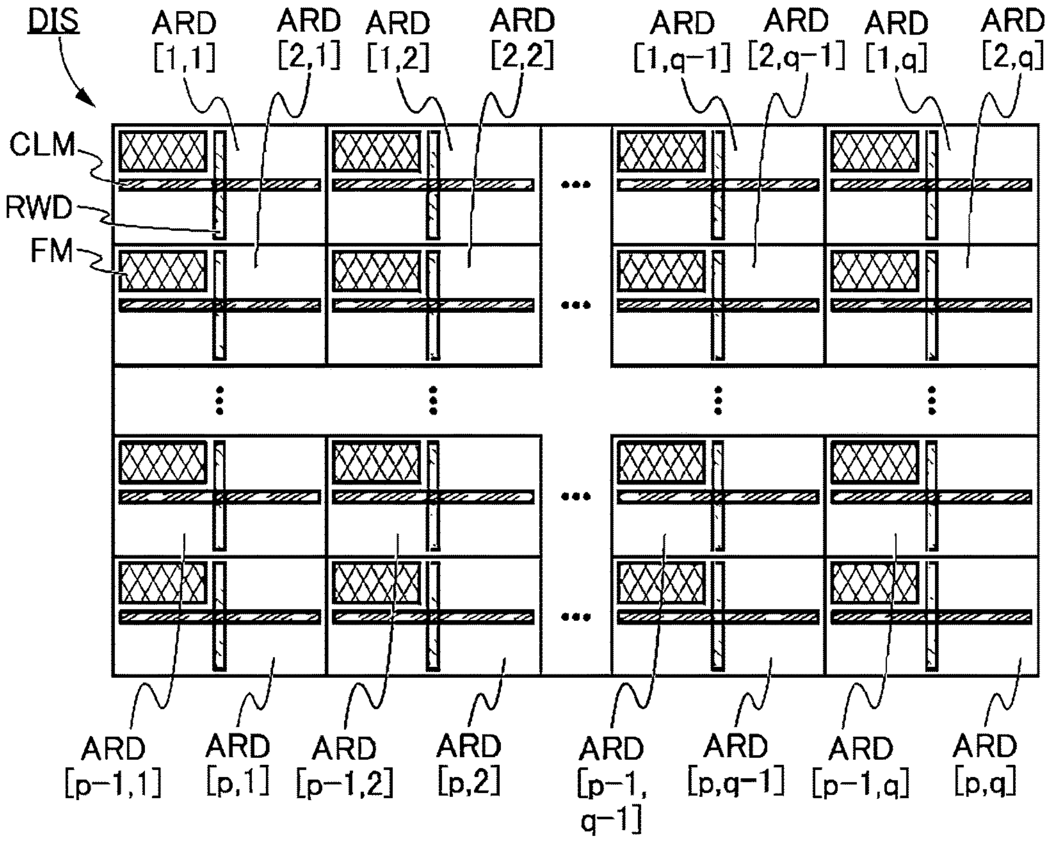
FIG. 3B is a schematic plan view illustrating an example of a driver circuit region of a display apparatus.

FIG. 3B is an example of a plan view of the display portion DIS, and illustrates only the driver circuit region DRV included in the circuit layer SICL.

Since the pixel array ALP in FIG. 3A is divided into p rows and q columns of regions, each of the divided display region ARA[1,1] to the display region ARA[p,q] needs a corresponding driver circuit. Specifically, the driver circuit region DRV may also be divided into p rows and q columns of regions and a driver circuit may be provided in each of the divided regions.

The driver circuit region DRV of the display portion DIS in FIG. 3B is divided into p rows and q columns of regions. Thus, the driver circuit region DRV includes a circuit region ARD[1,1] to a circuit region ARD[p,q]. Note that FIG. 3B selectively illustrates, as examples, the circuit region ARD [1,1], the circuit region ARD[2,1], the circuit region ARD [p−1,1], the circuit region ARD[p,l], the circuit region ARD[1,2], the circuit region ARD[2,2], the circuit region ARD[p−1,2], the circuit region ARD[p,2], the circuit region ARD[1,*q*−1], the circuit region ARD[2,*q*−1], the circuit region ARD[p−1,q−1], the circuit region ARD[p,q−1], the circuit region ARD[1,*q*], the circuit region ARD[2,*q*], the circuit region ARD[p−1,q], and the circuit region ARD[p,q].

Each of the circuit region ARD[1,1] to the circuit region ARD[p,q] includes the column driver circuit CLM, the row driver circuit RWD, and a frame memory FM. For example, the column driver circuit CLM and the row driver circuit RWD included in a circuit region ARD[h,k](not illustrated in FIG. 3B) located in the h-th row and the k-th column (h is an integer greater than or equal to 1 and less than or equal top, and k is an integer greater than or equal to 1 and less than or equal to q) can drive a plurality of pixels included in the display region ARA[h,k] located in the h-th row and the k-th column in the display portion DIS.

The column driver circuit CLM includes, for example, a source driver circuit that transmits an image signal to the plurality of pixels included in the corresponding display region ARA. The column driver circuit CLM may include an amplifier circuit for amplifying an image signal. The column driver circuit CLM may include a memory device such as a register that temporarily retains data of an image signal. Thus, a wiring for electrically connecting the column driver circuit CLM to the pixels included in the corresponding display region ARA is preferably provided in the display portion DIS in FIG. 2A. The column driver circuit CLM may include a digital-analog conversion circuit that converts an image signal as digital data into analog data.

The row driver circuit RWD includes, for example, a gate driver circuit that selects a plurality of display pixels, which are destinations to which an image signal is transmitted, in the corresponding display region ARA. Thus, a wiring for electrically connecting the row driver circuit RWD to the pixels included in the corresponding display region ARA is preferably provided in the display portion DIS in FIG. 2A.

The frame memory FM has a function of retaining an image signal transmitted to the display pixel included in the corresponding display region ARA as a potential, for example.

Note that the display portion DIS illustrated in FIG. 2A, FIG. 3A, and FIG. 3B has a structure in which the display region ARA[h,k] and the circuit region ARD[h,k] overlap with each other, but the display apparatus of one embodiment of the present invention is not limited to this. In the structure of the display apparatus of one embodiment of the present invention, the display region ARA[h,k] and the circuit region ARD[h,k] do not necessarily overlap with each other.

Figure 2B:
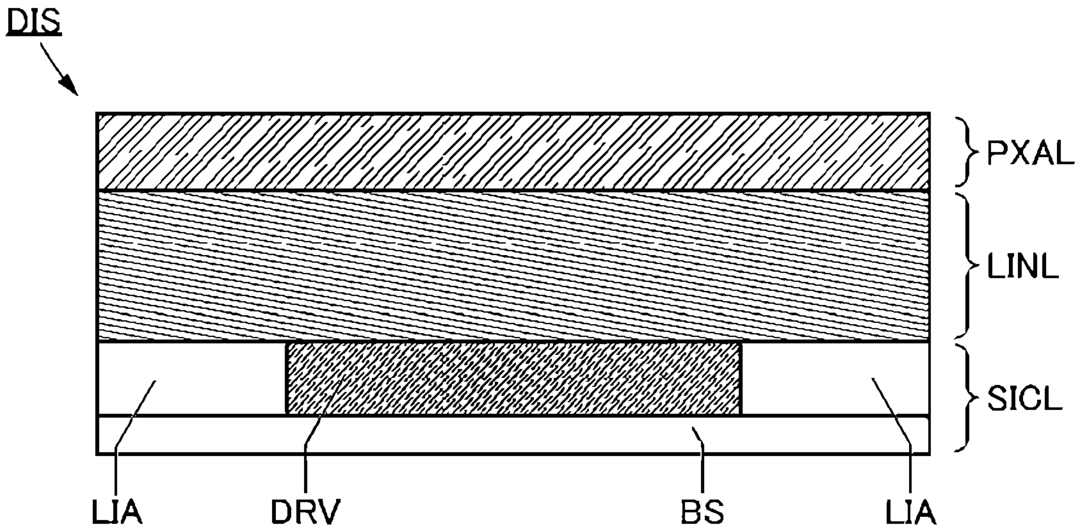

For example, as illustrated in FIG. 2B, the display portion DIS may have a structure in which not only the driver circuit region DRV but also a region LIA is provided over the substrate BS.

A wiring is provided in the region LIA, as an example. The wiring included in the region LIA may be electrically connected to the wiring included in the wiring layer LINL. At this time, the display portion DIS may have a structure in which the circuit included in the driver circuit region DRV and the circuit included in the pixel layer PXAL are electrically connected to each other through the wiring included in the region LIA and the wiring included in the wiring layer LINL. The display portion DIS may have a structure in which the circuit included in the driver circuit region DRV is electrically connected to the wiring or a circuit included in the region LIA through the wiring included in the wiring layer LINL.

The region LIA may include a GPU, for example. In the case where the display portion DIS includes a touch panel, the region LIA may include a sensor controller for controlling a touch sensor included in the touch panel. In the case where a liquid crystal element is used as a display element of the display portion DIS, the region LIA may include a gamma correction circuit. The region LIA may also include a controller having a function of processing an input signal from the outside of the display portion DIS. The region LIA may include a voltage generation circuit for generating a voltage to be supplied to the above-described circuit and the driver circuit included in the circuit region ARD.

In the case where a light-emitting device fabricated using an organic EL material is used as a display element of the display portion DIS, an EL correction circuit may be included. The EL correction circuit has a function of appropriately adjusting the amount of current input to the light-emitting device containing an organic EL material, for example. Since the emission luminance of the light-emitting device containing an organic EL material is proportional to current, the luminance of light emitted from the light-emitting device might be lower than a desired luminance when the characteristics of a driving transistor electrically connected to the light-emitting device are not favorable. For example, the EL correction circuit monitors the amount of current flowing through the light-emitting device and increases the amount of current flowing through the light-emitting device when the amount of current is smaller than a desired amount of current, whereby the luminance of light emitted from the light-emitting device can be increased. By contrast, when the amount of current is larger than a desired amount of current, the amount of current flowing through the light-emitting device can be adjusted to be small.

Figure 4A:
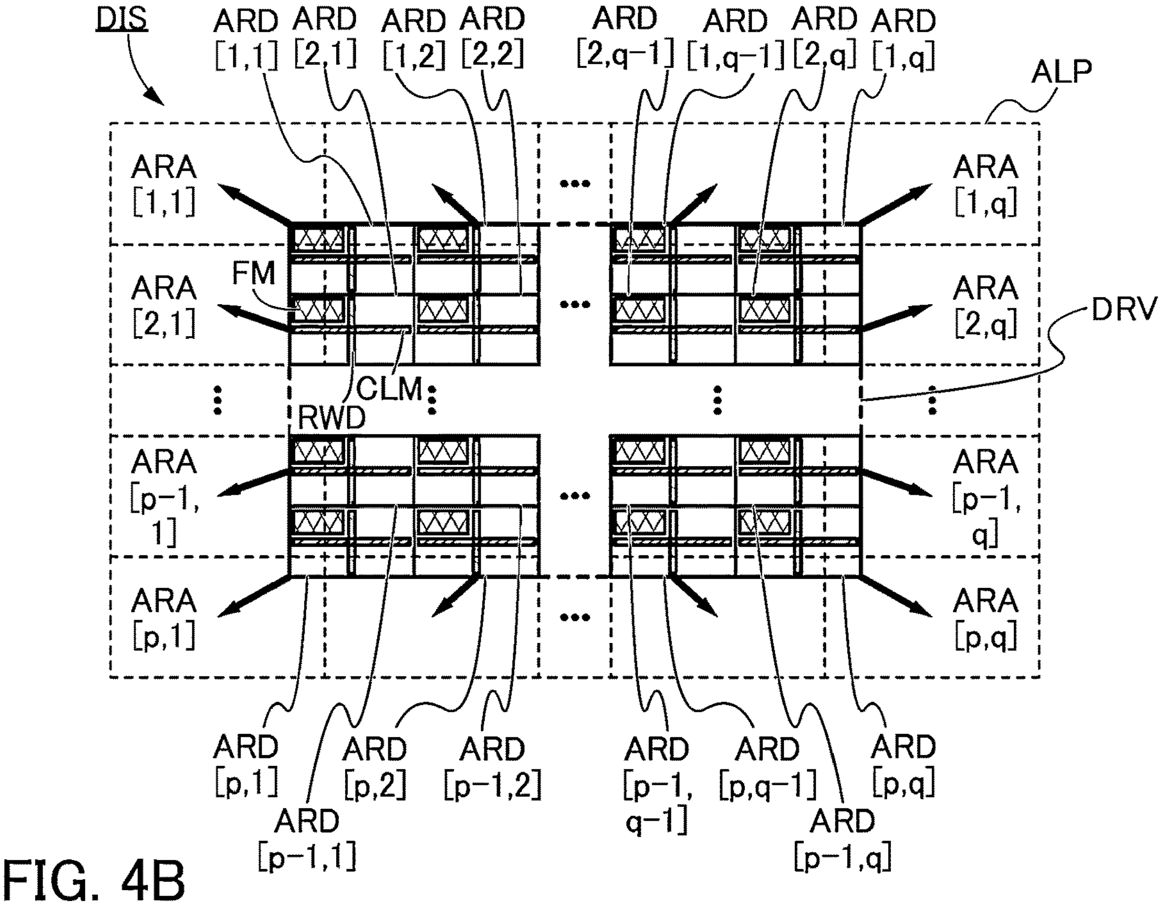
FIG. 4A and FIG. 4B are schematic plan views illustrating configuration examples of a display portion of a display apparatus.
Figure 4B:
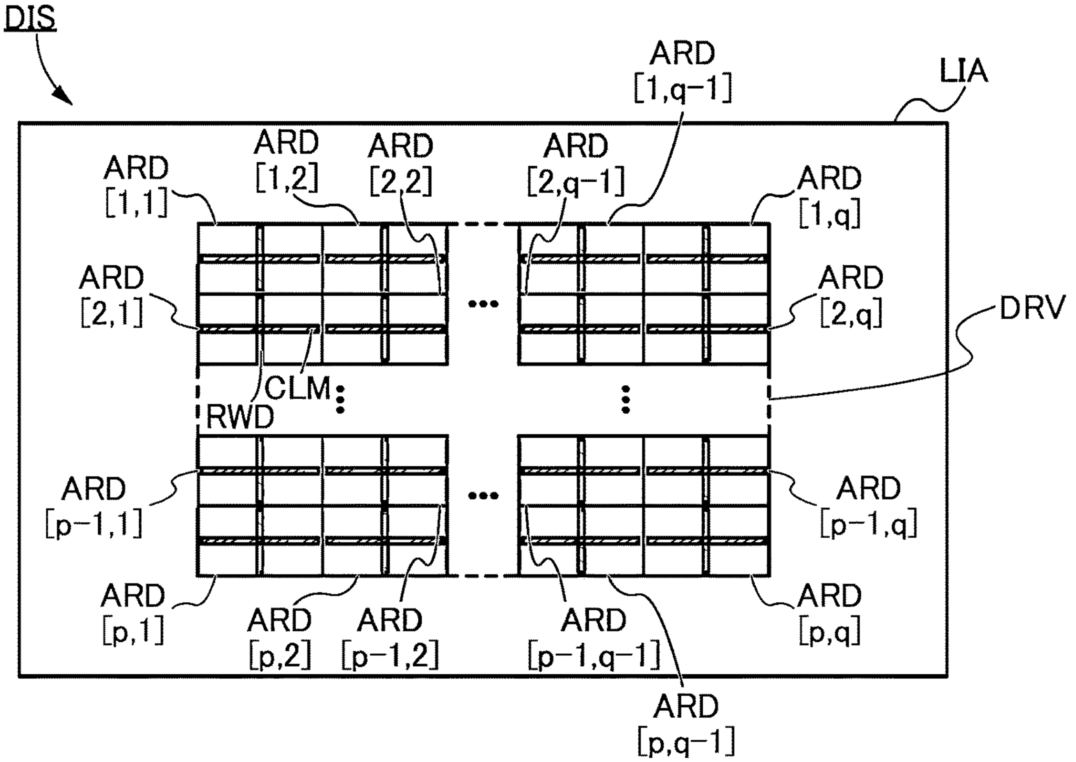

FIG. 4A is an example of a plan view of the display portion DIS illustrated in FIG. 2B, and illustrates the driver circuit region DRV denoted by a solid line and the display portion DIS denoted by a dotted line. In the display portion DIS in FIG. 4A, as an example, the driver circuit region DRV is surrounded by the region LIA (FIG. 4B illustrates an example of a plan view of the display apparatus DP in which only the circuit layer SICL is illustrated). Thus, as illustrated in FIG. 4A, the driver circuit region DRV is provided to overlap with the interior of the pixel array ALP in the plan view.

In the display portion DIS illustrated in FIG. 4A, the pixel array ALP is divided into the display region ARA[1,1] to the display region ARA[p,q] and the driver circuit region DRV is divided into the circuit region ARD[1,1] to the circuit region ARD[p,q] as in FIG. 3A.

As illustrated in FIG. 4A, a correspondence between the display region ARA and the circuit region ARD including a driver circuit that drives a pixel included in the display region ARA is shown by a thick arrow. Specifically, a driver circuit included in the circuit region ARD[1,1] drives a pixel included in the display region ARA[1,1], and a driver circuit included in the circuit region ARD[2,1] drives a pixel included in the display region ARA[2,1]. A driver circuit included in the circuit region ARD[p−1,1] drives a pixel included in the display region ARA[p−1,1], and a driver circuit included in the circuit region ARD[p,1] drives a pixel included in the display region ARA[p,i]. A driver circuit included in the circuit region ARD[1,*q*] drives a pixel included in the display region ARA[1,*q*], and a driver circuit included in the circuit region ARD[2,*q*] drives a pixel included in the display region ARA[2,*q*]. A driver circuit included in the circuit region ARD[p−1,q] drives a pixel included in the display region ARA[p−1,q], and a driver circuit included in the circuit region ARD[p,q] drives a pixel included in the display region ARA[p,q]. That is, although not illustrated in FIG. 4A, a driver circuit included in the circuit region ARD[h,k] positioned in the h-th row and the k-th column drives a pixel included in the display region ARA[h,k].

In FIG. 2B, when the driver circuit included in the circuit region ARD in the circuit layer SICL and the pixel included in the display region ARA in the pixel layer PXAL are electrically connected through a wiring included in the wiring layer LINL, the display portion DIS can have a structure in which the display region ARA[h,k] and the circuit region ARD[h,k] do not necessarily overlap with each other. Accordingly, the positional relation between the driver circuit region DRV and the display portion DIS is not limited to the plan view of the display apparatus DP illustrated in FIG. 4A, and the position of the driver circuit region DRV can be freely determined.

Figure 2C:
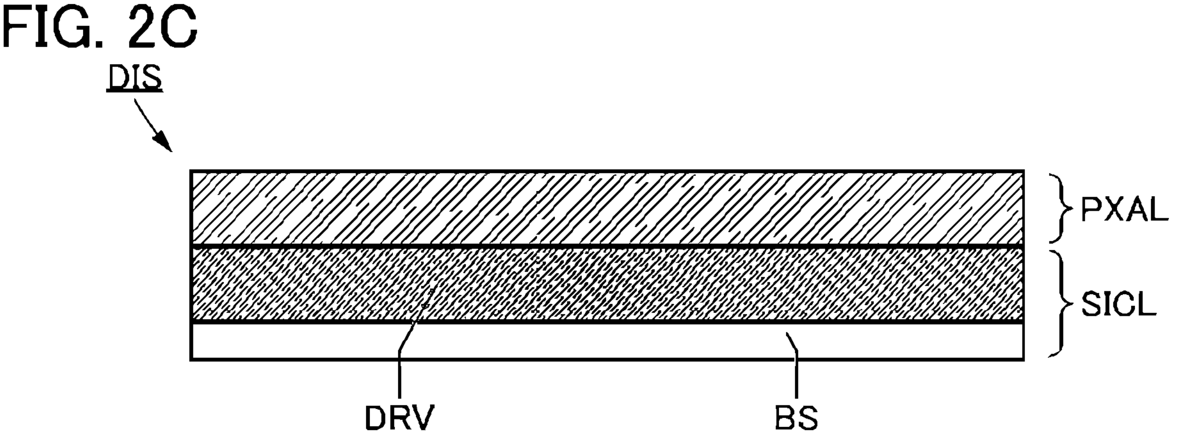

Note that the display portion DIS illustrated in FIG. 2A and FIG. 2B has a structure including the wiring layer LINL, but one embodiment of the present invention is not limited thereto. The display apparatus of one embodiment of the present invention may have a structure in which the pixel layer PXAL is provided on the circuit layer SICL as illustrated in FIG. 2C, for example.

In each of the circuit region ARD[1,1] to the circuit region ARD[p,q] illustrated in FIG. 3B and FIG. 4A, the arrangement of the column driver circuit CLM and the row driver circuit RWD is not limited to the structure of the display apparatus of one embodiment of the present invention. Although the column driver circuit CLM and the row driver circuit RWD are arranged to intersect each other (to form a cross) in FIG. 3B and FIG. 4A, the column driver circuit CLM and the row driver circuit RWD may be arranged to form various shapes in each circuit region ARD.

Next, a configuration example of the display region ARA[h,k] and the circuit region ARD[h,k] is described. FIG. 5 is a block diagram selectively illustrating the display region ARA[h,k] and the circuit region ARD[h,k] in the display apparatus DP illustrated in FIG. 1A and FIG. 3A to FIG. 4B.

Figure 5:
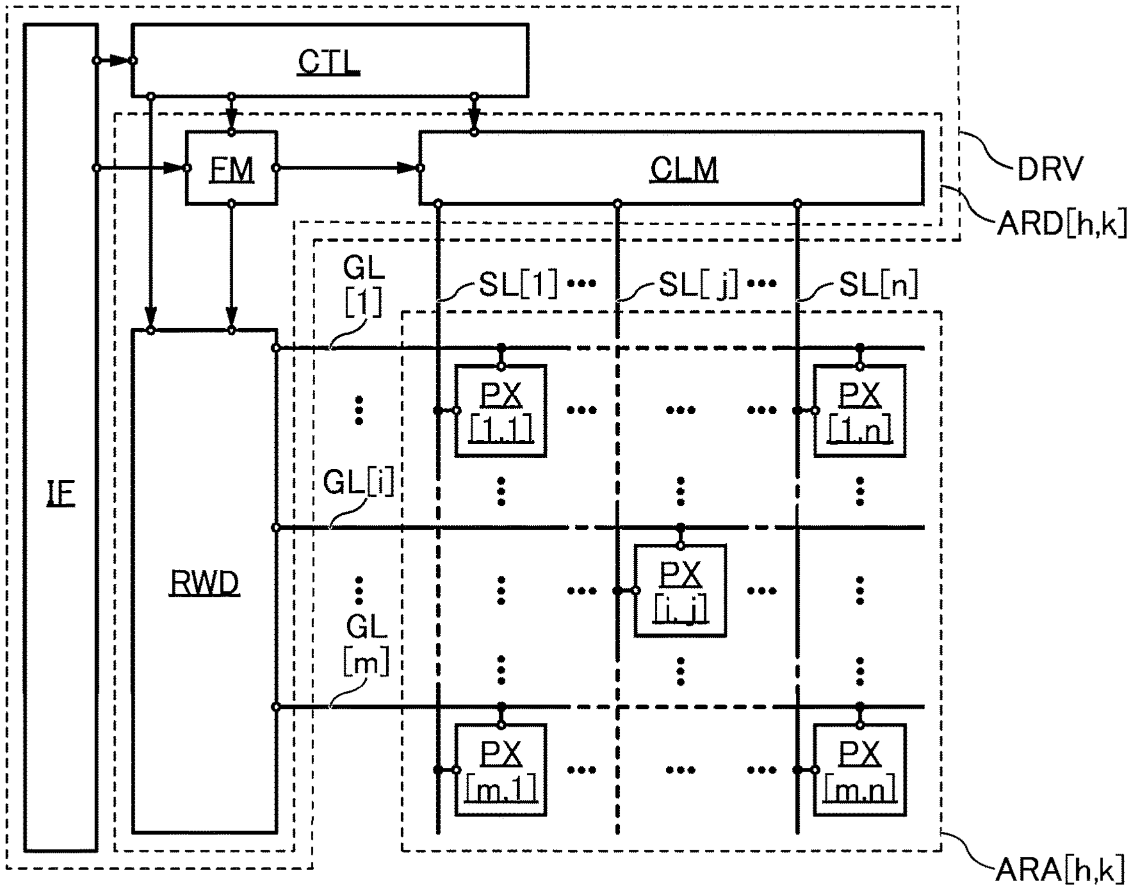
FIG. 5 is a block diagram illustrating an example of a circuit included in a display apparatus.

In FIG. 5, the display region ARA[h,k] includes a plurality of display pixels PX. The plurality of display pixels PX are arranged in a matrix of m rows and n columns (m is an integer greater than or equal to 1, and n is an integer greater than or equal to 1) in the display region ARA[h,k]. Note that FIG. 5 selectively illustrates only the display pixel PX[1,1], the display pixel PX[m,1], the display pixel PX[1,*n*], the display pixel PX[m, n], and the display pixel PX[i,j] (i is an integer greater than or equal to 1 and less than or equal to m, andj is an integer greater than or equal to 1 and less than or equal to n) in the display region ARA[h,k].

As illustrated in FIG. 5, the circuit region ARD[h,k] includes the row driver circuit RWD, the column driver circuit CLM, and the frame memory FM, as in FIG. 3B and FIG. 4A. FIG. 5 also illustrates the driver circuit region DRy and the interface IF and the control portion CTL included in the driver circuit region DRV, in addition to the display region ARA[h,k] and the circuit region ARD[h,k].

The row driver circuit RWD is electrically connected to a wiring GL[1] to a wiring GL[m], for example. The column driver circuit CLM is electrically connected to a wiring SL[1] to a wiring SL[n], for example. The frame memory FM is electrically connected to the row driver circuit RWD and the column driver circuit CLM. The interface IF is electrically connected to the control portion CTL and the frame memory FM. The control portion CTL is electrically connected to the row driver circuit RWD, the column driver circuit CLM, and the frame memory FM in the driver circuit region DRV. The display pixel PX[i,j] is electrically connected to a wiring SL[j] and a wiring GL[i].

Either a liquid crystal display device or a light-emitting device, or both can be applied to each of the display pixel PX[1,1] to the display pixel PX[m,n], for example. Examples of the light-emitting device include a light-emitting device including an organic EL element (OLED (Organic Light Emitting Diode)), an inorganic EL element, an LED (including a micro LED), a QLED (Quantum-dot Light Emitting Diode), and a semiconductor laser. Note that in the description in this embodiment, the display pixel PX includes a light-emitting device containing an organic EL material. In particular, the luminance of light emitted from a light-emitting device capable of high luminance light emission can be, for example, higher than or equal to 500 $cd/m^2$, preferably higher than or equal to 1000 $cd/m^2$ and lower than or equal to 10000 $cd/m^2$, further preferably higher than or equal to 2000 $cd/m^2$ and lower than or equal to 5000 $cd/m^2$.

The row driver circuit RWD includes a circuit having a function of selecting at least one of a first row to an n-th row, which is a supply destination of an image data signal, in the display region ARA[h,k], and transmitting a selection signal to the plurality of display pixels PX located in the selected row, as described above. Note that the selection signal can be, for example, an analog potential, a digital potential (a high-level potential or a low-level potential), or a pulse potential.

The row driver circuit RWD may have not only a function of a function of selecting one wiring from the wiring GL[1] to the wiring GL[m] and transmitting a selection signal to the wiring but also a function of transmitting the same selection signal to two or more consecutive adjacent wirings of the wiring GL[1] to the wiring GL[m]. That is, the row driver circuit RWD can select the display pixels PX arranged in two or more consecutive adjacent rows at a time. Furthermore, the row driver circuit RWD may have a function of changing the frame frequency of the row driver circuit RWD in accordance with a signal from the control portion CTL described later.

The column driver circuit CLM includes a circuit having a function of transmitting an image data signal to the display pixel PX included in the display region ARA[h,k], as described above. Note that the image data signal can be, for example, an analog potential, a digital potential (a high-level potential or a low-level potential), or a pulse potential.

The column driver circuit CLM may have not only a function of a function of selecting one wiring from the wiring SL[1] to the wiring SL[n] and transmitting the selection signal to the wiring but also a function of transmitting the same selection signal to two or more consecutive adjacent wirings of the wiring SL[1] to the wiring SL[n]. That is, the column driver circuit CLM can transmit the same image signal to the display pixels PX arranged in two or more consecutive adjacent columns at a time. The column driver circuit CLM may have a function of changing the frame frequency of the column driver circuit CLM in accordance with a signal from the control portion CTL described later.

The interface IF has a function of taking, into the driver circuit region DRV, image data for displaying an image on the display apparatus DP, which is input from a device outside the display apparatus DP, as described above. In FIG. 5, the interface IF has a function of inputting the image data to the frame memory FM. The interface IF has a function of inputting, to the control portion CTL, an instruction signal for controlling the display apparatus DP which is input from the device outside the display apparatus DP.

The frame memory FM has a function of temporarily retaining the image data transmitted from the interface IF, for example. The frame memory FM also has a function of temporarily retaining an address of the display pixel PX to which the image data is written. The frame memory FM may further have a function of changing the frame frequency of the frame memory FM in accordance with a later-described signal from the control portion CTL.

In FIG. 5, the control portion CTL has a function of controlling the number of rows to which the row driver circuit RWD transmits the selection signal at a time, for example. Similarly, the control portion CTL has a function of controlling the number of columns to which the column driver circuit CLM transmits the same image signal, for example. Here, the control portion CTL is assumed to be capable of transmitting control signals performing the above operations to the row driver circuit RWD and the column driver circuit CLM.

The control portion CTL may have a function of controlling the frame frequency of each of the row driver circuit RWD, the column driver circuit CLM, and the frame memory FM, for example. In this case, the control portion CTL is assumed to be capable of transmitting a signal for changing the frame frequency to each of the row driver circuit RWD, the column driver circuit CLM, and the frame memory FM.

Figure 6:
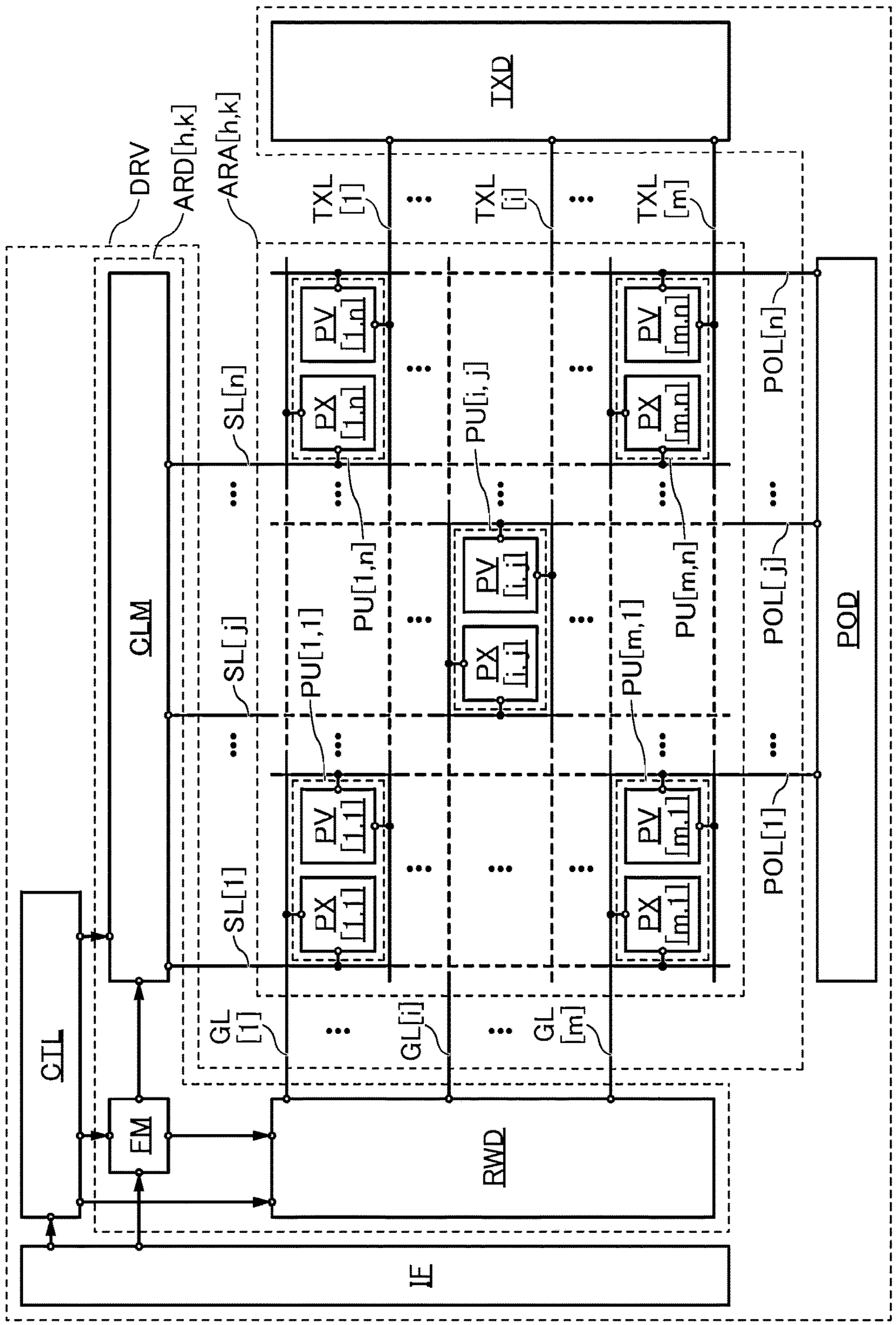
FIG. 6 is a block diagram illustrating an example of a circuit included in a display apparatus.

In the case where the display apparatus DP has the configuration in FIG. 1B, that is, the pixel array ALP includes the light-emitting portion SHB for image capturing and the light-receiving portion SJB for image capturing, the block diagram in FIG. 5 can be rewritten into a block diagram in FIG. 6, for example.

The block diagram in FIG. 6 is different from the block diagram in FIG. 5 in that the display region ARA[h,k] includes an image capturing pixel PV[1,1] to an image capturing pixel PV[m,n] and the driver circuit region DRV includes a sensor row driver circuit TXD and a sensor column driver circuit POD.

Note that FIG. 6 selectively illustrates the image capturing pixel PV[1,1], an image capturing pixel PV[m,1], an image capturing pixel PV[1,*n*], the image capturing pixel PV[m,n], and an image capturing pixel PV[i,j], among the image capturing pixel PV[1,1] to the image capturing pixel PV[m,n].

In FIG. 6, the display region ARA[h,k] includes a pixel PU[1,1] to a pixel PU[m,n]. Note that the pixel PU[1,1] includes the display pixel PX[1,1] and the image capturing pixel PV[1,1]; the pixel PU[m,1] includes the display pixel PX[m,1] and the image capturing pixel PV[m,1]; the pixel PU[1,*n*] includes the display pixel PX[1,*n*] and the image capturing pixel PV[1,*n*]; the pixel PU[m,n] includes the display pixel PX[n,1] and the image capturing pixel PV[m, n]; and the pixel PU[i,j] includes the display pixel PX[i,j] and the image capturing pixel PV[i,j]. That is, as in the display region ARA[h,k] in FIG. 5, the pixel PU[1,1] to the pixel PU[m,n] are arranged in a matrix of m rows and n columns in the display region ARA[h,k].

Note that FIG. 6 selectively illustrates the pixel PU[1,1], an pixel PU[1,1], an pixel PU[1,*n*], the pixel PU[m,n], and an pixel PU[i,j], among the pixel PU[1,1] to the pixel PU[m,n].

The sensor row driver circuit TXD is electrically connected to a wiring TXL[1] to a wiring TXL[m], for example. The sensor column driver circuit POD is electrically connected to a wiring POL[1] to a wiring POL[n], for example.

The image capturing pixel PV[i,j] is electrically connected to a wiring TXL[i] and a wiring POL[j].

The image capturing pixel PV[1,1] to the image capturing pixel PV[m,n] illustrated in FIG. 6 each correspond to the light-receiving portion SJB for image capturing in FIG. 1A and FIG. 1B. Thus, the image capturing pixel PV[1,1] to the image capturing pixel PV[m,n] can each be a pixel including a light-receiving device such as a photoelectric conversion element (e.g., a pn-type or pin-type photodiode).

In the case where the display pixel PX[1,1] to the display pixel PX[m,n] illustrated in FIG. 6 each include a light-emitting device, the display pixel PX[1,1] to the display pixel PX[n,n] can also each be used as a light-emitting pixel for image capturing. In other words, the display pixel PX[1,1] to the display pixel PX[m,n] illustrated in FIG. 6 can each be a pixel that not only displays an image but also emits light necessary at the time of image capturing. In this case, the display pixel PX[1,1] to the display pixel PX[m,n] each correspond to the light-emitting portion SHB for image capturing in FIG. 1A and FIG. 1B. Furthermore, in the display region ARA[h,k], a light-emitting pixel for image capturing (not illustrated) may be provided in addition to the display pixel PX[1,1] to the display pixel PX[m,n].

The sensor row driver circuit TXD has a function of, for example, selecting a row in the display region ARA[h,k] where image capturing is performed. Note that an image capturing method in the configuration example in FIG. 6 may be a rolling shutter method or a global shutter method.

The sensor column driver circuit POD has a function of reading data captured by the image capturing pixel PV in the display portion DIS, for example. Thus, the sensor column driver circuit POD is referred to as a reading circuit in some cases. The sensor column driver circuit POD may include an amplifier circuit for amplifying data and an analog-digital converter circuit.

Although the sensor row driver circuit TXD and the sensor column driver circuit POD are provided outside the circuit region ARD[h,k] in the configuration example illustrated in FIG. 6, the sensor row driver circuit TXD and the sensor column driver circuit POD may be provided inside the circuit region ARD[h,k].

As described above, the application of the configuration example illustrated in FIG. 6 to the display apparatus DP can form the display apparatus DP in FIG. 1B, in which the light-emitting portion SHB for image capturing and the light-receiving portion SIB for image capturing are provided in the pixel array ALP.

One embodiment of the present invention is a display apparatus in which a pixel array is divided into a plurality of regions so that the display quality of each region can be changed in accordance with the position of the user's gaze. Specifically, the display quality of a region apart from the position of the user's gaze is decreased, which can reduce the amount of image data transmitted to the pixel array. Note that examples of a method for changing the display quality include a method for changing screen resolution and a method for changing frame frequency.

<Changing Screen Resolution>

First, a method for changing the screen resolution in each divided region of the pixel array of the display apparatus will be described. The display portion DIS of the display apparatus DP illustrated in FIG. 3A to FIG. 4B is used here in the description.

In the case where the screen resolution of the display portion DIS of the display apparatus DP is 8K4K, for example, the number of the display pixels PX included in the display portion DIS is 7680×4320. Here, in the case where the screen resolution of the display portion DIS of the display apparatus DP is changed to 4K2K (3840×2160), the matrix of display pixels PX in the display portion DIS is divided into regions of two rows and two columns, four display pixels PX included in each region are assumed as one pixel, and the same image signal is transmitted to the four display pixels PX included in one region; thus, the display apparatus DP can be driven as a display apparatus with 4K2K screen resolution. In the case where the screen resolution of the display portion DIS of the display apparatus DP is changed to FHD (1920×1080 pixels), the matrix of display pixels PX of the display portion DIS is divided into regions of four rows and four columns, 16 display pixels PX included in each region are assumed as one pixel, and the same image signal is transmitted to the four display pixels PX included in one region; thus, the 8K4K display apparatus DP can be driven as a display apparatus with FHD screen resolution. In the case where the screen resolution of the display portion DIS of the display apparatus DP is changed to HD (1280×720 pixels), the matrix of display pixels PX of the display portion DIS is divided into regions of six rows and six columns, and 36 display pixels PX included in one region in each region are assumed as one pixel, and the same image signal is transmitted to the 36 display pixels PX included in one region; thus, the 8K4K display apparatus DP can be driven as a display apparatus with I-ID screen resolution.

Although the screen resolution of the display portion DIS of the display apparatus DP is changed in the above examples, the screen resolutions of the respective display region ARA in the display apparatus DP can be changed as previously described.

Figure 7:
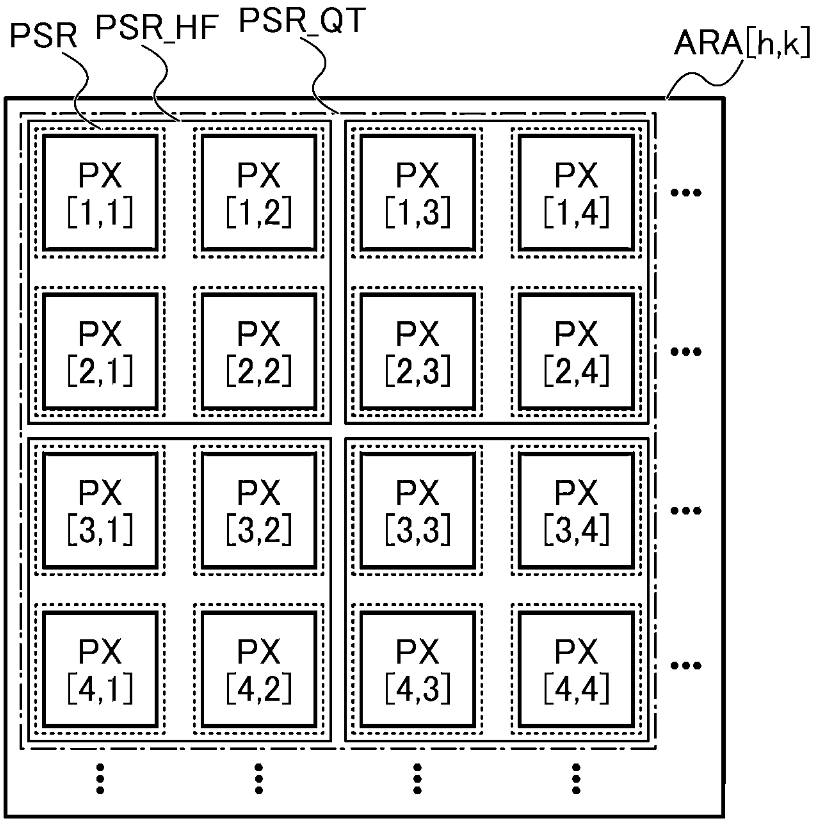
FIG. 7 is a block diagram illustrating an example of a display region included in a display apparatus.

FIG. 7 is a block diagram of the display region ARA[h,k] including the plurality of display pixels PX. Note that FIG. 7 selectively illustrates the display pixel PX[1,1], a display pixel PX[2,1], a display pixel PX[3,1], a display pixel PX[4,1], a display pixel PX[1,2], a display pixel PX[2,2], a display pixel PX[3,2], a display pixel PX[4,2], a display pixel PX[1,3], a display pixel PX[2,3], a display pixel PX[3,3], a display pixel PX[4,3], a display pixel PX[1,4], a display pixel PX[2,4], a display pixel PX[3,4], and a display pixel PX[4,4].

When the screen resolution of the display portion DIS of the display apparatus DP is 8K4K and the display portion DIS is divided into display regions of four rows and eight columns (i.e., when p=4 and q=8 in FIG. 3A to FIG. 4B), the number of display pixels PX included in one display region ARA is 960×1080. In this case, a region PSR enclosed by a dotted line displays an image as one pixel in the display region ARA[h,k] in FIG. 7.

Here, the case where the matrix of display pixels PX is divided into regions PSR_HF (regions each enclosed by a solid line) of two rows and two columns in the display region ARA[h,k] in FIG. 7 is considered. In this case, four display pixels PX included in each region PSR_HF are assumed as one pixel and the same image signal is transmitted to the four display pixels PX included in one region PSR_HF; thus, the display region ARA[h,k] where the region PSR_HF serves as one pixel can display an image. That is, the screen resolution of the display region ARA[h,k] can be regarded as 480×540 pixels. In addition, since the same image signal is written to the four display pixels PX in each of the regions PSR_HF of two rows and two columns, the amount of image data transmitted to the display region ARA[h,k] with 480×540 pixel screen resolution is one-quarter of the amount of image data transmitted in the case of normal screen resolution.

Similarly, the case where the matrix of display pixels PX is divided into regions PSR_QT (regions each enclosed by a dashed-dotted line) of four rows and four columns in the display region ARA[h,k] in FIG. 7 is considered. In this case, the same image signal is transmitted to 16 display pixels PX included in each region PSR_QT; thus, the display region ARA[h,k] where the region PSR_QT including the 16 display pixels PX serves as one pixel can display an image. That is, the screen resolution of the display region ARA[h,k] can be regarded as 240×270 pixels. In addition, since the same image signal is written to the 16 display pixels PX in each of the regions PSR_QT in four rows and four columns, the amount of image data transmitted to the display region ARA[h,k] with 240×270 pixel screen resolution is one 16-th of the amount of image data transmitted in the case of normal screen resolution.

The case where the matrix of display pixels PX is divided into regions of six rows and six columns in the display region ARA[h,k] in FIG. 7, which is not illustrated, is considered. In this case, the same image signal is transmitted to 36 display pixels PX included in each region; thus, the display region ARA[h,k] where the region including the 36 display pixels PX serves as one pixel can display an image. That is, the screen resolution of the display region ARA[h,k] can be regarded as 160×180 pixels. In addition, since the same image signal is written to the 36 display pixels PX in each of the regions of six rows and six columns, the amount of image data transmitted to the display region ARA[h,k] with 160×180 pixel screen resolution is one 36-th of the amount of image data transmitted in the case of normal screen resolution.

As described above, the amount of image data written to the display region ARA[h,k] can be reduced by decreasing the screen resolution of the display region ARA[h,k]. In other words, the load of the interface IF handling the image data input from the outside of the display apparatus DP can be reduced. Furthermore, since the amount of image data displayed on the display apparatus DP is reduced, the load of the circuits in the driver circuit region DRV can be reduced.

<<Configuration Examples of Column Driver Circuit CLM and Row Driver Circuit RWD>>

Next is the description of a configuration example of each of the column driver circuit CLM and the row driver circuit RWD included in the circuit region ARD corresponding to the display region ARA whose screen resolution can be changed.

Figure 8A:
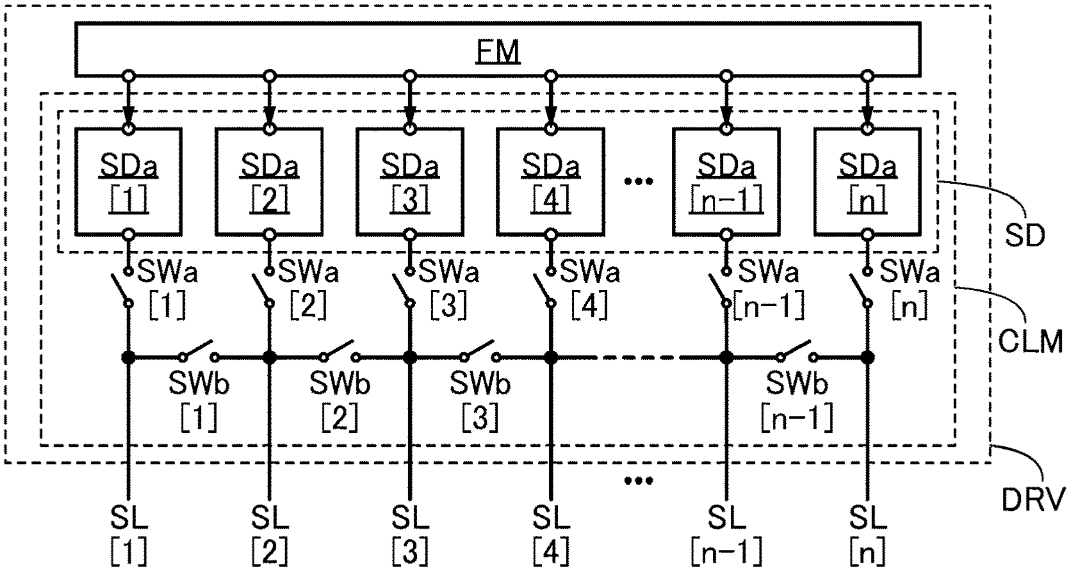
FIG. 8A and FIG. 8B are circuit diagrams illustrating examples of circuits included in a display apparatus.

FIG. 8A illustrates a configuration example of the column driver circuit CLM that can be applied to the circuit region ARD of the above-described display apparatus DP. Note that FIG. 8A also illustrates the frame memory FM to show connection to the column driver circuit CLM.

Figure 8B:
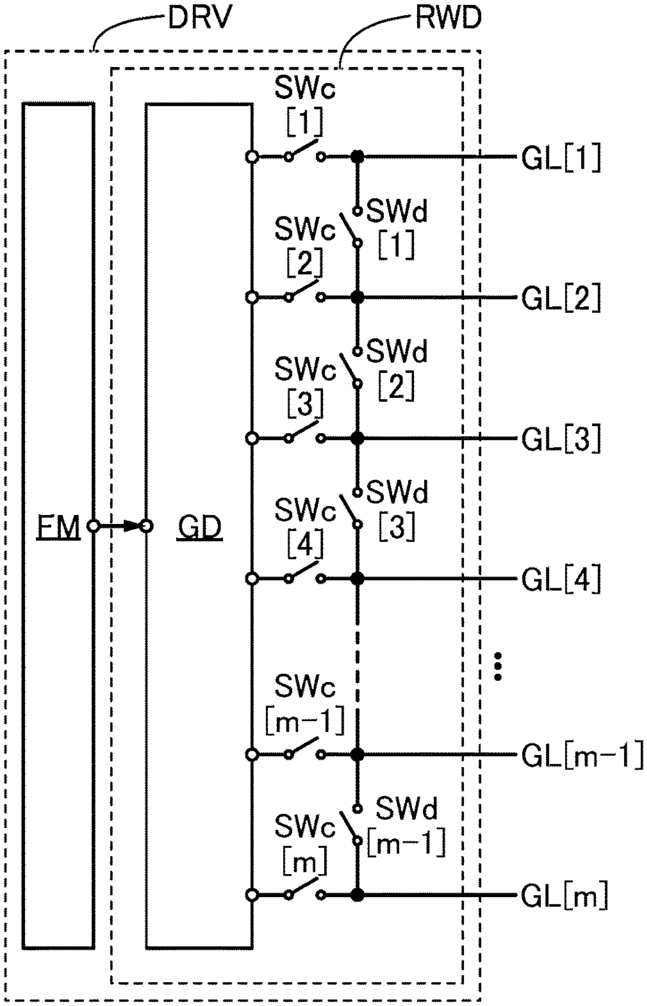

FIG. 8B illustrates a configuration example of the row driver circuit RWD that can be applied to the circuit region ARD of the above-described display apparatus DP.

The column driver circuit CLM in FIG. 8A includes the driver circuit SD, a switch SWa[1] to a switch SWa[n], and a switch SWb[1] to a switch SWb[n−1], for example.

The driver circuit SD includes a circuit SDa[1] to a circuit SDa[n], for example.

The row driver circuit RWD in FIG. 8B includes the driver circuit GD, a switch SWc[1] to a switch SWc[n], and a switch SWd[1] to a switch SWd[n−1], for example.

For each of the plurality of switches illustrated in FIG. 8A and FIG. 8B, an electrical switch such as an analog switch or a transistor can be used, for example. For each of the plurality of switches illustrated in FIG. 8A and FIG. 8B, in particular, the above-described transistor is preferably used as an electrical switch and an OS transistor is further preferably used. Alternatively, a mechanical switch may be used as each of the plurality of switches illustrated in FIG. 8A and FIG. 8B, for example.

The control portion CTL is used for switching control between the on state and the off state of each of the switch SWa[1] to the switch SWa[n], the switch SWb[1] to the switch SWb[n−1], the switch SWc[1] to the switch SWc[n], and the switch SWd[1] to the switch SWd[n−1], which are illustrated in FIG. 8A and FIG. 8B. Specifically, in accordance with the image analysis result of an image (e.g., the user's eye) captured by the light-receiving portion SIB for image capturing, the control portion CTL can determine whether to set the on state or the off state of each of the switch SWa[1] to the switch SWa[n], the switch SWb[1] to the switch SWb[n−1], the switch SWc[1] to the switch SWc[n], and the switch SWd[1] to the switch SWd[n−1]. Thus, the control portion CTL has a function of transmitting a control signal to each switch included in the column driver circuit CLM and the row driver circuit RWD.

Input terminals of the circuit SDa[1] to the circuit SDa[n] are electrically connected to the frame memory FM.

The output terminal of the circuit SDa[1] is electrically connected to a first terminal of the switch SWa[1]. The output terminal of the circuit SDa[n] is electrically connected to the first terminal of the switch SWa[n]. When J is an integer greater than or equal to 2 and less than or equal to n−1, an output terminal of the circuit SDa[J] is electrically connected to a first terminal of the switch SWa[J].

A second terminal of the switch SWa[1] is electrically connected to a first terminal of the switch SWb[1] and the wiring SL[1]. A second terminal of the switch SWa[J] is electrically connected to a second terminal of a switch SWb[J−1], a first terminal of the switch SWb[J], and a wiring SL[J]. A second terminal of the switch SWa[n] is electrically connected to a second terminal of a switch SWb[n] and the wiring SL[n].

The driver circuit SD functions as a source driver circuit, for example. Specifically, each of the circuit SDa[1] to the circuit SDa[n] has a function of, by obtaining digital data corresponding to an image displayed on the pixel array ALP from the frame memory FM, converting the digital data into analog data and outputting the analog data to the output terminal.

The driver circuit GD functions as a gate driver circuit, for example. Specifically, the driver circuit GD has a function of, by obtaining a signal including the row (address) of the display pixel PX for image rewriting from the control portion CTL or the frame memory FM, transmitting a selection signal to the selected row.

Next, driving methods of the column driver circuit CLM and the row driver circuit RWD are described.

First, the case where the screen resolution of the display region ARA is normal and an image is displayed on the display region ARA, for example, is considered.

In this case, in the r column driver circuit CLM, the switch SWa[1] to the switch SWa[n] are all brought into an on state and the switch SWb[1] to the switch SWb[n−1] are all brought into an off state.

Accordingly, one of the circuit SDa[1] to the circuit SDa[n] can transmit an image signal to the corresponding wiring of the wiring SL[1] to the wiring SL[n].

In this case, in the row driver circuit RWD, the switch SWc[1] and the switch S SWc[n] are brought into an on state and the switch SWd[1] to the switch SWd[n−1] are brought into an off state.

Accordingly, the driver circuit GD can transmit selection signals to the corresponding wiring of the wiring GL[1] to the wiring GL[n].

Through the above operations, the rows where the display pixel PX to which image writing is performed are located, in the pixel array ALP, can be selected one by one by the column driver circuit CLM. In addition, the row driver circuit RWD can transmit the corresponding image signal to each of the display pixel PX[1,1] to the display pixel PX[m,n] included in the pixel array ALP. That is, these operations enable the display region ARA to display an image with the normal screen resolution.

Next, the case where the screen resolution of the display region ARA is one-quarter of the normal screen resolution and an image is displayed on the display region ARA, for example, is considered. Note that in this case, each of m and n in the display region ARA is a multiple of 2.

In this case, in the column driver circuit CLM, a switch SWa[J+1] and a switch SWb[J+1] are brought into an on state and a switch SWa[J+2] and a switch SWb[J+2] are brought into an off state. Note that J here is 0 or an even number greater than or equal to greater than or equal to 1 and less than or equal to n−1.

Accordingly, the circuit SDa[J+1] can transmit the same image signal to the wiring SL[J+1] and the wiring SL[J+2]. In other words, the same image signals can be transmitted to the plurality of display pixels PX located in the J+1-th column and the plurality of display pixels PX located in the J+2-th column.

In the row driver circuit RWD, a switch SWc[K+1] and a switch SWd[K+1] are brought into an on state and a switch SWc[K+2] and a switch SWd[K+2] are brought into an off state. Note that K here is 0 or an even number greater than or equal to greater than or equal to 1 and less than or equal to m−1.

Accordingly, the driver circuit GD can transmit image signals to the wiring GL[K+1] and the wiring GL[K+2]. In other words, the same selection signals can be transmitted to the plurality of display pixels PX located in the K+1-th row and the plurality of display pixels PX located in the K+2-th row.

Thus, by the above operations, the matrix of m rows and n columns in the pixel array ALP can be divided into regions of two rows and two columns, and the same image signal and the same selection signal can be transmitted to four display pixels PX included in each region. In addition, as described above, four display pixels PX included in each of the regions of two rows and two columns are regarded as one pixel, whereby the screen resolution of the display region ARA can be reduced to one-quarter.

Next, the case where the screen resolution of the display region ARA is one 16-th of the normal screen resolution and an image is displayed on the display region ARA, for example, is considered. Note that in this case, each of n and n in the display region ARA is a multiple of 4.

In this case, in the column driver circuit CLM, the switch SWa[J+1] and the switch SWb[J+1] to the switch SWb[J+3] are each brought into an on state and a switch SWa[J+2] to the switch SWa[J+4] and the switch SWb[J+4] are each brought into an off state. Note that J here is 0 or a multiple of 4 greater than or equal to greater than or equal to 1 and less than or equal to n−1.

Accordingly, the circuit SDa[J+1] can transmit the same image signal to the wiring SL[J+1] to the wiring SL[J+4]. In other words, the same image signal can be transmitted to the plurality of display pixels PX located in the J+1-th column, the plurality of display pixels PX located in the J+2-th column, the plurality of display pixels PX located in the J+3-th column, and the plurality of display pixels PX located in the J+4-th column.

In the row driver circuit RWD, the switch SWc[K+1] and the switch SWd[K+1] to the switch SWd[K+3] are brought into an on state and the switch SWc[K+2] to the switch SWc[K+4] and the switch SWd[K+4] are brought into an off state. Note that K here is 0 or a multiple of 4 greater than or equal to greater than or equal to 1 and less than or equal to m−1.

Accordingly, the driver circuit GD can transmit image signals to the wiring GL[K+1] to the wiring GL[K+4]. In other words, the same selection signals can be transmitted to the plurality of display pixels PX located in the K+1-th row, the plurality of display pixels PX located in the K+2-th row, the plurality of display pixels PX located in the K+3-th row, and the plurality of display pixels PX located in the K+4-th row.

Thus, by the above operations, the matrix of m rows and n columns in the pixel array ALP can be divided into regions of four rows and four columns, and the same image signal and the same selection signal can be transmitted to 16 display pixels PX included in each region. In addition, as described above, 16 display pixels PX included in each of the regions of four rows and four columns are regarded as one pixel, whereby the screen resolution of the display region ARA can be reduced to one 16-th.

Next, the case where the screen resolution of the display region ARA is one 36-th of the normal screen resolution and an image is displayed on the display region ARA, for example, is considered. Note that in this case, each of n and n in the display region ARA is a multiple of 6.

In this case, in the column driver circuit CLM, the switch SWa[J+1] and the switch SWb[J+1] to the switch SWb[J+5] are each brought into an on state and a switch SWa[J+2] to the switch SWa[J+6] and the switch SWb[J+6] are each brought into an off state. Note that J here is 0 or a multiple of 6 greater than or equal to greater than or equal to 1 and less than or equal to n−1.

Accordingly, the circuit SDa[J+1] can transmit the same image signal to the wiring SL[J+1] to the wiring SL[J+6]. In other words, the same image signal can be transmitted to the plurality of display pixels PX located in the J+1-th column, the plurality of display pixels PX located in the J+2-th column, the plurality of display pixels PX located in the J+3-th column, the plurality of display pixels PX located in the J+4-th column, the plurality of display pixels PX located in the J+6-th column, and the plurality of display pixels PX located in the J+6-th column.

In the row driver circuit RWD, the switch SWc[K+1] and the switch SWd[K+1] to the switch SWd[K+5] are brought into an on state and the switch SWc[K+2] to the switch SWc[K+6] and the switch SWd[K+6] are brought into an off state. Note that K here is 0 or a multiple of 6 greater than or equal to greater than or equal to 1 and less than or equal to M−1.

Accordingly, the driver circuit GD can transmit image signals to the wiring GL[K+1] to the wiring GL[K+6]. In other words, the same selection signals can be transmitted to the plurality of display pixels PX located in the K+1-th row, the plurality of display pixels PX located in the K+2-th row, the plurality of display pixels PX located in the K+3-th row, the plurality of display pixels PX located in the K+4-th row, the plurality of display pixels PX located in the K+5-th row, and the plurality of display pixels PX located in the K+6-th row.

Thus, by the above operations, the matrix of m rows and n columns in the pixel array ALP can be divided into regions of six rows and six columns, and the same image signal and the same selection signal can be transmitted to 36 display pixels PX included in each region. In addition, as described above, 36 display pixels PX included in each of the regions of six rows and six columns are regarded as one pixel, whereby the screen resolution of the display region ARA can be reduced to one 36-th.

Note that in the above operation examples in which the screen resolution is reduced, the row driver circuit RWD transmits a selection signal to a plurality of rows simultaneously; however, the row driver circuit RWD may transmit a selection signal to a plurality of rows not simultaneously but one by one.

Figure 9:
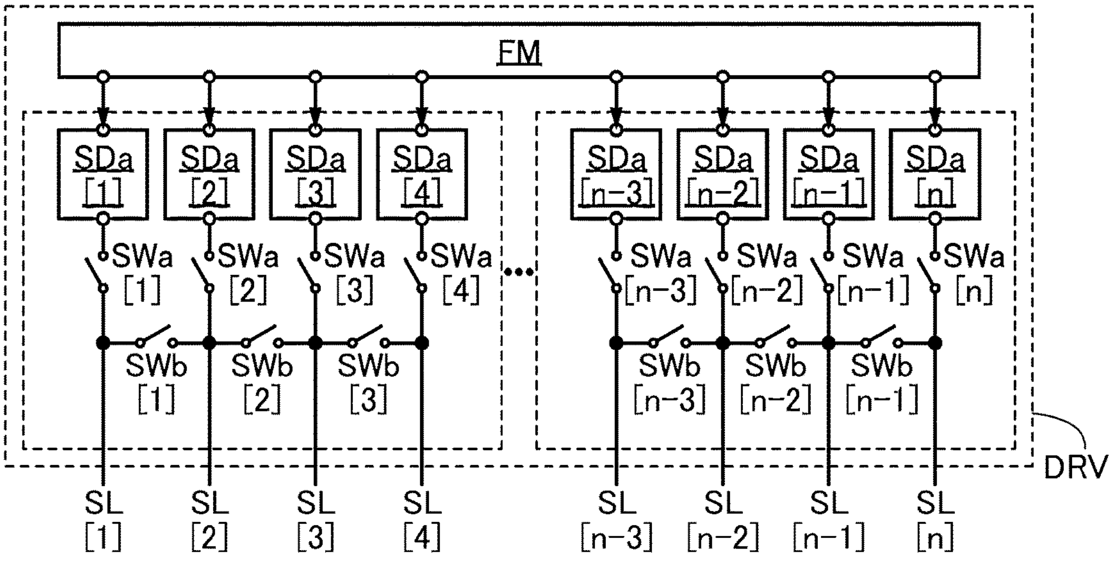
FIG. 9 is a circuit diagram illustrating an example of a circuit included in a display apparatus.

The configuration of one or both of the column driver circuit CLM and the row driver circuit RWD described above is not limited to one embodiment of the present invention. For example, the column driver circuit CLM in FIG. 8A may have a configuration in which one or more switches selected from the switch SWb[1] to the switch SWb[n−1] are not provided. Specifically, the column driver circuit CLM may have a configuration illustrated in FIG. 9, for example. The column driver circuit CLM in FIG. 9 is different from the column driver circuit CLM in FIG. 8A in that the switch SWb[J] (here, J is a multiple of 4 greater than or equal to 1) is not provided. Note that in the column driver circuit CLM in FIG. 9, n is a multiple of 4 greater than or equal to 1. With the use of the column driver circuit CLM in FIG. 9, the same image signal can be transmitted to wirings in four columns at a maximum.

<<Changing Screen Resolution Depending on User's Gaze>>

As described above, the screen resolution can be changed for each display region ARA in the display apparatus DP. In an operation described here, the region of the pixel array ALP to which the user's gaze is directed is detected and the screen resolution is changed for each display region ARA. Note that gaze detection (eye tracking) is described later.

Figure 10A:
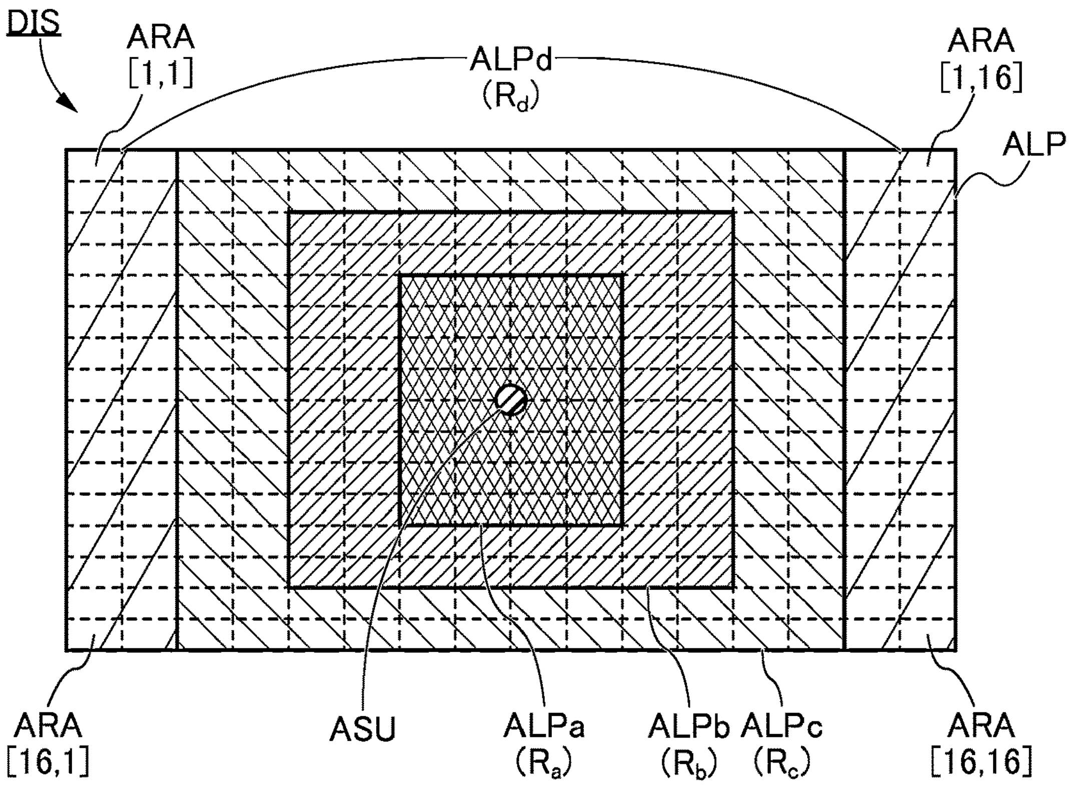
FIG. 10A and FIG. 10B are diagrams illustrating examples in which a display surface of a display apparatus is divided into a plurality of regions.

FIG. 10A illustrates an example in which the display portion DIS of the display apparatus DP is divided into display regions of 16 rows and 16 columns (i.e., p=16 and q=16 in FIG. 3A to FIG. 4B).

The display apparatus DP is assumed to have a function of detecting the user's gaze. Thus, the display apparatus DP can determine which part of the pixel array ALP the user is looking at. For example, in FIG. 10A, a region ASU is a region determined as the region that the user is looking at (user's gaze point) by the eye tracking function of the display apparatus DP.

Since the user's gaze falls on the region ASU, the region ASU is clearly visible to the user. By contrast, the user has difficulty in clear visual confirmation of a region apart from the region ASU (a region that is included in the user's view but not at the user's gaze point, or a region that is not carefully watched by the user). In other words, an image displayed on the display region ARA apart from the region ASU does not attract conscious attention of the user. Therefore the display quality of the display region ARA is not necessarily high.

In the display apparatus DP, as illustrated in FIG. 10A, a region ALPa on the periphery of the region ASU, a region ALPb surrounding the periphery of the region ALPa, a region ALPc surrounding the periphery of the ALPb, and a region ALPd surrounding the periphery of the ALPc are set based on the region ASU detected by the eye tracking function. Then, screen resolutions are set for the respective display regions ARA included in the region ALPa to the region ALPd. Here, the screen resolution of the display region ARA included in the region ALPa is $R_a$, the screen resolution of the display region ARA included in the region ALPb is $R_b$, the screen resolution of the display region ARA included in the region ALPc is $R_c$, and the screen resolution of the display region ARA included in the region ALPd is $R_d$. Specifically, it is preferable that $R_a$ be higher than $R_b$, $R_b$ be higher than $R_c$, and Re be higher than $R_d$.

As described above, the screen resolution of the display region ARA on the periphery of the region ASU at the user's gaze point is increased and the screen resolution of the display region ARA apart from the region ASU is decreased, whereby the amount of image data transmitted to the display portion DIS of the display apparatus DP can be reduced. Consequently, the interface for transmitting image data to the display apparatus DP does not need to have improved performance, which reduces power consumption and cost. Furthermore, a circuit included in the circuit region ARD driving the display pixel PX included in the display region ARA with the lower screen resolution transmits a reduced amount of image data to the display region ARA, which reduces power consumption.

Since the user has difficulty in clear visual confirmation of the display region ARA apart from the region ASU, user's viewing of the image displayed on the pixel array ALP is hardly affected by the lower display quality of the image displayed on the whole pixel array ALP due to the reduction in the lower screen resolution of the display region ARA apart from the region ASU.

Figure 10B:
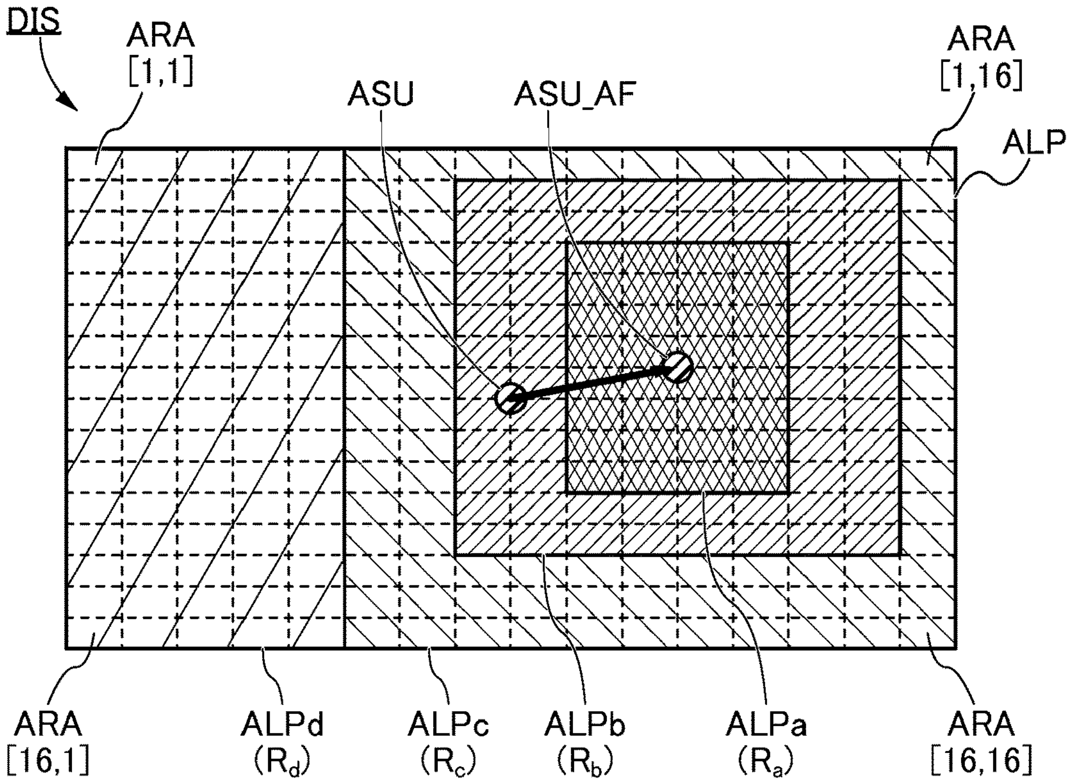
Figure 11A:
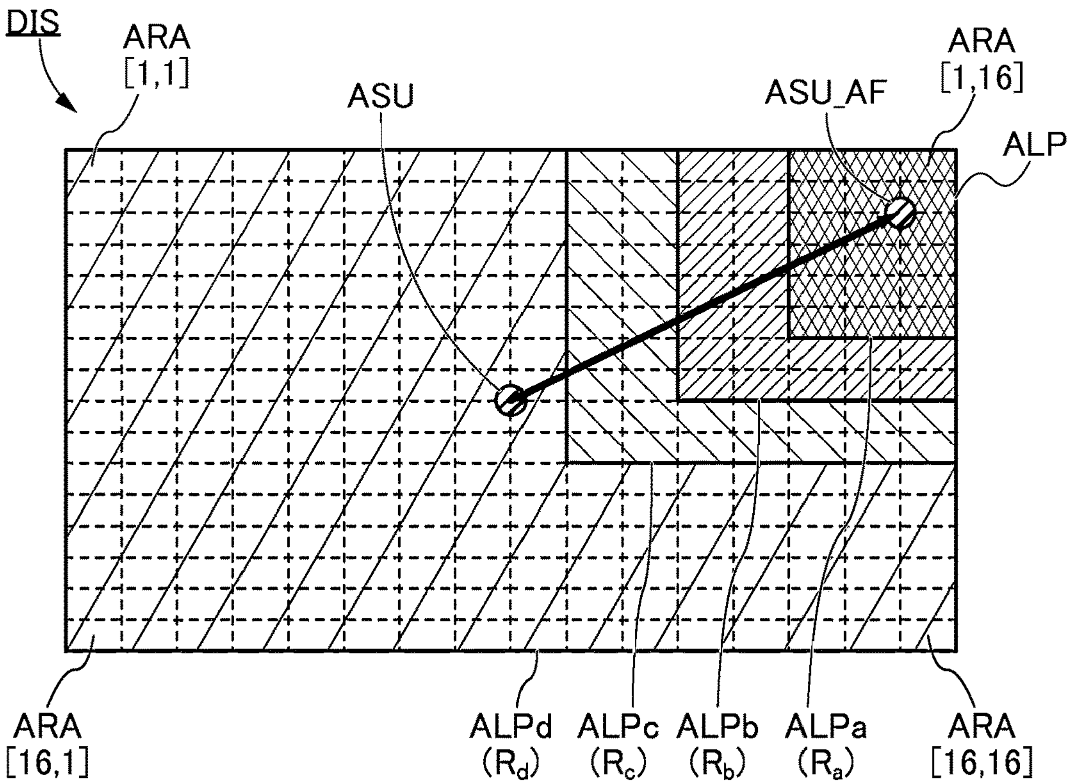
FIG. 11A is a diagram illustrating an example in which a flat surface of a display portion of a display apparatus is divided into a plurality of regions.

With a movement of the user's gaze, a change in the position of the region ASU may be accompanied with changes in the positions and ranges of the region ALPa, the region ALPb, the region ALPc, and the region ALPd. For example, as illustrated in FIG. 10B or FIG. 11A, a movement of the user's gaze point from the region ASU to the region ASU_AF changes the positions of the region ALPa, the region ALPb, the region ALPc, and the region ALPd. Note that in the example in FIG. 10B showing the changes, the range (size) of each of the region ALPa and the region ALPb is not changed, the range of the region ALPc is decreased, and the range of the region ALPd is increased. FIG. 11A is an example showing the changes where the region at the user's gaze point moves from the region ASU to the region ASU_AF near the end of the pixel array ALP, the range of each of the region ALPa, the region ALPb, and the region ALPc is decreased, and the range of the region ALPd is increased.

Figure 11B:
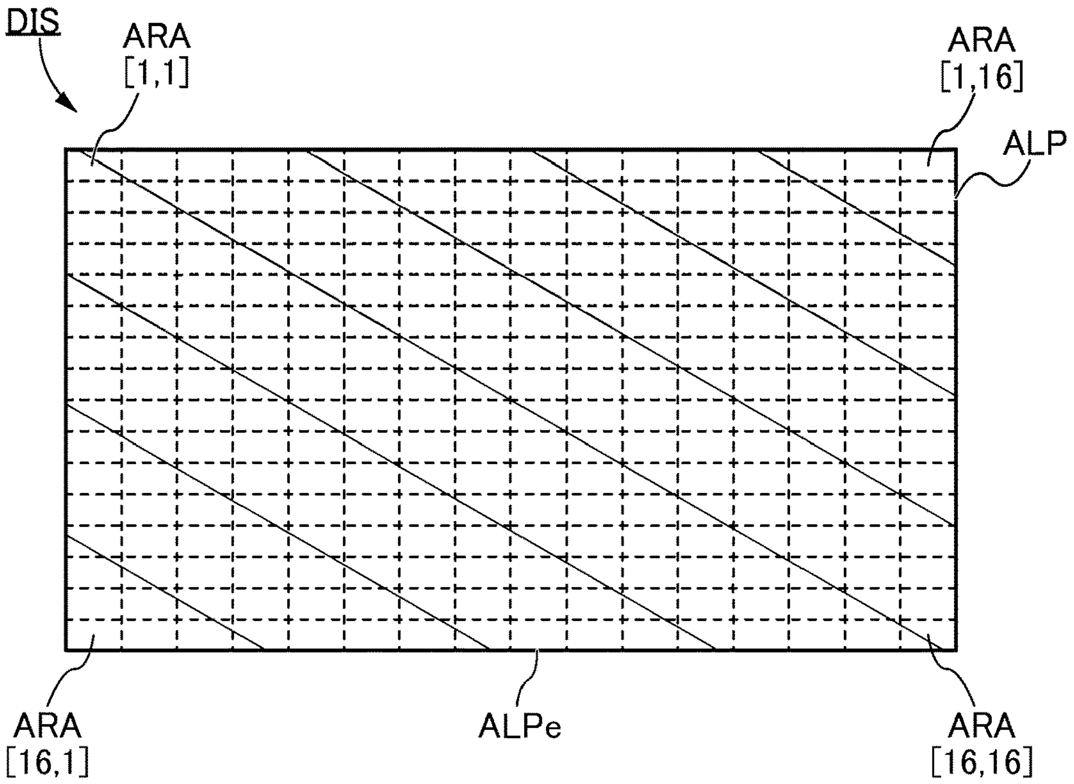
FIG. 11B is a diagram illustrating an example of a flat surface of a display portion of a display apparatus.

In the case where the user's gaze point is not detected by the eye tracking function of the display apparatus DP, the whole pixel array ALP may be set to a region ALPe in the display apparatus DP, as illustrated in FIG. 11B. Examples of the case where the user's gaze point is not detected includes the case where the user's eyes are closed and the case where the user is asleep. The screen resolutions of the display regions ARA included in the region ALPe may be lower than that of the region ALPd, for example. Alternatively, the display apparatus DP may perform an operation of not transmitting an image signal to the display pixels PX of the display regions ARA included in the region ALPe. In other words, the display apparatus DP may perform an operation of transmitting an image signal of black display to the display pixels PX of the display regions ARA included in the region ALPe.

In the configurations of the display apparatus DP in FIG. 10A and FIG. 10B, the display portion DIS is divided into four regions, the region ALPa, the region ALPb, the region ALPc, and the region ALPd, and the region ALPa, the region ALPb, the region ALPc, and the region ALPd have different screen resolutions; however, the display apparatus of one embodiment of the present invention is not limited thereto. For example, the display portion DIS of the display apparatus DP may be divided into two, three, or five or more regions, and the regions may have different screen resolutions.

<Changing Frame Frequency>

Next, a method for changing the frame frequency in each divided region of the pixel array of the display apparatus will be described. The display portion DIS of the display apparatus DP illustrated in FIG. 3A to FIG. 4B is used here in the description.

For example, in the case where the frame frequency of the pixel array ALP of the display apparatus DP is 120 Hz (referred to as fps in some cases), the display apparatus DP performs image writing 120 times per second. Here, in the case where the frame frequency of the pixel array ALP of the display apparatus DP is changed to 60 Hz, the display apparatus DP performs image writing 60 times per second. In this case, the image data transmitted (amount of transmission) to the pixel array ALP per second is half the image data transmitted per second at 120 Hz. In the case where the frame frequency of the pixel array ALP of the display apparatus DP is changed to 30 Hz, the image data transmitted (amount of transmission) to the pixel array ALP per second is one-quarter of the image data transmitted per second at 120 Hz.

Note that in the case where the frame frequency of the pixel array ALP of the display apparatus DP is changed to 180 Hz, the image data transmitted (amount of transmission) to the pixel array ALP per second is 1.5 times the image data transmitted per second at 120 Hz. In addition, in the case where the frame frequency of the pixel array ALP of the display apparatus DP is changed to 240 Hz, the image data transmitted (amount of transmission) to the pixel array ALP per second is twice the image data transmitted per second at 120 Hz.

Although an example of changing the frame frequency of the pixel array ALP of the display apparatus DP is described above, the frame frequency may be changed for each display region ARA in the display apparatus DP.

Figure 12A:
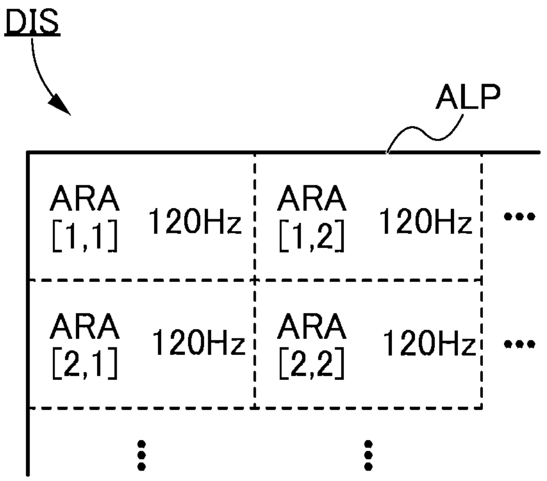
FIG. 12A and FIG. 12C are diagrams illustrating part of a flat surface of a display portion of a display apparatus.

The display apparatus DP in FIG. 12A includes the pixel array ALP including the display region ARA[1,1], the display region ARA[2,1], the display region ARA[1,2], and the display region ARA[2,2], for example.

Figure 12B:
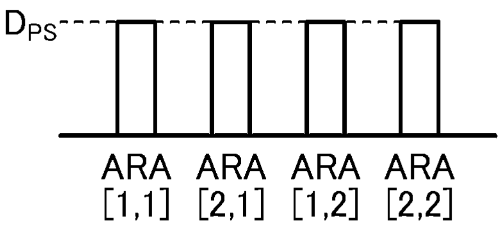
FIG. 12B and FIG. 12D are graphs showing an example of the amount of image data transmitted to display regions of a display apparatus.

When the frame frequency of each of the display region ARA[1,1], the display region ARA[2,1], the display region ARA[1,2], and the display region ARA[2,2] included in the display portion DIS is 120 Hz, the amounts of image data transmitted to the display region ARA[1,1], the display region ARA[2,1], the display region ARA[1,2], and the display region ARA[2,2] are equal to each other (see FIG. 12B). Note that the amount of image data transmitted to each of the display region ARA[1,1], the display region ARA[2,1], the display region ARA[1,2], and the display region ARA[2,2] is referred to as $D_{PS}$.

Figure 12C:
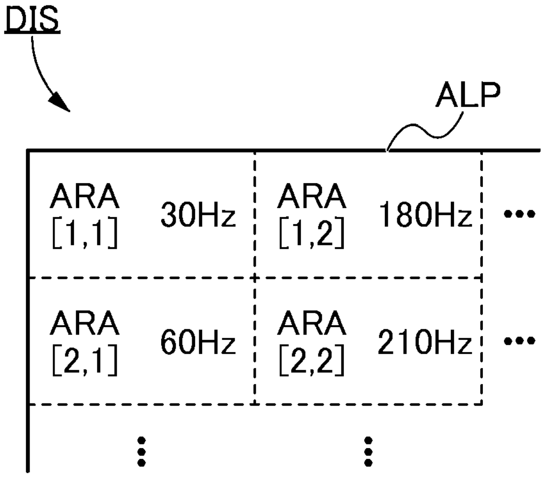

Here, as illustrated in FIG. 12C, the frame frequency of the display region ARA[1,1] is changed to 30 Hz and the frame frequency of the display region ARA[2,1] is changed to 60 Hz.

In the display region ARA[1,1], the decrease in frame frequency from 120 Hz to 30 Hz reduces the amount of image data transmitted to the display region ARA[1,1] to $D_{PS}/4$. In other words, the decrease in frame frequency from 120 Hz to 30 Hz reduces the amount of image data transmission to the display region ARA[1,1] by $3D_{PS}/4$.

In the display region ARA[2,1], the decrease in frame frequency from 120 Hz to 60 Hz reduces the amount of image data transmitted to the display region ARA[2,1] to $D_{PS}/2$. In other words, the decrease in frame frequency from 120 Hz to 60 Hz reduces the amount of image data transmission to the display region ARA[2,1] by $D_{PS}/2$.

It is assumed here that the reduced amount of transmission in each of the display region ARA[1,1] and the display region ARA[2,1] can be allocated to one or more regions selected from the display region ARA[1,2] and the display region ARA[2,2].

Figure 12D:
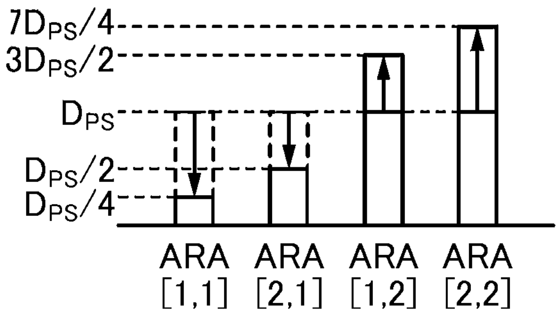

For example, the reduced amount of transmission in the display region ARA[1,1], i.e., $3D_{PS}/4$, may be added to the amount of image data transmitted to the display region ARA[2,2]. The amount of image data transmitted to the display region ARA[2,2] accordingly becomes $7D_{PS}/4$, and thus the image data transmitted to the display region ARA[2,2] can be achieved by increasing the frame frequency of the display region ARA[2,2] to 210 Hz (see FIG. 12C and FIG. 12D).

For example, the reduced amount of transmission in the display region ARA[2,1], i.e., $D_{PS}/2$, may be added to the amount of image data transmitted to the display region ARA[1,2]. The amount of image data transmitted to the display region ARA[1,2] accordingly becomes $3D_{PS}/2$, and thus the image data transmitted to the display region ARA[1,2] can be achieved by increasing the frame frequency of the display region ARA[1,2] to 180 Hz (see FIG. 12C and FIG. 12D).

<<Changing Frame Frequency Depending on User's Gaze>>

As described above, the frame frequency can be changed for each display region ARA in the display apparatus DP. In an operation described here, the region of the pixel array ALP to which the user's gaze is directed is detected and the frame frequency is changed for each display region ARA. Gaze detection (eye tracking) is described later.

Note that description of the portions overlapping with the description of the above "Changing screen resolution" is omitted in some cases.

Figure 13A:
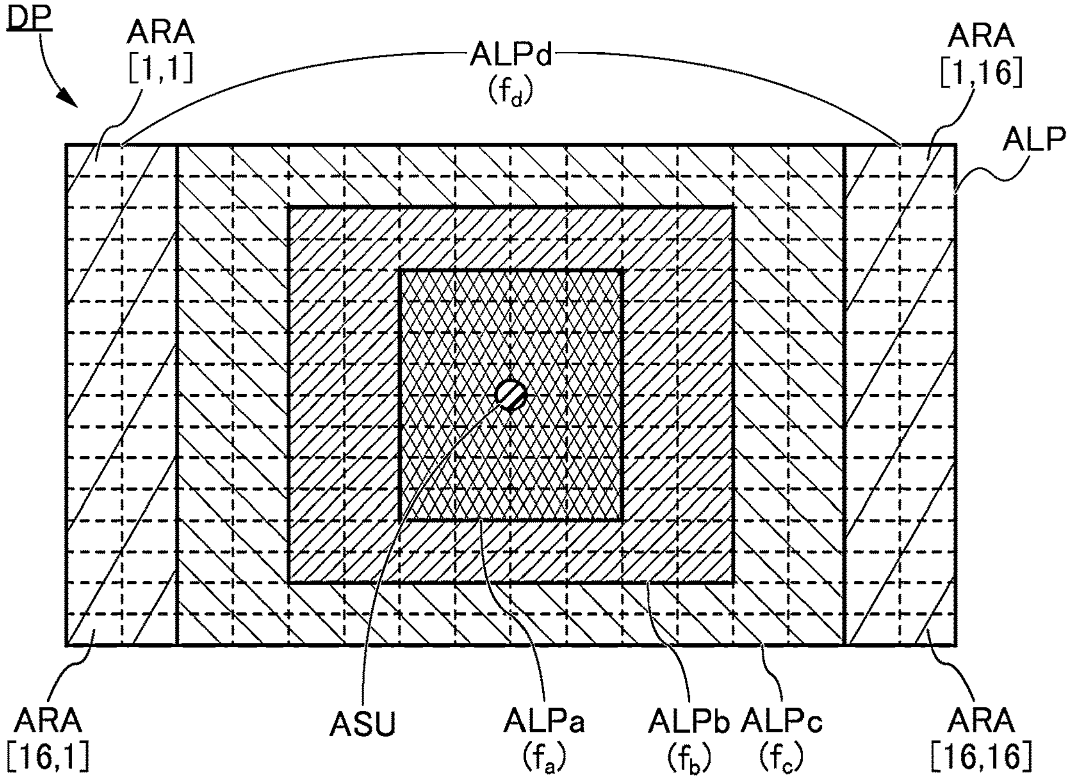
FIG. 13A and FIG. 13B are diagrams illustrating examples in which a display surface of a display apparatus is divided into a plurality of regions.

FIG. 13A illustrates an example in which the pixel array ALP of the display apparatus DP is divided into display regions of 16 rows and 16 columns (i.e., p=16 and q=16 in FIG. 3A to FIG. 4B), as in FIG. 10A.

As in FIG. 10A, the display apparatus DP is assumed to have a function of detecting the user's gaze. Thus, the display apparatus DP illustrated in FIG. 13A can determine which part of the pixel array ALP the user is looking at. Note that for the region ASU illustrated in FIG. 13A, the description of FIG. 10A is referred to.

As described for FIG. 10A, the region ASU is clearly visible to the user while the region apart from the region ASU (a region that is included in the user's view but not at the user's gaze point, or a region that is not carefully watched by the user) does not attract conscious attention of the user. Thus, an image displayed on the display region ARA apart from the region ASU does not attract conscious attention of the user. Therefore the display quality of the display region ARA is not necessarily high.

In the display apparatus DP, as illustrated in FIG. 13A, a region ALPa on the periphery of the region ASU, a region ALPb surrounding the periphery of the region ALPa, a region ALPc surrounding the periphery of the ALPb, and a region ALPd surrounding the periphery of the ALPc are set based on the region ASU detected by the eye tracking function. Then, frame frequencies are set for the respective display regions ARA included in the region ALPa to the region ALPd. Here, the frame frequency of the display region ARA included in the region ALPa is $f_a$, the frame frequency of the display region ARA included in the region ALPb is $f_b$, the frame frequency of the display region ARA included in the region ALPc is $f_c$, and the frame frequency of the display region ARA included in the region ALPd is $f_d$. Specifically, it is preferable that $f_a$ be higher than $f_b$, $f_b$ be higher than $f_c$, and $f_c$ be higher than $f_d$.

Specifically, as described for FIG. 12A to FIG. 12D, the amount of image data transmitted to the display region ARA included in the region ALPa is made larger than the amount of image data transmitted to the display region ARA included in the region ALPb, the amount of image data transmitted to the display region ARA included in the region ALPb is made larger than the amount of image data transmitted to the display region ARA included in the region ALPc, and the amount of image data transmitted to the display region ARA included in the region ALPc is made larger than the amount of image data transmitted to the display region ARA included in the region ALPd.

Figure 15:
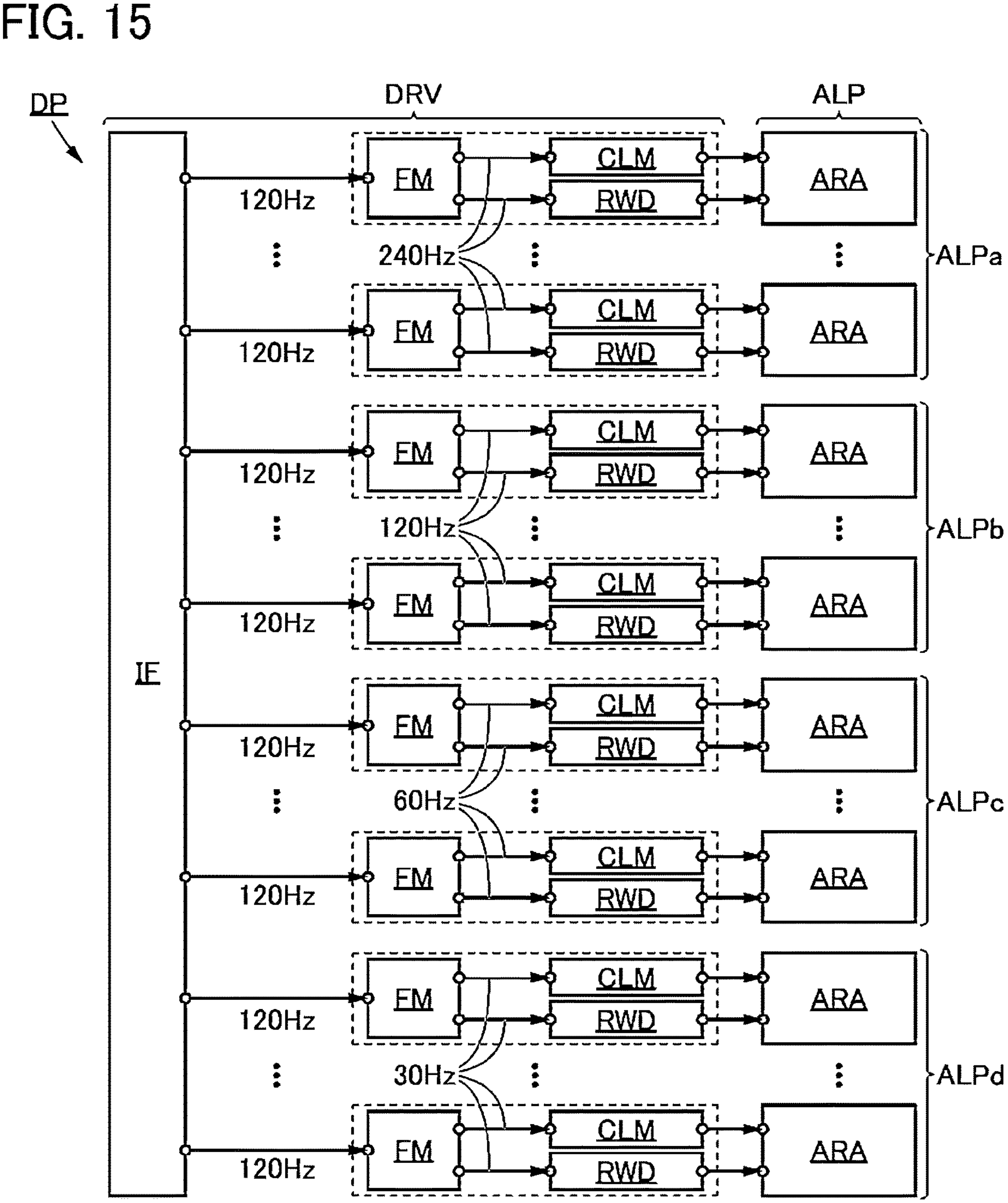
FIG. 15 is a block diagram illustrating a configuration example of a display portion.

A specific example is described below. FIG. 15 is an example of a block diagram of the display apparatus DP illustrated in FIG. 3A to FIG. 4B. Here, the interface IF is assumed to be capable of inputting image data to all the circuit regions ARD at a frame frequency of 120 Hz, for example. In addition, the maximum value of the image data that the interface IF can transmit to all the circuit regions ARD at a frame frequency of 120 Hz is $D_{MAX}$.

Figure 16:
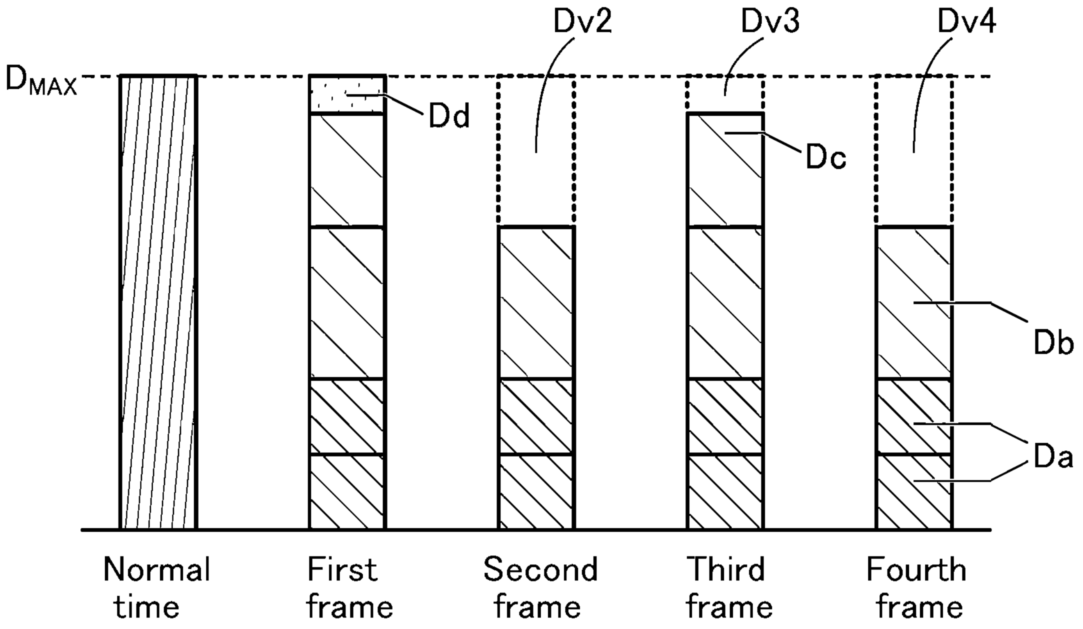
FIG. 16 is a graph showing an example of the amount of image data input to a display apparatus.

FIG. 16 is a graph showing the amount of image data input to the interface IF from the outside of the display apparatus DP. For example, it is shown that in the case where the whole pixel array ALP of the display apparatus DP is driven at a frame frequency of 120 Hz (denoted as normal time in FIG. 16), the amount of the image data input to the interface IF is $D_{MAX}$.

Figure 17:
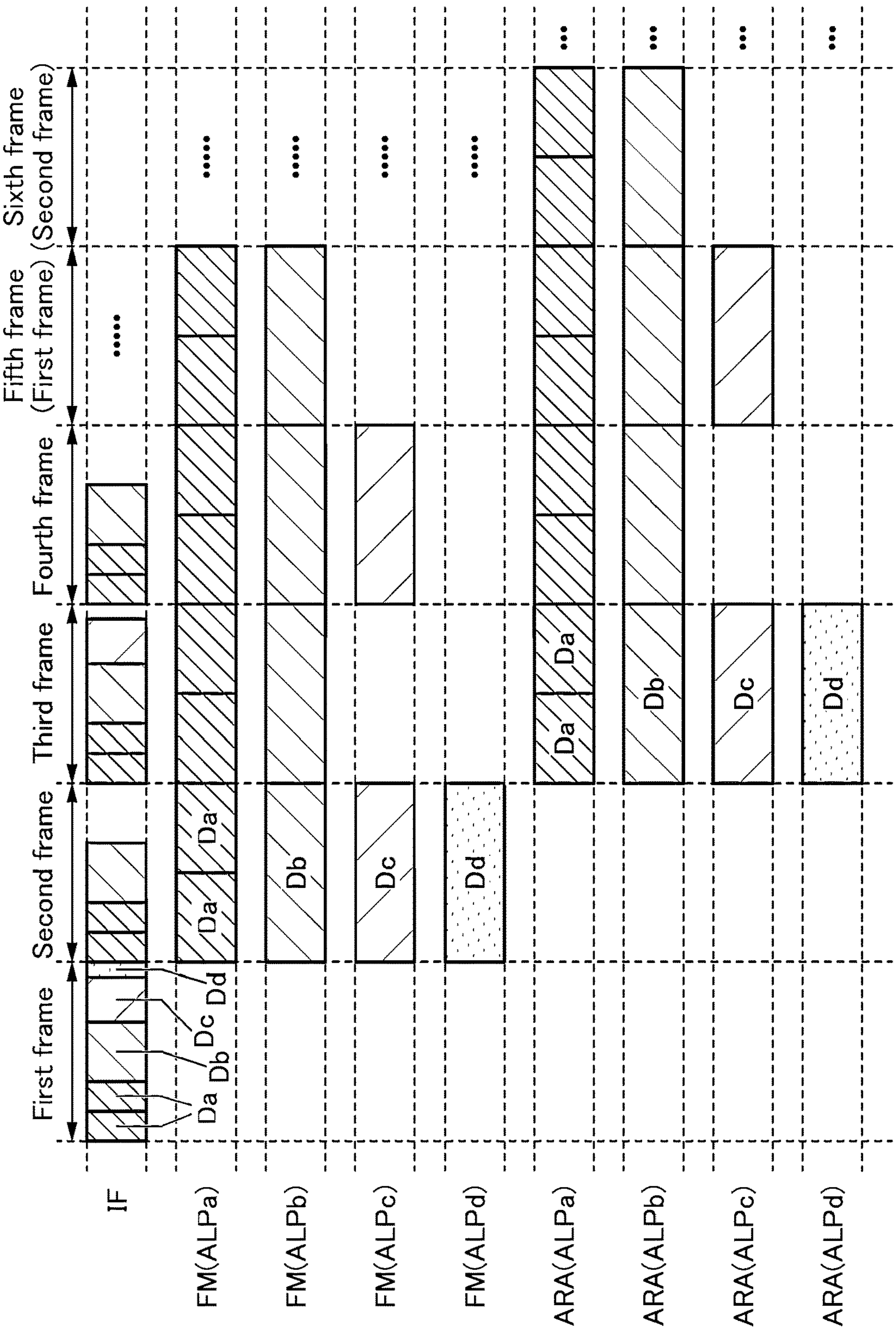
FIG. 17 is a diagram illustrating an example of timings of inputting image data to circuits of a display apparatus.

FIG. 17 illustrates a timing of inputting image data to the interface IF, a timing of inputting image data to the frame memory FM in each of the region ALPa to the region ALPd, and a timing of inputting image data to the display region ARA in each of the region ALPa to the region ALPd.

Here is considered the case where the display apparatus DP is driven in FIG. 13A with the frame frequency of the display region ARA in the region ALPa set to 240 Hz, the frame frequency of the display region ARA in the region ALPb set to 120 Hz, the frame frequency of the display region ARA in the region ALPc set to 60 Hz, and the frame frequency of the display region ARA in the region ALPd set to 30 Hz. It is assumed that in this case, a control signal is supplied from the control portion CTL so that the frame memory FM of the circuit region ARD corresponding to the display region ARA in the region ALPa is driven at 240 Hz, the frame memory FM of the circuit region ARD corresponding to the display region ARA in the region ALPb is driven at 120 Hz, the frame memory FM of the circuit region ARD corresponding to the display region ARA in the region ALPc is driven at 60 Hz, and the frame memory FM of the circuit region ARD corresponding to the display region ARA in the region ALPd is driven at 30 Hz.

In the first frame, Data Da, data Db, data Dc, and data Dd are input to the interface IF driven at a frame frequency of 120 Hz (see the interface IF in FIG. 16 and FIG. 17). The data Da is image data for display on the display region ARA included in the region ALPa, the data Db is image data for display on the display region ARA included in the region ALPb, the data Dc is image data for display on the display region ARA included in the region ALPc, and the data Dd is image data for display on the display region ARA included in the region ALPd.

According to FIG. 16 and FIG. 17, the data Da and the data Db are input to the interface IF in the second frame. In addition, the data Da, the data Db, and the data Dc are input to the interface IF in the third frame, and the data Da and the data Db are input to the interface IF in the fourth frame.

It is assumed that image data input as in the first frame to the fourth frame is repeated in the frames from the fifth frame.

Note that since the frame frequency of the display region ARA of the region ALPa is 240 Hz, the amount of data Da input to the interface in the first frame to the fourth frame is twice the amount of data transmitted at a frame frequency of 120 Hz. Thus, FIG. 16 illustrates two pieces of data Da in each frame.

According to FIG. 17, the two pieces of data Da input to the interface IF in the first frame are input to the frame memory FM of the region ALPa (denoted as FM(ALPa) in FIG. 17) in the second frame. In addition, the data Db input to the interface IF in the first frame is input to the frame memory FM of the region ALPb (denoted as FM(ALPb) in FIG. 17). In addition, the data Dc input to the interface IF in the first frame is input to the frame memory FM of the region ALPc (denoted as FM(ALPc) in FIG. 17). In addition, the data Dd input to the interface IF in the first frame is input to the frame memory FM of the region ALPd (denoted as FM(ALPd) in FIG. 17).

According to FIG. 17, the two pieces of data Da input to the frame memory FM of the region ALPa in the second frame are input to the display region ARA of the region ALPa (denoted as ARA(ALPa) in FIG. 17) in the third frame. In addition, the data Db input to the frame memory FM of the region ALPb in the second frame is input to the region ALPb (denoted as ARA(ALPb) in FIG. 17). In addition, the data Dc input to the frame memory FM of the region ALPc in the second frame is input to the region ALPc (denoted as ARA(ALPc) in FIG. 17). In addition, the data Dd input to the frame memory FM of the region ALPd in the second frame is input to the region ALPd (denoted as ARA(ALPd) in FIG. 17).

Similarly, the data Da and the data Db input to the interface IF in the second frame are input to the display regions ARA in the region ALPa and the region ALPb, respectively, at the timing two frames later.

Similarly, the data Da to the data Dc input to the interface IF in the third frame are input to the display regions ARA in the region ALPa to the region ALPc, respectively, at the timing two frames later.

Similarly, the data Da and the data Db input to the interface IF in the fourth frame are input to the display regions ARA in the region ALPa and the region ALPb, respectively, at the timing two frames later.

The above can be summarized as follows: image rewriting in the display region ARA included in the region ALPa is performed twice in one frame; image rewriting in the display region ARA included in the region ALPb is performed once in one frame; image rewriting in the display region ARA included in the region ALPc is performed once in two frames; and image rewriting in the display region ARA included in the region ALPa is performed once in four frames.

In other words, the above operation enables image display on the display region ARA included in the region ALPa at a frame frequency of 240 Hz, image display on the display region ARA included in the region ALPb at a frame frequency of 120 Hz, image display on the display region ARA included in the region ALPc at a frame frequency of 60 Hz, and image display on the display region ARA included in the region ALPa at a frame frequency of 30 Hz, as illustrated in FIG. 17.

According to FIG. 16, in the case of the 120-Hz frame frequency operation of the display apparatus DP, the amount of the image data input to the interface IF is $D_{MAX}$ in each frame. In the case of the above-described operation of the display apparatus DP, the amount of the image data input to the interface can be reduced by data Dv2 in the second frame, reduced by data Dv3 in the third frame, and reduced by data Dv4 in the fourth frame.

As described above, the frame frequency of the display region ARA on the periphery of the region ASU at the user's gaze point is increased and the frame frequency of the display region ARA apart from the region ASU is decreased, whereby the amount of image data transmitted to the display portion DIS of the display apparatus DP can be reduced. Consequently, the interface for transmitting image data to the display apparatus DP does not need to have improved performance, which reduces power consumption and cost. Since the user has difficulty in clear visual confirmation of the display region ARA apart from the region ASU, user's viewing of the image displayed on the display portion DIS is hardly affected by the lower display quality of the image displayed on the whole display portion DIS due to the reduction in the lower screen resolution of the display region ARA apart from the region ASU.

Figure 13B:
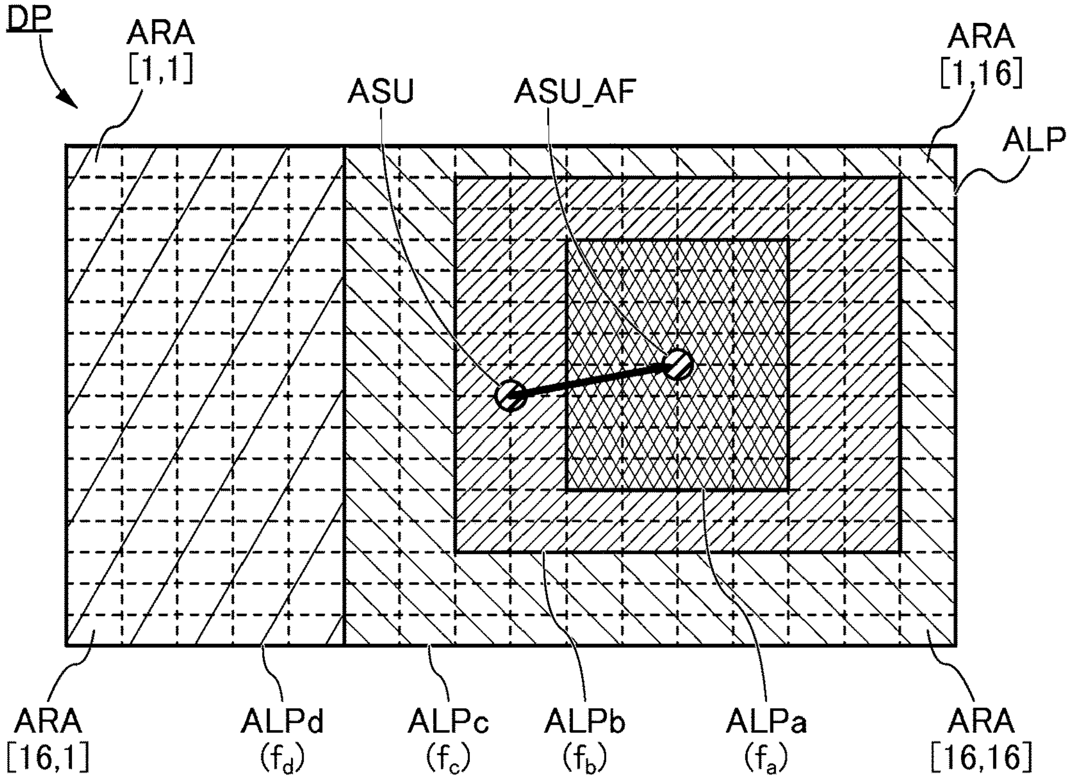
Figure 14A:
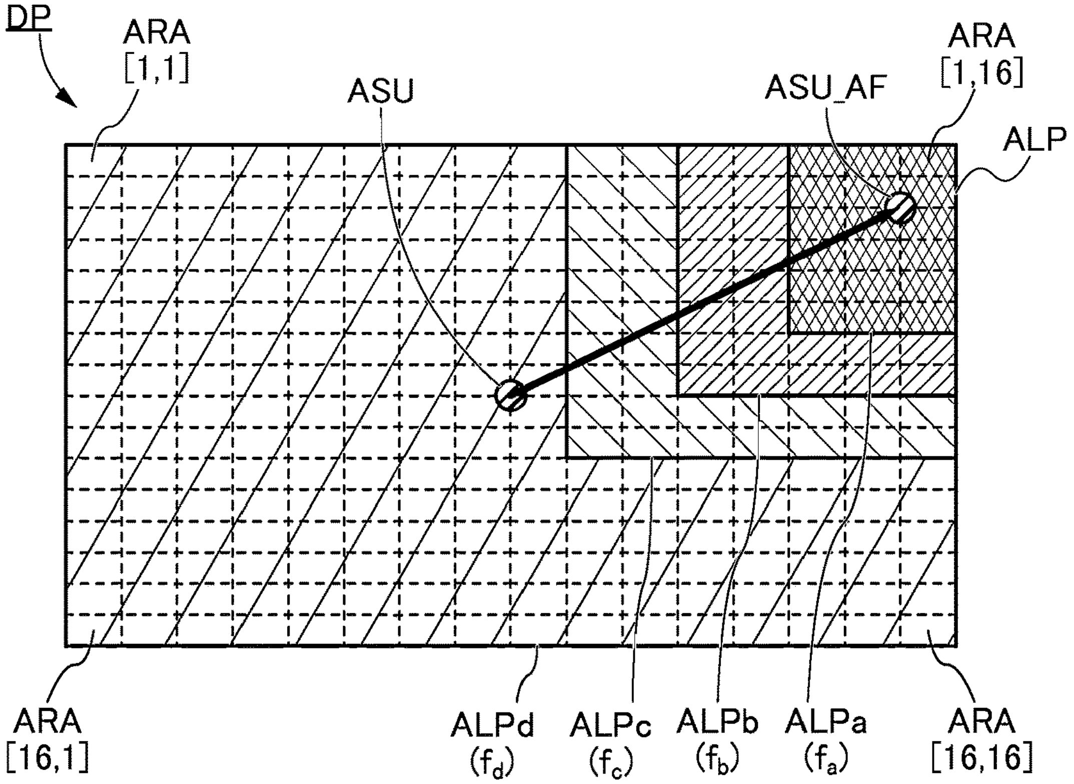
FIG. 14A is a diagram illustrating an example in which a display surface of a display apparatus is divided into a plurality of regions.

With a movement of the user's gaze, a change in the position of the region ASU may be accompanied with changes in the positions and ranges of the region ALPa, the region ALPb, the region ALPc, and the region ALPd. For example, as illustrated in FIG. 13B or FIG. 14A, a movement of the user's gaze point from the region ASU to the region ASU_AF changes the positions of the region ALPa, the region ALPb, the region ALPc, and the region ALPd. Note that in the example in FIG. 13B showing the changes, the range (size) of each of the region ALPa and the region ALPb is not changed, the range of the region ALPc is decreased, and the range of the region ALPd is increased. FIG. 14A is an example showing the changes where the region at the user's gaze point moves from the region ASU to the region ASU_AF near the end of the display portion DIS, the range of each of the region ALPa, the region ALPb, and the region ALPc is decreased, and the range of the region ALPd is increased.

Figure 14B:
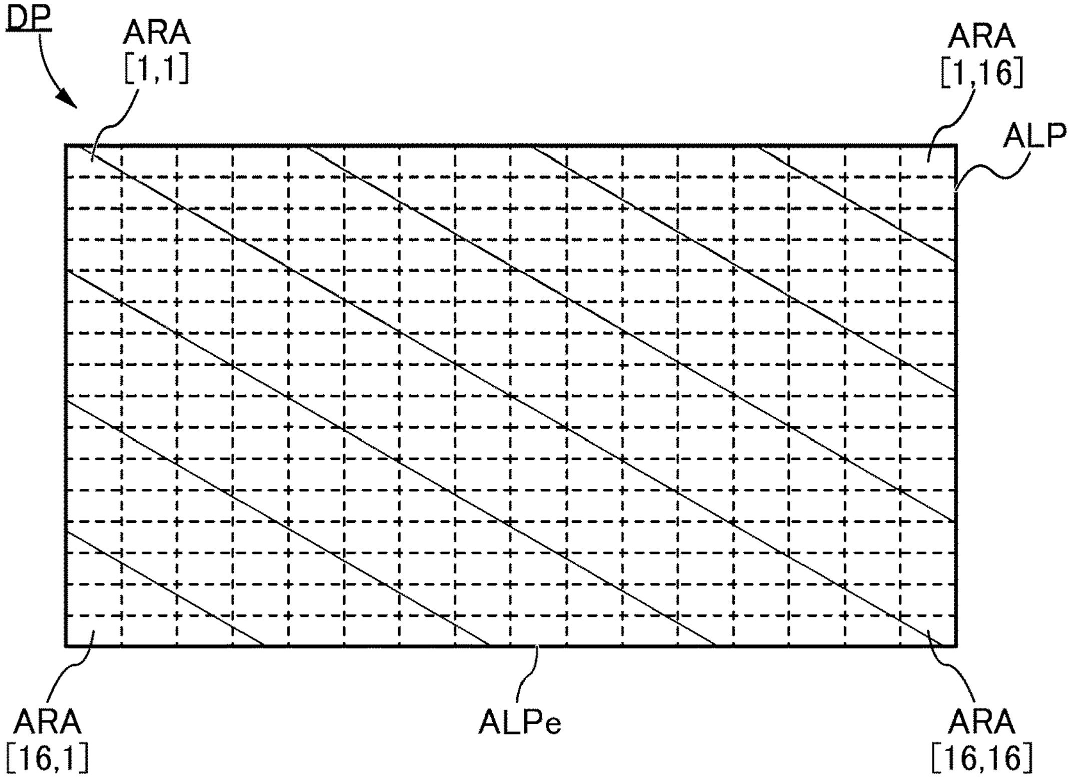
FIG. 14B is a diagram illustrating part of a flat surface of a display portion of a display apparatus.

In the case where the user's gaze point is not detected by the eye tracking function of the display apparatus DP, the whole display portion DIS may be set to the region ALPe in the display apparatus DP, as illustrated in FIG. 14B. Examples of the case where the user's gaze point is not detected includes the case where the user's eyes are closed and the case where the user is asleep. The frame frequency of the display regions ARA included in the region ALPe may be lower than that of the region ALPd, for example. Alternatively, the frame frequency of the region ALPe may be 0. In other words, the display apparatus DP may stop the transmission of an image signal to the display pixels PX of the display regions ARA included in the region ALPe.

In the configurations of the display apparatus DP in FIG. 13A and FIG. 13B, the display portion DIS is divided into four regions, the region ALPa, the region ALPb, the region ALPc, and the region ALPd, and the region ALPa, the region ALPb, the region ALPc, and the region ALPd have different frame frequencies; however, the display apparatus of one embodiment of the present invention is not limited thereto. For example, the display portion DIS of the display apparatus DP may be divided into two, three, or five or more regions, and the regions may have different frame frequencies.

<Structure Examples of Electronic Device Capable of Gaze Detection (Eye Tracking)>

Here, structure examples of an electronic device capable of gaze detection (eye tracking) are described.

Figure 18A:
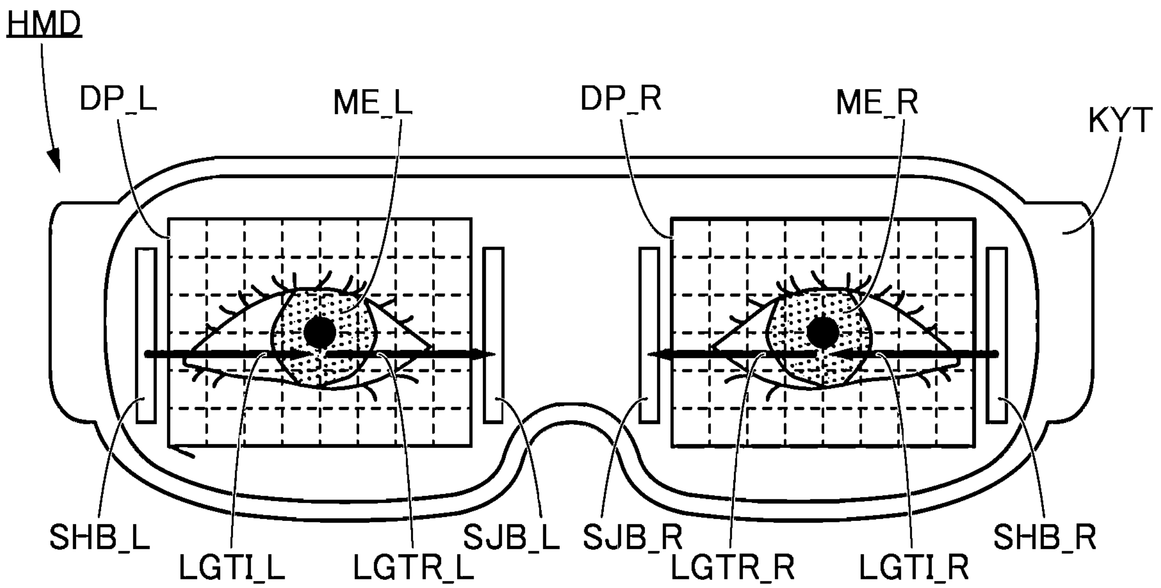
FIG. 18A and FIG. 18B are diagrams illustrating an example of an electronic device including a display apparatus.

FIG. 18A illustrates an electronic device (head-mounted display) using the display apparatus DP in FIG. 1A. The electronic device HMD includes a housing KYT. The housing KYT is shaped to be capable of being worn on a human head. The housing KYT is provided with a display apparatus DP_L and a display apparatus DP_R, each of which corresponds to the display apparatus DP described above. Note that FIG. 18A illustrates a left eye ME_L of a user and a right eye ME_R of the user when the user wears the electronic device Hf-MD.

Specifically, the display apparatus DP_L is provided in the housing KYT so as to be in front of a left eye ME_L of a user who wears the electronic device HMD. That is, in a front view, the left eye ME_L of the user and the display apparatus DP_L overlap with each other in a region. The display apparatus DP_R is provided in the housing KYT so as to be in front of the right eye of the user who wears the electronic device HMD. That is, in a front view, a right eye ME_R of the user and the display apparatus DP_R overlap with each other in a region.

The electronic device HMD includes a light-emitting portion SHB_L for image capturing, a light-emitting portion SHB_R for image capturing, a light-receiving portion SJB_L for image capturing, and a light-receiving portion SJB_R for image capturing, and they are provided on the housing KYT. Note that the light-emitting portion SHB_L for image capturing and the light-emitting portion SHB_R for image capturing correspond to the light-emitting portion SHB for image capturing in FIG. 1A, and the light-receiving portion SJB_L for image capturing and the light-receiving portion SJB_R for image capturing correspond to the light-receiving portion SJB for image capturing in FIG. 1A.

The light-emitting portion SHB_L for image capturing and the light-receiving portion SJB_L for image capturing function as devices for tracking the gaze of the left eye ME_L of the user. Specifically, the light-emitting portion SHB_L for image capturing has a function of irradiating the left eye ME_L of the user with light LGTI_L for image capturing and the light-receiving portion SJB_L for image capturing has a function of detecting light LGTR_L reflected from the left eye ME_L of the user.

By detecting the light LGTR_L from the left eye ME_L of the user, the light-receiving portion SJB_L for image capturing can obtain an image of the left eye ME_L of the user. Since the image shows the lens, the pupil, the cornea, the macula, or the fovea centralis, an image analysis on the image by the electronic device HMD can determine which part of the display apparatus DP_L the left eye ME_L of the user is looking at. Consequently, the gaze of the left eye ME_L of the user can be detected.

The light-emitting portion SHB_R for image capturing and the light-receiving portion SJB_R for image capturing function as devices for tracking the gaze of the right eye ME_R of the user. Specifically, the light-emitting portion SHB_R for image capturing has a function of irradiating the right eye ME_R of the user with light LGTI_R for image capturing and the light-receiving portion SJB_R for image capturing has a function of detecting light LGTR_R reflected from the right eye ME_R of the user.

Similarly, by detecting the light LGTR_R from the right eye ME_R of the user, the light-receiving portion SJB_R for image capturing can obtain an image of the right eye ME_R of the user. Since the image shows the lens, the pupil, the cornea, the macula, or the fovea centralis, an image analysis on the image by the electronic device MID can determine which part of the display apparatus DP_R the right eye ME_R of the user is looking at. Consequently, the gaze of the right eye ME_R of the user can be detected.

Light emitted by one or both of the light-emitting portion SHB_L for image capturing and the light-emitting portion SHB_R for image capturing may be visible light or infrared rays (referred to as IR in some cases). The light-receiving device included in each of the light-receiving portion SJB_L for image capturing and the light-receiving portion SJB_R for image capturing can be chosen in accordance with light emitted from the light-emitting portion SHB_L for image capturing and the light-emitting portion SHB_R for image capturing. For example, the light-receiving device is a light-receiving device capable of receiving visible light in the case where visible light is emitted from the light-emitting device of the light-emitting portion SHB_L for image capturing (light-emitting portion SHB_R for image capturing). For example, the light-receiving device is a light-receiving device capable of receiving infrared rays in the case where infrared rays are emitted from the light-emitting device of the light-emitting portion SHB_L for image capturing (light-emitting portion SHB_R for image capturing).

Figure 18B:
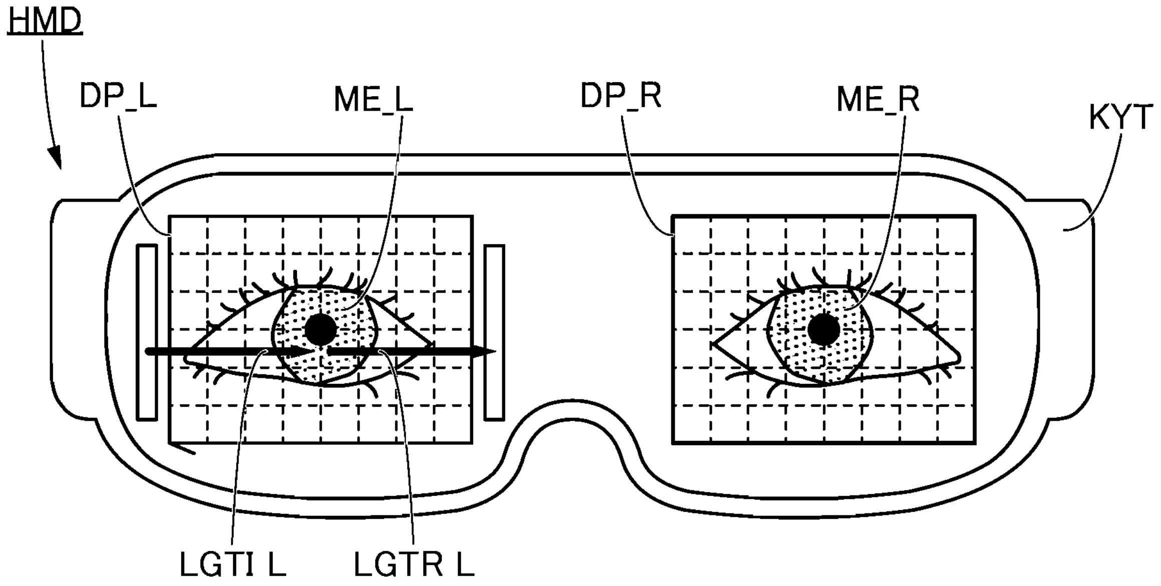

The electronic device HMD may perform gaze detection for one of the left eye and the right eye, instead of both eyes. For example, in the case where gaze detection is intended to be performed only for the left eye, the electronic device MID is configured such that a periphery of the display apparatus DP_L is provided with the light-emitting portion SHB_L for image capturing and the light-receiving portion SJB_L for image capturing, as illustrated in FIG. 18B, so that an image of the left eye ME_L of the user can be captured. In the case where image capturing of the right eye ME_R of the user is not needed, a periphery of the display apparatus DP_R may be provided with neither the light-emitting portion SHB_R for image capturing nor the light-receiving portion SJB_R for image capturing in the electronic device HMD, as illustrated in FIG. 18B.

Although the electronic device HMD illustrated in FIG. 18A and FIG. 18B has a structure in which one display apparatus is interposed between one light-emitting portion for image capturing and one light-receiving portion for image capturing, one embodiment of the present invention is not limited thereto. The electronic device of one embodiment of the present invention may have a structure in which the positions of the light-emitting portion for image capturing and the light-receiving portion for image capturing are interchanged in FIG. 18A and FIG. 18B. The electronic device of one embodiment of the present invention may have a structure in which one display apparatus is vertically interposed between one light-emitting portion for image capturing and one light-receiving portion for image capturing. The electronic device of one embodiment of the present invention may have a structure in which a plurality of light-emitting portions for image capturing are provided in the periphery of the display apparatus. The electronic device of one embodiment of the present invention may have a structure in which a plurality of light-receiving portions for image capturing are provided in the periphery of the display apparatus.

The light-emitting portion for image capturing and the light-receiving portion for image capturing may be provided inside the display apparatus, instead of outside the display apparatus.

Figure 19A:
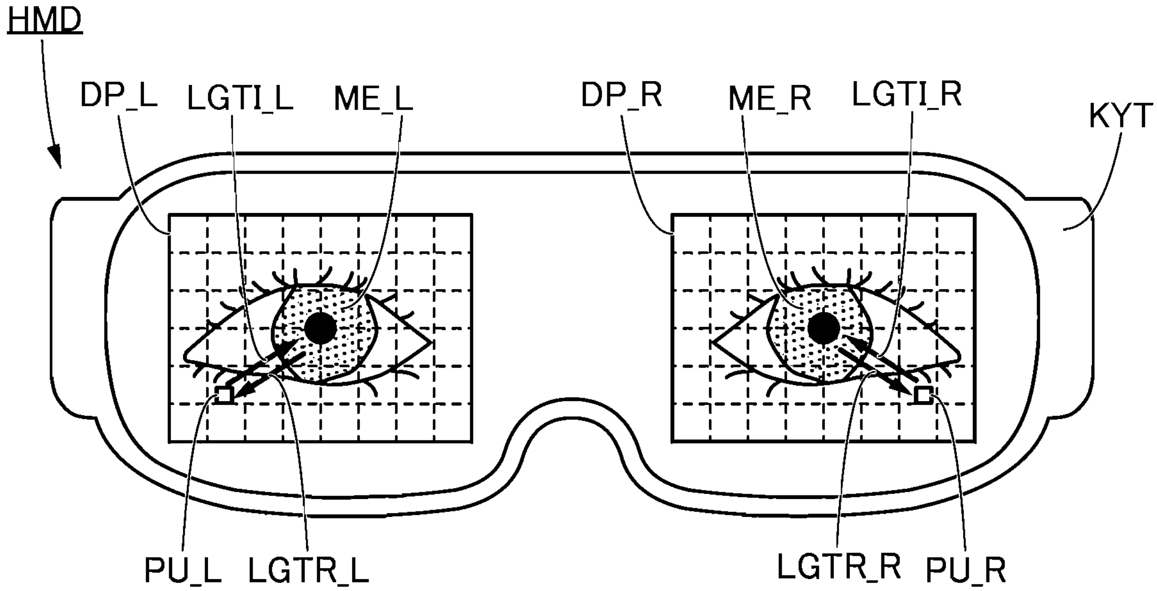
FIG. 19A is a diagram illustrating an example of an electronic device including a display apparatus.

The electronic device HMD illustrated in FIG. 19A is a head-mounted display using the display apparatus in FIG. 1B. Specifically, a pixel included in the display apparatus includes a light-emitting pixel functioning as a light-emitting portion for image capturing and an image capturing pixel functioning as a light-receiving portion for image capturing. For example, in the electronic device HMD in FIG. 19A, the display apparatus DP_L includes a pixel PU_L including a display pixel displaying an image, a light-emitting pixel, and an image capturing pixel, and the display apparatus DP_R includes a pixel PU_R including a display pixel displaying an image, a light-emitting pixel, and an image capturing pixel.

The light-emitting pixel included in the pixel PU_L has a function of irradiating the left eye ME_L of the user with the light LGTI_L and the image capturing pixel included in the pixel PU_L has a function of detecting the light LGTR_L reflected from the left eye ME_L of the user. Similarly, the light-emitting pixel included in the pixel PU_R has a function of irradiating the right eye ME_R of the user with the light LGTI_R and the image capturing pixel included in the pixel PU_R has a function of detecting the light LGTR_R reflected from the right eye ME_R of the user.

Next are described a path in which the light LGTI_L (light LGTI_R) from the light-emitting pixel included in the pixel PU_L (the pixel PU_R) travels to irradiate the left eye ME_L of the user (right eye ME_R of the user) and a path in which the light LGTR_L (light LGTR_R) from the left eye ME_L (right eye ME_R) of the user travels to be detected by the light-receiving device included in the pixel PU_L (pixel PU_R).

Figure 19B:
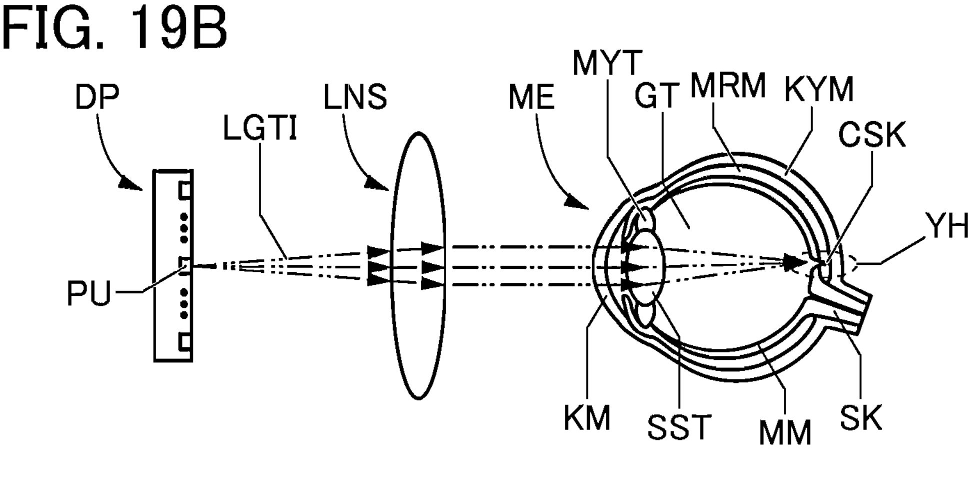
FIG. 19B and FIG. 19C are diagrams illustrating examples of paths of light between a display portion included in the electronic device and a user's eye.
Figure 19C:
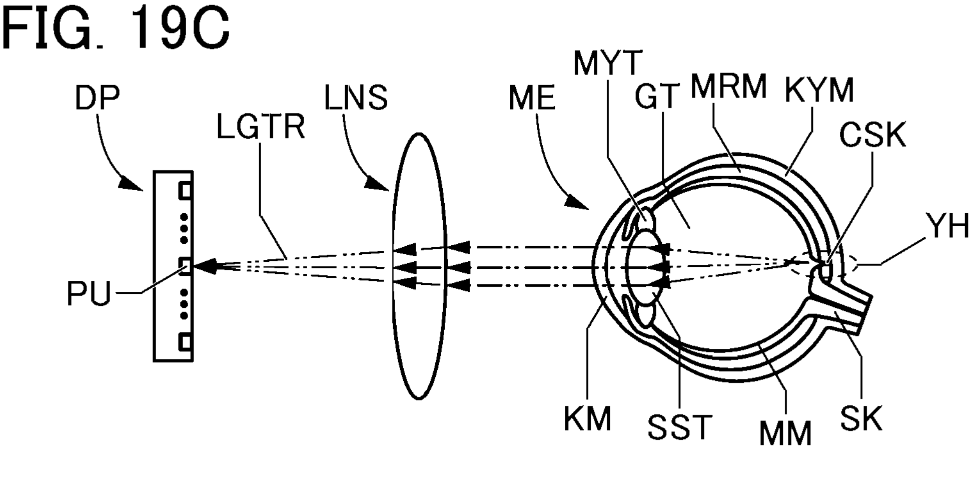

FIG. 19B and FIG. 19C are cross-sectional views illustrating the display apparatus DP corresponding to the display apparatus DP_L or the display apparatus DP_R and an eye ME of the user corresponding to the left eye ME_L of the user or the right eye ME_R of the user, for example. FIG. 19B and FIG. 19C also illustrate cross-sectional views of a lens LNS functioning as an optical system.

In FIG. 19B and FIG. 19C, the display apparatus DP includes a plurality of pixels PU, for example. The plurality of pixels PU are preferably arranged regularly in a matrix or the like, for example.

Each of the light-emitting pixels for image capturing included in the plurality of pixels PU has a function of emitting light that can captured by the light-receiving device included in the pixels PU onto a display surface of the display apparatus DP with. For example, FIG. 19B illustrates a state where the light LGTI from the light-emitting pixel for image capturing included in the pixel PU is emitted onto the display surface of the display apparatus DP.

The lens LNS has, for example, a function of refracting light emitted from the display apparatus DP and making the light travel toward the eye ME of the user. For example, FIG. 19B illustrates a state where the light LGTI is refracted by the lens LNS and travels toward the eye ME of the user.

Note that display pixels included in the plurality of pixels PU have a function of emitting light based on an image signal input to the display apparatus DP onto the display surface of the display apparatus DP. The path of the light based on the image signal can be regarded as the same as the path of the light LGTI emitted by the light-emitting pixel for image capturing. In particular, the user can recognize converged light (an image) on the macula YH in the retina MM as a point or a region of a gaze point.

In FIG. 19B, the eye ME of the user includes a cornea KM, a ciliary body MYT (in this specification and the like, a ciliary zonule (a zonule of Zinn) is included in the ciliary body MYT), a crystalline lens SST, a vitreous body GT, a retina MM, a choroid MRM, a sclera KYM, and an optic nerve SK.

The macula YH is included in part of a region of the retina MM. Cells having a function of recognizing details and color of an object are concentrated in the macula YH. Furthermore, a fovea CSK is included in the macula YH. The user recognizes converged light (an image) on the macula YH included in the user's eye as a point or a region of a gaze point.

For example, FIG. 19B illustrates a state in which the light LGTI emitted from the light-emitting pixel for image capturing included in the pixel PU of the display apparatus DP is converged at the macula YH through the lens LNS and the crystalline lens SST.

The crystalline lens SST of the eye ME of the user functions as a lens for converging light to the above-described fovea CSK, for example. The ciliary body MYT has a function of changing the thickness of the crystalline lens SST. The adjustment of the degree of light converged at the fovea CSK can be performed by changing the thickness of the crystalline lens SST. In other words, the crystalline lens SST and the ciliary body MYT can perform adjustment of the focus of light incident on the eye ME of the user.

A distance between the display apparatus DP and the lens LNS (or a distance between the lens LNS and the eye ME of the user) can be freely determined, and the distance between the display apparatus DP and the lens LNS is preferably a distance in which light emitted from the display pixel circuit is converged on the retina MM of the eye ME of the user, for example.

As described above, at least one of changing the thickness of the crystalline lens SST and changing the distance between the display apparatus DP and the lens LNS is performed, whereby light emitted from the plurality of display pixels included in the display apparatus DP or the plurality of light-emitting pixels for image capturing can be converged on the retina MM.

When light is incident on an object in a direction perpendicular to the object, the light is reflected in a 180° direction with respect to the incident direction. In other words, the path of incident light in a direction perpendicular to the object is substantially aligned with the path of reflected light by the object.

Thus, the light LGTR that is reflected light from the macula YH reaches the pixel PU in a path substantially the same as that of the light LGTI, as illustrated in FIG. 19B. Specifically, the light LGTR is received by the image capturing pixel included in the pixel PU.

Thus, when an image capturing operation is performed using the image capturing pixels included in all the pixels PU in the display apparatus DP, the retina MM and the macula YH that is part of a region of the retina MM can be captured as an image. Since the user recognizes incident light (an image) on the macula YH as a point or a region of a gaze point, a region of a display image of the display apparatus DP where the user's gaze point is facing can be found from the position (coordinates) where the macula YH is captured in the image.

Specifically, an address of the image capturing pixel that has captured an image of the macula YH is obtained from the image, and a display pixel included in the same pixel as the image capturing pixel can be found. Light emitted by the display pixel included in the same pixel as the image capturing pixel that has captured the image of the macula YH reaches the macula YH. Accordingly, in a display image of the display apparatus DP, a display image displayed by the display pixel included in the same pixel as the image capturing pixel that has captured the image of the macula YH is a region where the user's gaze point is facing.

Although the control portion CTL included in the display apparatus DP performs gaze detection in this embodiment, for example, one embodiment of the present invention is not limited thereto. For example, instead of the control portion CTL of the display apparatus DP, an external server (control computer) may perform an image analysis for the display apparatus DP using the gaze detection. Specifically, the following process is possible: an external server, to which an image obtained by the display apparatus DP is temporarily transmitted, performs an image analysis and transmits the analysis result to the display apparatus DP so that the operation of the display apparatus is performed in accordance with the gaze detection result.

Similarly, an external server (control computer) may perform processing related to the electronic device MID (e.g., image processing). A system in which an external server (control computer) for the display apparatus DP (or the electronic device HIMD) performs processing and transmits the processing result to the display apparatus DP (or the electronic device MID) so that the operation of the display apparatus DP (or the electronic device I-IMD) is performed is referred to as a thin client system in some cases. The display apparatus DP (or the electronic device MID) in this system may be referred to as a thin client terminal.

Note that this embodiment can be combined with any of the other embodiments in this specification as appropriate.

Embodiment 2

In this embodiment, configuration examples of a display apparatus of one embodiment of the present invention will be described.

Structure Example 1 of Display Apparatus

Figure 20:
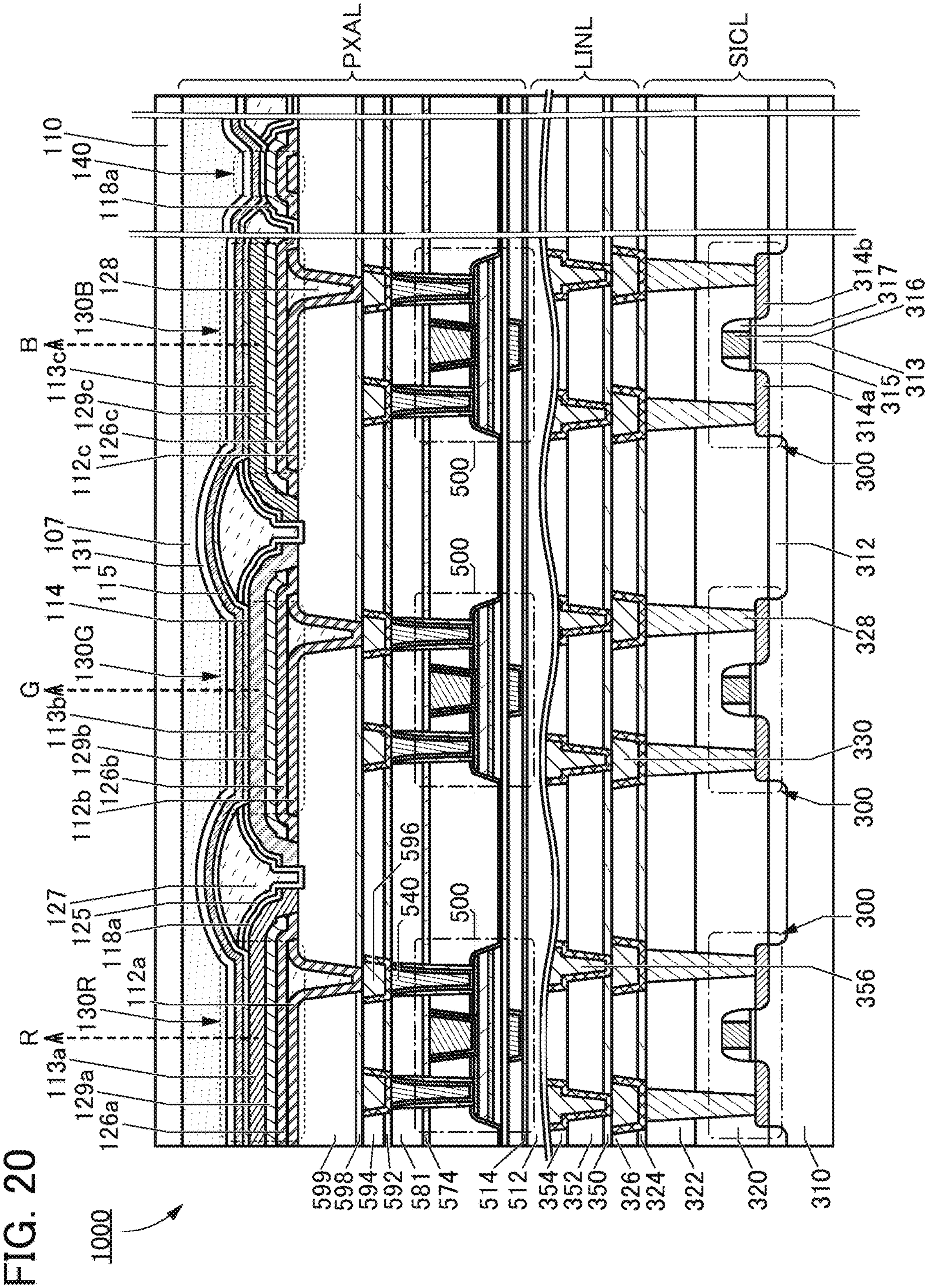
FIG. 20 is a schematic cross-sectional view illustrating a structure example of a display apparatus.

FIG. 20 is a cross-sectional view illustrating an example of a display apparatus of one embodiment of the present invention. A display apparatus 1000 illustrated in FIG. 20 has a structure in which a pixel circuit, a driver circuit, and the like are provided over a substrate 310, for example. Note that the display apparatus DP and the like in FIG. 1A described in the above embodiment can have a structure of the display apparatus 1000 in FIG. 20. The pixel circuit described in this embodiment can be the display pixel described in the above embodiment.

For example, the circuit layer SICL, the wiring layer LINL, and the pixel layer PXAL in the display apparatus DP illustrated in FIG. 2A can be those in the display apparatus 1000 in FIG. 20. The circuit layer SICL includes the substrate 310, for example, and a transistor 300 is formed over the substrate 310. The wiring layer LINL is provided above the transistor 300, and the wiring layer LINL includes a wiring that electrically connects the transistor 300, a transistor 500 to be described later, a light-emitting device 130R, a light-emitting device 130G, and a light-emitting device 130B to be described later, and the like. The pixel layer PXAL is provided above the wiring layer LINL, and the pixel layer PXAL includes, for example, the transistor 500 and a light-emitting device 130 (the light-emitting device 130R, the light-emitting device 130G, and the light-emitting device 130B in FIG. 16).

As the substrate 310, a semiconductor substrate (e.g., a single crystal substrate containing silicon or germanium as a material) can be used, for example. Besides the semiconductor substrate, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, or paper or a base material film containing a fibrous material can be given as the substrate 310. Examples of the glass substrate include barium borosilicate glass, aluminoborosilicate glass, and soda lime glass. Examples of the flexible substrate, the attachment film, the base material film, and the like include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus 1000 includes heat treatment, a highly heat-resistant material is preferably selected for the substrate 310.

The diagonal size of the display apparatus can be determined depending on the kind and the size of the substrate 310, for example. In the case where a display apparatus with a diagonal size less than or equal to 10 inches, less than or equal to 5 inches, less than or equal to 1.5 inches, or less than or equal to 1 inch is fabricated for an application such as a device for XR or a wearable information terminal, a semiconductor substrate may be used as the substrate 310, for example.

There is no particular limitation on the screen ratio (aspect ratio) of the display apparatus 1000. For example, the display apparatus 1000 is compatible with a variety of screen ratios such as 1:1 (a square), 4:3, 16:9, 16:10, 21:9, and 32:9.

In the description of this embodiment, the substrate 310 is a semiconductor substrate containing silicon as a material.

The transistor 300 is provided on the substrate 310 and includes an element isolation layer 312, a conductor 316, an insulator 315, an insulator 317, a semiconductor region 313 that is part of the substrate 310, and a low-resistance region 314*a* and a low-resistance region 314*b* that function as a source region and a drain region. Thus, the transistor 300 is a Si transistor. Although FIG. 20 illustrates a structure in which one of the source and the drain of the transistor 300 is electrically connected to a conductor 330 and a conductor 356, which are described later, through a conductor 328 described later, the electrical connection in the display apparatus of one embodiment of the present invention is not limited thereto. The display apparatus of one embodiment of the present invention may have a structure in which, for example, a gate of the transistor 300 is electrically connected to the conductor 330 and the conductor 356 through the conductor 328.

The transistor 300 can be a fin type when, for example, the top surface of the semiconductor region 313 and the side surface thereof in the channel width direction are covered with the conductor 316 with the insulator 315 functioning as a gate insulating film therebetween. The effective channel width can be increased in the fin-type transistor 300, so that the on-state characteristics of the transistor 300 can be improved. In addition, contribution of the electric field of the gate electrode can be increased, so that the off-state characteristics of the transistor 300 can be improved.

Note that the transistor 300 may be either a p-channel transistor or an n-channel transistor. Alternatively, a plurality of the transistors 300 may be provided and both the p-channel transistor and the n-channel transistor may be used.

A region of the semiconductor region 313 where a channel is formed, a region in the vicinity thereof, and the low-resistance region 314*a* and the low-resistance region 314*b* that function as the source region and the drain region preferably contain a semiconductor such as a silicon-based semiconductor, specifically, preferably contain single crystal silicon. Alternatively, each of the regions may be formed using germanium, silicon germanium, gallium arsenide, aluminum gallium arsenide, or gallium nitride, for example. A structure using silicon whose effective mass is controlled by applying stress to the crystal lattice and changing the lattice spacing may be employed. Alternatively, the transistor 300 may be a HEMT (High Electron Mobility Transistor) using gallium arsenide and aluminum gallium arsenide, for example.

For the conductor 316 functioning as a gate electrode, a semiconductor material such as silicon containing an element that imparts n-type conductivity, such as arsenic or phosphorus, or an element that imparts p-type conductivity, such as boron or aluminum, can be used. Alternatively, for the conductor 316, a conductive material such as a metal material, an alloy material, or a metal oxide material can be used, for example.

Note that since the work function of a conductor depends on the material of the conductor, the threshold voltage of the transistor can be adjusted by selecting the material of the conductor. Specifically, it is preferable to use one or both of titanium nitride and tantalum nitride as the material of the conductor. Moreover, in order to ensure both conductivity and embeddability, it is preferable to use stacked layers of metal materials of one or both of tungsten and aluminum for the conductor, and it is particularly preferable to use tungsten in terms of heat resistance.

The element isolation layer 312 is provided to separate a plurality of transistors formed on the substrate 310 from each other. The element isolation layer can be formed by, for example, a LOCOS (Local Oxidation of Silicon) method, an STI (Shallow Trench Isolation) method, or a mesa isolation method.

Note that the transistor 300 illustrated in FIG. 20 is an example and the structure is not limited thereto; an appropriate transistor is used in accordance with a circuit structure, a driving method, or the like. For example, the transistor 300 may have a planar structure instead of a fin-type structure.

Over the transistor 300 illustrated in FIG. 20, an insulator 320, an insulator 322, an insulator 324, and an insulator 326 are stacked in this order from the substrate 310 side.

For the insulator 320, the insulator 322, and the insulator 326, one or more selected from silicon oxide, silicon oxynitride, silicon nitride oxide, silicon nitride, aluminum oxide, aluminum oxynitride, aluminum nitride oxide, and aluminum nitride can be used, for example.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulator 322 may have a function of a planarization film for eliminating a level difference caused by the transistor 300 or the like covered with the insulator 320 and the insulator 322. For example, the top surface of the insulator 322 may be planarized by planarization treatment using a chemical mechanical polishing (CMP) method to improve planarity.

For the insulator 324, it is preferable to use an insulating film having a barrier property (referred to as a barrier insulating film) which prevents diffusion of impurities such as water and hydrogen from the substrate 310, the transistor 300, or the like to a region above the insulator 324 (e.g., the region where the transistor 500, the light-emitting device 130R, the light-emitting device 130G, the light-emitting device 130B, and the like are provided). Accordingly, for the insulator 324, it is preferable to use an insulating material that has a function of inhibiting diffusion of impurities such as a hydrogen atom, a hydrogen molecule, and a water molecule (through which the above impurities are less likely to pass). Furthermore, depending on the situation, for the insulator 324, it is preferable to use an insulating material that has a function of inhibiting diffusion of impurities such as a nitrogen atom, a nitrogen molecule, a nitrogen oxide molecule (e.g., $N_2O$, NO, and $NO_2$), and a copper atom (through which the above oxygen is less likely to pass). In addition, it is preferable that the insulator 324 have a function of inhibiting diffusion of oxygen (e.g., one or both of an oxygen atom and an oxygen molecule).

For the film having a barrier property against hydrogen, silicon nitride formed by a CVD (Chemical Vapor Deposition) method can be used, for example.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$ in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

In addition, the conductor 328, the conductor 330, and the like that are connected to the light-emitting devices and the like provided above the insulator 326 are embedded in the insulator 320, the insulator 322, the insulator 324, and the insulator 326. Note that the conductor 328, the conductor 330, and the like each have a function of a plug or a wiring. A plurality of conductors each having a function of a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (the conductor 328 or the conductor 330), a single layer or a stacked layer of one or more conductive materials selected from a metal material, an alloy material, a metal nitride material, and a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used for formation. The use of a low-resistance conductive material can reduce wiring resistance.

A wiring layer may be provided over the insulator 326 and the conductor 330. For example, in FIG. 20, an insulator 350, an insulator 352, and an insulator 354 are provided to be stacked in this order above the insulator 326 and the conductor 330. Furthermore, the conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that like the insulator 324, for example, the insulator 350 is preferably formed using an insulator having a barrier property against one or more selected from hydrogen, oxygen, and water. Like the insulator 326, the insulator 352 and the insulator 354 are preferably formed using an insulator having a relatively low dielectric constant to reduce parasitic capacitance generated between wirings. The insulator 352 and the insulator 354 each have functions of an interlayer insulating film and a planarization film. Furthermore, the conductor 356 preferably includes a conductor having a barrier property against one or more selected from hydrogen, oxygen, and water.

For the conductor having a barrier property against hydrogen, tantalum nitride is preferably used, for example. The use of a stack including tantalum nitride and tungsten that has high conductivity can inhibit diffusion of hydrogen from the transistor 300 while the conductivity of a wiring is kept. In that case, a tantalum nitride layer having a barrier property against hydrogen is preferably in contact with the insulator 350 having a barrier property against hydrogen.

An insulator 512 is provided above the insulator 354 and the conductor 356.

In FIG. 20, the transistor 500 is provided over an insulator 512. The insulator 512 is preferably formed using a substance having a barrier property against oxygen and hydrogen. Specifically, for example, the insulator 512 is formed using one or more selected from silicon oxide, silicon oxynitride, silicon nitride oxide, silicon nitride, aluminum oxide, aluminum oxynitride, aluminum nitride oxide, or aluminum nitride.

For the film having a barrier property against hydrogen, silicon nitride formed by a CVD method can be used, for example. Here, diffusion of hydrogen into a semiconductor element including an oxide semiconductor (e.g., the transistor 500) degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

A material similar to that for the insulator 320 can be used for the insulator 512, for example. When a material with a relatively low permittivity is used for these insulators, parasitic capacitance generated between wirings can be reduced. A silicon oxide film or a silicon oxynitride film can be used as the insulator 512, for example.

An insulator 514 is provided over the insulator 512, and the transistor 500 is provided over the insulator 514. An insulator 574 is formed over the transistor 500, and an insulator 581 is formed over the insulator 574.

The insulator 574 and the insulator 581 will be described in detail in Embodiment 3.

As the insulator 514, it is preferable to use a film (film having a barrier property) that inhibits impurities such as hydrogen from the substrate 310, a region where the circuit element below the insulator 512 is provided, or the like into a region where the transistor 500 is provided. Thus, silicon nitride formed by a CVD method can be used for the insulator 514, for example.

The transistor 500 illustrated in FIG. 20 is an OS transistor that includes a metal oxide in a channel formation region, as described above. Note that the OS transistor will be described in detail in Embodiment 3.

An insulator 592 and an insulator 594 are formed in this order over the insulator 581. Furthermore, a conductor 596 is embedded in the insulator 592 and the insulator 594. The conductor 596 has a function of a plug or a wiring that is connected to the transistor 300. Note that the conductor 596 can be provided using a material similar to that for the conductor 328 and the conductor 330.

Note that like the insulator 324, for example, the insulator 592 is preferably formed using an insulator having a barrier property against one or more selected from hydrogen, oxygen, or water. Like the insulator 326, the insulator 594 is preferably formed using an insulator having a relatively low dielectric constant to reduce parasitic capacitance generated between wirings. The insulator 594 has functions of an interlayer insulating film and a planarization film. Furthermore, the conductor 596 preferably includes a conductor having a barrier property against one or more selected from hydrogen, oxygen, or water.

An insulator 598 and an insulator 599 are formed over the insulator 594 and the conductor 597.

Like the insulator 324, for example, the insulator 598 is preferably formed using an insulator having a barrier property against one or more selected from hydrogen, oxygen, and water. Like the insulator 326, the insulator 599 is preferably formed using an insulator having a relatively low dielectric constant to reduce parasitic capacitance generated between wirings. The insulator 599 has functions of an interlayer insulating film and a planarization film.

The light-emitting device 130R, the light-emitting device 130G, the light-emitting device 130B, and a connection portion 140 are formed over the insulator 599.

The connection portion 140 is referred to as a cathode contact portion in some cases, and is electrically connected to cathode electrodes of the light-emitting device 130R, the light-emitting device 130G, and the light-emitting device 130B. The connection portion 140 in FIG. 20 includes one or more conductors selected from a conductor 112*a* to a conductor 112*c* to be described later, one or more conductors selected from a conductor 126*a* to a conductor 126*c* to be described later, one or more conductors selected from a conductor 129*a* to a conductor 129*c* to be described later, a common layer 114 to be described later, and a common electrode 115 to be described later.

Note that the connection portion 140 may be provided to surround four sides of the display portion or may be provided in the display portion (e.g., between adjacent light-emitting devices 130).

The light-emitting device 130R includes the conductor 112*a*, the conductor 126*a* over the conductor 112*a*, and the conductor 129*a* over the conductor 126*a*. All of the conductor 112*a*, the conductor 126*a*, and the conductor 129*a* can be referred to as a pixel electrode, or one or two of them can be referred to as a pixel electrode.

The light-emitting device 130G includes the conductor 112*b*, the conductor 126*b* over the conductor 112*b*, and the conductor 129*b* over the conductor 126*b*. As in the light-emitting device 130R, all of the conductor 112*b*, the conductor 126*b*, and the conductor 129*b* can be referred to as a pixel electrode, or one or two of them can be referred to as a pixel electrode.

The light-emitting device 130B includes the conductor 112*c*, the conductor 126*c* over the conductor 112*c*, and the conductor 129*c* over the conductor 126*c*. As in the light-emitting device 130R and the light-emitting device 130G, all of the conductor 112*c*, the conductor 126*c*, and the conductor 129*c* can be referred to as a pixel electrode, or one or two of them can be referred to as a pixel electrode.

For the conductor 112*a* to the conductor 112*c* and the conductor 126*a* to the conductor 126*c*, a conductive layer functioning as a reflective electrode can be used, for example. For the conductive layer functioning as a reflective electrode, a conductor with high visible-light reflectance such as silver, aluminum, or an alloy film of silver (Ag), palladium (Pd), and copper (Cu) (an Ag—Pd—Cu (APC) film) can be used. The conductor 112*a* to the conductor 112*c* and the conductor 126*a* to the conductor 126*c* can each be a stacked-layer film in which a pair of titanium films sandwich aluminum (a film in which Ti, Al, and Ti are stacked in this order), or a stacked-layer film in which a pair of indium tin oxide films sandwich silver (a film in which ITO, Ag, and ITO are stacked in this order).

For example, a conductive layer functioning as a reflective electrode may be used for the conductor 112*a* to the conductor 112*c*, and a conductor with a high light-transmitting property may be used for the conductor 126*a* to the conductor 126*c*. Examples of the conductor with a high light-transmitting property include an alloy of silver and magnesium and indium tin oxide (sometimes referred to as ITO).

A conductive layer functioning as a transparent electrode can be used for the conductor 129*a* to the conductor 129*c*. For the conductive layer functioning as a transparent electrode, for example, the above-described conductor with a high light-transmitting property can be used.

A microcavity structure may be provided in the light-emitting device 130 to be described in detail later. The microcavity structure refers to a structure in which the distance between the bottom surface of the light-emitting layer and the top surface of a lower electrode is set to a thickness depending on a wavelength of color of light emitted from the light-emitting layer. In that case, a light-transmitting and light-reflective conductive material is preferably used for the conductor 129*a* to the conductor 129*c* serving as an upper electrode (a common electrode), and a light-reflective conductive material is preferably used for the conductor 112*a* to the conductor 112*c* and the conductor 126*a* to the conductor 126*c* which serve as lower electrodes (pixel electrodes).

The microcavity structure refers to a structure in which the optical distance between the lower electrode and the light-emitting layer is adjusted to be $(2n-1)\lambda/4$ (n is a natural number greater than or equal to 1, and $\lambda$ is a wavelength of emitted light to be amplified). Thus, light that is reflected back by the lower electrode (reflected light) considerably interferes with light that directly enters the upper electrode from the light-emitting layer (incident light). Accordingly, the phases of the reflected light and the incident light each having the wavelength $\lambda$ can be aligned with each other, and the light emitted from the light-emitting layer can be further amplified. Meanwhile, in the case where the reflected light and the incident light each have a wavelength other than the wavelength λ, their phases are not aligned with each other, resulting in attenuation without resonation.

The conductor 112*a* is connected to the conductor 596 embedded in the insulator 594 through an opening formed in the insulator 599. The end portion of the conductor 112*a* is positioned on the outer side of the end portion of the conductor 126*a*. The end portion of the conductor 126*a* and the end portion of the conductor 129*a* are aligned or substantially aligned with each other.

Since the conductor 112*b*, the conductor 126*b*, and the conductor 129*b* of the light-emitting device 130G and the conductor 112*c*, the conductor 126*c*, and the conductor 129*c* of the light-emitting device 130B are similar to the conductor 112*a*, the conductor 126*a*, and the conductor 129*a* of the light-emitting device 130R, detailed description is omitted.

Depression portions are formed in the conductor 112*a*, the conductor 112*b*, and the conductor 112*c* to cover the openings provided in the insulator 519. A layer 128 is embedded in the depression portions.

The layer 128 has a function of filling the depression portions of the conductor 112*a*, the conductor 112*b*, and the conductor 112*c*. The conductor 126*a*, the conductor 126*b*, and the conductor 126*c* electrically connected to the conductor 112*a*, the conductor 112*b*, and the conductor 112*c*, respectively, are provided over the conductor 112*a*, the conductor 112*b*, and the conductor 112*c* and the layer 128. Thus, regions overlapping with the depression portions of the conductor 112*a*, the conductor 112*b*, and the conductor 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. For the layer 128, an acrylic resin, a polyimide resin, an epoxy resin, a polyamide resin, a polyimide-amide resin, a siloxane resin, a benzocyclobutene-based resin, a phenol resin, or a precursor of any of these resins can be used, for example. A photosensitive resin can also be used for the layer 128. As the photosensitive resin, a positive material or a negative material is given.

When a photosensitive resin is used, the layer 128 can be formed through only light-exposure and development steps, reducing the influence of dry etching or wet etching on the surfaces of the conductor 112*a*, the conductor 112*b*, and the conductor 112*c*. When the layer 128 is formed using a negative photosensitive resin, the layer 128 can sometimes be formed using the same photomask (light-exposure mask) as the photomask used for forming the opening in the insulator 519.

Figure 21A:
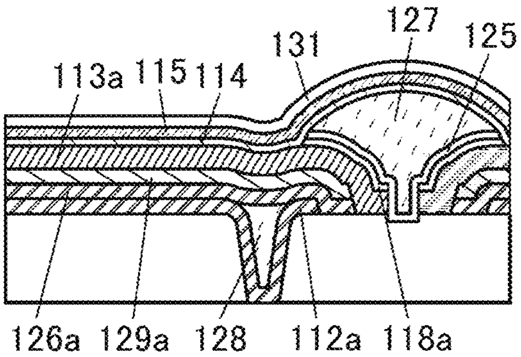
FIG. 21A to 21C are schematic cross-sectional views each illustrating a region in a part of a structure example of a display apparatus.
Figure 21B:
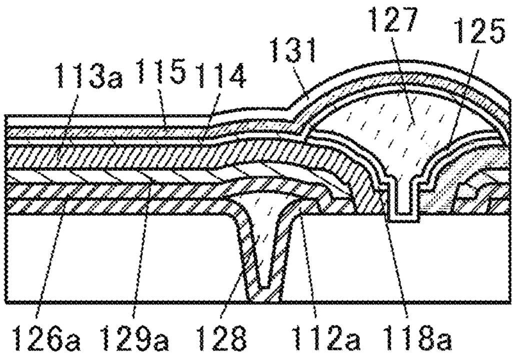
Figure 21C:
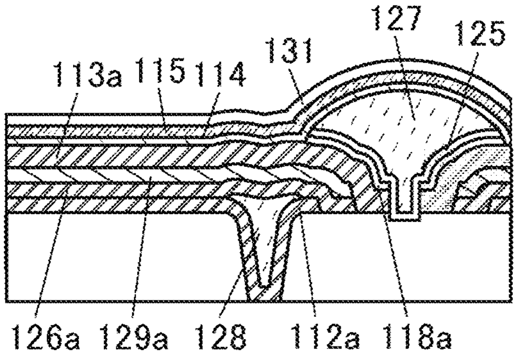

Although FIG. 20 illustrates an example where the top surface of the layer 128 includes a flat portion, the shape of the layer 128 is not particularly limited. FIG. 21A to FIG. 21C illustrate modification examples of the layer 128.

As illustrated in FIG. 21A and FIG. 21C, in the cross-sectional view, the top surface of the layer 128 can have a shape such that its center and the vicinity thereof are recessed, i.e., a shape including a concave surface.

As illustrated in FIG. 21B, in the cross-sectional view, the top surface of the layer 128 can have a shape in which its center and vicinity thereof rise, i.e., a shape including a convex surface.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductor 112*a* may be the same or substantially the same, or may be different from each other. For example, the level of the top surface of the layer 128 may be either lower or higher than the level of the top surface of the conductor 112*a*.

FIG. 21A can be said as an example where the layer 128 fits in the depression portion formed in the conductor 112*a*. By contrast, as illustrated in FIG. 21C, the layer 128 may exist also outside the depression portion formed in the conductor 112*a*, that is, the top surface of the layer 128 may extend beyond the depression portion.

The light-emitting device 130R includes a first layer 113*a*, the common layer 114 over the first layer 113*a*, and the common electrode 115 over the common layer 114. The light-emitting device 130G includes a second layer 113*b*, the common layer 114 over the second layer 113*b*, and the common electrode 115 over the common layer 114. The light-emitting device 130B includes a third layer 113*c*, the common layer 114 over the third layer 113*c*, and the common electrode 115 over the common layer 114.

The first layer 113*a* is formed to cover the top surface and side surface of the conductor 126*a* and the top surface and side surface of the conductor 129*a*. Similarly, the second layer 113*b* is formed to cover the top surface and side surface of the conductor 126*b* and the top surface and side surface of the conductor 129*b*. Similarly, the third layer 113*c* is formed to cover the top surface and side surface of the conductor 126*c* and the top surface and side surface of the conductor 129*c*. Accordingly, regions provided with the conductor 126*a*, the conductor 126*b*, and the conductor 126*c* can be entirely used as the light-emitting regions of the light-emitting device 130R, the light-emitting device 130G, and the light-emitting device 130B, respectively, increasing the aperture ratio of the pixels.

In the light-emitting device 130R, the first layer 113*a* and the common layer 114 can be collectively referred to as an EL layer. Similarly, in the light-emitting device 130G, the second layer 113*b* and the common layer 114 can be collectively referred to as an EL layer. Similarly, in the light-emitting device 130B, the third layer 113*c* and the common layer 114 can be collectively referred to as an EL layer.

There is no particular limitation on the structure of the light-emitting device in this embodiment, and the light-emitting device can have a single structure or a tandem structure.

The first layer 113*a*, the second layer 113*b*, and the third layer 113*c* each have an island shape after being processed by a photolithography method. At each of end portions of the first layer 113*a*, the second layer 113*b*, and the third layer 113*c*, an angle between the top surface and side surface is approximately 90°. By contrast, for example, an organic film formed using an FMM (Fine Metal Mask) tends to have a thickness that gradually decreases with decreasing distance to an end portion, and has the top surface forming a slope in an area extending greater than or equal to 1 μm and less than or equal to 10 μm from the end portion, for example; thus, such an organic film has a shape whose top surface and side surface cannot be easily distinguished from each other.

The top surface and side surface of each of the first layer 113*a*, the second layer 113*b*, and the third layer 113*c* are clearly distinguished from each other. Accordingly, as for the first layer 113*a* and the second layer 113*b* which are adjacent to each other, one of the side surfaces of the first layer 113*a* and one of the side surfaces of the second layer 113*b* face to each other. This applies to a combination of any of the first layer 113*a*, the second layer 113*b*, and the third layer 113*c*.

The first layer 113*a*, the second layer 113*b*, and the third layer 113*c* each include at least a light-emitting layer. For example, a structure is preferable in which the first layer 113*a* includes a light-emitting layer that emits red light, the second layer 113*b* includes a light-emitting layer that emits green light, and the third layer 113*c* includes a light-emitting layer that emits blue light. Other than the above colors, cyan, magenta, yellow, or white can be employed for the light-emitting layers.

The first layer 113*a*, the second layer 113*b*, and the third layer 113*c* may each include one or more of a hole-injection layer, a hole-transport layer, a hole-blocking layer, a charge-generation layer, an electron-blocking layer, an electron-transport layer, and an electron-injection layer.

The first layer 113*a*, the second layer 113*b*, and the third layer 113*c* may each include a hole-injection layer, a hole-transport layer, a light-emitting layer, and an electron-transport layer, for example. In addition, an electron-blocking layer may be provided between the hole-transport layer and the light-emitting layer. Furthermore, an electron-injection layer may be provided over the electron-transport layer.

The first layer 113*a*, the second layer 113*b*, and the third layer 113*c* may each include an electron-injection layer, an electron-transport layer, a light-emitting layer, and a hole-transport layer in this order, for example. In particular, in each of the first layer 113*a*, the second layer 113*b*, and the third layer 113*c*, the electron-injection layer, the electron-transport layer, the light-emitting layer, and the hole-transport layer are preferably stacked in this order. In addition, a hole-blocking layer may be provided between the electron-transport layer and the light-emitting layer. Furthermore, a hole-injection layer may be provided over the hole-transport layer.

The first layer 113*a*, the second layer 113*b*, and the third layer 113*c* each preferably include a light-emitting layer and a carrier-transport layer (an electron-transport layer or a hole-transport layer) over the light-emitting layer. Since surfaces of the first layer 113*a*, the second layer 113*b*, and the third layer 113*c* may be exposed in the manufacturing process of the display apparatus, providing the carrier-transport layer over the light-emitting layers inhibits the light-emitting layers from being exposed on the outermost surface, so that damage to the light-emitting layers can be reduced. Accordingly, the reliability of the light-emitting devices and a light-receiving device can be improved.

Alternatively, the first layer 113*a*, the second layer 113*b*, and the third layer 113*c* may each include a first light-emitting unit, a charge-generation layer, and a second light-emitting unit, for example. It is preferable that the first layer 113*a* include two or more light-emitting units that emit red light, the second layer 113*b* include two or more light-emitting units that emit green light, and the third layer 113*c* include two or more light-emitting units that emit blue light, for example.

The second light-emitting unit preferably includes a light-emitting layer and a carrier-transport layer (an electron-transport layer or a hole-transport layer) over the light-emitting layer. Since the surface of the second light-emitting unit is exposed in the manufacturing process of the display apparatus, providing the carrier-transport layer over the light-emitting layer inhibits the light-emitting layer from being exposed on the outermost surface, so that damage to the light-emitting layer can be reduced. Accordingly, the reliability of the light-emitting device can be improved.

The common layer 114 includes, for example, an electron-injection layer or a hole-injection layer. Alternatively, the common layer 114 may include a stack of an electron-transport layer and an electron-injection layer, or may include a stack of a hole-transport layer and a hole-injection layer. The common layer 114 is shared by the light-emitting device 130R, the light-emitting device 130G, and the light-emitting device 130B.

The common electrode 115 is shared by the light-emitting device 130R, the light-emitting device 130G, and the light-emitting device 130B. As illustrated in FIG. 20, the common electrode 115 shared by the plurality of light-emitting devices is electrically connected to a conductor included in the connection portion 140.

The side surfaces of the first layer 113*a*, the second layer 113*b*, and the third layer 113*c* are covered with the insulator 125 and the insulator 127. The mask layer 118*a* is positioned between the first layer 113*a* and the insulator 125. The mask layer 118*a* is positioned between the second layer 113*b* and the insulator 125, and the mask layer 118*a* is positioned between the third layer 113*c* and the insulator 125. The common layer 114 is provided over the first layer 113*a*, the second layer 113*b*, the third layer 113*c*, the insulator 125, and the insulator 127, and the common electrode 115 is provided over the common layer 114. The common layer 114 and the common electrode 115 are each a continuous film shared by a plurality of light-emitting devices.

The insulator 125 can be an insulating layer containing an inorganic material. As the insulator 125, one or more inorganic insulating films selected from an oxide insulating film, a nitride insulating film, an oxynitride insulating film, and a nitride oxide insulating film can be used, for example. The insulator 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer when the later-described insulator 127 is formed. When an inorganic insulating film such as an aluminum oxide film, a hafnium oxide film, or a silicon oxide film is formed by an ALD (Atomic Layer Deposition) method as the insulator 125, the insulator 125 can have few pinholes and an excellent function of protecting the EL layer. The insulator 125 may have a stacked-layer structure of a film formed by an ALD method and a film formed by a sputtering method. The insulator 125 may have a stacked-layer structure of an aluminum oxide film formed by an ALD method and a silicon nitride film formed by a sputtering method, for example.

The insulator 125 preferably has a function of a barrier insulating layer against one or both of one of water and oxygen. Alternatively, the insulator 125 preferably has a function of inhibiting diffusion of one or both of water and oxygen. Alternatively, the insulator 125 preferably has a function of capturing or fixing (also referred to as gettering) one or both of water and oxygen.

When the insulator 125 has a function of a barrier insulating layer or a gettering function, entry of impurities (typically, one or both of water and oxygen) that would diffuse into the light-emitting devices from the outside can be inhibited. With this structure, a highly reliable light-emitting device and a highly reliable display panel can be provided.

The insulator 125 preferably has a low impurity concentration. Accordingly, degradation of the EL layer, which is caused by entry of impurities into the EL layer from the insulator 125, can be inhibited. In addition, when the impurity concentration is reduced in the insulator 125, a barrier property against one or both of water and oxygen can be increased. For example, it is desirable that one or both of the hydrogen concentration and the carbon concentration in the insulator 125 be sufficiently low.

As the insulator 127, an insulating layer containing an organic material can be favorably used. As the organic material, a photosensitive organic resin is preferably used; for example, a photosensitive resin composition containing an acrylic resin may be used. The viscosity of the material of the insulator 127 is greater than or equal to 1 cP and less than or equal to 1500 cP, and is preferably greater than or equal to 1 cP and less than or equal to 12 cP. By setting the viscosity of the material of the insulator 127 in the above-described range, the insulator 127 having a tapered shape, which is to be described later, can be formed relatively easily. Note that in this specification and the like, an acrylic resin refers to not only a polymethacrylic acid ester or a methacrylic resin, but also all the acrylic polymer in a broad sense in some cases.

Note that the organic material that can be used for the insulator 127 is not limited to the above as long as the insulator 127 has a tapered side surface as described later. For the insulator 127, an acrylic resin, a polyimide resin, an epoxy resin, an imide resin, a polyamide resin, a polyimide-amide resin, a silicone resin, a siloxane resin, a benzocyclobutene-based resin, a phenol resin, or precursors of these resins can be used in some cases, for example. Alternatively, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be employed for the insulator 127 in some cases. For the insulator 127, for example, a photoresist can be used as the photosensitive resin in some cases. Note that as the photosensitive resin, a positive material or a negative material can be used.

For the insulator 127, a material absorbing visible light may be used. When the insulator 127 absorbs light from the light-emitting device, leakage of light (stray light) from the light-emitting device to the adjacent light-emitting device through the insulator 127 can be inhibited. Thus, the display quality of the display panel can be improved. Since the display quality of the display panel can be improved without using a polarizing plate, the weight and thickness of the display panel can be reduced.

Examples of the material absorbing visible light include materials containing pigment of black or the like, materials containing dye, light-absorbing resin materials (e.g., polyimide), and resin materials that can be used for color filters (color filter materials). Using a resin material obtained by stacking or mixing color filter materials of two colors or three or more colors is particularly preferred, in which case the effect of blocking visible light can be enhanced. In particular, mixing color filter materials of three or more colors enables the formation of a black or nearly black resin layer.

For example, the insulator 127 can be formed by a wet film formation method such as spin coating, dipping, spray coating, ink-jetting, dispensing, screen printing, offset printing, doctor blade coating, slit coating, roll coating, curtain coating, or knife coating. Specifically, an organic insulating film that is to be the insulator 127 is preferably formed by spin coating.

The insulator 127 is formed at a temperature lower than the heat resistance temperature of the EL layer. The typical substrate temperature in formation of the insulator 127 is lower than or equal to 200° C., preferably lower than or equal to 180° C., further preferably lower than or equal to 160° C., still further preferably lower than or equal to 150° C., yet still further preferably lower than or equal to 140° C.

The description is made below on the structure of the insulator 127 or the like using the structure of the insulator 127 between the light-emitting device 130R and the light-emitting device 130G as an example. Note that the same applies to the insulator 127 between the light-emitting device 130G and the light-emitting device 130B, the insulator 127 between the light-emitting device 130B and the light-emitting device 130R, and the like. The description made below sometimes using an end portion of the insulator 127 over the second layer 113*b* as an example applies to an end portion of the insulator 127 over the first layer 113*a* and an end portion of the insulator 127 over the third layer 113*c*.

In a cross-sectional view of the display apparatus, the side surface of the insulator 127 preferably has a tapered shape with the taper angle θ1. The taper angle θ1 is an angle formed by the side surface of the insulator 127 and the substrate surface. Note that the taper angle θ1 is not limited to the angle with the substrate surface, and may be an angle formed by the side surface of the insulator 127 and the top surface of the flat portion of the insulator 125, the top surface of the flat portion of the second layer 113*b*, the top surface of a flat portion of the pixel electrode 111*b*, or the like. When the side surface of the insulator 127 has a tapered shape, the side surface of the insulator 125 and the side surface of the mask layer 118*a* also have a tapered shape in some cases.

The taper angle θ1 of the insulator 127 is less than 90°, preferably less than or equal to 60°, and further preferably less than or equal to 45°. Such a forward tapered shape of the end portion of the side surface of the insulator 127 can prevent disconnection, local thinning, or the like from occurring in the common layer 114 and the common electrode 115 which are provided over the end portion of the side surface of the insulator 127, leading to film formation with good coverage. The common layer 114 and the common electrode 115 can have improved in-plane uniformity in this manner, whereby the display apparatus can have improved display quality.

The top surface of the insulator 127 preferably has a convex shape in a cross-sectional view of the display apparatus. The top surface of the insulator 127 preferably has a convex shape that bulges gradually toward the center. The insulator 127 preferably has a shape such that the projecting portion at the center portion of the top surface is connected smoothly to the tapered portion of the end portion of the side surface. When the insulator 127 has such a shape, the common layer 114 and the common electrode 115 can be formed with good coverage over the whole the insulator 127.

The insulator 127 is formed in a region between two EL layers (e.g., a region between the first layer 113*a* and the second layer 113*b*). At this time, part or the whole of the insulator 127 is located at a position between an end portion of the side surface of one of the EL layers (e.g., the first layer 113*a*) and an end portion of the side surface of the other of the EL layers (e.g., the second layer 113*b*).

One end portion of the insulator 127 preferably overlaps with the pixel electrode 111*a*, and the other end portion of the insulator 127 preferably overlaps with the pixel electrode 111*b*. With such a structure, the end portion of the insulator 127 can be formed over a substantially flat region of the first layer 113*a* (the second layer 113*b*). This makes it relatively easy to process the tapered shape of the insulator 127 as described above.

By providing the insulator 127 and the like in the above manner, a disconnected portion and a locally thinned portion can be prevented from being formed in the common layer 114 and the common electrode 115 from a substantially flat region in the first layer 113*a* to a substantially flat region in the second layer 113*b*. Thus, between the light-emitting devices, a connection defect caused by the disconnected portion and an increase in electric resistance caused by the locally thinned portion can be inhibited from occurring in the common layer 114 and the common electrode 115.

In the display apparatus of this embodiment, the distance between the light-emitting devices can be short. Specifically, the distance between the light-emitting devices, the distance between the EL layers, or the distance between the pixel electrodes can be less than 10 μm, less than or equal to 8 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus of this embodiment includes a region where a distance between two adjacent island-shaped EL layers is less than or equal to 1 μm, preferably less than or equal to 0.5 μm (500 nm), further preferably less than or equal to 100 nm. The distance between light-emitting devices is shortened in this manner, whereby a display apparatus with high resolution and a high aperture ratio can be provided.

A protective layer 131 is provided over the light-emitting device 130R, the light-emitting device 130G, and the light-emitting device 130B. The protective layer 131 is a film serving as a passivation film for protecting the light-emitting devices 130. Provision of the protective layer 131 covering the light-emitting device can inhibit an impurity such as water and oxygen from entering the light-emitting device, and increase the reliability of the light-emitting device 130.

For the protective layer 131, aluminum oxide, silicon nitride, or silicon nitride oxide can be used, for example.

The protective layer 131 and the substrate 110 are bonded to each other with an adhesive layer 107. A solid sealing structure, a hollow sealing structure, or the like can be employed to seal the light-emitting devices. In FIG. 20, a solid sealing structure is employed in which a space between the substrate 310 and the substrate 110 is filled with the adhesive layer 107. Alternatively, a hollow sealing structure in which the space is filled with an inert gas (e.g., nitrogen or argon) may be employed. Here, the adhesive layer 107 may be provided not to overlap with the light-emitting devices. The space may be filled with a resin other than the frame-shaped adhesive layer 107.

For the adhesive layer 107, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-liquid-mixture-type resin may be used. An adhesive sheet may be used.

The display apparatus 1000 has a top-emission structure. Light from the light-emitting device is emitted toward the substrate 110 side. Thus, for the substrate 110, a material having a high visible-light-transmitting property is preferably used. For example, a substrate having a high visible-light-transmitting property may be selected as the substrate 110 among substrates usable as the substrate 310 and the substrate BS. The pixel electrode contains a material that reflects visible light, and a counter electrode (the common electrode 115) contains a material that transmits visible light.

When the above structure example is applied to a display apparatus, the display apparatus having high resolution and high definition can be achieved. Specifically, for example, a display apparatus with a resolution of HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320) can be achieved in some cases. Furthermore, specifically, for example, a display apparatus with a definition of greater than or equal to 100 ppi, greater than or equal to 300 ppi, greater than or equal to 500 ppi, greater than or equal to 1000 ppi, greater than or equal to 2000 ppi, greater than or equal to 3000 ppi, or greater than or equal to 5000 ppi can be achieved in some cases.

Note that the display apparatus of one embodiment of the present invention is not limited to the structure of the display apparatus 1000 illustrated in FIG. 20. The display apparatus of one embodiment of the present invention may have the structure of the display apparatus 1000 in FIG. 20 on which some modification is performed as appropriate. A modification example of the display apparatus in FIG. 20, which is the display apparatus of one embodiment of the present invention, is described below.

Structure Example 2 of Display Apparatus

Figure 22:
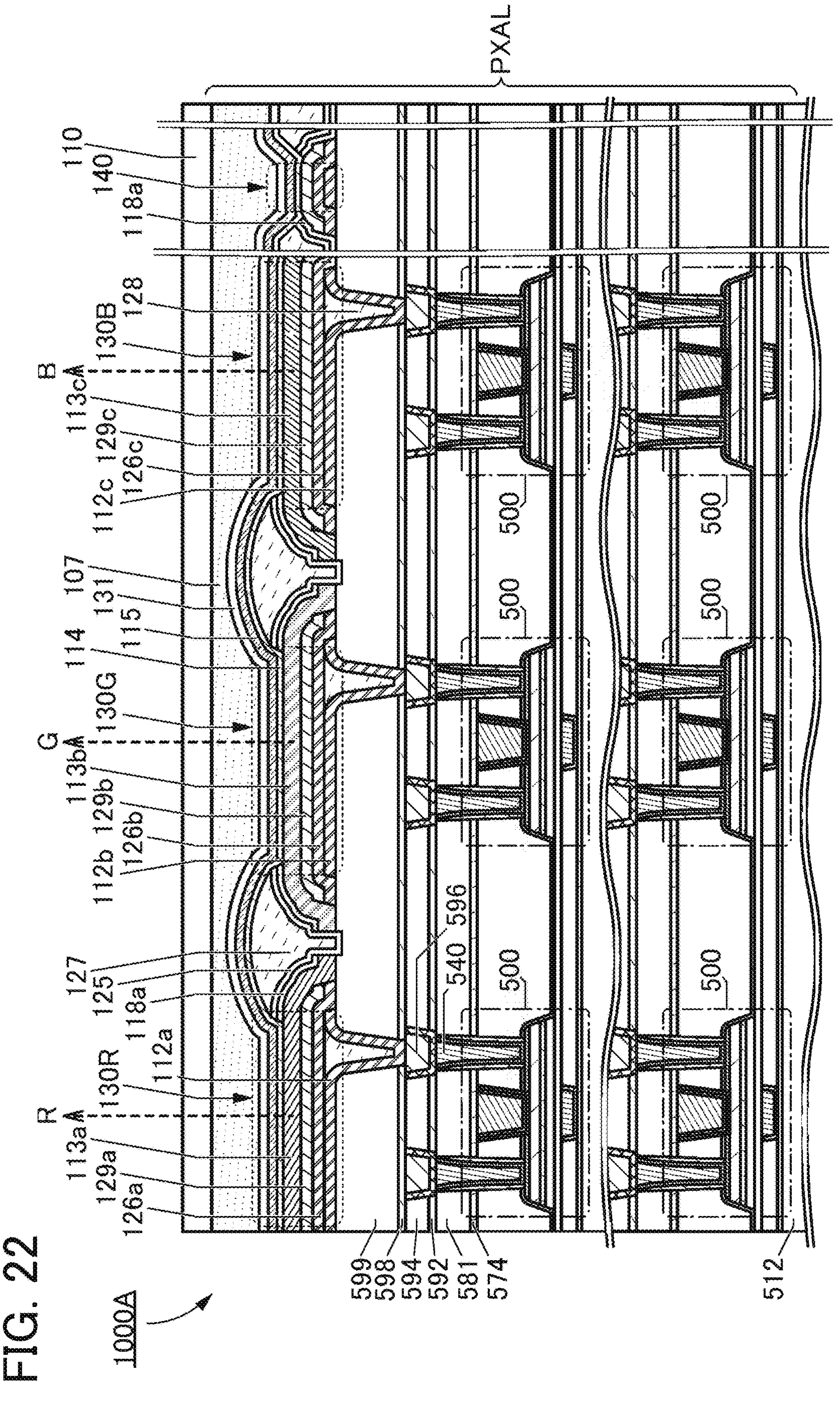
FIG. 22 is a schematic cross-sectional view illustrating a structure example of a display apparatus.

For example, the pixel layer PXAL in the display apparatus 1000 illustrated in FIG. 20 may have a structure in which transistors 500 are stacked in two or more layers. A display apparatus 1000A illustrated in FIG. 22 shows a structure example where the transistors 500 included in the pixel layer PXAL of the display apparatus 1000 in FIG. 20 are stacked in two layers. Note that FIG. 22 illustrates only the pixel layer PXAL in the display apparatus 1000A, and for the circuit layer SICL and the wiring layer LINE, the structure of the display apparatus 1000 in FIG. 22 can be referred to.

In the case where the number of transistors included in a pixel is increased in the display apparatus 1000, the structure of the display apparatus 1000A in FIG. 22 can be employed.

Structure Example 3 of Display Apparatus

Figure 23:
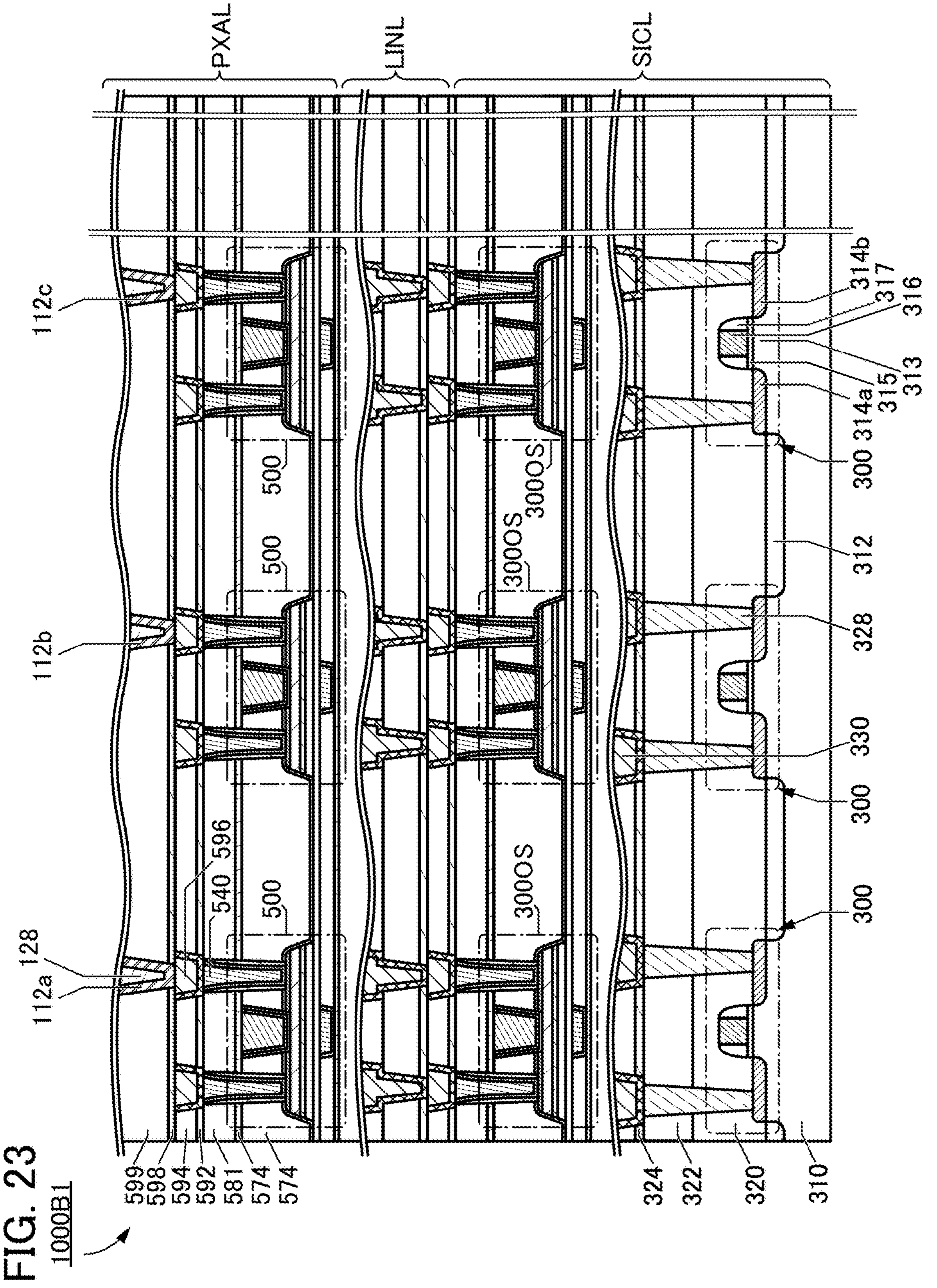
FIG. 23 is a schematic cross-sectional view illustrating a structure example of a display apparatus.

For example, in the circuit layer SICL in the display apparatus 1000 illustrated in FIG. 20, OS transistors may be stacked over the transistors 300. A display apparatus 1000B1 illustrated in FIG. 23 shows a structure example where transistors 3000S, which are OS transistors, are stacked over the transistors 300 in the circuit layer SICL of the display apparatus 1000 in FIG. 20. Note that the display apparatus 1000B1 illustrated in FIG. 23 illustrates the circuit layer SICL, the wiring layer LINL, and only the layer of the pixel layer PXAL including the transistors 500; thus, for the layer of the pixel layer PXAL including light-emitting devices, the structure of the display apparatus 1000 in FIG. 20 can be referred to.

Since a p-type semiconductor is difficult to form with use of a metal oxide in terms of mobility and reliability, a circuit formed with OS transistors becomes a single-polarity circuit with n-channel transistors in many cases. In view of this, in the structure of the display apparatus 1000B1 in FIG. 23, an n-channel transistor is used as the transistor 3000S and a p-channel transistor is used as the transistor 300, whereby a circuit included in the circuit layer SICL in FIG. 23 can be a CMOS circuit. In particular, a circuit in which an n-channel transistor is used as the OS transistor and a p-channel transistor is used as the Si transistor is referred to as LTPO in some cases.

For example, the circuit layer SICL in the display apparatus 1000 in FIG. 20 may include OS transistors instead of the transistors 300. A display apparatus 1000B2 illustrated in FIG. 24 shows a structure example where the transistors 3000S, which are OS transistors, are formed in the circuit layer SICL in the display apparatus 1000 in FIG. 20, instead of the transistors 300.

Figure 24:
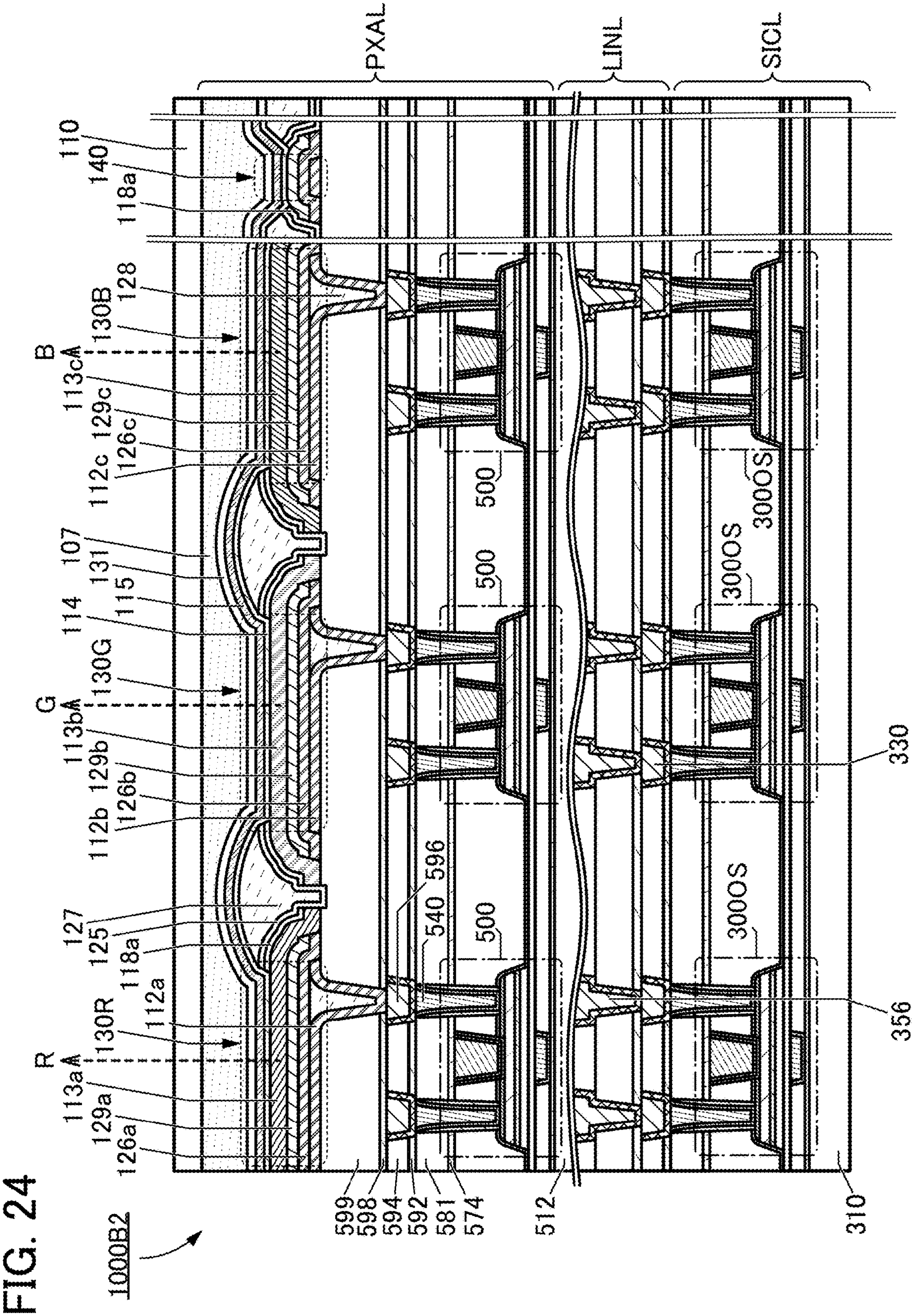
FIG. 24 is a schematic cross-sectional view illustrating a structure example of a display apparatus.

Note that in the display apparatus 1000B2 illustrated in FIG. 24, a substrate other than the semiconductor substrate can also be used as the substrate 310. For example, any of the following can be used as the substrate 310: a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, and paper and a base film each including a fibrous material. Note that in the case where the manufacturing process of the display apparatus includes heat treatment, a highly heat-resistant material is preferably selected for the substrate 310.

The circuit layer SICL in the display apparatus 1000 illustrated in FIG. 20 may have a structure in which a plurality of substrates are attached to each other, for example. The circuit layer SICL in a display apparatus 1000B4 illustrated in FIG. 25 includes the substrate 310 and a substrate 310A and has a structure in which the upper surface of the substrate 310 and the bottom surface of the substrate 310A are attached to each other. Note that FIG. 25 illustrates the circuit layer SICL and only the layer of the pixel layer PXAL including the transistors 500; thus, for the wiring layer LINL and the layer of the pixel layer PXAL including light-emitting devices, the structure of the display apparatus 1000 in FIG. 20 can be referred to.

Figure 25:
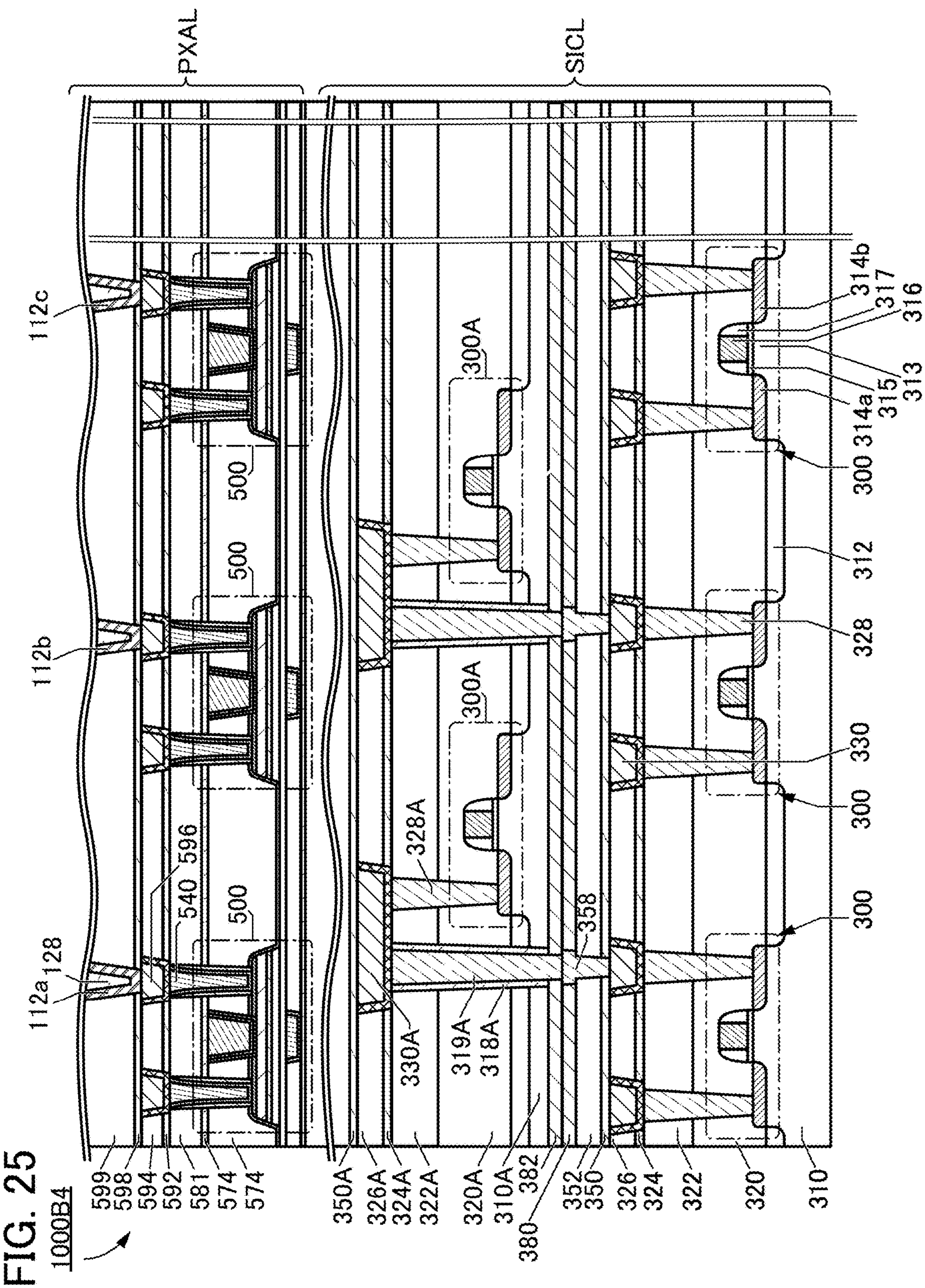
FIG. 25 is a schematic cross-sectional view illustrating a structure example of a display apparatus.

For the components from the substrate 310 to the insulator 326 and the conductor 330 in the display apparatus 1000B4 in FIG. 25, the description of the display apparatus 1000 in FIG. 20 is referred to.

As in the display apparatus 1000 in FIG. 20, the insulator 350 and the insulator 352 are formed in this order over the insulator 326 and the conductor 330.

An opening portion is formed in regions of the insulator 350 and the insulator 352 which overlap with part of the conductor 330, and the conductor 358 is embedded to fill the opening portion. The conductor 358 is also formed over the insulator 352. After that, the conductor 358 is patterned into a form of a wiring, a terminal, or a pad through an etching step or the like.

For the conductor 358, for example, copper, aluminum, tin, zinc, tungsten, silver, platinum, gold, or the like can be used. The conductor 358 preferably contains the same component as the material used for a later-described conductor 319A.

Then, the insulator 380 is formed to cover the insulator 372 and the conductor 376 and is subsequently subjected to planarization treatment by a chemical mechanical polishing (CMP) method or the like until the conductor 376 is exposed. In this manner, the conductor 376 serving as a wiring, a terminal, or a pad can be formed over the substrate 310.

For the insulator 380, a film that inhibits diffusion of impurities such as water and hydrogen (a film having a barrier property) is preferably used. In other words, for the insulator 380, any of the materials usable for the insulator 324 is preferably used. Like the insulator 326, the insulator 380 may be formed using an insulator having a relatively low dielectric constant to reduce the parasitic capacitance generated between wirings, for example. In other words, for the insulator 380, any of the materials usable for the insulator 326 may be used. The insulator 380 preferably contains the same component as the material used for an insulator 382 to be described later.

Next, the substrate 310A is described. As the substrate 310A, a semiconductor substrate usable as the substrate 310 can be used, for example.

Transistors, insulators, and conductors are formed over the substrate 310A as over the substrate 310. Specifically, transistors 300A are formed over the substrate 310A, an insulator 320A is formed to cover the transistors 300A, and an insulator 322A, an insulator 324A, an insulator 326A, and an insulator 350A are formed in this order over the insulator 320A. Note that for the insulator 320A, a material usable for the insulator 320 can be used. Similarly, for the insulator 322A, a material usable for the insulator 322 can be used; for the insulator 324A, a material usable for the insulator 324 can be used; for the insulator 326A, a material usable for the insulator 326 can be used; and for the insulator 350A, a material usable for the insulator 350 can be used.

Like the conductor 328, a conductor 328A serving as a plug or a wiring is embedded in the insulator 320A and the insulator 322A. Like the conductor 330, a conductor 330A serving as a plug or a wiring is embedded in the insulator 324A and the insulator 326A. Note that for the conductor 328A, a material usable for the conductor 328 can be used, and for the conductor 330A, a material usable for the conductor 330 can be used.

For the components above the insulator 350A in the display apparatus 1000B4, the description of the display apparatus 1000 can be referred to.

The insulator 382 is formed on a surface of the substrate 310A opposite to a surface where the transistor 300A is formed. For the insulator 382, a material usable for the insulator 380 can be used, as described above.

In addition to the opening portion in which the conductor 328A is formed, an opening portion is formed in the insulator 320A and the insulator 322A in a region overlapping with the conductor 358. The opening portion formed in the region overlapping with the conductor 358 has the side surface provided with an insulator 318A, and the conductor 319A is formed in a remaining space of the opening portion. In particular, the conductor 319A is sometimes referred to as a TSV (Through Silicon Via).

For the conductor 319A, a material usable for the conductor 358 can be used, as described above. The insulator 318A has a function of insulating the conductor 319A from the substrate 310A, for example. Note that for the insulator 318A, for example, any of the materials usable for the insulator 320 or the insulator 324 is preferably used.

The insulator 380 and the conductor 358 serve as bonding layers for the substrate 310 side, and the insulator 382 and the conductor 319A serve as bonding layers for the substrate 310A side. That is, the insulator 380 and the conductor 358 that are formed over the substrate 310 can be bonded to the insulator 382 and the conductor 319A that are formed on the substrate 310A in a bonding step, for example.

Before the bonding step, for example, planarization treatment is performed to make surfaces of the insulator 380 and the conductor 358 level with each other on the substrate 310 side. In a similar manner, planarization treatment is performed to make the insulator 382 and the conductor 319A level with each other on the substrate 310 side.

In the bonding step, for bonding of the insulator 380 and the insulator 382, i.e., bonding of insulating layers, hydrophilic bonding or the like can be employed in which, after high planarity is obtained by polishing (e.g., a chemical mechanical polishing (CMP) method), the surfaces are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be obtained.

When bonding of the conductor 358 and the conductor 319A, i.e., bonding of the conductors, is performed, a surface activated bonding method can be employed in which an oxide film, a layer adsorbing impurities, and the like on the surface are removed by sputtering treatment or the like and the cleaned and activated surfaces are brought into contact to be bonded to each other. Alternatively, a diffusion bonding method in which the surfaces are bonded to each other by using temperature and pressure together can be employed. Both methods cause bonding at an atomic level; thus, not only electrically but also mechanically excellent bonding can be obtained.

Through the above-described bonding step, the conductor 358 on the substrate 310 side can be electrically connected to the conductor 319A on the substrate 310A side. In addition, mechanically strong connection can be established between the insulator 380 on the substrate 310 side and the insulator 382 on the substrate 310A side.

In the case where the substrate 310 and the substrate 310A are bonded to each other, the insulating layers and the metal layers coexist on their bonding surfaces; thus, the surface activated bonding method and the hydrophilic bonding method are performed in combination, for example. For example, it is possible to employ a method in which the surfaces are made clean after polishing, the surfaces of the metal layers are subjected to antioxidant treatment and hydrophilicity treatment, and then bonding is performed. Alternatively, hydrophilicity treatment may be performed with the metal layers having surfaces of a hardly oxidizable metal such as gold.

Note that the substrate 310 and the substrate 310A may be bonded by a bonding method different from the above-described methods. For example, as a method for bonding the substrate 310 and the substrate 310A, a flip-chip bonding method may be employed. In the case of employing a flip-chip bonding method, a connection terminal such as a bump may be provided above the conductor 358 on the substrate 310 side or provided below the conductor 319A on the substrate 310A side. Flip-chip bonding can be performed by, for example, injecting a resin containing anisotropic conductive particles between the insulator 380 and the insulator 382 and between the conductor 358 and the conductor 319A, or by using a Sn—Ag solder. Alternatively, an ultrasonic wave bonding method can be employed in the case where the bump and a conductor connected to the bump are gold. To reduce thermal stress or physical stress such as an impact, the above-described flip-chip bonding method may be combined with injection of an underfill agent between the insulator 380 and the insulator 382 and between the conductor 358 and the conductor 319A. Furthermore, a die bonding film may be used in bonding of the substrate 310 and the substrate 310A, for example.

Structure Example 4 of Display Apparatus

Figure 26:
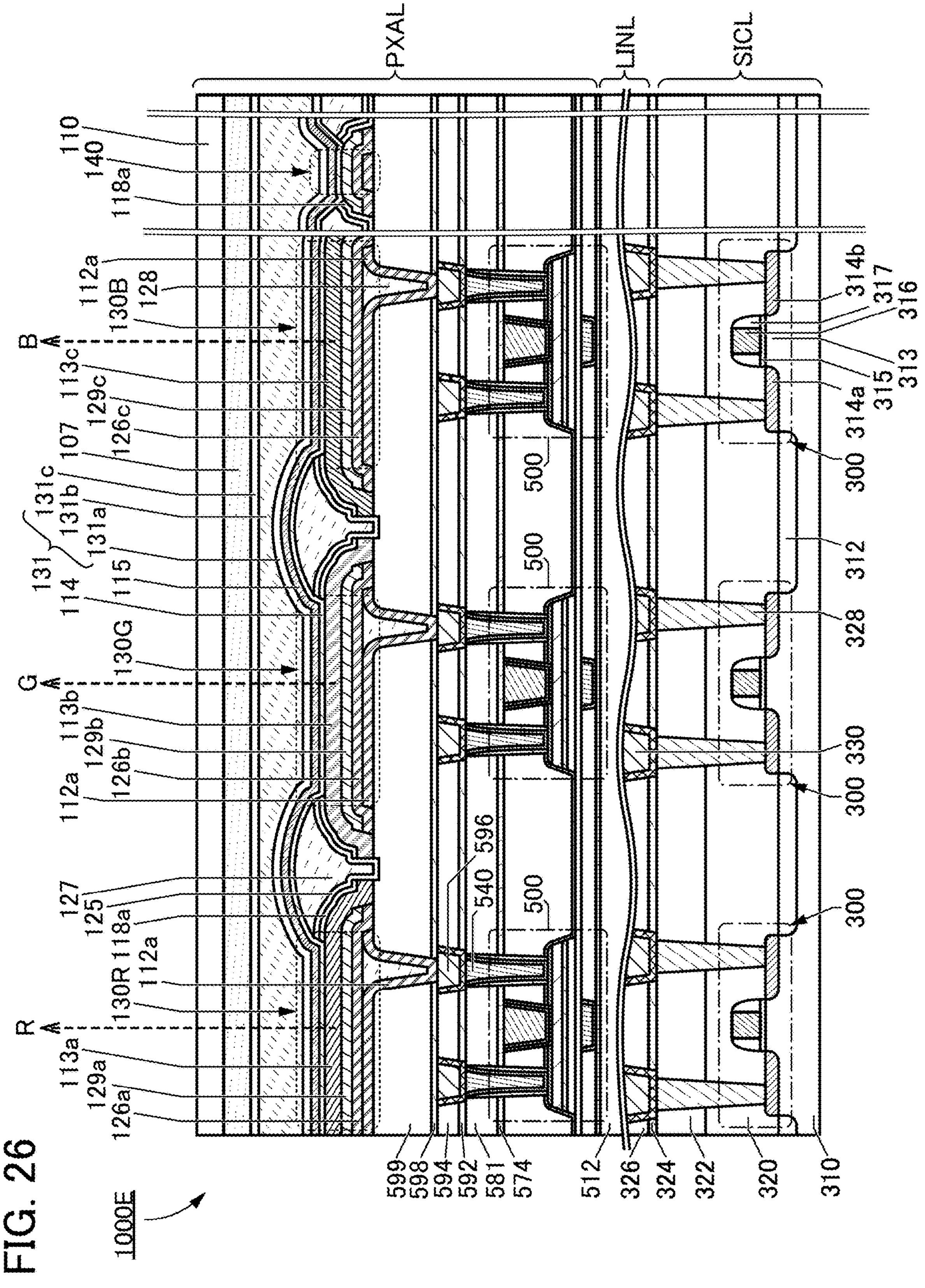
FIG. 26 is a schematic cross-sectional view illustrating a structure example of a display apparatus.

The protective layer 131 in the display apparatus 1000 in FIG. 20 may have a stacked-layer structure of two or more layers, not a single-layer structure, for example. The protective layer 131 may have a three-layer structure that includes an insulator made of an inorganic material as the first layer, an insulator made of an organic material as the second layer, and an insulator made of an inorganic material as the third layer. FIG. 26 illustrates a cross-sectional view illustrating part of a display apparatus 1000E in which the protective layer 131 has a multilayer structure including a protective layer 131*a*, a protective layer 131*b*, and a protective layer 131*c*; an insulator made of an inorganic material is used for the protective layer 131*a*, an insulator made of an organic material is used for the protective layer 131*b*, and an insulator made of an inorganic material is used for the protective layer 131*c*. Note that when an insulator made of an organic material is used for the protective layer 131*b* as illustrated in FIG. 26 the protective layer 131*b* can be provided as a planarization film.

Structure Example 5 of Display Apparatus

Figure 27:
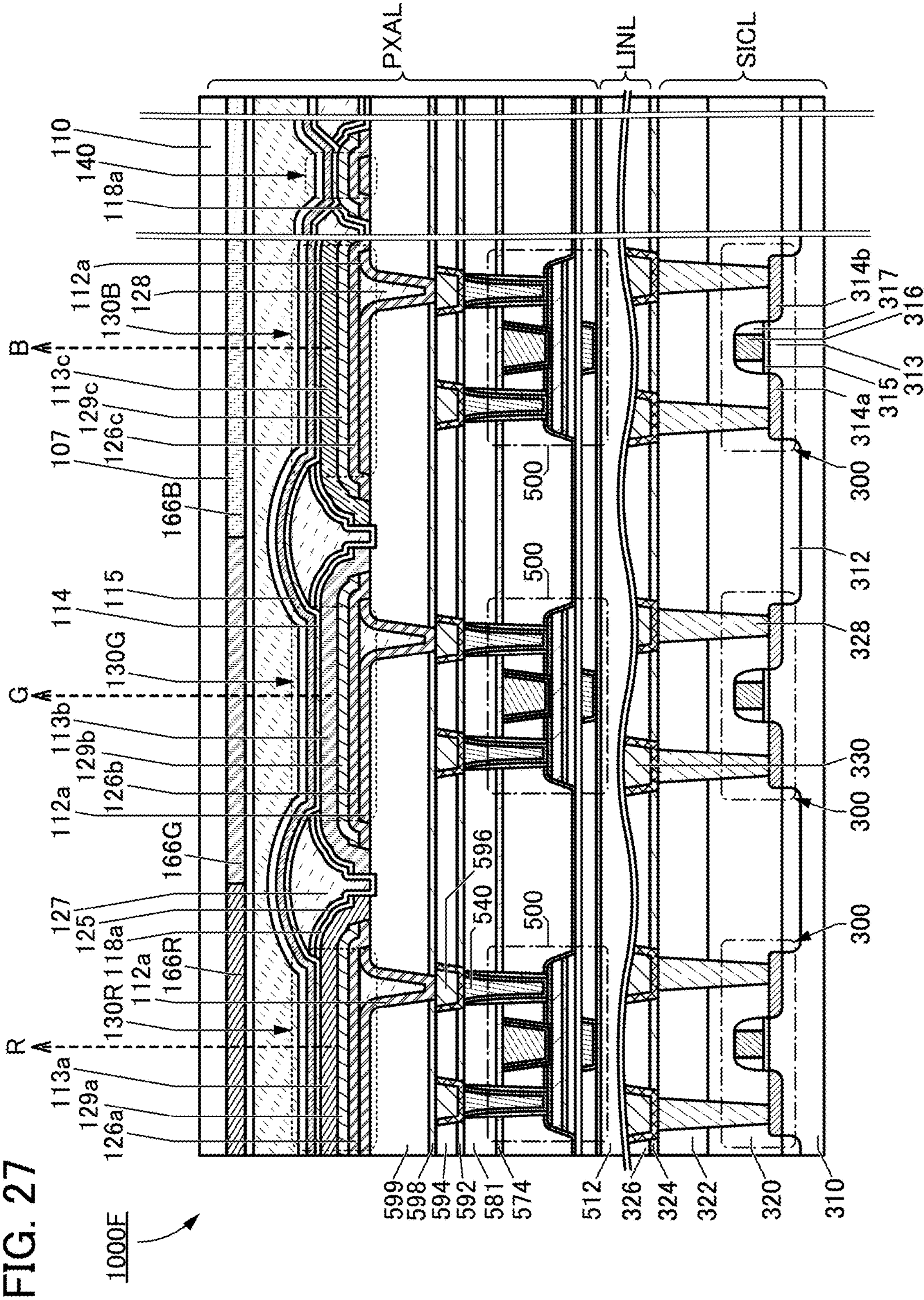
FIG. 27 is a schematic cross-sectional view illustrating a structure example of a display apparatus.

The display apparatus 1000 in FIG. 20 may include, for example, a coloring layer (a color filter) or the like. A display apparatus 1000F illustrated in FIG. 27 includes a coloring layer 166*a*, a coloring layer 166*b*, and a coloring layer 166*c* between the adhesive layer 107 and the substrate 110, for example. Note that the coloring layer 166*a* to the coloring layer 166*c* can be formed on the substrate 110, for example. In the case where the light-emitting device 130R includes a light-emitting layer that emits red (R) light, the light-emitting device 130G includes a light-emitting layer that emits green (G) light, and the light-emitting device 130B includes a light-emitting layer that emits blue (B) light, the coloring layer 166*a* is a red coloring layer, the coloring layer 166*b* is a green coloring layer, and the coloring layer 166*c* is a blue coloring layer.

Structure Example 6 of Display Apparatus

The display apparatus 1000 in FIG. 20 may include, for example, an image capturing pixel. For example, a display apparatus 1000G illustrated in FIG. 28 includes the light-receiving device 150 included in the image capturing pixel which detects light L.

A pn-type or pin-type photodiode can be used as the light-receiving device 150, for example. The light-receiving device 150 functions as a photoelectric conversion device that detects light entering the light-receiving device 150 and generates charge. The amount of generated charge in the photoelectric conversion element is determined depending on the amount of incident light.

It is particularly preferable to use an organic photodiode including a layer containing an organic compound, as the light-receiving device 150. An organic photodiode, which is easily made thin, lightweight, and large in area and has a high degree of freedom for shape and design, can be used in a variety of devices.

The light-receiving device 150 includes a conductor 112*d*, a conductor 126*d* over the conductor 112*d*, and a conductor 129*d* over the conductor 126*d*. All of the conductor 112*d*, the conductor 126*d*, and the conductor 129*d* can be referred to as pixel electrodes, or one or two of them can be referred to as pixel electrodes.

Furthermore, the light-receiving device 150 includes the conductor 112*d* over the insulator 599, a layer 113*d* over the conductor 112*d*, the common layer 114 over the layer 113*d*, and the common electrode 115 over the common layer 114.

The layer 113*d* includes a photoelectric conversion layer that has sensitivity in the visible light or infrared light wavelength range. A wavelength range to which the photoelectric conversion layer included in the layer 113*d* is sensitive may include one or more of the wavelength range of light emitted from the first layer 113*a*, the wavelength range of light emitted from the second layer 113*b*, and the wavelength range of light emitted from the third layer 113*c*.

Figure 28:
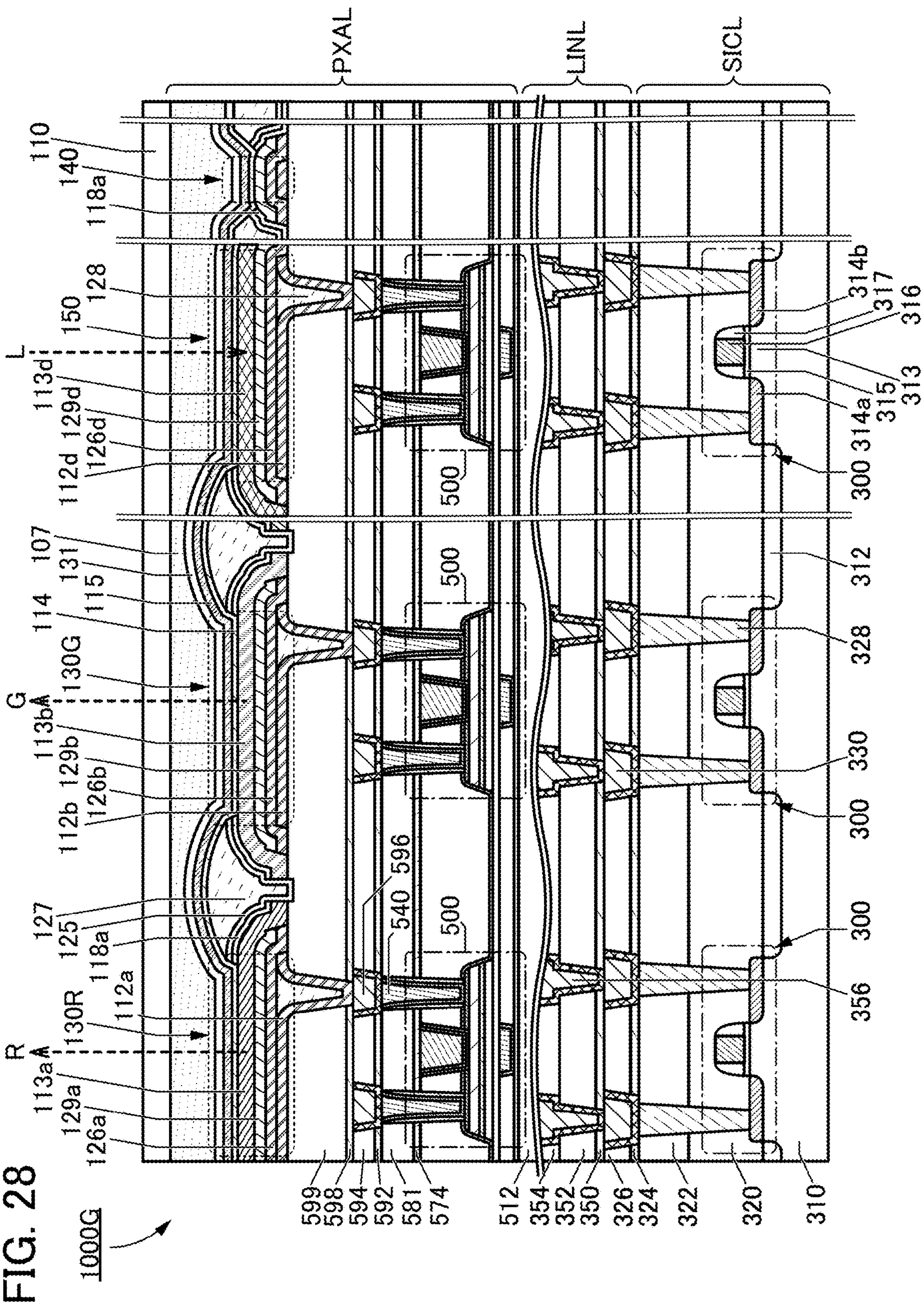
FIG. 28 is a schematic cross-sectional view illustrating a structure example of a display apparatus.

As in the display apparatus 1000G illustrated in FIG. 28, the display apparatus DP in FIG. 1B can be formed with the light-receiving device 150 provided in the pixel layer PXAL.

<Structure Example of Light-Emitting Device>

Next, a configuration example of a light-emitting device that can be used for the above-described display apparatus is described.

Figure 29A:
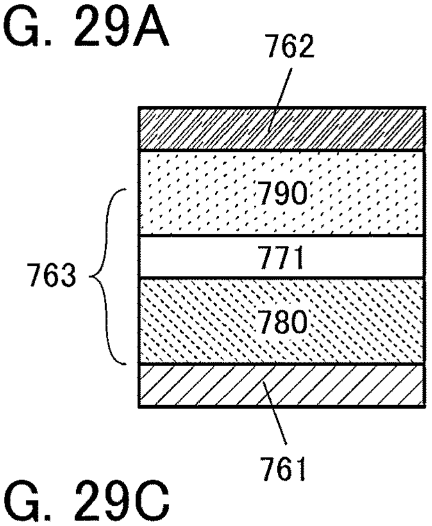
FIG. 29A to FIG. 29F are diagrams illustrating structure examples of a light-emitting device.

As illustrated in FIG. 29A, the light-emitting device includes an EL layer 763 between a pair of electrodes (a lower electrode 761 and an upper electrode 762). The EL layer 763 can be a layer including a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance with a high hole-injection property (a hole-injection layer), a layer containing a substance with a high hole-transport property (a hole-transport layer), and a layer containing a substance with a high electron-blocking property (an electron-blocking layer). Furthermore, the layer 790 includes one or more of a layer containing a substance with a high electron-injection property (an electron-injection layer), a layer containing a substance with a high electron-transport property (an electron-transport layer), and a layer containing a substance with a high hole-blocking property (a hole-blocking layer). In the case where the lower electrode 761 is a cathode and the upper electrode 762 is an anode, the above structures of the layer 780 and the layer 790 are replaced with each other.

The structure including the layer 780, the light-emitting layer 771, and the layer 790, which is provided between a pair of electrodes, can function as a single light-emitting unit, and the structure in FIG. 29A is referred to as a single structure in this specification.

Figure 29B:
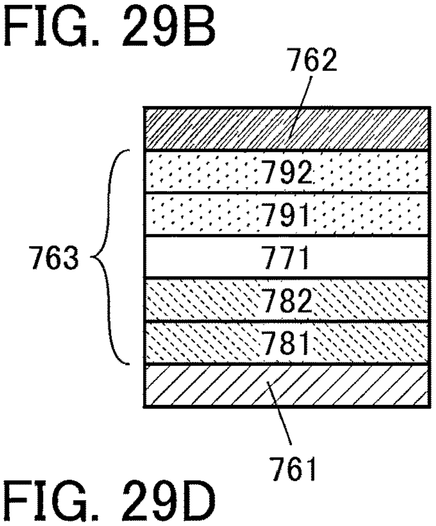

FIG. 29B is a modification example of the EL layer 763 included in the light-emitting device illustrated in FIG. 29A. Specifically, the light-emitting device illustrated in FIG. 29B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layer structure, carriers can be efficiently injected to the light-emitting layer 771, and the efficiency of the recombination of carriers in the light-emitting layer 771 can be increased.

Figure 29C:
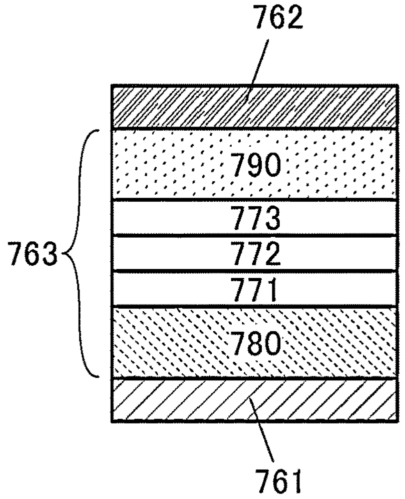
Figure 29D:
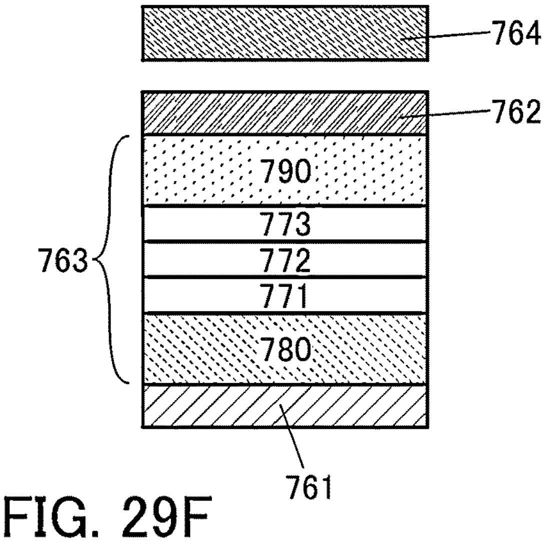

Note that structures in which a plurality of light-emitting layers (the light-emitting layer 771, a light-emitting layer 772, and a light-emitting layer 773) are provided between the layer 780 and the layer 790 as illustrated in FIG. 29C and FIG. 29D are variations of the single structure. Although FIG. 29C and FIG. 29D illustrate the examples where three light-emitting layers are included, the light-emitting device having a single structure may include two or four or more light-emitting layers. In addition, the light-emitting device having a single structure may include a buffer layer between two light-emitting layers.

Figure 29E:
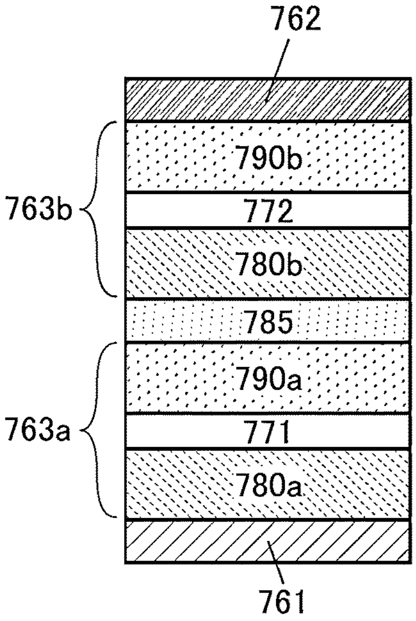
Figure 29F:
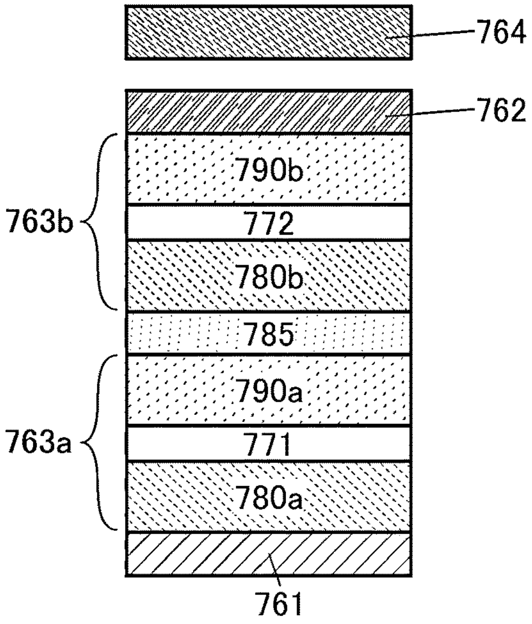

A structure in which a plurality of light-emitting units (a light-emitting unit 763*a* and a light-emitting unit 763*b*) are connected in series with a charge-generation layer 785 (also referred to as an intermediate layer) therebetween as illustrated in FIG. 29E and FIG. 29F is referred to as a tandem structure in this specification. Note that the tandem structure may be referred to as a stack structure. The tandem structure enables a light-emitting device capable of high-luminance light emission. Furthermore, the tandem structure reduces the amount of current needed for obtaining the same luminance as compared with a single structure, and thus can improve the reliability.

Note that FIG. 29D and FIG. 29F illustrate examples where the display apparatus includes a layer 764 overlapping with the light-emitting device. FIG. 29D illustrates an example where the layer 764 overlaps with the light-emitting device illustrated in FIG. 29C, and FIG. 29F illustrates an example where the layer 764 overlaps with the light-emitting device illustrated in FIG. 29E.

One or both of a color conversion layer and a color filter (coloring layer) can be used as the layer 764.

In FIG. 29C and FIG. 29D, light-emitting substances that emit light of the same color, or moreover, the same light-emitting substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. In a subpixel that emits blue light, blue light emitted from the light-emitting device can be extracted. In a subpixel that emits red light and a subpixel that emits green light, by providing a color conversion layer as the layer 764 illustrated in FIG. 29D, blue light emitted from the light-emitting device can be converted into light with a longer wavelength, and red light or green light can be extracted.

Light-emitting substances that emit light of different colors may be used for the light-emitting layer 771, the light-emitting layer 772, and the light-emitting layer 773. White light can be obtained when the light-emitting layer 771, the light-emitting layer 772, and the light-emitting layer 773 emit light of complementary colors. The light-emitting device having a single structure preferably includes a light-emitting layer containing a light-emitting substance that emits blue light and a light-emitting layer containing a light-emitting substance that emits visible light with a longer wavelength than blue light, for example.

In the case where the light-emitting device having a single structure includes three light-emitting layers, for example, a light-emitting layer containing a light-emitting substance that emits red (R) light, a light-emitting layer containing a light-emitting substance that emits green (G) light, and a light-emitting layer containing a light-emitting substance that emits blue (B) light are preferably included. The stacking order of the light-emitting layers can be, for example, a red (R) light-emitting layer, a green (G) light-emitting layer, and a blue (B) light-emitting layer from the anode side, or a red (R) light-emitting layer, a green (B) light-emitting layer, and a blue (G) light-emitting layer from the anode side. In that case, a buffer layer may be provided between red (R) and green (G) or between red (R) and blue (B).

For example, in the case where the light-emitting device having a single structure includes two light-emitting layers, the light-emitting device preferably includes a light-emitting layer containing a light-emitting substance that emits blue (B) light and a light-emitting layer containing a light-emitting substance that emits yellow (Y) light. Such a structure may be referred to as a BY single structure.

A color filter may be provided as the layer 764 illustrated in FIG. 29D. When white light passes through the color filter, light of a desired color can be obtained.

The light-emitting device that emits white light preferably contains two or more kinds of light-emitting substances. To obtain white light emission, two or more light-emitting substances may be selected such that their emission colors are complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

In FIG. 29E and FIG. 29F, light-emitting substances that emit light of the same color, or moreover, the same light-emitting substance may be used for the light-emitting layer 771 and the light-emitting layer 772.

For example, in light-emitting devices included in subpixels emitting light of different colors, a light-emitting substance that emits blue light may be used for each of the light-emitting layer 771 and the light-emitting layer 772. In a subpixel that emits blue light, blue light emitted from the light-emitting device can be extracted. In the subpixel that emits red light and the subpixel that emits green light, by providing a color conversion layer as the layer 764 illustrated in FIG. 29F, blue light emitted from the light-emitting device can be converted into light with a longer wavelength, and red light or green light can be extracted.

In the case where the light-emitting device having the structure illustrated in FIG. 29E or FIG. 29F is used for the subpixels emitting different colors, the subpixels may use different light-emitting substances. Specifically, in the light-emitting device included in the subpixel emitting red light, a light-emitting substance that emits red light may be used for each of the light-emitting layer 771 and the light-emitting layer 772. Similarly, in the light-emitting device included in the subpixel emitting green light, a light-emitting substance that emits green light may be used for each of the light-emitting layer 771 and the light-emitting layer 772. In the light-emitting device included in the subpixel emitting blue light, a light-emitting substance that emits blue light may be used for each of the light-emitting layer 771 and the light-emitting layer 772. A display apparatus having such a structure can be regarded as employing a light-emitting device with the tandem structure and the SBS structure. Thus, advantages of both the tandem structure and the SBS structure can be achieved. Accordingly, a light-emitting device being capable of high-luminance light emission and having high reliability can be obtained.

In FIG. 29E and FIG. 29F, light-emitting substances that emit light of different colors may be used for the light-emitting layer 771 and the light-emitting layer 772. White light emission can be obtained when the light-emitting layer 771 and the light-emitting layer 772 emit light of complementary colors. A color filter may be provided as the layer 764 illustrated in FIG. 29F. When white light passes through the color filter, light of a desired color can be obtained.

Although FIG. 29E and FIG. 29F illustrate examples where the light-emitting unit 763*a* includes one light-emitting layer 771 and the light-emitting unit 763*b* includes one light-emitting layer 772, one embodiment of the present invention is not limited thereto. Each of the light-emitting unit 763*a* and the light-emitting unit 763*b* may include two or more light-emitting layers.

In addition, although FIG. 29E and FIG. 29F each illustrate the light-emitting device including two light-emitting units as an example, one embodiment of the present invention is not limited thereto. The light-emitting device may include three or more light-emitting units.

Figure 30A:
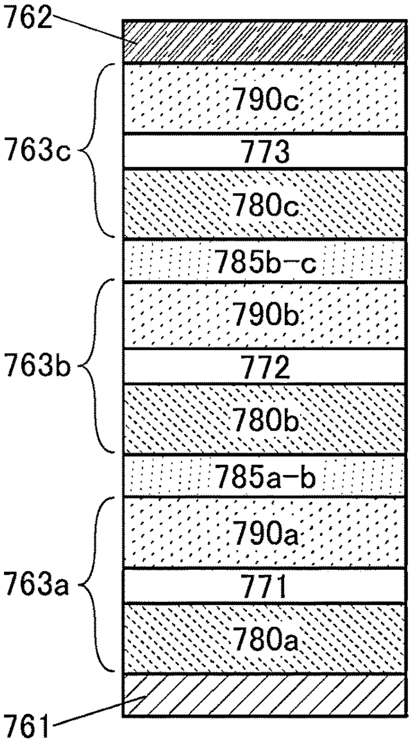
FIG. 30A to FIG. 30C are diagrams illustrating structure examples of a light-emitting device.
Figure 30B:
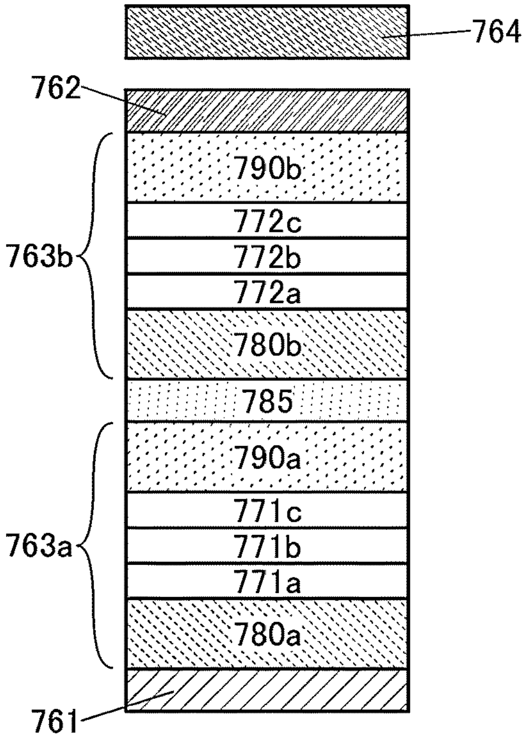
Figure 30C:
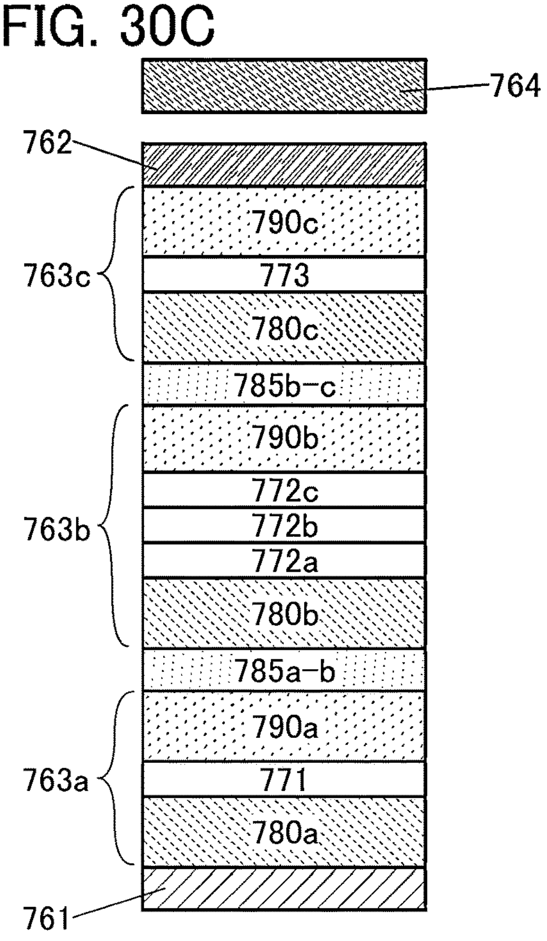

Specifically, structures of the light-emitting device illustrated in FIG. 30A to FIG. 30C can be given.

FIG. 30A illustrates a structure including three light-emitting units. Note that a structure including two light-emitting units and a structure including three light-emitting units may be referred to as a two-unit tandem structure and a three-unit tandem structure, respectively.

As illustrated in FIG. 30A, a plurality of light-emitting units (the light-emitting unit 763*a*, the light-emitting unit 763*b*, and a light-emitting unit 763*c*) are connected in series through charge-generation layers 785 (a charge-generation layer 785*a-b* and a charge-generation layer 785*b-c*). Specifically, in the light-emitting device illustrated in FIG. 30A, the light-emitting unit 763*a*, the charge-generation layer 785*a-b*, the light-emitting unit 763*b*, the charge-generation layer 785*b-c*, and the light-emitting unit 763*c* are stacked in this order. The light-emitting unit 763*a* includes a layer 780*a*, the light-emitting layer 771, and a layer 790*a*. The light-emitting unit 763*b* includes a layer 780*b*, the light-emitting layer 772, and a layer 790*b*. The light-emitting unit 763*c* includes a layer 780*c*, the light-emitting layer 773, and a layer 790*c*.

For the charge-generation layer 785*a-b* and the charge-generation layer 785*b-c*, the above description of the charge-generation layer 785 can be referred to.

In the structure illustrated in FIG. 30A, the light-emitting layer 771, the light-emitting layer 772, and the light-emitting layer 773 preferably contain light-emitting substances that emit light of the same color. Specifically, the light-emitting layer 771, the light-emitting layer 772, and the light-emitting layer 773 can each contain a light-emitting substance that emits red (R) light (what is called an R\R\R three-unit tandem structure); the light-emitting layer 771, the light-emitting layer 772, and the light-emitting layer 773 can each contain a light-emitting substance that emits green (G) light (what is called a G\G\G three-unit tandem structure); or the light-emitting layer 771, the light-emitting layer 772, and the light-emitting layer 773 can each contain a light-emitting substance that emits blue (B) light (what is called a B\B\B three-unit tandem structure).

Note that the structure containing the light-emitting substances that emit light of the same color is not limited to the above structure. For example, a light-emitting device having a tandem structure may be employed in which light-emitting units each including a plurality of light-emitting substances are stacked as illustrated in FIG. 30B. FIG. 30B illustrates a structure in which a plurality of light-emitting units (the light-emitting unit 763*a* and the light-emitting unit 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In the structure illustrated in FIG. 30B, light-emitting substances for the light-emitting layer 771*a*, the light-emitting layer 771*b*, and the light-emitting layer 771*c* are selected so as to emit light of complementary colors for white (W) light emission. Light-emitting substances for the light-emitting layer 772*a*, the light-emitting layer 772*b*, and the light-emitting layer 772*c* are selected so as to emit light of complementary colors for white (W) light emission.
That is, the structure illustrated in FIG. 30C is a two-unit tandem structure of W\W. Note that there is no particular limitation on the stacking order of the light-emitting substances emitting light of complementary colors for the light-emitting layer 771*a*, the light-emitting layer 771*b*, and the light-emitting layer 771*c*. The practitioner can select the optimal stacking order as appropriate. Although not illustrated, a three-unit tandem structure of W\W\W or a tandem structure with four or more units may be employed.

In the case of using a light-emitting device having a tandem structure, the following structure can be given: a B\Y two-unit tandem structure including a light-emitting unit that emits yellow (Y) light and a light-emitting unit that emits blue (B) light; an RG\B two-unit tandem structure including a light-emitting unit that emits red (R) light and green (G) light and a light-emitting unit that emits blue (B) light; a B\Y\B three-unit tandem structure including a light-emitting unit that emits blue (B) light, a light-emitting unit that emits yellow (Y) light, and a light-emitting unit that emits blue (B) light in this order; a B\YG\B three-unit tandem structure including a light-emitting unit that emits blue (B) light, a light-emitting unit that emits yellowish-green (YG) light, and a light-emitting unit that emits blue (B) light in this order; and a B\G\B three-unit tandem structure including a light-emitting unit that emits blue (B) light, a light-emitting unit that emits green (G) light, and a light-emitting unit that emits blue (B) light in this order.

As illustrated in FIG. 30C, a light-emitting unit including one light-emitting substance and a light-emitting unit including a plurality of light-emitting substances may be used in combination.

Specifically, in the structure illustrated in FIG. 30C, a plurality of light-emitting units (the light-emitting unit 763*a*, the light-emitting unit 763*b*, and the light-emitting unit 763*c*) are connected in series through the charge-generation layers (the charge-generation layer 785*a-b* and the charge-generation layer 785*b-c*). The light-emitting unit 763*a* includes the layer 780*a*, the light-emitting layer 771, and the layer 790*a*. The light-emitting unit 763*b* includes a layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

As the structure illustrated in FIG. 30C, for example, a three-unit tandem structure of B\R-G-YG\B in which the light-emitting unit 763*a* is a light-emitting unit that emits blue (B) light, the light-emitting unit 763*b* is a light-emitting unit that emits red (R), green (G), and yellowish-green (YG) light, and the light-emitting unit 763*c* is a light-emitting unit that emits blue (B) light can be employed.

Examples of the number of stacked light-emitting units and the order of colors from the anode side include a two-unit structure of B and Y, a two-unit structure of B and a light-emitting unit X, a three-unit structure of B, Y, and B, and a three-unit structure of B, X, and B. Examples of the number of light-emitting layers stacked in the light-emitting unit X and the order of colors from an anode side include a two-layer structure of R and Y, a two-layer structure of R and G, a two-layer structure of G and R, a three-layer structure of G, R, and G, and a three-layer structure of R, G, and R. Another layer may be provided between two light-emitting layers.

Also in FIG. 29C and FIG. 29D, the layer 780 and the layer 790 may each independently have a stacked-layer structure of two or more layers as illustrated in FIG. 29B.

In FIG. 29E and FIG. 29F, the light-emitting unit 763*a* includes the layer 780*a*, the light-emitting layer 771, and the layer 790*a*, and the light-emitting unit 763*b* includes the layer 780*b*, the light-emitting layer 772, and the layer 790*b*.

In the case where the lower electrode 761 is an anode and the upper electrode 762 is a cathode, the layer 780*a* and the layer 780*b* each include one or more of a hole-injection layer, a hole-transport layer, and an electron-blocking layer. The layer 790*a* and the layer 790*b* each include one or more of an electron-injection layer, an electron-transport layer, and a hole-blocking layer. In the case where the lower electrode 761 is a cathode and the upper electrode 762 is an anode, the structures of the layer 780*a* and the layer 790*a* are replaced with each other, and the structures of the layer 780*b* and the layer 790*b* are also replaced with each other.

In the case where the lower electrode 761 is an anode and the upper electrode 762 is a cathode, for example, the layer 780*a* includes a hole-injection layer and a hole-transport layer over the hole-injection layer, and may further include an electron-blocking layer over the hole-transport layer. The layer 790*a* includes an electron-transport layer, and may further include a hole-blocking layer between the light-emitting layer 771 and the electron-transport layer. The layer 780*b* includes a hole-transport layer, and may further include an electron-blocking layer over the hole-transport layer. The layer 790*b* includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780*a* includes an electron-injection layer and an electron-transport layer over the electron-injection layer, and may further include a hole-blocking layer over the electron-transport layer. The layer 790*a* includes a hole-transport layer, and may further include an electron-blocking layer between the light-emitting layer 771 and the hole-transport layer. The layer 780*b* includes an electron-transport layer, and may further include a hole-blocking layer over the electron-transport layer. The layer 790*b* includes a hole-transport layer and a hole-injection layer over the hole-transport layer, and may further include an electron-blocking layer between the light-emitting layer 772 and the hole-transport layer.

In the case of fabricating a light-emitting device having a tandem structure, two light-emitting units are stacked with the charge-generation layer 785 therebetween. The charge-generation layer 785 includes at least a charge-generation region. The charge-generation layer 785 has a function of injecting electrons into one of the two light-emitting units and injecting holes into the other when voltage is applied between the pair of electrodes.

Next, materials that can be used for the light-emitting device will be described.

A conductive film transmitting visible light is used as the electrode through which light is extracted, which is either the lower electrode 761 or the upper electrode 762. A conductive film reflecting visible light is preferably used as the electrode through which light is not extracted. In the case where a display apparatus includes a light-emitting device emitting infrared light, it is preferable that a conductive film transmitting visible light and infrared light be used as the electrode through which light is extracted, and a conductive film reflecting visible light and infrared light be used as the electrode through which light is not extracted.

A conductive film transmitting visible light may be used as the electrode through which light is not extracted. In that case, the electrode is preferably placed between a reflective layer and the EL layer 763. In other words, light emitted from the EL layer 763 may be reflected by the reflective layer to be extracted from the display apparatus.

As a material that forms the pair of electrodes of the light-emitting device, a metal, an alloy, an electrically conductive compound, a mixture thereof, or the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Examples of the material include indium tin oxide (In—Sn oxide, also referred to as ITO), In—Si—Sn oxide (also referred to as ITSO), indium zinc oxide (In—Zn oxide), and In—W—Zn oxide. Another example of the material is an alloy containing aluminum (an aluminum alloy). An example of the alloy containing aluminum is an alloy (Al—Ni—La) of aluminum (Al), nickel (Ni), and lanthanum (La). Another example of the material is an alloy (Ag—Pd—Cu, also referred to as APC) of silver, palladium, and copper. Other example of the material include elements belonging to Group 1 or Group 2 of the periodic table, which are not exemplified above (e.g., lithium, cesium, calcium, and strontium), rare earth metals such as europium and ytterbium, an alloy containing any of these metals in appropriate combination, and graphene.

The light-emitting device preferably employs a microcavity structure. Therefore, one of the pair of electrodes of the light-emitting device preferably includes an electrode having properties of transmitting and reflecting visible light (a transflective electrode), and the other preferably includes an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode is preferably formed with, for example, a conductor having properties of transmitting and reflecting visible light. Alternatively, for example, the transflective electrode may have a stacked-layer structure of a conductive layer that can be used as a reflective electrode and a conductive layer that can be used as an electrode having a property of transmitting visible light (also referred to as a transparent electrode).

The transparent electrode has a light transmittance higher than or equal to 40%. For example, an electrode having a visible light (light with a wavelength longer than or equal to 400 nm and shorter than 750 nm) transmittance higher than or equal to 40% is preferably used as the transparent electrode of the light-emitting device. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity less than or equal to $1\times10^{-2}$ Ωcm.

The light-emitting device includes at least the light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, or a substance with a bipolar property (a substance with a high electron-transport property and a high hole-transport property). For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may be included. Each layer included in the light-emitting device can be formed by any of the following methods: an evaporation method (including a vacuum evaporation method), a transfer method, a printing method, an ink-jet method, and a coating method.

The light-emitting layer contains one or more kinds of light-emitting substances. As the light-emitting substance, for example, a substance exhibiting an emission color of blue, violet, bluish violet, green, yellowish green, yellow, orange, or red is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of a substance with a high hole-transport property (a hole-transport material) and a substance with a high electron-transport property (an electron-transport material) can be used. As the hole-transport material, it is possible to use a material having a high hole-transport property which can be used for the hole-transport layer and will be described later. As the electron-transport material, it is possible to use a material having a high electron-transport property which can be used for the electron-transport layer and will be described later. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination is selected to form an exciplex that exhibits light emission whose wavelength overlaps with the wavelength of the lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

The hole-injection layer is a layer injecting holes from the anode to the hole-transport layer, and is a layer containing a material with a high hole-injection property. Examples of a material with a high hole-injection property include an aromatic amine compound and a composite material containing a hole-transport material and an acceptor material (electron-accepting material).

As the hole-transport material, it is possible to use a material having a high hole-transport property which can be used for the hole-transport layer and will be described later.

As the acceptor material, an oxide of a metal belonging to Group 4 to Group 8 of the periodic table can be used, for example. Specific examples of the oxide of the metal include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. An organic acceptor material containing fluorine can be used. An organic acceptor material such as a quinodimethane derivative, a chloranil derivative, or a hexaazatriphenylene derivative can be used.

As the material having a high hole-injection property, a material that contains a hole-transport material and the above-described oxide of a metal belonging to any of Group 4 to Group 8 of the periodic table (typically, molybdenum oxide) may be used, for example.

The hole-transport layer is a layer transporting holes injected from the anode by the hole-injection layer, to the light-emitting layer. The hole-transport layer is a layer containing a hole-transport material. As the hole-transport material, a substance having a hole mobility higher than or equal to $1\times10^{-6}$ $cm^2/Vs$ is preferable. Note that other substances can also be used as long as the substances have a hole-transport property higher than an electron-transport property. As the hole-transport material, a material with a high hole-transport property, such as a t-electron rich heteroaromatic compound (e.g., a carbazole derivative, a thiophene derivative, or a furan derivative) or an aromatic amine (a compound having an aromatic amine skeleton), is preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer is a layer transporting electrons injected from the cathode by the electron-injection layer, to the light-emitting layer. The electron-transport layer is a layer containing an electron-transport material. As the electron-transport material, a substance having an electron mobility higher than or equal to $1\times10^{-6}$ $cm^2/Vs$ is preferable. Note that other substances can also be used as long as the substances have an electron-transport property higher than a hole-transport property. As the electron-transport material, any of the following materials with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a n-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer is a layer injecting electrons from the cathode to the electron-transport layer, and is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The difference between the lowest unoccupied molecular orbital (LUMO) level of the material with a high electron-injection property and the work function value of the material used for the cathode is preferably small (specifically, smaller than or equal to 0.5 eV).

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. The stacked-layer structure can be, for example, a structure in which lithium fluoride is used for the first layer and ytterbium is used for the second layer.

The electron-injection layer may contain an electron-transport material. For example, a compound having an unshared electron pair and an electron deficient heteroaromatic ring can be used as the electron-transport material. Specifically, a compound having one or more selected from a pyridine ring, a diazine ring (a pyrimidine ring, a pyrazine ring, or a pyridazine ring), and a triazine ring can be used.

Note that the LUMO level of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used for the organic compound having an unshared electron pair. Note that NBPhen has a higher glass transition temperature (Tg) than BPhen and thus has high heat resistance.

As described above, the charge-generation layer includes at least a charge-generation region. The charge-generation region preferably contains an acceptor material, and for example, preferably contains a hole-transport material and an acceptor material which can be used for the hole-injection layer.

The charge-generation layer preferably includes a layer containing a material having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be suitably used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases on the basis of the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can inhibit an increase in driving voltage.

<Structure Example of Pixel Circuit>

Here, structure examples of a pixel circuit that can be included in the pixel layer PXAL are described.

Figure 31A:
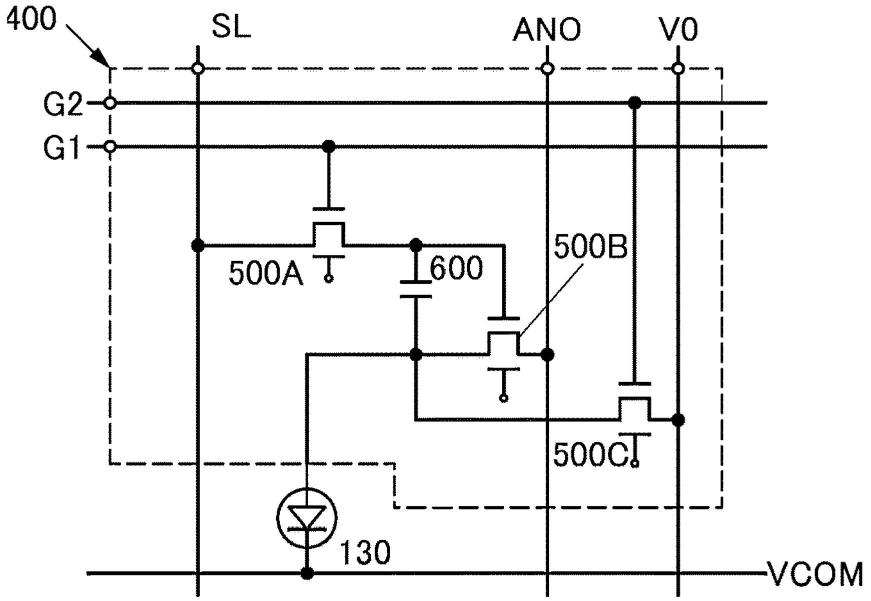
FIG. 31A is a circuit diagram illustrating a configuration example of a pixel circuit included in a display apparatus.
Figure 31B:
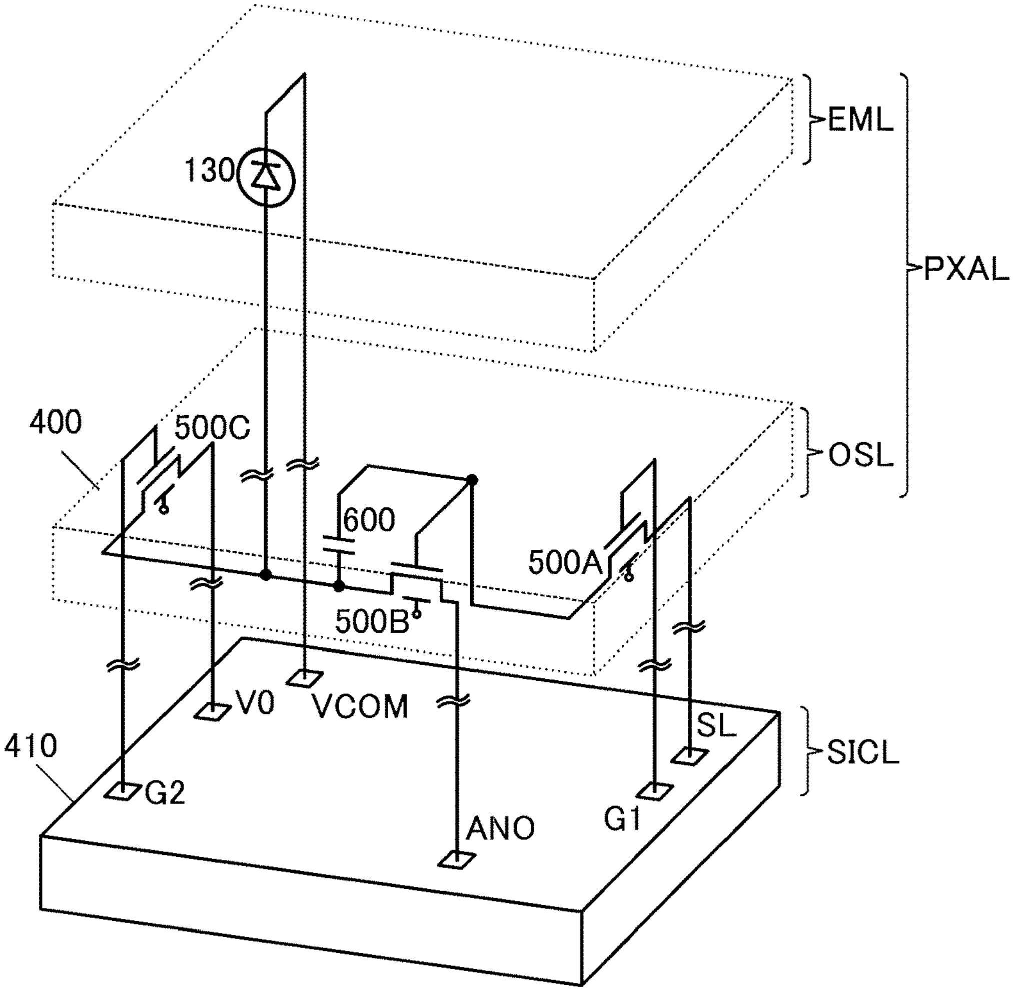
FIG. 31B is a schematic perspective view illustrating the configuration example of the pixel circuit included in a display apparatus.

FIG. 31A and FIG. 31B illustrate a configuration example of a pixel circuit that can be included in the pixel layer PXAL and the light-emitting device 130 connected to the pixel circuit. FIG. 31A is a diagram illustrating connection of circuit elements included in a pixel circuit 400 included in the pixel layer PXAL, and FIG. 31B is a diagram schematically illustrating the vertical relation of the circuit layer SICL including a driver circuit 410, a layer OSL including a plurality of transistors of the pixel circuit, and a layer EML including the light-emitting device 130. Note that the pixel layer PXAL of the display apparatus 1000 illustrated in FIG. 31B includes the layer OSL and the layer EML, for example. A transistor 500A, a transistor 500B, and a transistor 500C included in the layer OSL illustrated in FIG. 31B each correspond to the transistor 500 in FIG. 20, for example. The light-emitting device 130 included in the layer EML illustrated in FIG. 31B corresponds to the light-emitting device 130R, the light-emitting device 130G, or the light-emitting device 130B in FIG. 20.

The pixel circuit 400 illustrated as an example in FIG. 31A and FIG. 31B includes the transistor 500A, the transistor 500B, the transistor 500C, and a capacitor 600. The transistor 500A, the transistor 500B, and the transistor 500C can be transistors that can be used as the transistor 200 described above as an example.

That is, the transistor 500A, the transistor 500B, and the transistor 500C can be Si transistors. Alternatively, the transistor 500A, the transistor 500B, and the transistor 500C can be, for example, transistors that can be used as the transistor 500 described above. That is, the transistor 500A, the transistor 500B, and the transistor 500C can be OS transistors. In particular, in the case where the transistor 500A, the transistor 500B, and the transistor 500C are OS transistors, each of the transistor 500A, the transistor 500B, and the transistor 500C preferably includes a back gate electrode, in which case a structure in which the back gate electrode is supplied with the same signals as the gate electrode or a structure in which the back gate electrode is supplied with signals different from those supplied to the gate electrode can be employed. Although each of the transistor 500A, the transistor 500B, and the transistor 500C illustrated in FIG. 31A and FIG. 31B includes a back gate electrode, each of the transistor 500A, the transistor 500B, and the transistor 500C does not necessarily include a back gate electrode.

The transistor 500B includes a gate electrode electrically connected to the transistor 500A, a first electrode electrically connected to the light-emitting device 130, and a second electrode electrically connected to a wiring ANO. The wiring ANO is a wiring for supplying a potential for supplying current to the light-emitting device 130.

The transistor 500A includes a first terminal electrically connected to the gate electrode of the transistor 500B, a second terminal electrically connected to the wiring SL functioning as a source line, and the gate having a function of controlling switching of the on state and the off state on the basis of the potential of a wiring GL1 functioning as a gate line.

The transistor 500C includes a first terminal electrically connected to a wiring V0, a second terminal electrically connected to the light-emitting device 130, and the gate electrode having a function of controlling switching of the on state and the off state on the basis of the potential of a wiring GL2 functioning as a gate line. The wiring V0 is a wiring for supplying a reference potential and a wiring for outputting a current flowing through the pixel circuit 400 to the driver circuit 410.

The capacitor 600 includes a conductive film electrically connected to the gate electrode of the transistor 500B and a conductive film electrically connected to a second electrode of the transistor 500C.

The light-emitting device 130 includes a first electrode electrically connected to the first electrode of the transistor 500B and a second electrode electrically connected to a wiring VCOM. The wiring VCOM is a wiring for supplying a potential for supplying current to the light-emitting device 130.

Accordingly, the intensity of light emitted from the light-emitting device 130 can be controlled in accordance with an image signal supplied to the gate electrode of the transistor 500B. Furthermore, variations in the gate-source voltage of the transistor 500B can be inhibited by the reference potential of the wiring V0 supplied through the transistor 500C.

A current value that can be used for setting pixel parameters can be output from the wiring V0. Specifically, the wiring V0 can function as a monitor line for outputting a current flowing through the transistor 500B or a current flowing through the light-emitting device 130 to the outside. A current output to the wiring V0 is converted into a voltage by, for example, a source follower circuit and is output to the outside. Alternatively, for example, the current output to the wiring V0 can be converted into a digital signal by an A-D converter or the like and can be output to a circuit that performs dimming or toning (referred to as correction circuit in some cases), or a GPU.

Note that in the structure illustrated as an example in FIG. 31B, the wirings electrically connecting the pixel circuit 400 and the driver circuit 410 can be shortened, so that wiring resistance of the wirings can be reduced. Thus, data writing can be performed at high speed, leading to high-speed driving of the display apparatus 1000. Therefore, even when the number of pixel circuits 400 included in the display apparatus 1000 is large, a sufficiently long frame period can be ensured and thus the pixel density of the display apparatus 1000 can be increased. In addition, the increased pixel density of the display apparatus 1000 can increase the resolution of an image displayed by the display apparatus 1000. For example, the pixel density of the display apparatus 1000 can be higher than or equal to 1000 ppi, higher than or equal to 5000 ppi, or higher than or equal to 7000 ppi. Thus, the display apparatus 1000 can be, for example, a display apparatus for AR or VR and can be suitably used in an electronic device with a short distance between a display portion and the user, such as a head-mounted display.

Although FIG. 31A and FIG. 31B illustrate, as an example, the pixel circuit 400 including three transistors in total, the pixel circuit of the electronic device of one embodiment of the present invention is not limited thereto. Structure examples of a pixel circuit that can be used as the pixel circuit 400 will be described below.

Figure 32A:
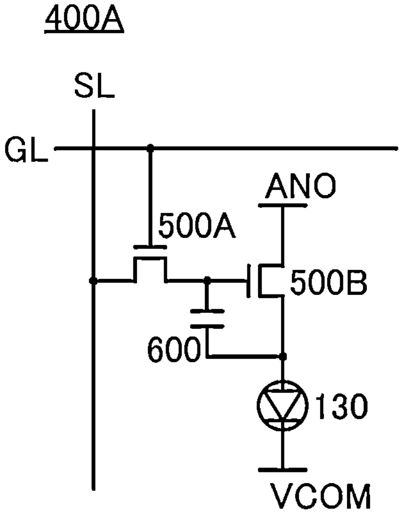
FIG. 32A to FIG. 32D are circuit diagrams each illustrating a configuration example of a pixel circuit included in a display apparatus.

A pixel circuit 400A illustrated in FIG. 32A includes the transistor 500A, the transistor 500B, and the capacitor 600. FIG. 32A illustrates the light-emitting device 130 connected to the pixel circuit 400A. The wiring SL, the wiring GL, the wiring ANO, and the wiring VCOM are electrically connected to the pixel circuit 400A.

A gate of the transistor 500A is electrically connected to the wiring GL, one of a source and a drain of the transistor 500A is electrically connected to the wiring SL, and the other of the source and the drain of the transistor 500A is electrically connected to a gate of the transistor 500B and one electrode of the capacitor 600. One of a source and a drain of the transistor 500B is electrically connected to the wiring ANO and the other of the source and the drain of the transistor 500B is electrically connected to an anode of the light-emitting device 130. The other electrode of the capacitor 600 is electrically connected to the anode of the light-emitting device 130. A cathode of the light-emitting device 130 is electrically connected to the wiring VCOM.

Figure 32B:
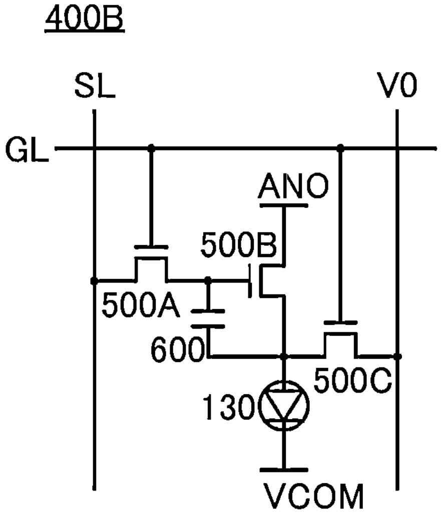

A pixel circuit 400B illustrated in FIG. 32B has a structure in which the transistor 500C is added to the pixel circuit 400A. In addition, the wiring V0 is electrically connected to the pixel circuit 400B.

Figure 32C:
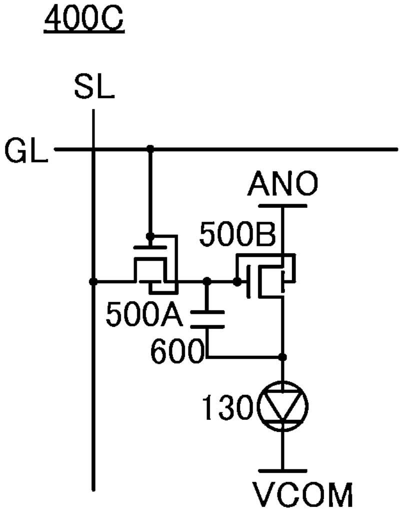
Figure 32D:
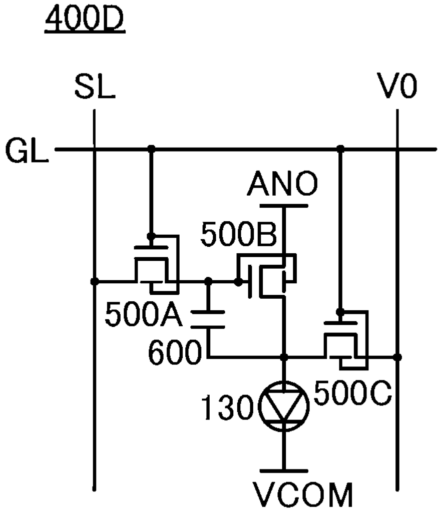

A pixel circuit 400C illustrated in FIG. 32C is an example of the case where a transistor in which a gate and a back gate are electrically connected to each other is used as each of the transistor 500A and the transistor 500B of the pixel circuit 400A. A pixel circuit 400D illustrated in FIG. 32D is an example of the case where such transistors are used in the pixel circuit 400B. Thus, current that can flow through the transistors can be increased. Note that although a transistor in which a pair of gates are electrically connected to each other is used as all the transistors here, one embodiment of the present invention is not limited thereto. A transistor that includes a pair of gates electrically connected to different wirings may be used. For example, when a transistor in which one of gates is electrically connected to a source is used, the reliability can be increased.

Figure 33A:
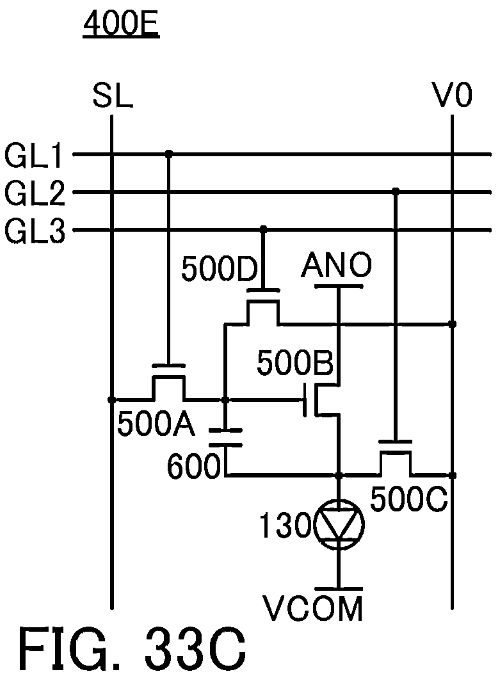
FIG. 33A to 33D are circuit diagrams each illustrating a configuration example of a pixel circuit included in a display apparatus.

A pixel circuit 400E illustrated in FIG. 33A has a structure in which a transistor 500D is added to the pixel circuit 400B. Three wirings (the wiring GL1, the wiring GL2, and a wiring GL3) functioning as gate lines are electrically connected to the pixel circuit 400E.

A gate of the transistor 500D is electrically connected to the wiring GL3, one of a source and a drain of the transistor 500D is electrically connected to the gate of the transistor 500B, and the other of the source and the drain of the transistor 500D is electrically connected to the wiring V0. The gate of the transistor 500A is electrically connected to the wiring GL1, and the gate of the transistor 500C is electrically connected to the wiring GL2.

When the transistor 500C and the transistor 500D are turned on at the same time, the source and the gate of the transistor 500B have the same potential, so that the transistor 500B can be turned off. Thus, current flowing through the light-emitting device 130 can be blocked forcibly. Such a pixel circuit is suitable for the case of using a display method in which a display period and a non-lighting period are alternately provided.

Figure 33B:
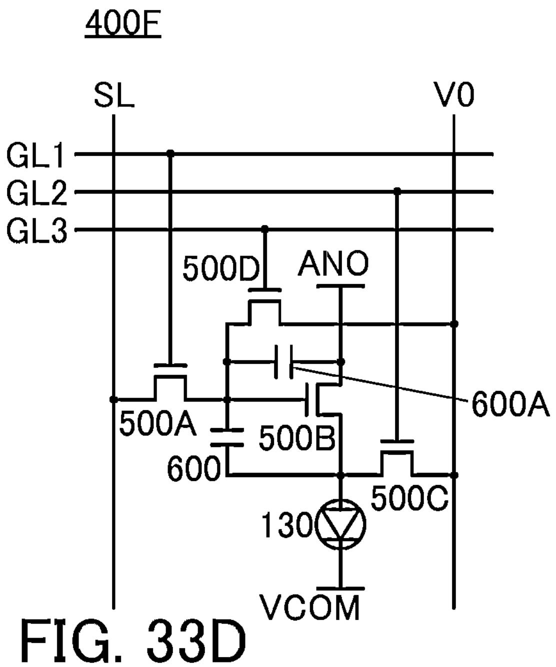

A pixel circuit 400F illustrated in FIG. 33B is an example of the case where a capacitor 600A is added to the pixel circuit 400E. The capacitor 600A functions as a storage capacitor.

Figure 33C:
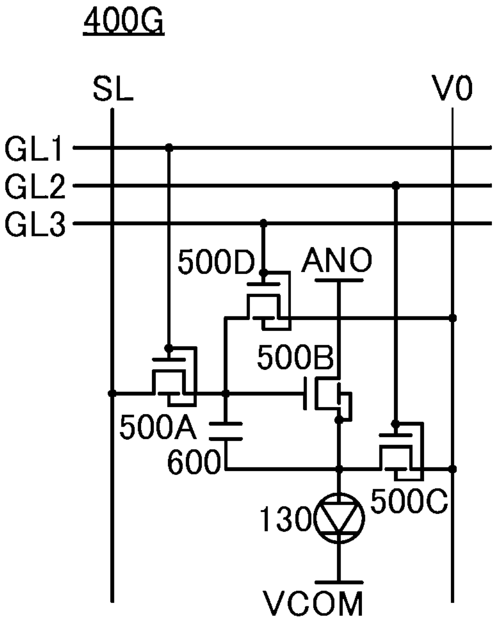
Figure 33D:
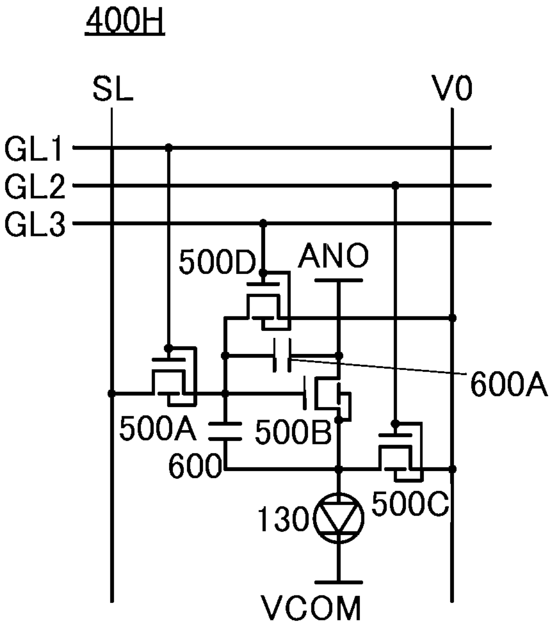

A pixel circuit 400G illustrated in FIG. 33C and a pixel circuit 400H illustrated in FIG. 33D are respectively examples of the cases where transistors each including a gate and a back gate that are electrically connected to each other are used in the pixel circuit 400E and the pixel circuit 400E. A transistor in which a gate and a back gate are electrically connected to each other is used as each of the transistor 500A, the transistor 500C, and the transistor 500D, and a transistor in which a gate is electrically connected to a source is used as the transistor 500B.

<Pixel Layout>

Here, a pixel layout is described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of the top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting device.

Figure 34A:
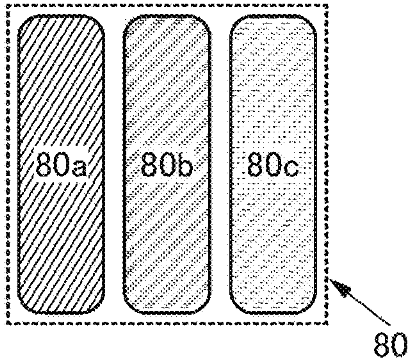
FIG. 34A to FIG. 34G are plan views each illustrating an example of a pixel.
Figure 35A:
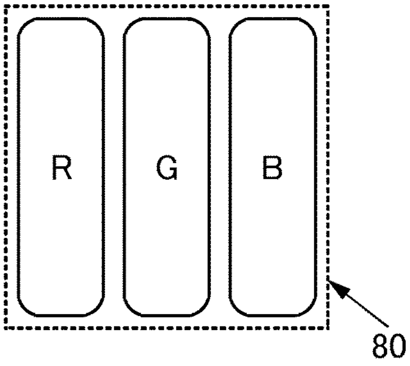
FIG. 35A to FIG. 35F are plan views each illustrating an example of a pixel.

A pixel 80 illustrated in FIG. 34A employs stripe arrangement. The pixel 80 illustrated in FIG. 34A is composed of three subpixels: a subpixel 80*a*, a subpixel 80*b*, and a subpixel 80*c*. For example, as illustrated in FIG. 35A, the subpixel 80*a* may be a red subpixel R, the subpixel 80*b* may be a green subpixel G, and the subpixel 80*c* may be a blue subpixel B.

Figure 34B:
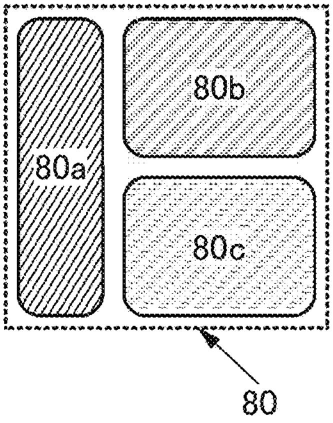
Figure 35B:
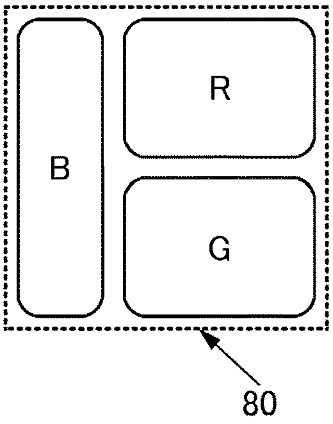

The pixel 80 illustrated in FIG. 34B employs S-stripe arrangement. The pixel 80 illustrated in FIG. 34B is composed of three subpixels: the subpixel 80*a*, the subpixel 80*b*, and the subpixel 80*c*. For example, as illustrated in FIG. 35B, the subpixel 80*a* may be the blue subpixel B, the subpixel 80*b* may be the red subpixel R, and the subpixel 80*c* may be the green subpixel G.

Figure 34C:
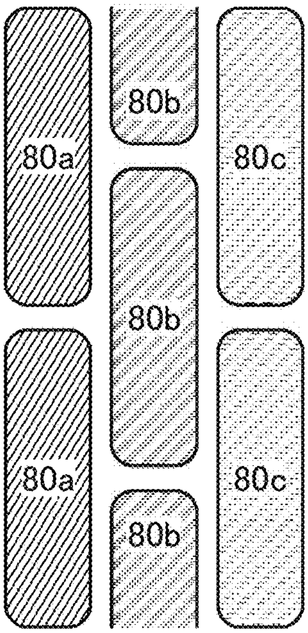
Figure 35C:
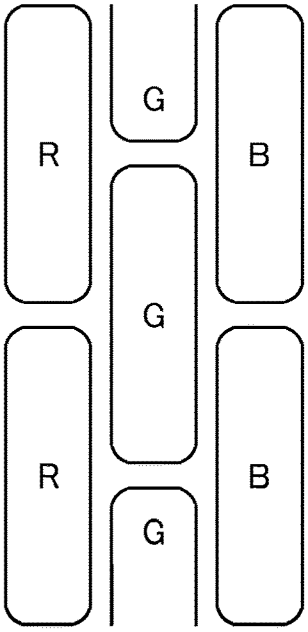

FIG. 34C illustrates an example where subpixels of different colors are arranged in a zigzag manner. Specifically, the positions of the top sides of two subpixels arranged in the column direction (e.g., the subpixel 80*a* and the subpixel 80*b* or the subpixel 80*b* and the subpixel 80*c*) are not aligned in the top view. For example, as illustrated in FIG. 35C, the subpixel 80*a* may be the red subpixel R, the subpixel 80*b* may be the green subpixel G, and the subpixel 80*c* may be the blue subpixel B.

Figure 34D:
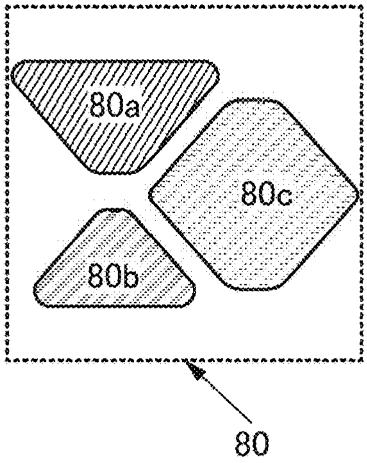
Figure 35D:
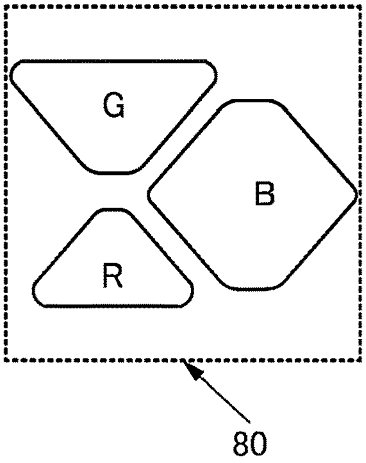

The pixel 80 illustrated in FIG. 34D includes the subpixel 80*a* whose top surface has a rough trapezoidal shape with rounded corners, the subpixel 80*b* whose top surface has a rough triangle shape with rounded corners, and the subpixel 80*c* whose top surface has a rough tetragonal or rough hexagonal shape with rounded corners. The subpixel 80*a* has a larger light-emitting area than the subpixel 80*b*. In this manner, the shapes and sizes of the subpixels can be determined independently. For example, the size of a subpixel including a light-emitting device with higher reliability can be smaller. For example, as illustrated in FIG. 35D, the subpixel 80*a* may be the green subpixel G, the subpixel 80*b* may be the red subpixel R, and the subpixel 80*c* may be the blue subpixel B.

Figure 34E:
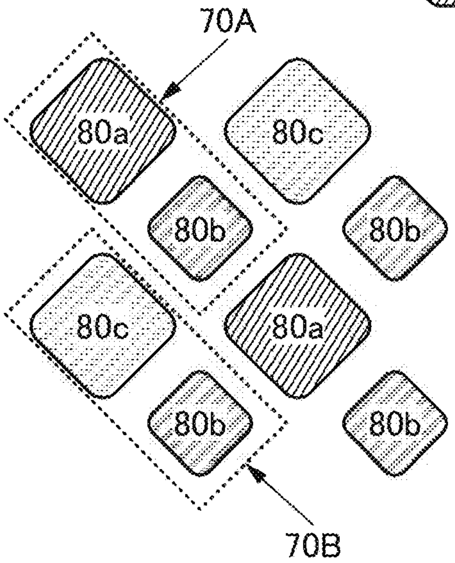
Figure 35E:
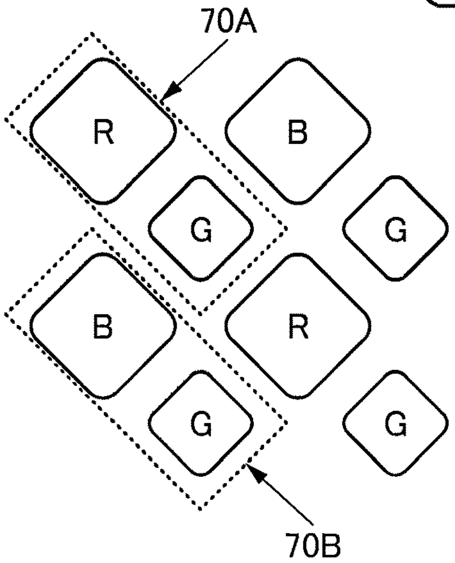

A pixel 70A and a pixel 70B illustrated in FIG. 34E employ pentile arrangement. FIG. 34E illustrates an example where the pixels 70A including the subpixel 80*a* and the subpixel 80*b* and the pixels 70B including the subpixel 80*b* and the subpixel 80*c* are alternately arranged. For example, as illustrated in FIG. 35E, the subpixel 80*a* may be the red subpixel R, the subpixel 80*b* may be the green subpixel G, and the subpixel 80*c* may be the blue subpixel B.

Figure 34F:
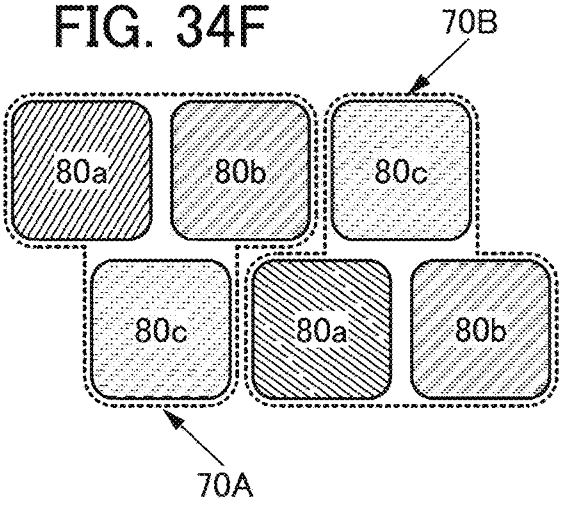
Figure 34G:
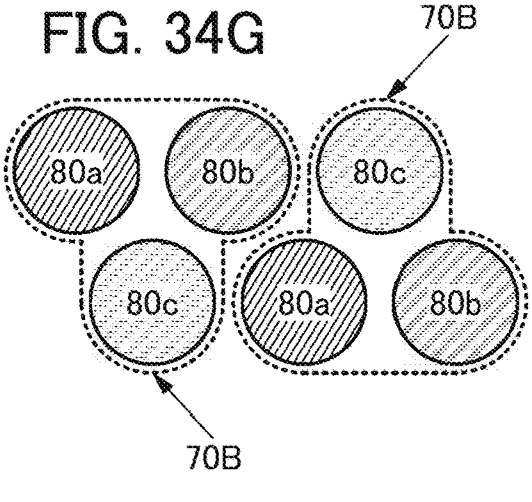
Figure 35F:
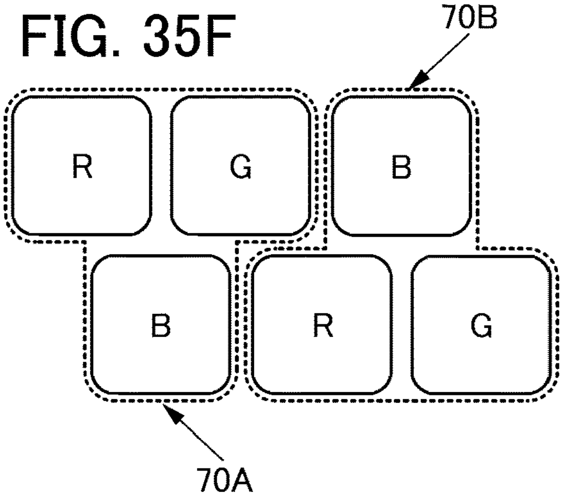

The pixel 70A and the pixel 70B illustrated in FIG. 34F and FIG. 34G employ delta arrangement. The pixel 70A includes two subpixels (the subpixel 80*a* and the subpixel 80*b*) in the upper row (first row) and one subpixel (the subpixel 80*c*) in the lower row (second row). The pixel 70B includes one subpixel (the subpixel 80*c*) in the upper row (first row) and two subpixels (the subpixel 80*a* and the subpixel 80*b*) in the lower row (second row). For example, as illustrated in FIG. 35F, the subpixel 80*a* may be the red subpixel R, the subpixel 80*b* may be the green subpixel G, and the subpixel 80*c* may be the blue subpixel B.

FIG. 34F illustrates an example where the top surface of each subpixel has a rough tetragonal shape with rounded corners, and FIG. 34G illustrates an example where the top surface of each subpixel has a circular shape.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel has a polygonal shape with rounded corners, an elliptical shape, or a circular shape in some cases.

Furthermore, in the method for manufacturing the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 36A:
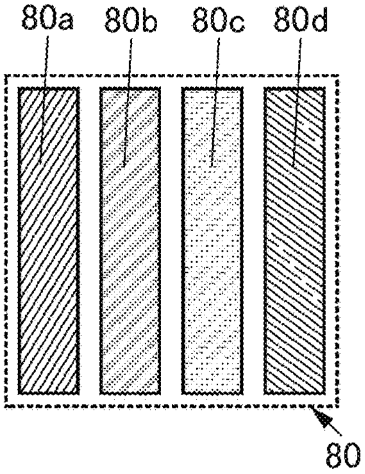
FIG. 36A to FIG. 36H are plan views each illustrating an example of a pixel.
Figure 36B:
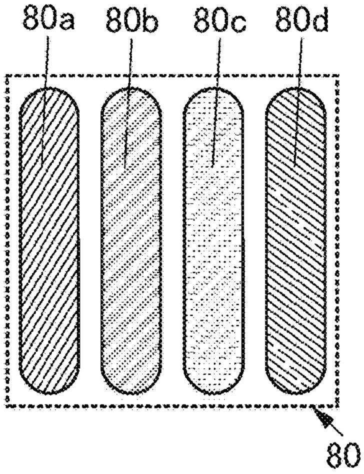
Figure 36C:
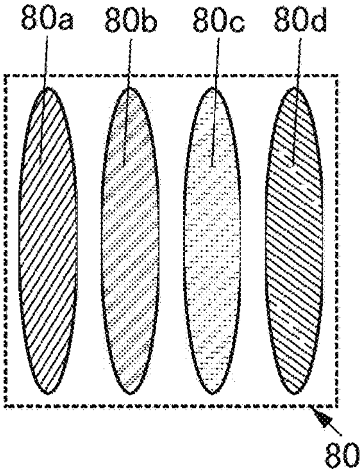

The pixels 80 illustrated in FIG. 36A to FIG. 36C employ stripe arrangement.

FIG. 36A illustrates an example where each subpixel has a rectangular top surface shape, FIG. 36B illustrates an example where each subpixel has a top surface shape formed by combining two half circles and a rectangle, and FIG. 36C illustrates an example where each subpixel has an elliptical top surface shape.

Figure 36D:
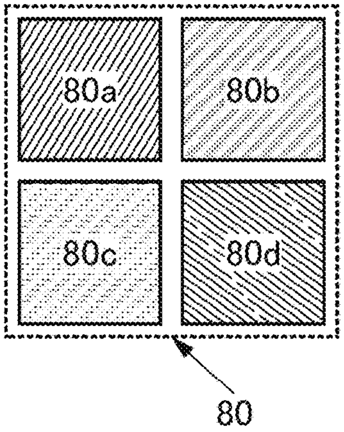
Figure 36E:
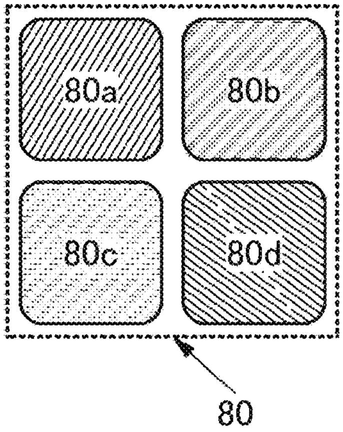
Figure 36F:
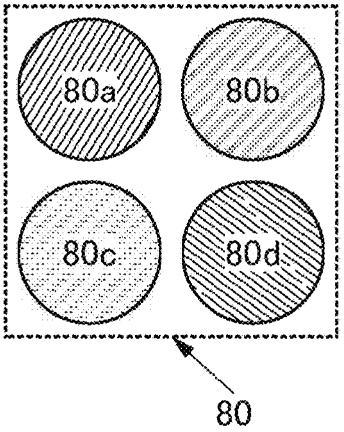

The pixels 80 illustrated in FIG. 36D to FIG. 36F employ matrix arrangement.

FIG. 36D illustrates an example where each subpixel has a square top surface shape, FIG. 36E illustrates an example where each subpixel has a substantially square top surface shape with rounded corners, and FIG. 36F illustrates an example where each subpixel has a circular top surface shape.

Figure 37A:
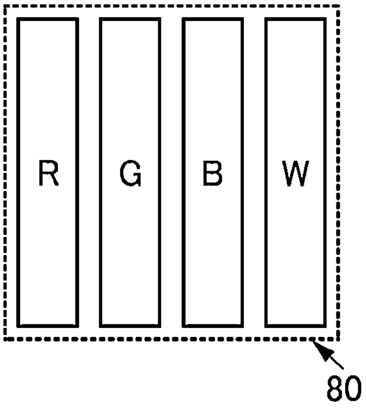
FIG. 37A to FIG. 37D are plan views each illustrating an example of a pixel.
Figure 37B:
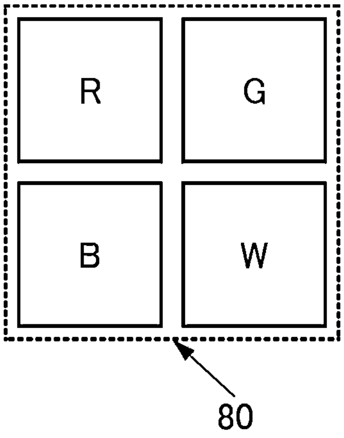

The pixels 80 illustrated in FIG. 36A to FIG. 36F are each composed of four subpixels: the subpixel 80*a*, the subpixel 80*b*, the subpixel 80*c*, and a subpixel 80*d*. The subpixel 80*a*, the subpixel 80*b*, the subpixel 80*c*, and the subpixel 80*d* emit light of different colors. For example, the subpixel 80*a*, the subpixel 80*b*, the subpixel 80*c*, and the subpixel 80*d* can be red, green, blue, and white subpixels, respectively. For example, the subpixel 80*a*, the subpixel 80*b*, the subpixel 80*c*, and the subpixel 80*d* can be red, green, blue, and white subpixels, respectively, as illustrated in FIG. 37A and FIG. 37B. Alternatively, the subpixel 80*a*, the subpixel 80*b*, the subpixel 80*c*, and the subpixel 80*d* can be red, green, blue, and image capturing light-emitting subpixels, respectively.

The subpixel 80*d* includes a light-emitting device. The light-emitting device includes, for example, a pixel electrode, an EL layer, and a common electrode. Note that for the pixel electrode, a material similar to those of the conductor 112*a* to the conductor 112*c* or the conductor 126*a* to the conductor 126*c* is used. For the EL layer, a material similar to that of the first layer 113*a*, the second layer 113*b*, or the third layer 113*c* is used, for example.

The subpixel 80*d* may be an image capturing pixel, for example. The subpixel 80*d* in this case includes a light-receiving device. The light-receiving device includes a pixel electrode, an active layer that functions as a photoelectric conversion layer, and a common electrode, for example. As the light-receiving device, an organic light-receiving device including a layer containing an organic compound is preferably used. An organic light-receiving device, which is easily made thin, lightweight, and large in area and has a high degree of freedom for shape and design, can be used in a variety of display apparatuses.

Figure 36G:
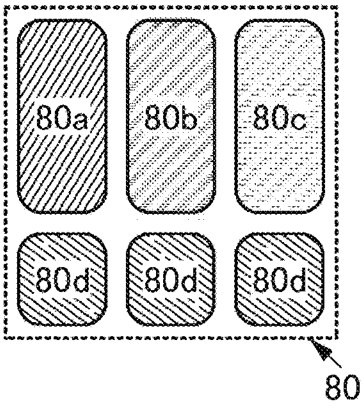

FIG. 36G illustrates an example where one pixel 80 is composed of two rows and three columns. The pixel 80 includes three subpixels (the subpixel 80*a*, the subpixel 80*b*, and the subpixel 80*c*) in the upper row (first row) and three subpixels 80*d* in the lower row (second row). In other words, the pixel 80 includes the subpixel 80*a* and the subpixel 80*d* in the left column (first column), the subpixel 80*b* and another subpixel 80*d* in the center column (second column), and the subpixel 80*c* and another subpixel 80*d* in the right column (third column). Matching the positions of the subpixels in the upper row and the lower row as illustrated in FIG. 36G enables dust and the like that would be produced in the manufacturing process to be removed efficiently. Thus, a display apparatus with high display quality can be provided.

Note that one or both of the light-emitting pixel for image capturing and the image capturing pixel may be used as the three subpixels 80*d* illustrated in FIG. 36G.

Figure 36H:
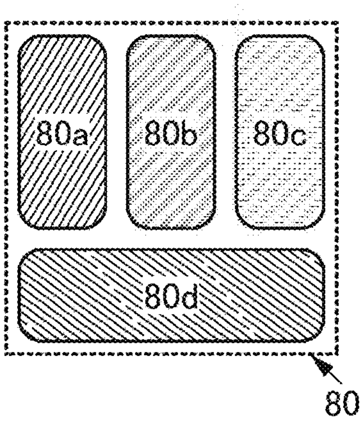

FIG. 36H illustrates an example where one pixel 80 is composed of two rows and three columns. The pixel 80 includes three subpixels (the subpixel 80*a*, the subpixel 80*b*, and the subpixel 80*c*) in the upper row (first row) and one subpixel (the subpixel 80*d*) in the lower row (second row). In other words, the pixel 80 includes the subpixel 80*a* in the left column (first column), the subpixel 80*b* in the center column (second column), the subpixel 80*c* in the right column (third column), and the subpixel 80*d* across these three columns.

Figure 37C:
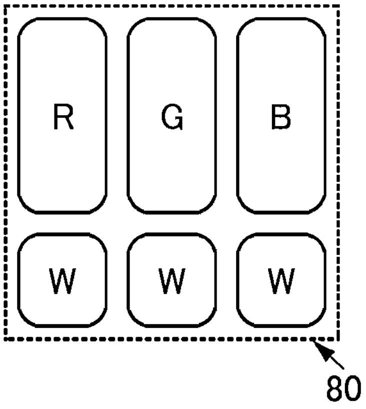
Figure 37D:
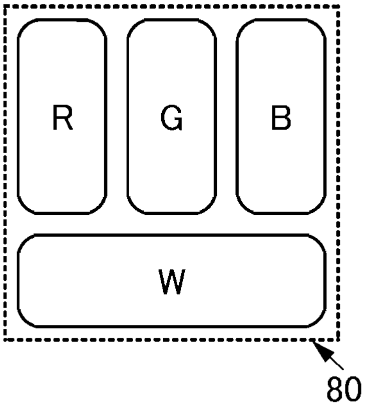

In the pixel 80 illustrated in each of FIG. 36G and FIG. 36H, for example, the subpixel 80*a* can be the red subpixel R, the subpixel 80*b* can be the green subpixel G, the subpixel 80*c* can be the blue subpixel B, and the subpixel 80*d* can be a white subpixel W, as illustrated in FIG. 37C and FIG. 37D.

Note that the insulators, the conductors, and the semiconductors disclosed in this specification and the like can be formed by a PVD (Physical Vapor Deposition) method or a CVD method. Examples of a PVD method include a sputtering method, a resistance heating evaporation method, an electron beam evaporation method, an MBE (Molecular Beam Epitaxy) method, and a PLD (Pulsed Laser Deposition) method. Examples of the CVD method include a plasma CVD method and a thermal CVD method. In particular, examples of a thermal CVD method include an MOCVD method and an ALD method.

A thermal CVD method is a deposition method not using plasma, and thus has an advantage that no defect due to plasma damage is generated.

Deposition by a thermal CVD method may be performed in such a manner that a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in such a manner that pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust the thickness and is thus suitable for manufacturing a minute FET.

A variety of films such as the metal film, the semiconductor film, and the inorganic insulating film disclosed in the above-described embodiments can be formed by a thermal CVD method such as an MOCVD method and an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus using an ALD method, two kinds of gases, ozone ($O_3$) as an oxidizer and a source gas which is obtained by vaporizing liquid containing a solvent and a hafnium precursor compound (e.g., hafnium alkoxide and hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed with a deposition apparatus using an ALD method, two kinds of gases, $H_2O$ as an oxidizer and a source gas which is obtained by vaporizing liquid containing a solvent and an aluminum precursor compound (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface on which a film is to be formed, and radicals of an oxidizing gas ($O_2$ or dinitrogen monoxide) are supplied to react with the adsorbate.

For example, in the case where a tungsten film is formed by a deposition apparatus using an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

In the case where an In—Ga—Zn—O film is formed as an oxide semiconductor film with a deposition apparatus using an ALD method, a precursor (generally referred to as a metal precursor or the like in some cases) and an oxidizer (generally referred to as a reactant, a non-metal precursor, or the like in some cases) are sequentially and repetitively introduced. Specifically, for example, an $In(CH_3)_3$ gas as a precursor and an $O_3$ gas) as an oxidizer are introduced to form an In—O layer; a $Ga(CH_3)_3$ gas as a precursor and an $O_3$ gas) as an oxidizer are introduced to form a GaO layer; and then, a $Zn(CH_3)_2$ gas as a precursor and an $O_3$ gas) as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas (e.g., argon) may be used instead of an $O_3$ gas), it is preferable to use an $O_3$ gas) which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, instead of a $Zn(CH_3)_2$ gas, a $Zn(C_2H_5)_2$ gas may be used.

There is no particular limitation on the screen ratio (aspect ratio) of the display portion of the electronic device of one embodiment of the present invention. For example, the display portion is compatible with a variety of screen ratios such as 1:1 (a square), 4:3, 16:9, 16:10, 21:9, and 32:9.

There is no particular limitation on the shape of the display portion of the electronic device of one embodiment of the present invention. The display portion can have any of various shapes such as a rectangular shape, a polygonal shape (e.g., an octagonal shape), a circular shape, and an elliptical shape.

Note that this embodiment can be combined with any of the other embodiments described in this specification as appropriate.

Embodiment 3

In this embodiment, a transistor that can be used in the semiconductor device of one embodiment of the present invention, specifically, the transistor 500 described in Embodiment 2 will be described.

<Structure Example of Transistor>

Figure 38A:
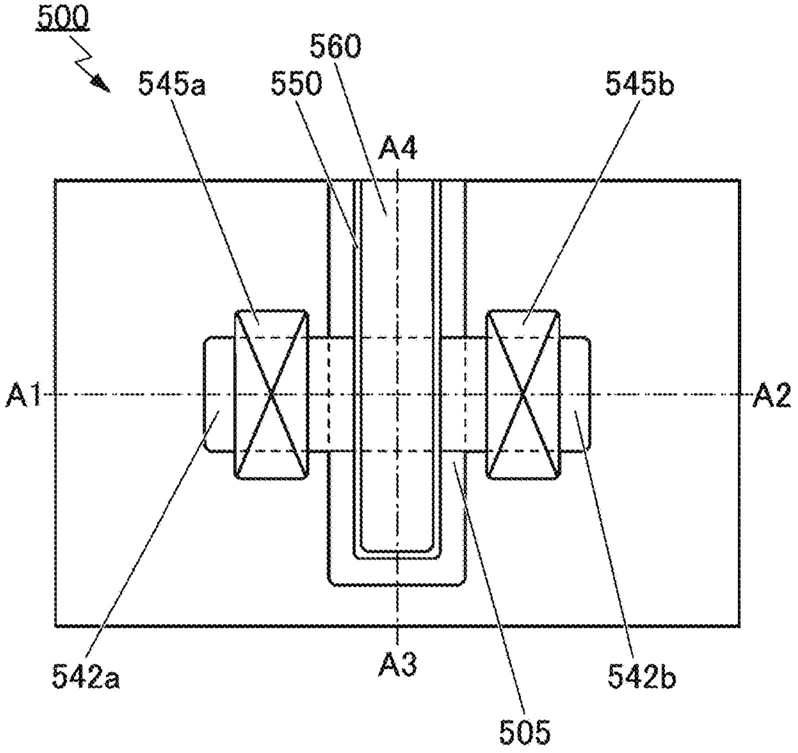
FIG. 38A is a schematic plan view illustrating a structure example of a transistor.
Figure 38C:
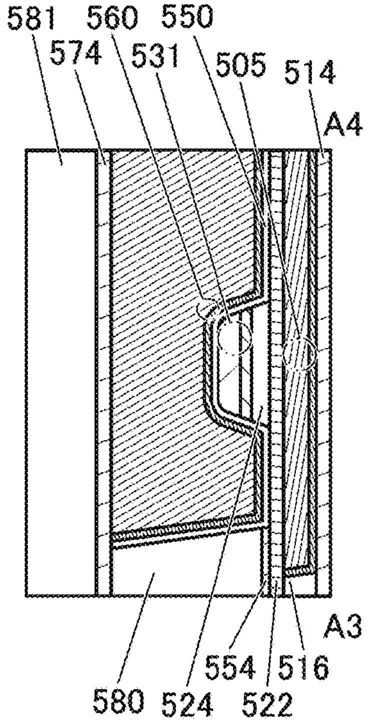
FIG. 38B and FIG. 38C are schematic cross-sectional views illustrating the structure example of the transistor.
Figure 38B:
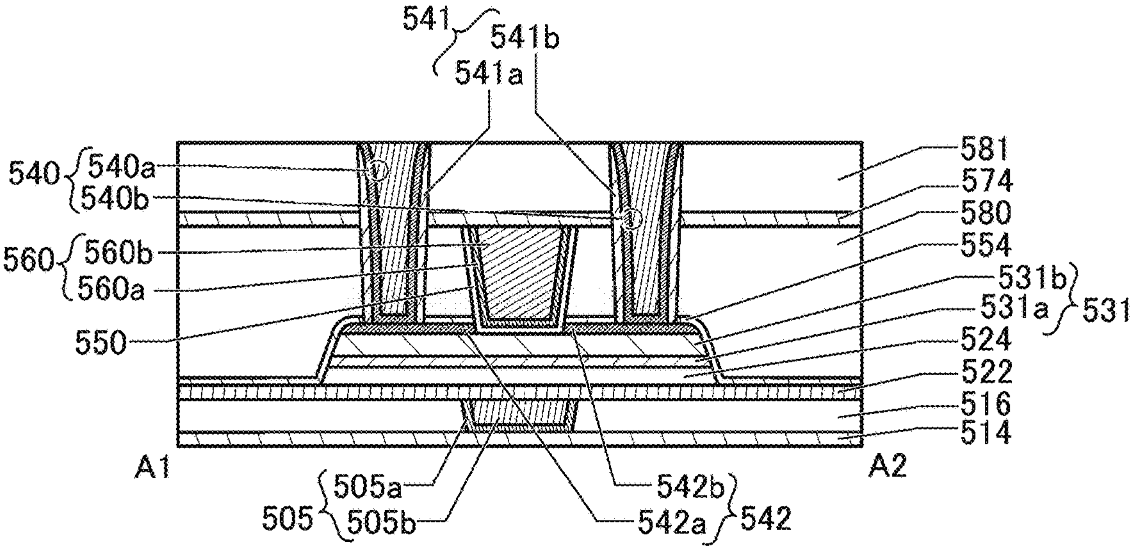

FIG. 38A, FIG. 38B, and FIG. 38C are a plan view and cross-sectional views of the transistor 500 that can be used in the semiconductor device of one embodiment of the present invention. The transistor 500 can be used in the semiconductor device of one embodiment of the present invention.

FIG. 38A is the plan view of the transistor 500. FIG. 38B and FIG. 38C are the cross-sectional views of the transistor 500. Here, FIG. 38B is a cross-sectional view of a portion indicated by the dashed-dotted line A1-A2 in FIG. 38A and is a cross-sectional view of the transistor 500 in the channel length direction. FIG. 38C is a cross-sectional view of a portion indicated by the dashed-dotted line A3-A4 in FIG. 38A and is a cross-sectional view of the transistor 500 in the channel width direction. Note that some components are omitted in the plan view of FIG. 38A for clarity of the drawing.

As illustrated in FIG. 38A to FIG. 38C, the transistor 500 includes a metal oxide 531*a* located over a substrate (not illustrated); a metal oxide 531*b* located over the metal oxide 531*a*; a conductor 542*a* and a conductor 542*b* that are located apart from each other over the metal oxide 531*b*; an insulator 580 that is located over the conductor 542*a* and the conductor 542*b* and has an opening between the conductor 542*a* and the conductor 542*b*; a conductor 560 placed in the opening; an insulator 550 located between the conductor 560 and the metal oxide 531*b*, the conductor 542*a*, the conductor 542*b*, and the insulator 580. Here, as illustrated in FIG. 38B and FIG. 38C, preferably, the top surface of the conductor 560 is substantially level with the top surfaces of the insulator 550 and the insulator 580. Hereinafter, the metal oxide 531*a* and the metal oxide 531*b* may be collectively referred to as a metal oxide 531. The conductor 542*a* and the conductor 542*b* may be collectively referred to as a conductor 542.

In the transistor 500 illustrated in FIG. 38A to FIG. 38C, the side surfaces of the conductor 542*a* and the conductor 542*b* on the conductor 560 side are substantially perpendicular. Note that the transistor 500 illustrated in FIG. 38A to FIG. 38C is not limited thereto, and the angle formed between the side surfaces and bottom surfaces of the conductor 542*a* and the conductor 542*b* may be greater than or equal to 10° and less than or equal to 80°, preferably greater than or equal to 30° and less than or equal to 60°. The side surfaces of the conductor 542*a* and the conductor 542*b* that face each other may have a plurality of surfaces.

In the transistor 500, two layers of the metal oxide 531*a* and the metal oxide 531*b* are stacked in and around a region where a channel is formed (hereinafter also referred to as a channel formation region); however, the present invention is not limited thereto. For example, a single-layer structure of the metal oxide 531*b* or a stacked-layer structure of three or more layers may be employed. Furthermore, each of the metal oxide 531*a* and the metal oxide 531*b* may have a stacked-layer structure of two or more layers.

Here, the conductor 560 functions as a gate electrode of the transistor, and the conductor 542*a* and the conductor 542*b* function as a source electrode and a drain electrode. As described above, the conductor 560 is formed to be embedded in the opening of the insulator 580 and the region sandwiched between the conductor 542*a* and the conductor 542*b*. Here, the positions of the conductor 560, the conductor 542*a*, and the conductor 542*b* are selected in a self-aligned manner with respect to the opening of the insulator 580. In other words, in the transistor 500, the gate electrode can be placed between the source electrode and the drain electrode in a self-aligned manner. Therefore, the conductor 560 can be formed without an alignment margin, resulting in a reduction in the area occupied by the transistor 500. Accordingly, the display apparatus can have high resolution. In addition, the display apparatus can have a narrow bezel.

As illustrated in FIG. 38B, the conductor 560 preferably includes a conductor 560*a* provided inside the insulator 550 and a conductor 560*b* provided to be embedded inside the conductor 560*a*. Although the conductor 560 having a stacked-layer structure of two layers is illustrated in FIG. 38B and FIG. 38C, the present invention is not limited thereto. For example, the conductor 560 may have a single-layer structure or a stacked-layer structure of three or more layers.

The transistor 500 preferably includes the insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. The metal oxide 531*a* is preferably placed over the insulator 524.

As illustrated in FIG. 38B and FIG. 38C, the insulator 554 is preferably placed between the insulator 580 and the insulator 522, the insulator 524, the metal oxide 531*a*, the metal oxide 531*b*, the conductor 542*a*, the conductor 542*b*, and the insulator 550. Here, as illustrated in FIG. 38B and FIG. 38C, the insulator 554 is preferably in contact with the side surface of the insulator 550, the top surface and side surface of the conductor 542*a*, the top surface and side surface of the conductor 542*b*, the side surfaces of the metal oxide 531*a*, the metal oxide 531*b*, and the insulator 524, and the top surface of the insulator 522.

The insulator 574 and the insulator 581 functioning as interlayer films are preferably placed over the transistor 500. Here, the insulator 574 is preferably placed in contact with the top surfaces of the conductor 560, the insulator 550, and the insulator 580.

The insulator 522, the insulator 554, and the insulator 574 preferably have a function of inhibiting diffusion of hydrogen (e.g., one or both of a hydrogen atom and a hydrogen molecule). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., one or both of an oxygen atom and an oxygen molecule). For example, the insulator 522 and the insulator 554 preferably have a lower oxygen permeability than the insulator 524, the insulator 550, and the insulator 580.

A conductor 540 (a conductor 540*a* and a conductor 540*b*) that is electrically connected to the transistor 500 and functions as a plug is preferably provided. Note that an insulator 541 (an insulator 541*a* and an insulator 541*b*) is provided in contact with the side surface of the conductor 540 functioning as a plug. In other words, the insulator 541 is provided in contact with the inner wall of an opening in the insulator 554, the insulator 580, the insulator 574, and the insulator 581. In addition, a structure may be employed in which a first conductor of the conductor 540 is provided in contact with the side surface of the insulator 541 and a second conductor of the conductor 540 is provided on the inner side of the first conductor. Here, the top surface of the conductor 540 and the top surface of the insulator 581 can be substantially level with each other. Although the transistor 500 has a structure in which the first conductor of the conductor 540 and the second conductor of the conductor 540 are stacked, the present invention is not limited thereto. For example, the conductor 540 may have a single-layer structure or a stacked-layer structure of three or more layers. In the case where a component has a stacked-layer structure, layers may be distinguished by ordinal numbers given corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531*a* and the metal oxide 531*b*). For example, it is preferable to use a metal oxide having a band gap of 2 eV or more, preferably 2.5 eV or more as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more selected from aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (H), tantalum (Ta), tungsten (W), magnesium (Mg), and cobalt (Co) can be used. In particular, the element MI is preferably one or more of aluminum (Al), gallium (Ga), yttrium (Y), and tin (Sn). The element M further preferably contains one or both of gallium (Ga) and tin (Sn).

The metal oxide 531*b* in a region that does not overlap with the conductor 542 sometimes has a smaller thickness than the metal oxide 531*b* in a region that overlaps with the conductor 542. The thin region is formed when part of the top surface of the metal oxide 531*b* is removed at the time of forming the conductor 542*a* and the conductor 542*b*. When a conductive film to be the conductor 542 is formed, a low-resistance region is sometimes formed on the top surface of the metal oxide 531*b* in the vicinity of the interface with the conductive film. Removing the low-resistance region positioned between the conductor 542*a* and the conductor 542*b* on the top surface of the metal oxide 531*b* in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 500 that can be used in the display apparatus of one embodiment of the present invention is described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505*a* and a conductor 505*b*. The conductor 505*a* is provided in contact with the bottom surface and the sidewall of the opening provided in the insulator 516. The conductor 505*b* is provided to be embedded in a depression portion formed by the conductor 505*a*. Here, the top surface of the conductor 505*b* is substantially level with the top surface of the conductor 505*a* and the top surface of the insulator 516.

For the conductor 505*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., one or both of an oxygen atom and an oxygen molecule).

When a conductive material having a function of inhibiting diffusion of hydrogen is used for the conductor 505*a*, impurities such as hydrogen contained in the conductor 505*b* can be inhibited from diffusing into the metal oxide 531 through the insulator 524. When a conductive material having a function of inhibiting diffusion of oxygen is used for the conductor 505*a*, the conductivity of the conductor 505*b* can be inhibited from being lowered because of oxidation. Examples of the conductive material having a function of inhibiting diffusion of oxygen include titanium, titanium nitride, tantalum, tantalum nitride, ruthenium, and ruthenium oxide. Thus, the conductor 505*a* may have a structure of a single layer or stacked layers of the above conductive materials. For example, titanium nitride is used for the conductor 505*a*.

For the conductor 505*b*, a conductive material containing tungsten, copper, or aluminum as its main component is preferably used. For example, tungsten is used for the conductor 505*b*.

Here, the conductor 560 sometimes functions as a first gate (sometimes also referred to as top gate, for example) electrode. The conductor 505 sometimes functions as a second gate (sometimes also referred to as bottom gate, for example) electrode. In that case, Vth of the transistor 500 can be controlled by changing a potential applied to the conductor 505 independently of a potential applied to the conductor 560. In particular, by applying a negative potential to the conductor 505, Vth of the transistor 500 can be made higher and the off-state current can be made low. Thus, a drain current at the time when a potential applied to the conductor 560 is 0 V can be lower in the case where a negative potential is applied to the conductor 505 than in the case where a negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 38C. In other words, the conductor 505 and the conductor 560 preferably overlap with each other with the insulator therebetween, in a region outside the side surface of the metal oxide 531 in the channel width direction.

With the above structure, the channel formation region of the metal oxide 531 can be electrically surrounded by electric fields of the conductor 560 having a function of the first gate electrode and electric fields of the conductor 505 having a function of the second gate electrode.

As illustrated in FIG. 38C, the conductor 505 extends to function as a wiring as well. However, without limitation to this structure, a structure in which a conductor functioning as a wiring is provided below the conductor 505 may be employed.

The insulator 514 preferably functions as a barrier insulating film that inhibits the entry of impurities such as water and hydrogen to the transistor 500 from the substrate side. Accordingly, it is preferable to use, for the insulator 514, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are unlikely to pass). Alternatively, it is preferable to use an insulating material having a function of inhibiting diffusion of oxygen (e.g., one or both of an oxygen atom and an oxygen molecule) (an insulating material through which the oxygen is unlikely to pass).

For example, aluminum oxide or silicon nitride is preferably used for the insulator 514. Accordingly, it is possible to inhibit diffusion of impurities such as water and hydrogen to the transistor 500 side from the substrate side through the insulator 514. Alternatively, it is possible to inhibit diffusion of oxygen contained in the insulator 524 to the substrate side through the insulator 514.

The permittivity of each of the insulator 516, the insulator 580, and the insulator 581 functioning as an interlayer film is preferably lower than that of the insulator 514. When a material with a low permittivity is used for an interlayer film, the parasitic capacitance generated between wirings can be reduced. For the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 each have a function of a gate insulator.

Here, the insulator 524 in contact with the metal oxide 531 preferably releases oxygen by heating. In this specification and the like, oxygen that is released by heating is referred to as excess oxygen in some cases. For example, silicon oxide or silicon oxynitride is used as appropriate for the insulator 524. When an insulator containing oxygen is provided in contact with the metal oxide 531, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{9}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably higher than or equal to 100° C. and lower than or equal to 700° C. or higher than or equal to 100° C. and lower than or equal to 400° C.

Like the insulator 514, the insulator 522 preferably functions as a barrier insulating film that inhibits the entry of impurities such as water and hydrogen into the transistor 500 from the substrate side. For example, the insulator 522 preferably has a lower hydrogen permeability than the insulator 524. When the insulator 524, the metal oxide 531, and the insulator 550 are surrounded by the insulator 522, the insulator 554, and the insulator 574, the entry of impurities such as water and hydrogen into the transistor 500 from the outside can be inhibited.

Furthermore, it is preferable that the insulator 522 have a function of inhibiting diffusion of oxygen (e.g., one or both of an oxygen atom and an oxygen molecule) (it is preferable that the oxygen be less likely to pass through the insulator 522). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium include aluminum oxide, hafnium oxide, and an oxide containing aluminum and hafnium (hafnium aluminate), or the like is preferably used. In the case where the insulator 522 is formed using such a material, the insulator 522 functions as a layer inhibiting release of oxygen from the metal oxide 531 and entry of impurities such as hydrogen into the metal oxide 531 from the periphery of the transistor 500.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over any of the above insulators.

The insulator 522 may be a single layer or a stacked layer using an insulator containing what is called a high-k material, such as aluminum oxide, hafnium oxide, tantalum oxide, zirconium oxide, lead zirconate titanate (PZT), strontium titanate ($SrTiO_3$), or (Ba,Sr)$TiO_3$ (BST). With further miniaturization and higher integration of a transistor, a problem such as generation of a leakage current may arise because of a thinned gate insulator. When a high-k material is used for the insulator functioning as a gate insulator, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed. For example, an insulator similar to the insulator 524 may be provided below the insulator 522.

The metal oxide 531 includes the metal oxide 531*a* and the metal oxide 531*b* over the metal oxide 531*a*. When the metal oxide 531*a* is provided under the metal oxide 531*b*, it is possible to inhibit diffusion of impurities into the metal oxide 531*b* from the components formed below the metal oxide 531*a*.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably greater than the atomic ratio of the element A to In in the metal oxide 531*b*.

The energy of the conduction band minimum of the metal oxide 531*a* is preferably higher than the energy of the conduction band minimum of the metal oxide 531*b*. In other words, the electron affinity of the metal oxide 531*a* is preferably smaller than the electron affinity of the metal oxide 531*b*.

Here, the energy level of the conduction band minimum gently changes at junction portions between the metal oxide 531*a* and the metal oxide 531*b*. In other words, at junction portions between the metal oxide 531*a* and the metal oxide 531*b*, the energy level of the conduction band minimum continuously changes or the energy levels are continuously connected. This can be achieved by decreasing the density of defect states in a mixed layer formed at the interface between the metal oxide 531*a* and the metal oxide 531*b*.

Specifically, when the metal oxide 531*a* and the metal oxide 531*b* contain the same element (as a main component) in addition to oxygen, a mixed layer with a low density of defect states can be formed. For example, an In—Ga—Zn oxide, a Ga—Zn oxide, or gallium oxide may be used as the metal oxide 531*a*, in the case where the metal oxide 531*b* is an In—Ga—Zn oxide.

Specifically, as the metal oxide 531*a*, a metal oxide with In:Ga:Zn=1:3:4 [atomic ratio] or 1:1:0.5 [atomic ratio] is used. As the metal oxide 531*b*, a metal oxide with In:Ga:Zn=1:1:1 [atomic ratio], 4:2:3 [atomic ratio], or 3:1:2 [atomic ratio] is used.

In this case, the metal oxide 531*b* serves as a main carrier path. When the metal oxide 531*a* has the above structure, the density of defect states at the interface between the metal oxide 531*a* and the metal oxide 531*b* can be made low. Thus, the influence of interface scattering on carrier conduction is small, and the transistor 500 can have a high on-state current and high frequency characteristics.

The conductor 542 (the conductor 542*a* and the conductor 542*b*) functioning as the source electrode and the drain electrode is provided over the metal oxide 531*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, for the conductor 542, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier density of the region in the metal oxide 531 in the vicinity of the conductor 542 increases, and the region becomes a low-resistance region.

Here, the region between the conductor 542*a* and the conductor 542*b* is formed to overlap with the opening of the insulator 580. Accordingly, the conductor 560 can be placed in a self-aligned manner between the conductor 542*a* and the conductor 542*b*.

The insulator 550 functions as a gate insulator. The insulator 550 is preferably positioned in contact with the top surface of the metal oxide 531*b*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 524, the concentration of impurities such as water or hydrogen in the insulator 550 is preferably reduced. The thickness of the insulator 550 is preferably greater than or equal to 1 nm and less than or equal to 20 nm.

An insulator may be provided between the insulator 550 and the insulator 580, the insulator 554, the conductor 542, and the metal oxide 531*b*. For the insulator, aluminum oxide, hafnium oxide, or the like is preferably used. Providing the insulator can inhibit release of oxygen from the metal oxide 531*b*, excessive supply of oxygen to the metal oxide 531*b*, oxidation of the conductor 542, and the like, for example.

A metal oxide may be provided between the insulator 550 and the conductor 560. The metal oxide preferably inhibits diffusion of oxygen from the insulator 550 to the conductor 560. Accordingly, oxidation of the conductor 560 due to oxygen in the insulator 550 can be inhibited.

The metal oxide has a function of part of the gate insulator in some cases. Therefore, when silicon oxide, silicon oxynitride, or the like is used for the insulator 550, a metal oxide that is a high-k material with a high relative permittivity is preferably used as the metal oxide. When the gate insulator has a stacked-layer structure of the insulator 550 and the metal oxide, the stacked-layer structure can be thermally stable and have a high relative permittivity. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, and magnesium can be used. It is particularly preferable to use, as the metal oxide, any of aluminum oxide, hafnium oxide, and an oxide containing aluminum and hafnium (hafnium aluminate), which are insulators each contain an oxide of one or both of aluminum and hafnium.

Although the conductor 560 has a two-layer structure in FIG. 38B and FIG. 38C, the conductor 560 may have a single-layer structure or a stacked-layer structure of three or more layers.

For the conductor 560*a*, it is preferable to use the above-described conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom. Alternatively, it is preferable to use a conductive material having a function of inhibiting diffusion of oxygen (e.g., one or both of an oxygen atom and an oxygen molecule).

When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting oxygen diffusion, for example, tantalum, tantalum nitride, ruthenium, or ruthenium oxide is preferably used.

For the conductor 560*b*, a conductive material containing tungsten, copper, or aluminum as its main component is preferably used. Furthermore, the conductor 560 also functions as a wiring and thus is preferably a conductor having high conductivity. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

As illustrated in FIG. 38A and FIG. 38C, the side surface of the metal oxide 531 is placed to be covered with the conductor 560 in a region where the metal oxide 531*b* does not overlap with the conductor 542, that is, the channel formation region of the metal oxide 531. Accordingly, the electric field of the conductor 560 functioning as the first gate electrode is likely to act on the side surface of the metal oxide 531. Thus, the on-state current of the transistor 500 can be increased and the frequency characteristics can be improved.

Like the insulator 514, the insulator 554 preferably functions as a barrier insulating film that inhibits the entry of impurities such as water and hydrogen into the transistor 500 from the insulator 580 side. For example, the insulator 554 preferably has a lower hydrogen permeability than the insulator 524. Moreover, as illustrated in FIG. 38B and FIG. 38C, the insulator 554 is preferably in contact with the side surface of the insulator 550, the top surface and side surface of the conductor 542*a*, the top surface and side surface of the conductor 542*b*, and the side surfaces of the metal oxide 531*a*, the metal oxide 531*b*, and the insulator 524. Such a structure can inhibit the entry of hydrogen contained in the insulator 580 into the metal oxide 531 through the top surfaces or side surfaces of the conductor 542*a*, the conductor 542*b*, the metal oxide 531*a*, the metal oxide 531*b*, and the insulator 524.

Furthermore, it is preferable that the insulator 554 have a function of inhibiting diffusion of oxygen (e.g., one or both of an oxygen atom and an oxygen molecule) (it is preferable that the oxygen be unlikely to pass through the insulator 554). For example, the insulator 554 preferably has a lower oxygen permeability than the insulator 580 or the insulator 524.

The insulator 554 is preferably deposited by a sputtering method. When the insulator 554 is deposited by a sputtering method in an oxygen-containing atmosphere, oxygen can be added to the vicinity of a region of the insulator 524 that is in contact with the insulator 554. Thus, oxygen can be supplied from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531. Accordingly, oxygen vacancies in the metal oxide 531 can be reduced, so that the transistor can be inhibited from having normally-on characteristics.

As the insulator 554, an insulator containing an oxide of one or both of aluminum and hafnium is preferably deposited, for example. Note that as the insulator containing an oxide of one or both of aluminum and hafnium, aluminum oxide, hafnium oxide, or an oxide containing aluminum and hafnium (hafnium aluminate) is preferably used.

The insulator 580 is provided over the insulator 524, the metal oxide 531, and the conductor 542 with the insulator 554 therebetween. The insulator 580 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, materials such as silicon oxide, silicon oxynitride, and porous silicon oxide are preferably used, in which case a region containing oxygen to be released by heating can be easily formed.

The concentration of impurities such as water or hydrogen in the insulator 580 is preferably reduced. In addition, the top surface of the insulator 580 may be planarized.

Like the insulator 514, the insulator 574 preferably functions as a barrier insulating film that inhibits the entry of impurities such as water and hydrogen into the insulator 580 from above. As the insulator 574, for example, the insulator that can be used as the insulator 514 or the insulator 554 is used.

The insulator 581 functioning as an interlayer film is preferably provided over the insulator 574. As in the insulator 524, the concentration of impurities such as water and hydrogen in the insulator 581 is preferably reduced.

The conductor **540*a* and the conductor 540*b* are placed in openings formed in the insulator 581, the insulator 574, the insulator 580, and the insulator 554. The conductor 540*a* and the conductor 540*b* are provided to face each other with the conductor 560 therebetween. Note that the top surfaces of the conductor 540*a* and the conductor 540*b* may be on the same plane as the top surface of the insulator 581**.

The insulator **541*a* is provided in contact with the inner wall of the opening in the insulator 581, the insulator 574, the insulator 580, and the insulator 554, and the first conductor of the conductor 540*a* is formed in contact with the side surface of the insulator 541*a*. The conductor 542*a* is located on part or the whole of the bottom portion of the opening, and the conductor 540*a* is in contact with the conductor 542*a*. Similarly, the insulator 541*b* is provided in contact with the inner wall of the opening in the insulator 581, the insulator 574, the insulator 580, and the insulator 554, and the first conductor of the conductor 540*b* is formed in contact with the side surface of the insulator 541*b*. The conductor 542*b* is located on part or the whole of the bottom portion of the opening, and the conductor 540*b* is in contact with the conductor 542*b***.

For the conductor **540*a* and the conductor 540*b*, a conductive material containing tungsten, copper, or aluminum as its main component is preferably used. The conductor 540*a* and the conductor 540*b*** may have a stacked-layer structure.

In the case where the conductor 540 has a stacked-layer structure, the aforementioned conductor having a function of inhibiting diffusion of impurities such as water and hydrogen is preferably used as the conductor in contact with the conductor 542, the insulator 554, the insulator 580, the insulator 574, and the insulator 581. For example, tantalum, tantalum nitride, titanium, titanium nitride, ruthenium, or ruthenium oxide is preferably used. The conductive material having a function of inhibiting diffusion of impurities such as water and hydrogen can be used as a single layer or stacked layers. The use of the conductive material can inhibit oxygen added to the insulator 580 from being absorbed by the conductor **540*a* and the conductor 540*b*. Moreover, impurities such as water or hydrogen can be inhibited from entering the metal oxide 531 through the conductor 540*a* and the conductor 540*b* from a layer above the insulator 581**.

As the insulator **541*a* and the insulator 541*b*, for example, the insulator that can be used as the insulator 554 can be used. Since the insulator 541*a* and the insulator 541*b* are provided in contact with the insulator 554, impurities such as water and hydrogen can be inhibited from entering the metal oxide 531 from the insulator 580 through the conductor 540*a* and the conductor 540*b*. Furthermore, oxygen contained in the insulator 580 can be inhibited from being absorbed by the conductor 540*a* and the conductor 540*b***.

Although not illustrated, a conductor functioning as a wiring may be placed in contact with the top surface of the conductor **540*a* and the top surface of the conductor 540*b***. For the conductor functioning as a wiring, a conductive material containing tungsten, copper, or aluminum as its train component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example is a semiconductor substrate in which an insulator region is included in the above-described semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as a leakage current may arise because of a thinned gate insulator. When a high-k material is used for the insulator functioning as a gate insulator, the voltage at the time of the operation of the transistor can be reduced while the physical thickness is maintained. By contrast, when a material with a low relative permittivity is used for the insulator functioning as an interlayer film, the parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of e.g., oxygen and impurities such as hydrogen (e.g., the insulator 514, the insulator 522, the insulator 554, and the insulator 574), the electrical characteristics of the transistor can be stable. An insulator having a function of inhibiting the passage of oxygen and impurities such as hydrogen can be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator with a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 531, oxygen vacancies included in the metal oxide 531 can be compensated for.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; or an alloy containing a combination of the above metal elements. For the conductor, it is preferable to use, for example, tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably has a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used, for example. As another example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used, for example. Indium gallium zinc oxide containing nitrogen may be used, for example. With the use of such a material, hydrogen contained in the metal oxide where the channel is formed can be captured in some cases. Alternatively, hydrogen entering from an external insulator or the like can be captured in some cases.

At least part of this embodiment can be implemented in combination with the other embodiments described in this specification as appropriate.

Embodiment 4

In this embodiment, a metal oxide (hereinafter also referred to as an oxide semiconductor) that can be used for the OS transistor described in the above embodiment will be described.

The metal oxide used for the OS transistor preferably contains at least indium or zinc, and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and is further preferably gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

Note that a crystal structure of a film or a substrate can be evaluated with an X-ray diffraction (XIRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained by GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film formed at room temperature. Thus, it is suggested that the In—Ga—Zn oxide formed at room temperature is in an intermediate state, which is neither a single crystal nor polycrystal nor an amorphous state, and it cannot be concluded that the In—Ga—Zn oxide is in an amorphous state.

[Structure of Oxide Semiconductor]

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Note that indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2q) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by one or both of entry of impurities and formation of defects, the CAAC-OS can be regarded as an oxide semiconductor that has small amounts of impurities and defects (oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region is a region including indium oxide or indium zinc oxide as its main component. The second region is a region including gallium oxide or gallium zinc oxide as its main component. That is, the first region can be rephrased as a region containing In as its main component. The second region can be rephrased as a region containing Ga as its main component.

Note that a clear boundary between the first region and the second region cannot be observed in some cases.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure in which metal elements are unevenly distributed.

The CAC-OS can be formed by a sputtering method under a condition where a substrate is not heated, for example.

Furthermore, in the case where the CAC-OS is formed by a sputtering method, any one or more selected from an inert gas (a typical example is argon), an oxygen gas, and a nitrogen gas is used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is preferably higher than or equal to 0% and lower than 30%, further preferably higher than or equal to 0% and lower than or equal to 10%.

For example, according to EDX mapping obtained using energy dispersive X-ray spectroscopy (EDX), the CAC-OS in the In—Ga—Zn oxide has a structure in which the region containing In as its main component (the first region) and the region containing Ga as its main component (the second region) are unevenly distributed and mixed.

Here, the first region is a region having higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region is a region having a higher insulating property than the first region. In other words, when the second regions are distributed in a metal oxide, a leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility (μ), and favorable switching operation can be achieved.

A transistor using the CAC-OS has high reliability. Thus, the CAC-OS is most suitable for a variety of semiconductor devices such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor with high reliability can be achieved.

It is particularly preferable to use an oxide containing indium (In), gallium (Ga), and zinc (Zn) (also referred to as "IGZO") for the semiconductor layer where a channel is formed. Alternatively, an oxide containing indium (In), aluminum (Al), and zinc (Zn) (also referred to as "IAZO") may be used for the semiconductor layer. Further alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$ In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the oxide semiconductor is set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the oxide semiconductor is preferably reduced as much as possible. Specifically, the concentration of hydrogen in the oxide semiconductor, which is measured by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

The structure described in this embodiment can be used in an appropriate combination with any of the structures described in the other embodiments.

Embodiment 5

In this embodiment, a display module that can be used for the electronic device of one embodiment of the present invention will be described.

<Structure Example of Display Module>

First, a display module including the display apparatus that can be used for the electronic device of one embodiment of the present invention will be described.

Figure 39A:
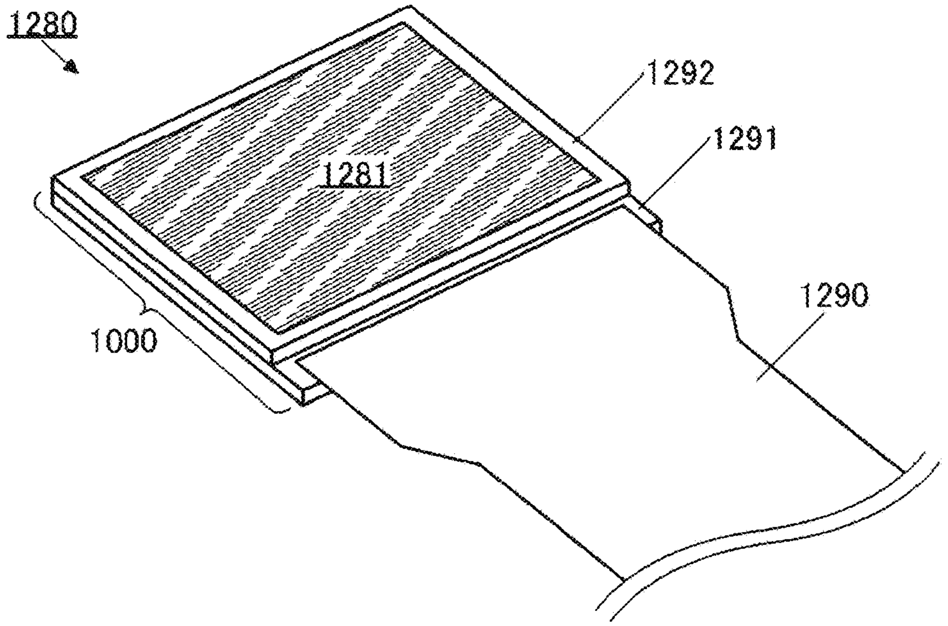
FIG. 39A and FIG. 39B are diagrams illustrating a structure example of a display module.

FIG. 39A is a perspective view of a display module 1280. The display module 1280 includes the display apparatus 1000 and an FPC 1290.

The display module 1280 includes a substrate 1291 and a substrate 1292. The display module 1280 includes a display portion 1281. The display portion 1281 is a region of the display module 1280 where an image is displayed, and is a region where light emitted from pixels provided in a pixel portion 1284 described later can be seen.

Figure 39B:
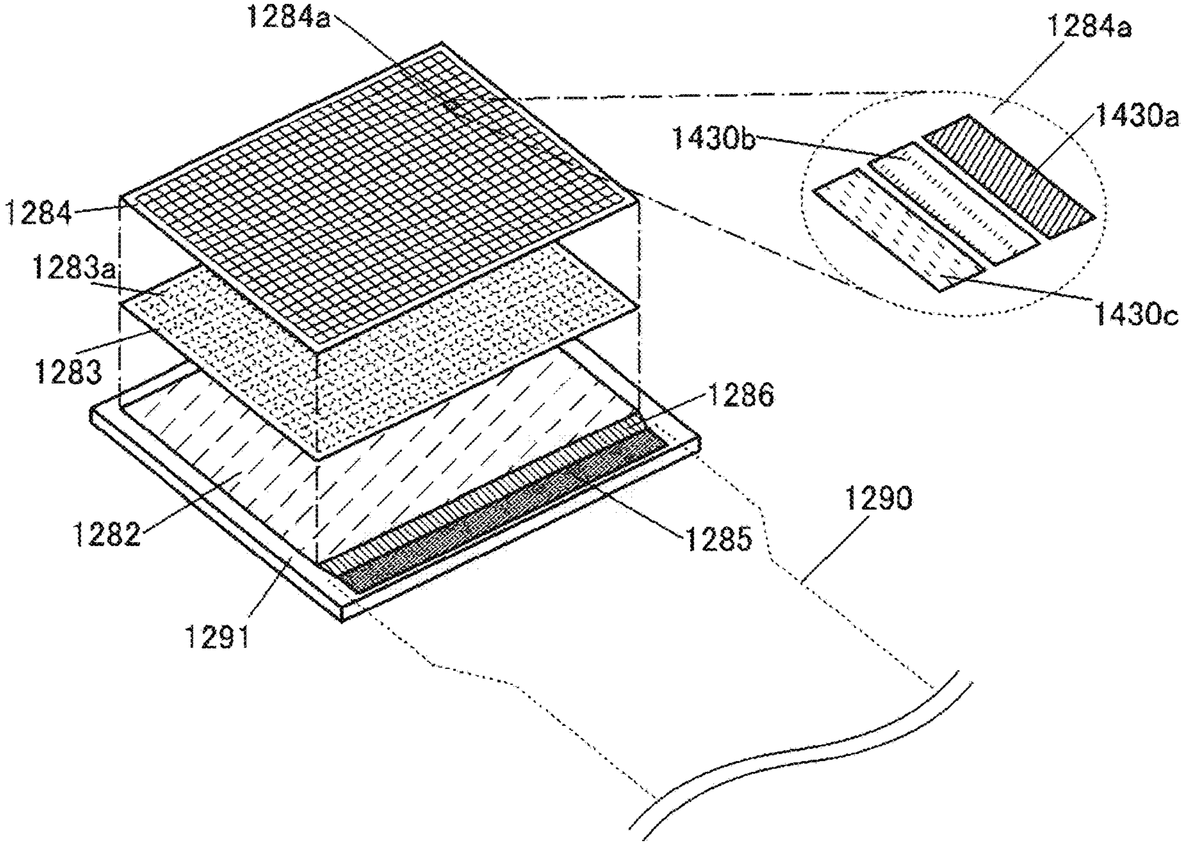

FIG. 39B is a perspective view schematically illustrating a structure on the substrate 1291 side. A circuit portion 1282, a pixel circuit portion 1283 over the circuit portion 1282, and the pixel portion 1284 over the pixel circuit portion 1283 are stacked over the substrate 1291. In addition, a terminal portion 1285 for connection to the FPC 1290 is provided in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel circuit portion 1283 correspond to the pixel layer PXAL described above, for example. The circuit portion 1282 corresponds to the circuit layer SICL described above, for example.

The pixel portion 1284 includes a plurality of pixels 1284*a* arranged periodically. An enlarged view of one pixel 1284*a* is illustrated on the right side in FIG. 39B. The pixel 1284*a* includes a light-emitting device 1430*a*, a light-emitting device 1430*b*, and a light-emitting device 1430*c* that emit light of different colors. Note that the light-emitting device 1430*a*, the light-emitting device 1430*b*, and the light-emitting device 1430*c* correspond to the light-emitting device 130R, the light-emitting device 130G, and the light-emitting device 130B described above, for example. The above-described light-emitting devices may be arranged in a stripe pattern as illustrated in FIG. 39B. Alternatively, a variety of arrangement methods, such as delta arrangement and pentile arrangement, can be employed.

The pixel circuit portion 1283 includes a plurality of pixel circuits 1283*a* arranged periodically.

One pixel circuit 1283*a* is a circuit that controls light emission from three light-emitting devices included in one pixel 1284*a*. One pixel circuit 1283*a* may be provided with three circuits each of which controls light emission from one light-emitting device. For example, the pixel circuit 1283*a* can include at least one selection transistor, one current control transistor (driving transistor), and a capacitor for one light-emitting device. In that case, a gate signal is input to a gate of the selection transistor, and a source signal is input to one of a source and a drain of the selection transistor. Thus, an active-matrix display apparatus is achieved.

The circuit portion 1282 includes a circuit for driving the pixel circuits 1283*a* in the pixel circuit portion 1283. For example, one or both of a gate line driver circuit and a source line driver circuit are preferably included. In addition, one or more selected from an arithmetic circuit, a memory circuit, and a power supply circuit may be included.

The FPC 1290 functions as a wiring for supplying an image signal, a power supply potential, or the like to the circuit portion 1282 from the outside. In addition, an IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be higher than or equal to 40% and lower than 100%, preferably higher than or equal to 50% and lower than or equal to 95%, further preferably higher than or equal to 60% and lower than or equal to 95%. Furthermore, the pixels 1284*a* can be arranged extremely densely and thus the display portion 1281 can have an extremely high resolution. For example, the pixels 1284*a* are preferably arranged in the display portion 1281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 1280 has an extremely high resolution and thus can be suitably used for a VR device such as a head-mounted display or a glasses-type AR device. For example, even with a structure in which the display portion of the display module 1280 is seen through a lens, pixels of the extremely-high-resolution display portion 1281 included in the display module 1280 are prevented from being perceived when the display portion is enlarged by the lens, so that display providing a strong sense of immersion can be performed. Without being limited thereto, the display module 1280 can be suitably used for electronic devices including relatively small display portions. For example, the display module 1280 can be suitably used for a display portion of a wearable electronic device such as a wristwatch.

Note that this embodiment can be combined with any of the other embodiments described in this specification as appropriate.

Embodiment 6

In this embodiment, examples of electronic devices each including a display apparatus will be described as examples of an electronic device of one embodiment of the present invention.

Figure 40A:
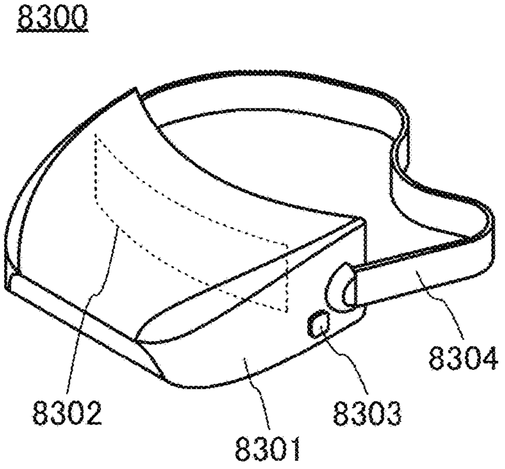
FIG. 40A to FIG. 40F are diagrams illustrating structure examples of electronic devices.
Figure 40B:
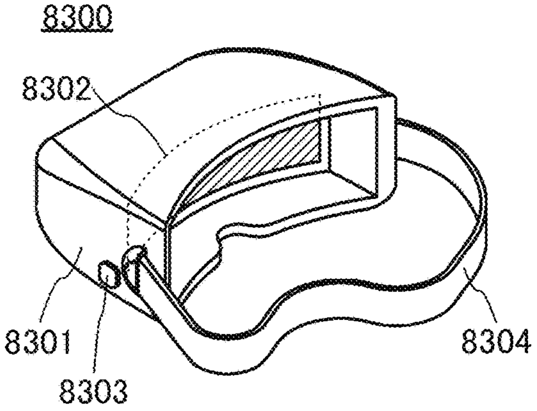

FIG. 40A and FIG. 40B each illustrate an appearance of an electronic device 8300 that is a head-mounted display.

The electronic device 8300 includes a housing 8301, a display portion 8302, an operation button 8303, and a band-shaped fixing unit 8304.

The operation button 8303 has a function of a power button or the like. The electronic device 8300 may include a button other than the operation button 8303.

Figure 40C:
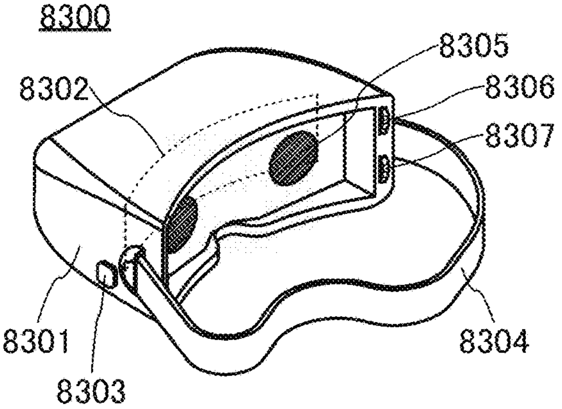

As illustrated in FIG. 40C, lenses 8305 may be included between the display portion 8302 and the positions of the user's eyes. The user can see magnified images on the display portion 8302 through the lenses 8305, leading to a higher realistic sensation. In that case, as illustrated in FIG. 40C, a dial 8306 for changing the positions of the lenses and adjusting visibility may be included.

For the display portion 8302, a display apparatus with an extremely high resolution is preferably used, for example. When a high-resolution display apparatus is used for the display portion 8302, it is possible to display a more realistic video that does not allow the user to perceive pixels even when the video is magnified using the lenses 8305 as illustrated in FIG. 40C.

FIG. 40A to FIG. 40C illustrate examples where one display portion 8302 is provided. Such a structure can reduce the number of components.

The display portion 8302 can display an image for the right eye and an image for the left eye side by side on a right region and a left region, respectively. Thus, a three-dimensional video using binocular disparity can be displayed.

One image that can be seen by both eyes may be displayed on the entire display portion 8302. A panorama video can thus be displayed from end to end of the field of view, which can provide a stronger sense of reality.

Here, the electronic device 8300 preferably has, for example, a mechanism for changing the curvature of the display portion 8302 to an optimal value in accordance with the size of the user's head, the position of the user's eyes, and the like. For example, the user himself or herself may adjust the curvature of the display portion 8302 by operating a dial 8307 for adjusting the curvature of the display portion 8302. Alternatively, a sensor for detecting the size of the user's head, the positions of the user's eyes, or the like (e.g., a camera, a contact sensor, or a noncontact sensor) may be provided on the housing 8301, and a mechanism for adjusting the curvature of the display portion 8302 on the basis of detection data obtained by the sensor may be provided.

In the case where the lenses 8305 are used, a mechanism for adjusting the positions and angle of the lenses 8305 in synchronization with the curvature of the display portion 8302 is preferably provided. Alternatively, the dial 8306 may have a function of adjusting the angle of the lenses.

Figure 40D:
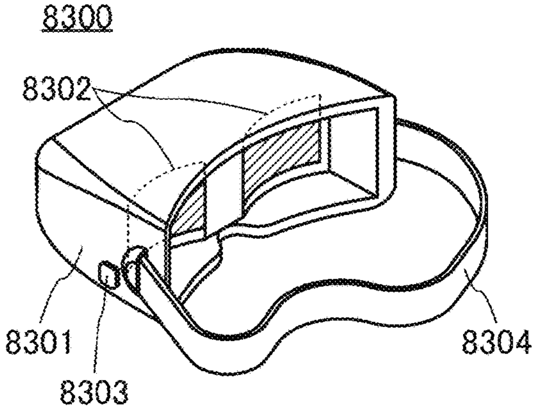
Figure 40E:
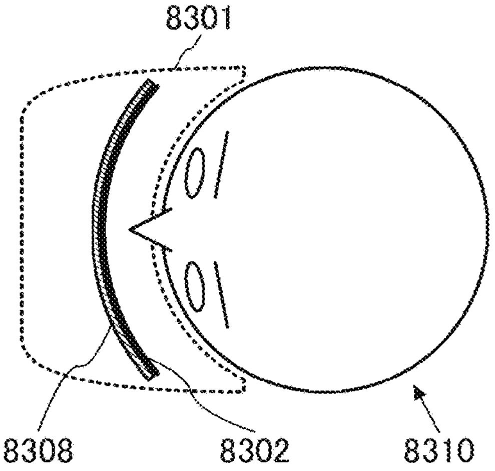
Figure 40F:
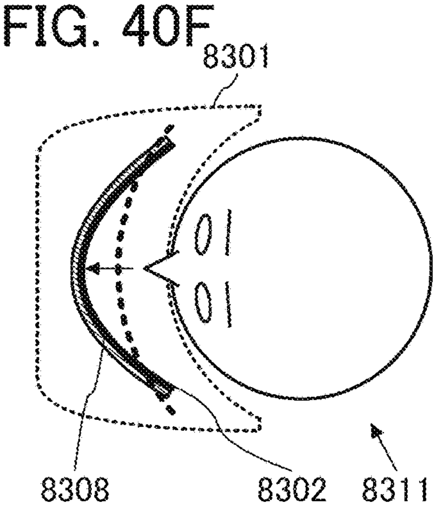

FIG. 40E and FIG. 40F illustrate an example where a driver portion 8308 controlling the curvature of the display portion 8302 is provided. The driver portion 8308 is fixed to at least part of the whole of the display portion 8302. The driver portion 8308 has a function of changing the shape of the display portion 8302 when the part that is fixed to the display portion 8302 changes in shape or moves.

FIG. 40E is a schematic view illustrating the case where a user 8310 having a relatively large head wears the housing 8301. In that case, the driver portion 8308 adjusts the shape of the display portion 8302 such that the curvature is relatively small (the radius of curvature is large).

By contrast, FIG. 40F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 such that the curvature of the display portion 8302 is large (the radius of curvature is small). In FIG. 40F, the position and shape of the display portion 8302 in FIG. 40E are denoted by a dashed line.

When the electronic device 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by fluctuating the curvature of the display portion 8302. In this way, it is possible to produce various effects depending on the scene in contents, and provide the user with new experiences. A further realistic display can be provided when the display portion 8302 operates in conjunction with a vibration module provided in the housing 8301.

Note that the electronic device 8300 may include two display portions 8302 as illustrated in FIG. 40D.

Since the two display portions 8302 are included, the user's eyes can see their respective display portions. This allows a high-definition video to be displayed even when three-dimensional display using parallax is performed. In addition, the display portion 8302 is curved around an arc with the user's eye as an approximate center. This allows a uniform distance between the user's eye and the display surface of the display portion; thus, the user can see a more natural video. Even when the luminance or chromaticity of light from the display portion is changed depending on the angle at which the user sees it, since the user's eye is positioned in a normal direction of the display surface of the display portion, the influence of the change can be substantially ignorable and thus a more realistic video can be displayed.

Figure 41A:
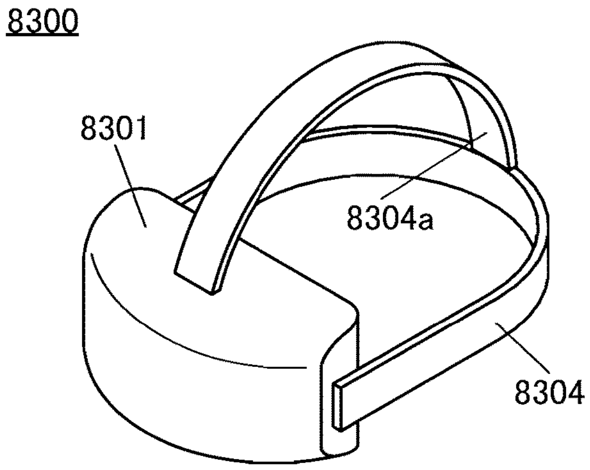
FIG. 41A to FIG. 41D are diagrams illustrating structure examples of electronic devices.
Figure 41B:
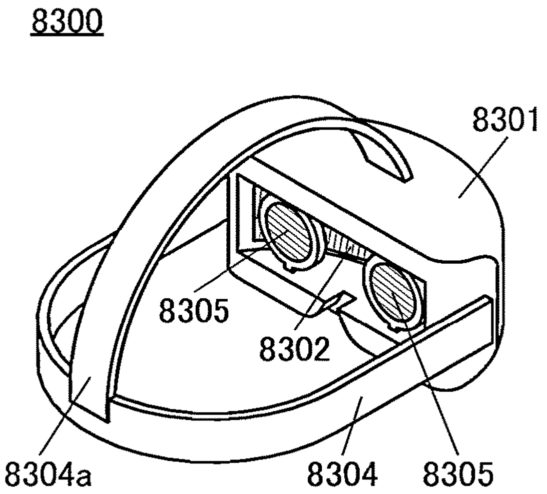
Figure 41C:
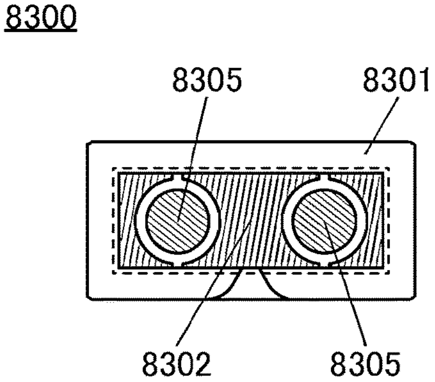

FIG. 41A to FIG. 41C are diagrams illustrating an appearance of another electronic device 8300, which is different from the electronic devices 8300 illustrated in FIG. 40A to FIG. 40D. Specifically, FIG. 41A to FIG. 41C are different from FIG. 40A to FIG. 40D in including a fixing unit 8304*a* worn on a head and a pair of lenses 8305, for example.

A user can see display on the display portion 8302 through the lenses 8305. The display portion 8302 is preferably curved so that the user can feel high realistic sensation. Another image displayed on another region of the display portion 8302 is seen through the lenses 8305, so that three-dimensional display using parallax or the like can be performed. Note that the structure is not limited to the structure in which one display portion 8302 is provided; two display portions 8302 may be provided and one display portion may be provided per eye of the user.

For the display portion 8302, a display apparatus with an extremely high resolution is preferably used, for example. When a high-resolution display apparatus is used for the display portion 8302, it is possible to display a more realistic video that does not allow the user to perceive pixels even when the video is magnified using the lenses 8305 as illustrated in FIG. 41C.

Figure 41D:
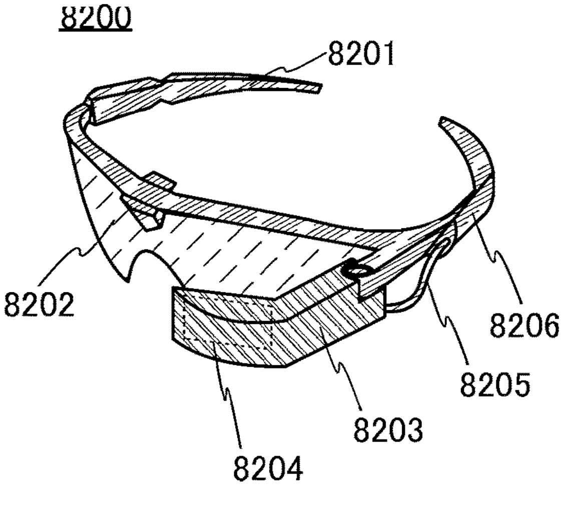

The head-mounted display, which is an electronic device of one embodiment of the present invention, may have a structure of an electronic device 8200 illustrated in FIG. 41D, which is a glasses-type head-mounted display.

The electronic device 8200 includes a mounting portion 8201, a lens 8202, a main body 8203, a display portion 8204, and a cable 8205. A battery 8206 is incorporated in the mounting portion 8201.

The cable 8205 supplies power from the battery 8206 to the main body 8203. The main body 8203 includes a wireless receiver or the like and can display received video information on the display portion 8204. The main body 8203 includes a camera, and information on the movement of the eyeballs or the eyelids of the user can be used as an input means.

The mounting portion 8201 may include a plurality of electrodes capable of sensing a current flowing accompanying with the movement of the user's eyeballs at a position in contact with the user to recognize the user's sight line. The mounting portion 8201 may also have a function of monitoring the user's pulse with use of a current flowing through the electrodes. The mounting portion 8201 may include a variety of sensors such as a temperature sensor, a pressure sensor, or an acceleration sensor to have a function of displaying the user's biological information on the display portion 8204, a function of changing a video displayed on the display portion 8204 in accordance with the movement of the user's head, and the like.

Figure 42A:
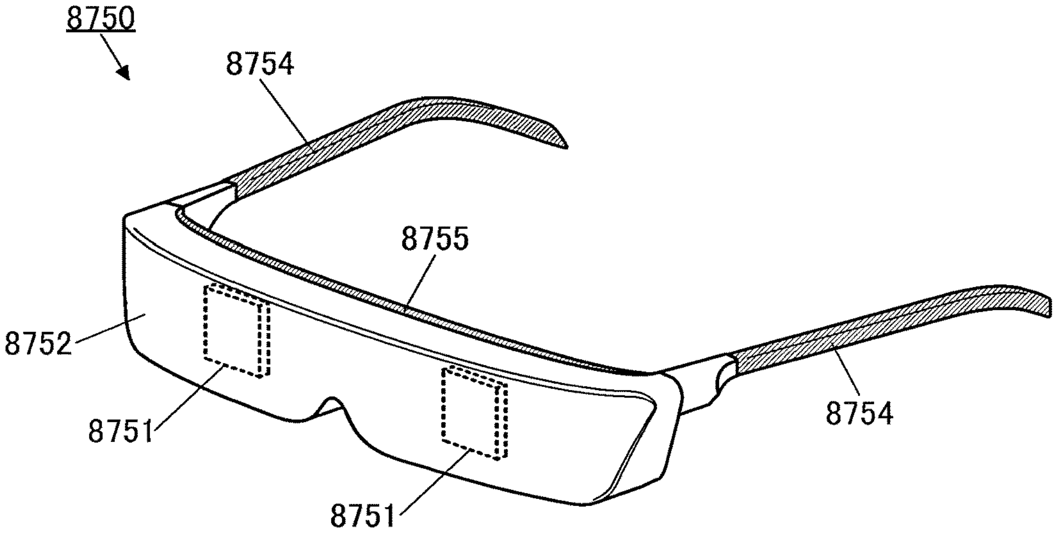
FIG. 42A to FIG. 42C are diagrams illustrating a structure example of an electronic device.
Figure 42B:
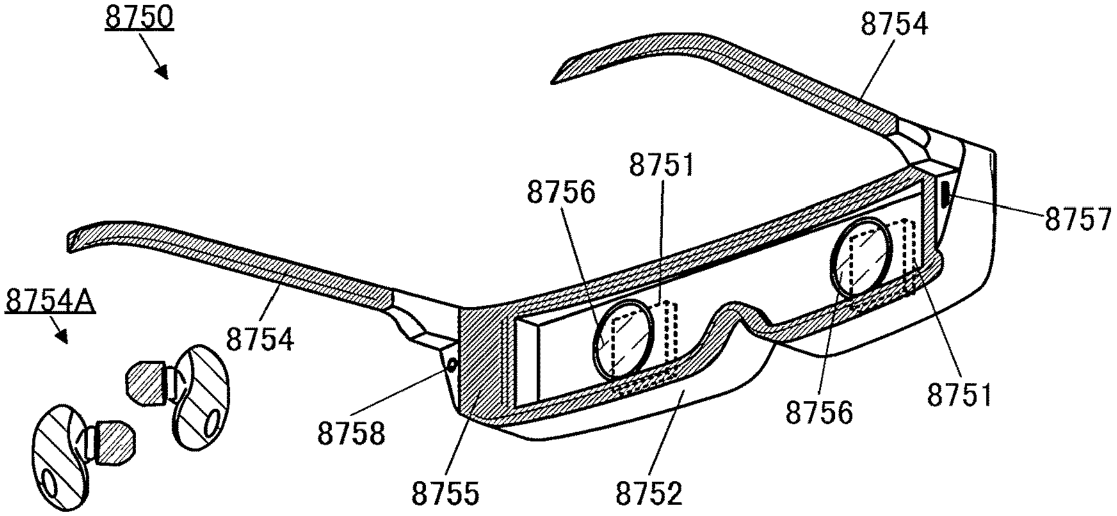
Figure 42C:
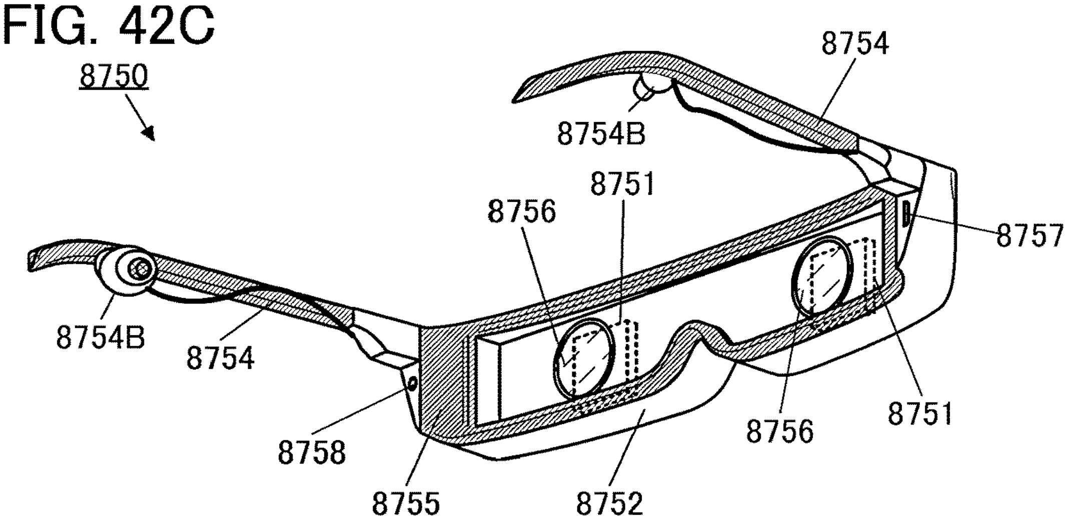

FIG. 42A to FIG. 42C are diagrams illustrating an appearance of an electronic device 8750, which is different from the electronic devices 8300 illustrated in FIG. 40A to FIG. 40D and FIG. 41A to FIG. 41C and the electronic device 8200 illustrated in FIG. 41D.

FIG. 42A is a perspective view illustrating the front surface, the top surface, and the left side surface of the electronic device 8750, and FIG. 42B and FIG. 42C are each a perspective view illustrating the back surface, the bottom surface, and the right side surface of the electronic device 8750.

The electronic device 8750 includes a pair of display apparatuses 8751, a housing 8752, a pair of mounting portions 8754, a cushion 8755, and a pair of lenses 8756. The pair of display apparatuses 8751 is located to be seen through the lenses 8756 inside the housing 8752.

Here, one of the pair of display apparatuses 8751 corresponds to the display apparatus DP illustrated in FIG. 1, for example. Although not illustrated, the electronic device 8750 illustrated in FIG. 42A to FIG. 42C includes an electronic component including the processing unit described in the above embodiment. Although not illustrated, the electronic device 8750 illustrated in FIG. 42A to FIG. 42C includes a camera. The camera can take an image of the user's eye and its periphery. Although not illustrated, in the housing 8752 of the electronic device 8750 illustrated in FIG. 42A to FIG. 42C, a motion detection portion, an audio, a control portion, a communication portion, and a battery are provided.

The electronic device 8750 is an electronic device for VR. A user wearing the electronic device 8750 can see an image displayed on the display apparatus 8751 through the lens 8756. Furthermore, the pair of display apparatuses 8751 may display different images, whereby three-dimensional display using parallax can be performed.

An input terminal 8757 and an output terminal 8758 are provided on the back side of the housing 8752. To the input terminal 8757, a cable for supplying an image signal from a video output device or the like or power or the like for charging a battery provided in the housing 8752 can be connected. The output terminal 8758 can function as, for example, an audio output terminal to which earphones or headphones can be connected.

The housing 8752 preferably includes a mechanism by which the left and right positions of the lens 8756 and the display apparatus 8751 can be adjusted to the optimal positions in accordance with the position of the user's eye. In addition, the housing 8752 preferably includes a mechanism for adjusting focus by changing the distance between the lens 8756 and the display apparatus 8751.

With use of the camera, the display apparatus 8751, and the electronic component, the electronic device 8750 can estimate the state of a user of the electronic device 8750 and can display information on the estimated user's state on the display apparatus 8751. Alternatively, information on a state of a user of an electronic device connected to the electronic device 8750 through a network can be displayed on the display apparatus 8751.

The cushion 8755 is a portion in contact with the user's face (e.g., forehead and cheek). The cushion 8755 is in close contact with the user's face, so that light leakage can be prevented, which increases the sense of immersion. A soft material is preferably used for the cushion 8755 so that the cushion 8755 is in close contact with the face of the user wearing the electronic device 8750. For example, any of materials such as rubber, silicone rubber, urethane, and sponge can be used. Furthermore, when a sponge or the like whose surface is covered with cloth or leather (e.g., natural leather or synthetic leather) is used, a gap is unlikely to be generated between the user's face and the cushion 8755, whereby light leakage can be suitably prevented. Furthermore, using such a material is preferable because it has a soft texture and the user does not feel cold when wearing the device in a cold season, for example. The member in contact with user's skin, such as the cushion 8755 or the mounting portion 8754, is preferably detachable because cleaning or replacement can be easily performed.

The electronic device in this embodiment may further include earphones 8754A. The earphones 8754A include a communication portion (not illustrated) and have a wireless communication function. The earphones 8754A can output audio data with the wireless communication function. Note that the earphones 8754A may include a vibration mechanism to function as bone-conduction earphones.

Like earphones 8754B illustrated in FIG. 42C, the earphones 8754A can be connected to the mounting portion 8754 directly or by wiring. The earphones 8754B and the mounting portion 8754 may each have a magnet. This is preferable because the earphones 8754B can be fixed to the mounting portion 8754 with magnetic force and thus can be easily housed.

The earphones 8754A may include a sensor portion. With use of the sensor portion, the state of the user of the electronic device can be estimated.

The electronic device of one embodiment of the present invention may include one or more selected from an antenna, a battery, a camera, a speaker, a microphone, a touch sensor, and an operation button, in addition to any one of the above structure examples.

The electronic device of one embodiment of the present invention may include a secondary battery, and it is preferable that the secondary battery be capable of being charged by contactless power transmission.

Examples of the secondary battery include a lithium ion secondary battery (such as a lithium polymer battery using a gel electrolyte (a lithium ion polymer battery)), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes an antenna and a secondary battery, the antenna may be used for contactless power transmission.

A display portion in an electronic device of one embodiment of the present invention can display a video with a definition of, for example, full high definition, 4K2K, 8K4K, 16K8K, or higher.

Note that this embodiment can be combined with any of the other embodiments described in this specification as appropriate.

Embodiment 7

In this embodiment, electronic devices each including a display apparatus fabricated using one embodiment of the present invention will be described.

Electronic devices described below as examples each include the display apparatus of one embodiment of the present invention in a display portion. Thus, the electronic devices achieve high resolution.

One embodiment of the present invention includes the display apparatus and one or more selected from an antenna, a battery, a housing, a camera, a speaker, a microphone, a touch sensor, and an operation button.

The electronic device of one embodiment of the present invention may include the secondary battery described in Embodiment 6, and it is preferable that the secondary battery be capable of being charged by contactless power transmission.

The electronic device of one embodiment of the present invention may include the antenna described in Embodiment 6.

A display portion in an electronic device of one embodiment of the present invention can display a video with a definition of for example, full high definition, 4K2K, 8K4K, 16K8K, or higher.

Examples of the electronic devices include electronic devices with relatively large screens, such as a television device, a laptop personal computer, a monitor device, digital signage, a pachinko machine, and a game machine. Examples of the electronic devices further include a digital camera, a digital video camera, a digital photo frame, a mobile phone, a portable game machine, a portable information terminal, and an audio reproducing device.

The electronic device using one embodiment of the present invention can be incorporated along a flat surface or a curved surface of an inside wall or an outside wall of a house or a building. The electronic device can be incorporated along a flat surface or a curved surface of an interior or an exterior of a car or the like.

[Mobile Phone]

Figure 43A:
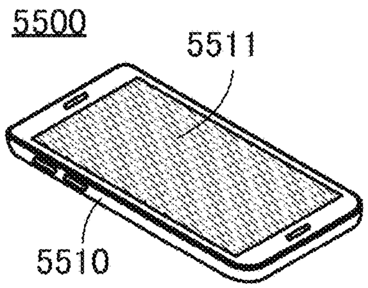
FIG. 43A to FIG. 43E are diagrams illustrating structure examples of electronic devices.

An information terminal 5500 illustrated in FIG. 43A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

[Wearable Terminal]

Figure 43B:
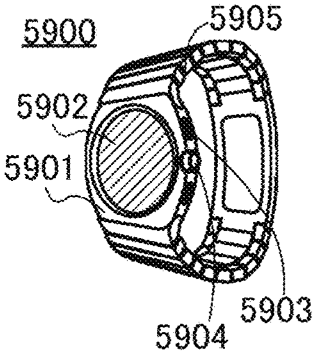

FIG. 43B is an external view of an information terminal 5900 that is an example of a wearable terminal. The information terminal 5900 includes a housing 5901, a display portion 5902, an operation button 5903, a crown 5904, and a band 5905.

[Information Terminal]

Figure 43C:
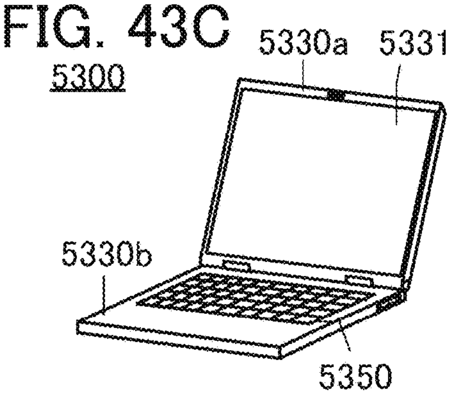

FIG. 43C illustrates a laptop information terminal 5300. The laptop information terminal 5300 illustrated in FIG. 43C includes, for example, a display portion 5331 in a housing 5330*a* and a keyboard portion 5350 in a housing 5330*b*.

Although the smartphone, the wearable terminal, and the laptop information terminal are respectively illustrated in FIG. 43A to FIG. 43C as examples of the electronic devices, one embodiment of the present invention can be used for information terminals other than a smartphone, a wearable terminal, and a laptop information terminal. Examples of information terminals other than a smartphone, a wearable terminal, and a laptop information terminal include a PDA (Personal Digital Assistant), a desktop information terminal, and a workstation.

[Camera]

Figure 43D:
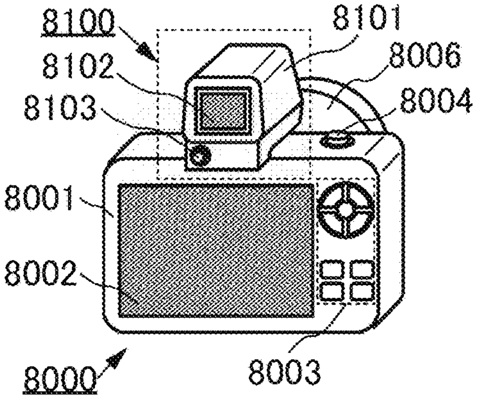

FIG. 43D is an external view of a camera 8000 to which a finder 8100 is attached.

The camera 8000 includes a housing 8001, a display portion 8002, operation buttons 8003, and a shutter button 8004. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that, in addition to the finder 8100, for example, a stroboscope can be connected to the housing.

The finder 8100 includes a housing 8101, a display portion 8102, and a button 8103.

The housing 8101 is attached to the camera 8000 with the mount engaging with a mount of the camera 8000. In the finder 8100, a video received from the camera 8000 can be displayed on the display portion 8102.

The button 8103 has a function of a power button.

The display apparatus of one embodiment of the present invention can be used for the display portion 8002 of the camera 8000 and the display portion 8102 of the finder 8100. Note that a finder may be incorporated in the camera 8000.

[Game Machine]

Figure 43E:
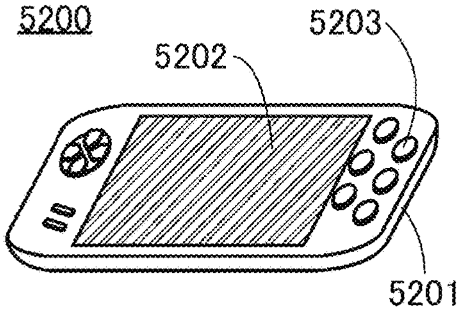

FIG. 43E is an external view of a portable game machine 5200 which is an example of a game machine. The portable game machine 5200 includes a housing 5201, a display portion 5202, and a button 5203.

Videos displayed on the portable game machine 5200 can be output with a display apparatus provided in a television device, a personal computer display, a game display, or a head-mounted display.

The portable game machine 5200 with low power consumption can be provided by applying the display apparatus described in the above embodiment to the portable game machine 5200. Moreover, heat generation from a circuit can be reduced owing to low power consumption; thus, the influence of heat generation on the circuit itself, a peripheral circuit, and a module can be reduced.

Although FIG. 43E illustrates the portable game machine as an example of a game machine, the electronic device of one embodiment of the present invention is not limited thereto. Examples of the electronic device of one embodiment of the present invention include a stationary game machine, an arcade game machine installed in entertainment facilities (e.g., a game center and an amusement park), and a throwing machine for batting practice installed in sports facilities.

Note that this embodiment can be combined with any of the other embodiments described in this specification as appropriate.

Example 1

Fabricated was a display apparatus in which the substrate BS was a semiconductor substrate containing Si as a material, a transistor included in the circuit layer SICL was a Si transistor, and a transistor included in the pixel layer PXAL was an OS transistor in the display apparatus DP illustrated in FIG. 2A. The display apparatus is described in this example.

First, comparison between a Si transistor and an OS transistor is described. Table 1 lists effective mass, energy gap, physical properties, and operation characteristics of a Si transistor and an OS transistor. In Table 1, the SiFET refers to a Si transistor formed on a semiconductor substrate containing silicon, and the ceramic OSFET refers to an OS transistor in which indium gallium zinc oxide is contained in a channel formation region.

Figure 44:
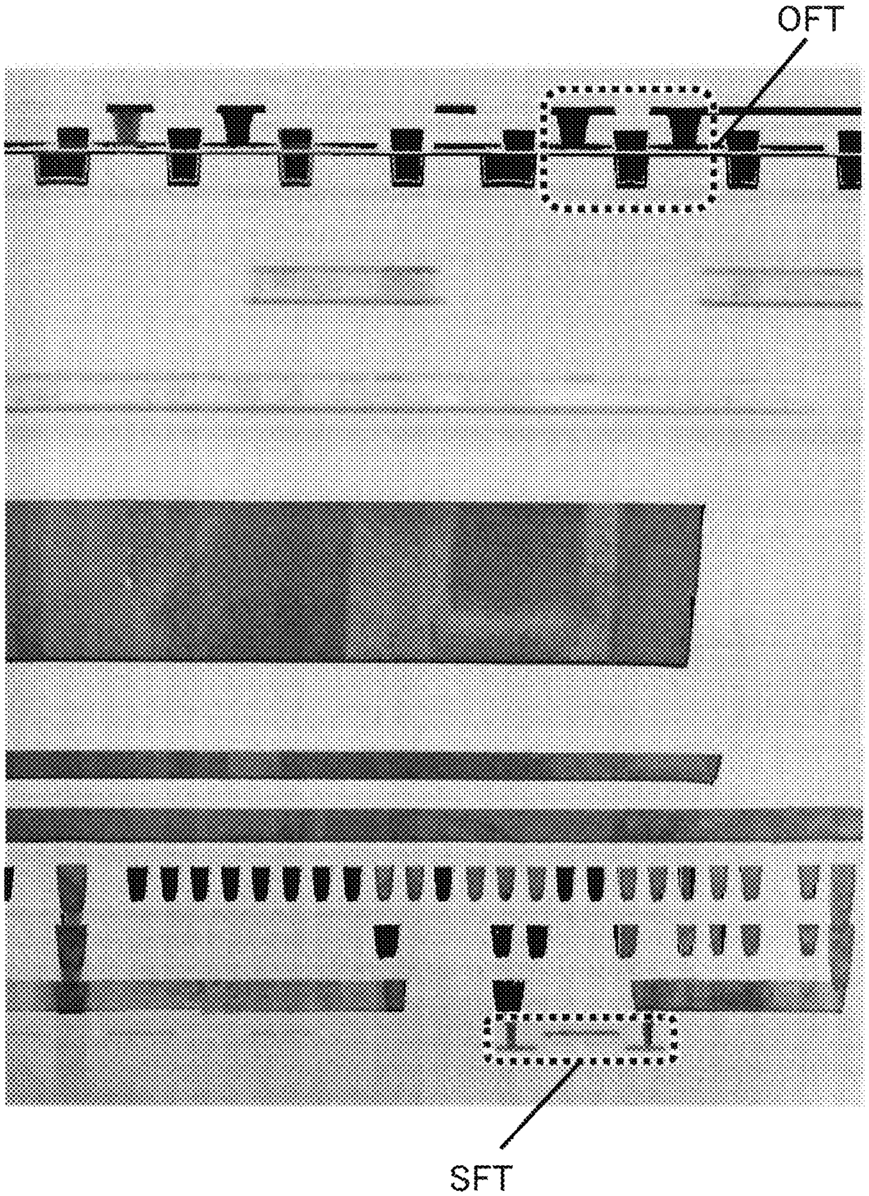
FIG. 44 is a cross-sectional image of a display apparatus mentioned in Example.

Next, FIG. 44 shows a cross-sectional image of the fabricated display apparatus. The display apparatus in FIG. 44 has a monolithic stack structure where a transistor SFT, which is a Si transistor, is provided below a transistor OFT, which is an OS transistor. In the bottom of FIG. 44, a CMOS circuit with a technology node of 55 nm is composed of a plurality of transistors SFT. In the top of FIG. 44, a pixel circuit is composed of a plurality of transistors OFT with a channel length of 200 nm and a channel width of 130 nm.

Since the OS transistor can be miniaturized as described above, for example, the channel length of the OS transistor is greater than or equal to 10 nm and less than or equal to 1000 nm so that a high-resolution display apparatus can be manufactured.

Figure 45:
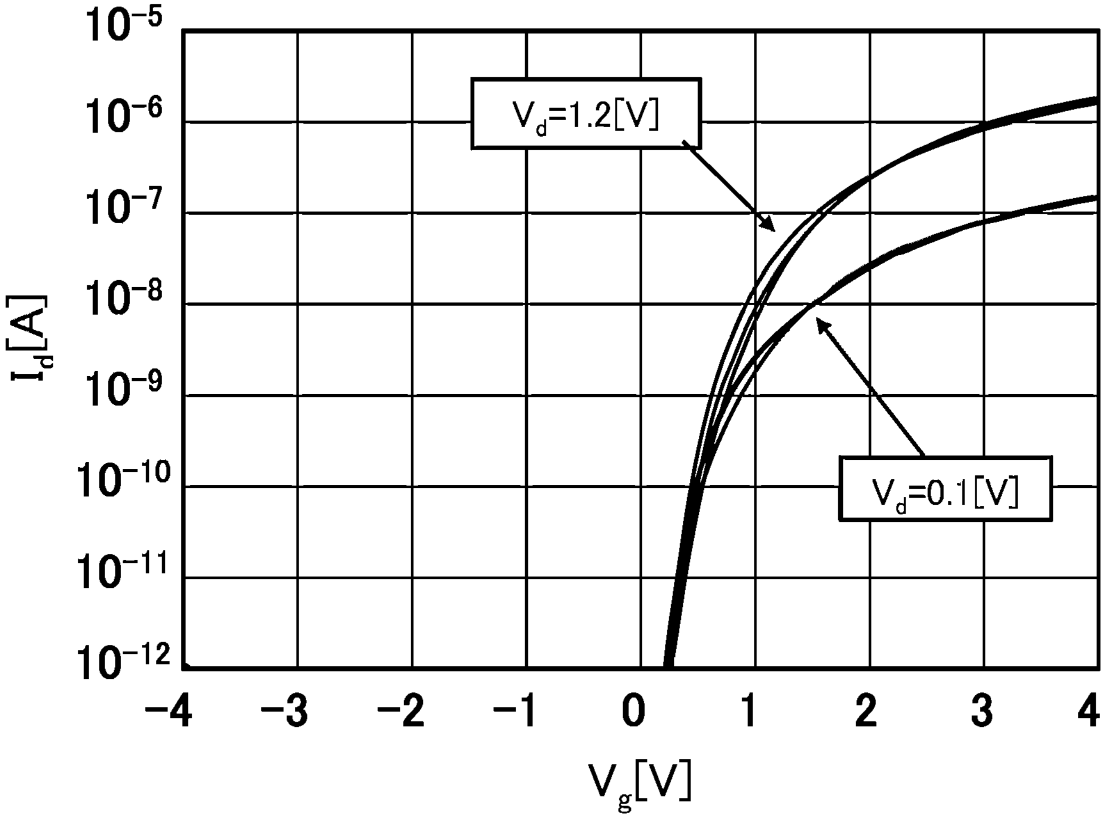
FIG. 45 is a graph showing characteristics of a gate-source voltage-drain current of a transistor included in a display apparatus mentioned in Example.

FIG. 45 shows the characteristics of the gate-source voltage-drain current of the transistor OFT in the top of FIG. 44. Note that the measurement was performed at a drain voltage $V_d$ of 0.1 V or 1.2 V. The number of transistors for the measurement was three in each of the case where $V_d$=0.1 [V] and the case where $V_d$=1.2 [V]. It was found from FIG. 45 that there were no variations in characteristics of the gate-source voltage-drain current in each of the case where $V_d$=0.1 [V] and the case where $V_d$=1.2 [V].

TABLE 1

| Region | Effective mass | Energy gap [eV] | Advantages (theoretical): Physical properties | Advantages (theoretical): Operation characteristics | Disadvantages (theoretical): Physical properties | Disadvantages (theoretical): Operation characteristics |
|---|---|---|---|---|---|---|
| SiFET | Electron: from 0.19 to 0.98 inclusive<br>Hole: from 0.16 to 0.49 inclusive | 1.12 | Substantially equal effective masses | CMOS formation | Large hot-carrier degradation<br>Large short-channel effect | Low breakdown voltage<br>Unattainable miniaturization<br>Much drain leakage |
| Ceramic OSFET | Electron: from 0.23 to 0.25 inclusive<br>Hole: from 11 to 40 inclusive | 3.2 | Effective masses different between electrons and holes<br>No hot-carrier degradation<br>No short-channel effect<br>Low Ioff | Higher breakdown voltage<br>Miniaturization<br>$10^{-24}$ A/FET | Extremely greater hole effective mass | Unattainable pMOS formation<br>Only nMOS |
| OSFET characteristics, etc. | Miniaturized FETs having high breakdown voltage can be fabricated<br>Enable extreme miniaturization, and f characteristics and fT close to those of SiFETs | | | | | |

The electron effective mass and the hole effective mass are substantially equal in a Si transistor, which enables formation of a CMOS circuit (a circuit including an n-channel transistor and a p-channel transistor). By contrast, the hole effective mass is greater than the electron effective mass in an OS transistor, which inhibits formation of a C MOS circuit.

However, compared with a Si transistor, the OS transistor has a high breakdown voltage and causes neither hot-carrier degradation nor a short-channel effect, thereby achieving miniaturization. Hence, the frequency characteristics (denoted by f characteristics in Table 1) and high cutoff frequency (denoted by fT in Table 1) of an OS transistor can be close to the frequency characteristics and the high cutoff frequency of a Si transistor. Furthermore, when the indium gallium zinc oxide in the channel formation region of the OS transistor is CAAC-OS, the carrier density of the channel formation region is low and accordingly the off-state current per OS transistor (denoted as Ioff in Table 1) is on the order of yA/FET ($10^{-24}$ A/PET).

Figure 46:
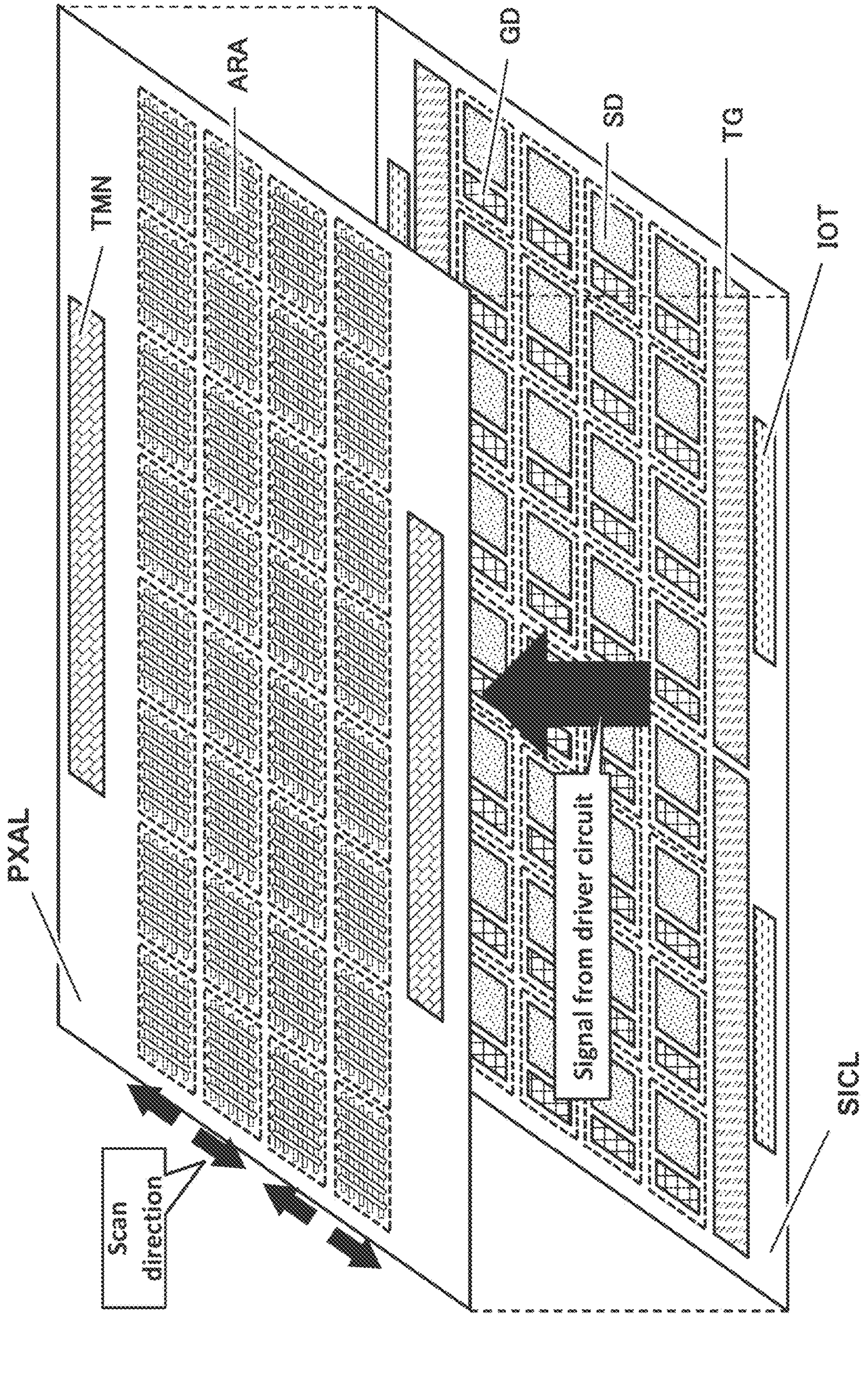
FIG. 46 is a schematic perspective view of a display apparatus mentioned in Example.

A block diagram of the fabricated display apparatus is shown in FIG. 46. The display apparatus illustrated in FIG. 46 includes the circuit layer SICL and the pixel layer PXAL located over the circuit layer SICL, like the display apparatus DP in FIG. 2A to FIG. 2C.

The use of the monolithic stack structure, where the pixel (pixel layer PXAL) is placed above and the driver circuit (the circuit layer SICL) is placed below, for the display apparatus as illustrated in FIG. 46 can reduce the size of a chip where the display apparatus is formed. The reduced chip size increases the number of chips obtained from the substrate, which can lower the cost of the display apparatus.

The display apparatus illustrated in FIG. 46 has a screen resolution of 3840×2880 (sometimes referred to as 4K3K), and a structure in which the pixel array of the pixel layer PXAL is divided into 4 rows and 8 columns. That is, the pixel array of the display apparatus in FIG. 46 is divided into 32 display regions ARA. A terminal portion TMN that can be connected to an FPC (Flexible Printed Circuit) is provided in the pixel layer PXAL.

The circuit layer SICL of the display apparatus in FIG. 46 includes 32 column driver circuits CLM, 32 row driver circuits RWD, 4 timing generators TG, and 4 input/output portions LOT. Specifically, one display region ARA of the pixel layer PXAL is placed to overlap with one column driver circuit CLM and one row driver circuit RWD. In particular, pixels included in the display region ARA are driven in accordance with signals transmitted from the column driver circuit CLM and the row driver circuit RWD that overlap with this display region ARA. That is, like the pixel layer PXAL, the circuit layer SICL includes a region divided into 4 rows and 8 columns, and each region includes the column driver circuit CLM and the row driver circuit RWD.

The column driver circuit CLM includes a source driver circuit and a first register. The source driver circuit has a function of transmitting an image signal to the pixels in the corresponding display region ARA. The first register has a function of retaining information such as the operation timing of the source driver circuit.

The row driver circuit RWD includes a gate driver circuit and a second register. The gate driver circuit has a function of transmitting a selection signal to the pixels in the corresponding display region ARA. The second register has a function of retaining information such as the scan direction and the operation timing of the gate driver circuit.

The timing generator TG has a function of generating a clock signal to be transmitted to the column driver circuit CLM and the row driver circuit RWD in order to operate the column driver circuit CLM and the row driver circuit RWD included in one of the regions divided into 4 rows and 8 columns in synchronization.

The input/output portion IOT has a function of an interface for transmitting an image signal to a circuit included in the circuit layer SICL from the outside of the display apparatus through the terminal portion TMN. Furthermore, power for driving a circuit included in the display apparatus is supplied to the input/output portion IOT through the terminal portion TMN.

Next, Table 2 lists the specifications of the display apparatus in FIG. 46. As shown in Table 2, the display apparatus in FIG. 46 has a screen diagonal size of 1.50 inches and a definition of 3207 ppi. A light-emitting device including organic EL (hereinafter, referred to as an OLED) is used for the pixel of the pixel layer PXAL.

TABLE 2

| | |
|---|---|
| Screen diagonal | 1.50" |
| Resolution | 3840 × 2880 |
| Pixel size | 7.92 μm × 7.92 μm |
| Pixel density | 3207 ppi |
| Aperture ratio | 53.7% |
| Pixel arrangement | S-stripe |
| Coloring method | SBS |
| Emission type | Top emission |
| CMOS Process | 55 nm HV (1.2 V/6.0 V) |
| Source driver | Integrated |
| Scan driver | Integrated |

The plurality of pixels included in the pixel array, in particular, are formed by patterning of light-emitting devices by a photolithography method. Accordingly, as compared with the normal FMM (fine metal mask), alignment accuracy for forming an OLED can be increased and high aperture ratio can be achieved accordingly. Furthermore, since the pixels are formed by a photolithography method, the OLEDs in the subpixels can be easily separated from each other, whereby leakage current flowing between the subpixels can be prevented. That is, the leakage current can be prevented from causing the OLEDs to emit light at a time.

Furthermore, in the display apparatus in FIG. 46, different OLEDs are formed for the respective colors, and thus an SBS (patterning) method is used as the colorization method of the display apparatus. The current efficiency of the OLED using the SBS method can be approximately three to four times as high as the current efficiency of the OLED using a method of white OLEDs+color filters (coloring layers). Thus, the display apparatus employing the SBS method can have lower power consumption than the display apparatus employing the method of white OLEDs+color filters (coloring layers).

Table 3 shows advantages of the display apparatus with the monolithic stack structure of OS transistors and Si transistors employing the SBS (patterning) method in contrast to a display apparatus formed with a semiconductor substrate employing the method of white OLEDs+color filters (coloring layers).

TABLE 3

| | |
|---|---|
| 1. Aperture ratio | The aperture ratio is not restricted by a fine metal mask and can be increased. |
| 2. Color purity | Color mixture due to color filters and lateral leakage can be prevented. |
| 3. Viewing angle | The viewing angle can be widened because of no effect of adjacent color filters. |
| 4. Power | OLEDs by an SBS method have high current efficiency. At the same luminance, an SBS method can achieve lower power consumption than a method of white OLEDs + color filters. Reduction in power consumption due to the monolithic OS/Si stack structure can be expected. |
| 5. Cost | A chip size can be reduced by the monolithic OS/Si stack structure. This increases chips obtained from one substrate, reducing cost. |

Figure 47:
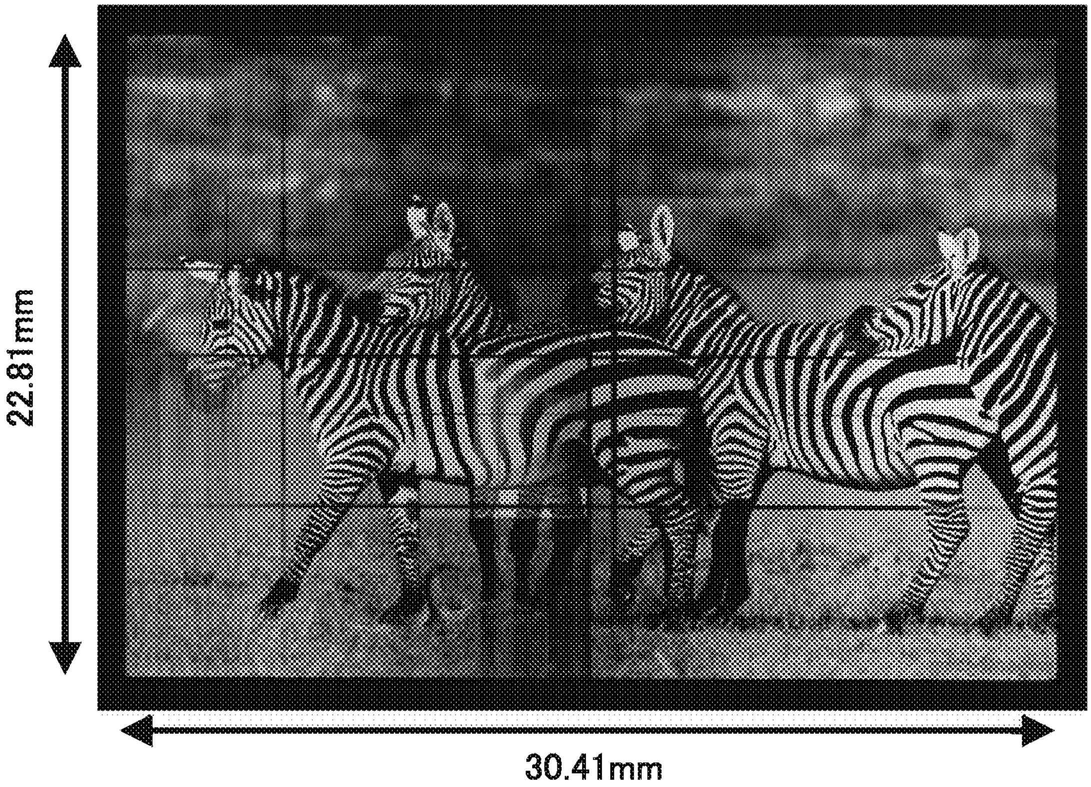
FIG. 47 is a photograph of a state where an image is displayed on a display apparatus mentioned in Example.

Next, FIG. 47 shows a photograph of an image displayed by the display apparatus in FIG. 46. FIG. 47 demonstrates that image display on the entire screen can be achieved by the display apparatus with the monolithic stack structure of an OS transistor and a Si transistor employing the SBS (patterning) method.

Example 2

This example explains estimation of power consumed when an image is displayed on the display portion DIS illustrated in FIG. 2A, FIG. 3A, and FIG. 3B.

The display portion for the estimation has a structure in which the display portion DIS in FIG. 2A, FIG. 3A, and FIG. 3B employs a semiconductor substrate containing silicon as a material as the substrate BS, a Si transistor as the transistor included in the driver circuit region DRV, and an OS transistor as the transistor included in the pixel layer PXAL. The display pixel included in the pixel layer PXAL is a light-emitting device containing an organic EL material.

The diagonal size of the display portion for the estimation is 1.50 inches, and the pixel array of the display portion is divided into 4 rows and 8 columns. In other words, the display portion has a structure in which the pixel array ALP in FIG. 3A includes 32 display regions ARA where p=4 and q=8.

Figure 48A:
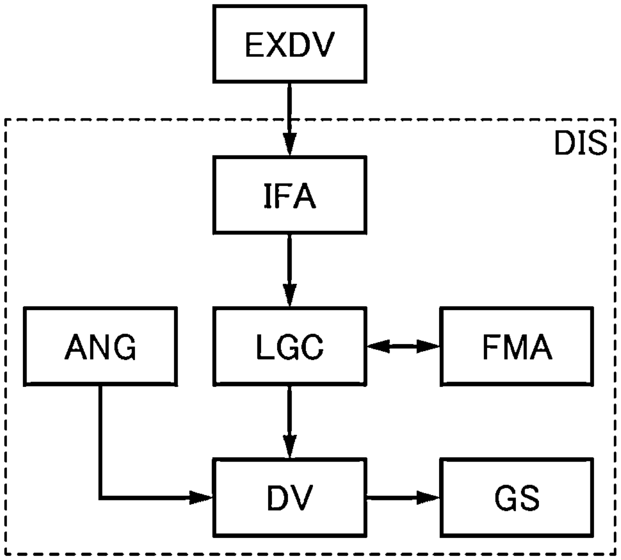
FIG. 48A is a block diagram illustrating a structure of a display portion mentioned in Example and FIG. 48B is a diagram illustrating a display region of the display portion mentioned in Example.

FIG. 48 is a block diagram illustrating a structure of the display portion for the estimation. The display portion DIS includes an interface IFA, a controller LGC, a frame memory FMA, and an analog circuit ANG, a division driver DV, and a pixel array GS.

The interface IFA of the display portion DIS is electrically connected to a transmission circuit EXDV outside the display portion. In the display portion DIS, the interface IFA is electrically connected to the controller LGC and the controller LGC is electrically connected to the frame memory FMA and the division driver DV. In addition, the division driver DV is electrically connected to the analog circuit ANG and the pixel array GS.

The description of the interface IF in the above embodiment is referred to for the interface IFA.

The description of the control portion CTL in the above embodiment is referred to for the controller LGC.

The description of the frame memory FM in the above embodiment is referred to for the frame memory FMA.

The division driver DV includes all the row driver circuits RWD and the column driver circuits CLM included in the driver circuit region DRV described in the above embodiment.

The description of the pixel array ALP in the above embodiment is referred to for the pixel array GS.

The analog circuit ANG has a function of converting image data that is digital data into an analog potential. In other words, the analog circuit ANG includes a digital-analog converter circuit (DAC), which is placed outside the division driver DV in the display portion DIS of this example, unlike in the above embodiment where it is placed in the column driver circuit CLM in the dividing driver DV.

Figure 48B:
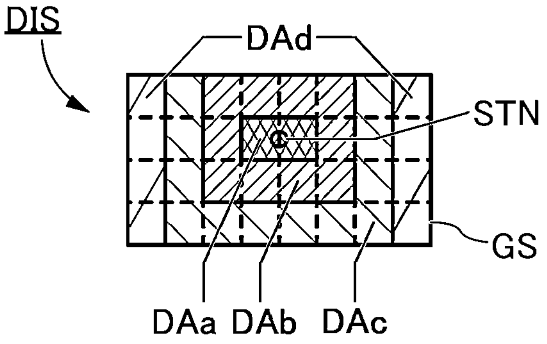

Next, as illustrated in FIG. 48B, a region STN of the user's gaze point is set in the above display portion DIS, and the display region over the pixel array ALP is divided into a region DAa, a region DAb, a region DAc, and a region DAd in ascending order according to the distance from the region STN. The driving conditions (frame frequency and screen resolution) for image display on the region DAa, the region DAb, the region DAc, and the region DAd are set as shown in Table 4.

TABLE 4

| | Conditions A | | Conditions B | | Conditions C | |
|---|---|---|---|---|---|---|
| Region | Frame frequency | Screen resolution | Frame frequency | Screen resolution | Frame frequency | Screen resolution |
| Region DAa | 120 Hz | Normal | 120 Hz | Normal | 120 Hz | Normal |
| Region DAb | 120 Hz | Normal | 90 Hz | Normal | 90 Hz | ½ of normal |
| Region DAc | 120 Hz | Normal | 60 Hz | Normal | 60 Hz | ¼ of normal |
| Region DAd | 120 Hz | Normal | 30 Hz | Normal | 30 Hz | ⅛ of normal |

Figure 49:
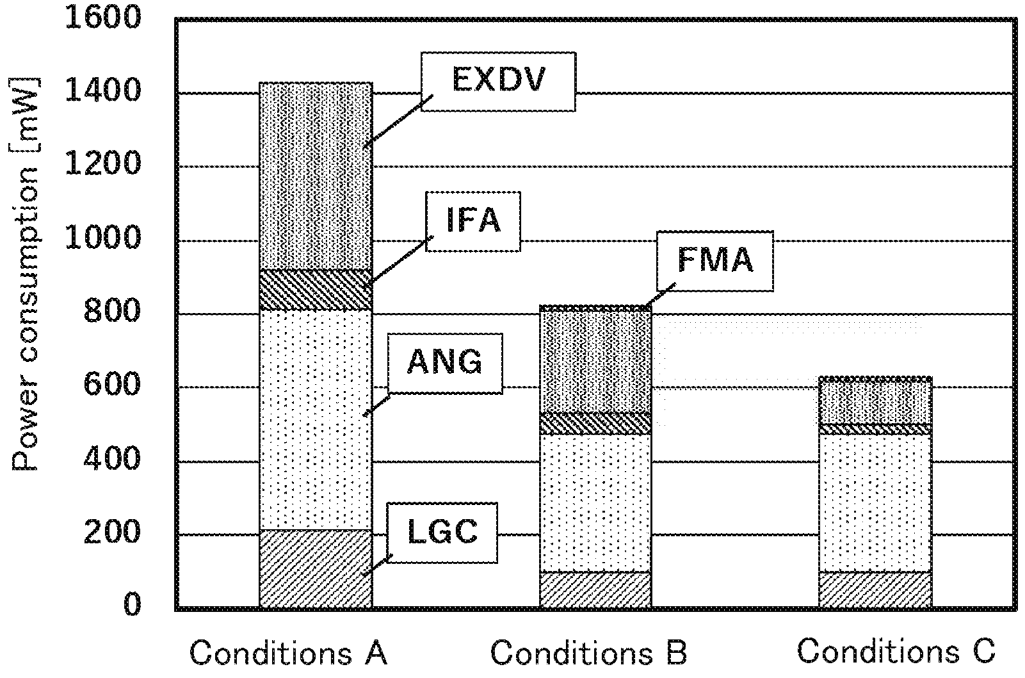
FIG. 49 is a graph showing power consumption of a display apparatus estimated in Example.

FIG. 49 shows the estimation results of power consumption of the display portion DIS when the display portion DIS is driven as shown in the above table.

Under Conditions B and Conditions C, the frame frequency of the display region included in the region DAa close to the region STN was made high and the frame frequencies of the display regions included in the region DAb, the region DAc, and the region DAd were decreased in this order. Consequently, it is confirmed from FIG. 49 that the power consumption under each of Conditions B and Conditions C is lower than the power consumption under Conditions A, where the display portion DIS was entirely driven at a frame frequency of 120 Hz. In particular, driving the display portion DIS under Conditions B results in an approximately 42% reduction in power consumption from driving the display portion DIS under Conditions A. Furthermore, it is confirmed that Conditions C, where the screen resolutions of the region DAa, the region DAb, the region DAc, and the region DAd, were decreased as in Conditions C, achieve lower power consumption than Conditions A and Conditions B. In particular, driving the display portion DIS under Conditions C results in an approximately 56% reduction in power consumption from driving the display portion DIS under Conditions A.

REFERENCE NUMERALS

DP: display apparatus, DIS: display portion, ALP: pixel array, DRV: driver circuit region, IF: interface, CTL: control portion, SHB: light-emitting portion for image capturing, SJB: light-receiving portion for image capturing, BS: substrate, SICL: circuit layer, LINL: wiring layer, PXAL: pixel layer, LIA: region, ARA: display region, ARD: circuit region, FM: frame memory, RWD: row driver circuit, CLM: column driver circuit, TXD: sensor row driver circuit, POD: sensor column driver circuit, SD: driver circuit, SDa: circuit, GD: driver circuit, PU: pixel, PU_R: pixel, PU_L: pixel, PX: display pixel, PV: imaging pixel, GL: wiring, SL: wiring, TXL: wiring, POL: wiring, PSR: region, PSR-_F: region, PSR_QT: region, ALPa: region, ALPb: region, ALPc: region, ALPd: region, ALPe: region, ASU: region, ASU_AF: region, SWa: switch, SWb: switch, SWc: switch, SWd: switch, Da: data, Db: data, Dc: data, Dd: data, Dv2: data, Dv3: data, Dv4: data, HMD: electronic device, KYT: housing, DP_L: display apparatus, DP_R: display apparatus, SHB_L: light-emitting portion for image capturing, SHB_R: light-emitting portion for image capturing, SJB_L: light-receiving portion for image capturing, SJB_R: light-receiving portion for image capturing, LNS: lens, LGTI: light, LGTI_L: light, LGTI_R: light, LGTR: light, LGTR_L: light, LGTR_R: light, ME: eye, ME_L: left eye, ME_R: right eye, SK: optic nerve, MM: retina, MYT: ciliary body, MRM: choroid, KYM: sclera, SST: crystalline lens, GT: vitreous body, KM: cornea, CSK: fovea, YH: macula, EML: layer, OSL: layer, GL1: wiring, GL2: wiring, GL3: wiring, ANO: wiring, VCOM: wiring, V0: wiring, EXDV: transmission circuit, IFA: interface, FMA: frame memory, ANG: analog circuit, GS: pixel array, DAa: region, DAb: region, DAc: region, DAd: region, STN: region, OFT: transistor, SFT: transistor, TMN: terminal portion, LOT: input/output portion, 70A: pixel, 70B: pixel, 80: pixel, 80*a*: subpixel, 80*b*: subpixel, 80*c*: subpixel, 80*d*: subpixel, 107: adhesive layer, 110: substrate, 112*a*: conductor, 112*b*: conductor, 112*c*: conductor, 112*d*: conductor, 113*a*: first layer, 113*b*: second layer, 113*c*: third layer, 113*d*: layer, 114: common layer, 115: common electrode, 118*a*: mask layer, 125: insulator, 126*a*: conductor, 126*b*: conductor, 126*c*: conductor, 126*d*: conductor, 127: insulator, 128: layer, 129*a*: conductor, 129*b*: conductor, 129*c*: conductor, 129*d*: conductor, 130: light-emitting device, 130R: light-emitting device, 130G: light-emitting device, 130B: light-emitting device, 131: protective layer, 131*a*: protective layer, 131*b*: protective layer, 131*c*: protective layer, 140: connection portion, 150: light-receiving device, 166*a*: coloring layer, 166*b*: coloring layer, 166*c*: coloring layer, 200: transistor, 300: transistor, 300A: transistor, 3000S: transistor, 310: substrate, 310A: substrate, 312: element isolation layer, 313: semiconductor region, 314*a*: low-resistance region, 314*b*: low-resistance region, 315: insulator, 316: conductor, 317: insulator, 318A: insulator, 319A: conductor, 320: insulator, 320A: insulator, 322: insulator, 322A: insulator, 324: insulator, 324A: insulator, 326: insulator, 326A: insulator, 328: conductor, 328A: conductor, 330: conductor, 330A: conductor, 350: insulator, 350A: insulator, 352: insulator, 354: insulator, 356: conductor, 358: conductor, 372: insulator, 376: conductor, 380: insulator, 382: insulator, 400: pixel circuit, 400A: pixel circuit, 400B: pixel circuit, 400C: pixel circuit, 400D: pixel circuit, 400E: pixel circuit, 400F: pixel circuit, 400G: pixel circuit, 400H: pixel circuit, 410: driver circuit, 500: transistor, 500A: transistor, 500B: transistor, 500C: transistor, 500D: transistor, 505: conductor, 505*a*: conductor, 505*b*: conductor, 512: insulator, 514: insulator, 516: insulator, 519: insulator, 522: insulator, 524: insulator, 540: conductor, 540*a*: conductor, 540*b*: conductor, 541: insulator, 541*a*: insulator, 541*b*: insulator, 542: conductor, 542*a*: conductor, 542*b*: conductor, 550: insulator, 554: insulator, 560: conductor, 560*a*: conductor, 560*b*: conductor, 574: insulator, 580: insulator, 581: insulator, 592: insulator, 594: insulator, 596: conductor, 597: conductor, 598: insulator, 599: insulator, 600: capacitor, 600A: capacitor, 761: lower electrode, 762: upper electrode, 763: EL layer, 764: layer, 771: light-emitting layer, 771*a*: light-emitting layer, 771*b*: light-emitting layer, 771*c*: light-emitting layer, 772: light-emitting layer, 772*a*: light-emitting layer, 772*b*: light-emitting layer, 772*c*: light-emitting layer, 773: light-emitting layer, 780: layer, 780*a*: layer, 780*b*: layer, 780*c*: layer, 781: layer, 782: layer, 785: charge-generation layer, 790: layer, 790*a*: layer, 790*b*: layer, 790*c*: layer, 791: layer, 792: layer, 1000: display apparatus, 1000A: display apparatus, 1000B1: display apparatus, 1000B2: display apparatus, 1000B4: display apparatus, 1000E: display apparatus, 1000F: display apparatus, 1000G: display apparatus, 1280: display module, 1281: display portion, 1290: FPC, 1282: circuit portion, 1283: pixel circuit portion, 1283*a*: pixel circuit, 1284: pixel portion, 1284*a*: pixel, 1285: terminal portion, 1286: wiring portion, 1291: substrate, 1292: substrate, 1430*a*: light-emitting device, 1430*b*: light-emitting device, 1430*c*: light-emitting device, 5200: portable game machine, 5201: housing, 5202: display portion, 5203: button, 5300: laptop information terminal, 5330*a*: housing, 5330*b*: housing, 5331: display portion, 5350: keyboard portion, 5500: information terminal, 5510: housing, 5511: display portion, 5900: information terminal, 5901: housing, 5902: display portion, 5903: operation button, 5904: crown, 5905: band, 8000: camera, 8001: housing, 8002: display portion, 8003: operation button, 8004: shutter button, 8006: lens, 8100: finder, 8101: housing, 8102: display portion, 8103: button, 8200: electronic device, 8201: mounting portion, 8202: lens, 8203: main body, 8204: display portion, 8205: cable, 8206: battery, 8300: electronic device, 8301: housing, 8302: display portion, 8303: operation button, 8304: fixing unit, 8304*a*: fixing unit, 8305: lens, 8310: user, 8311: user, 8750: electronic device, 8751: display apparatus, 8752: housing, 8754: mounting portion, 8754A: earphone, 8754B: earphone, 8755: cushion, 8756: lens, 8757: input terminal, 8758: output terminal

The invention claimed is:

1. A display apparatus comprising:

a display portion;

a light-emitting portion;

a light-receiving portion; and a control portion, wherein the display portion comprises a first display region and a first circuit region, wherein the first display region and the first circuit region overlap with each other, wherein the first display region comprises a plurality of display pixels comprising a first display pixel and a second display pixel, wherein the first circuit region comprises a first driver circuit, wherein the first driver circuit is electrically connected to a first wiring and a second wiring which are extended in the first display region, wherein the first display pixel and the second display pixel are electrically connected to the first wiring and the second wiring, respectively, wherein the light-receiving portion is electrically connected to the control portion, wherein the control portion is electrically connected to the first driver circuit, wherein the light-emitting portion is configured to emit first light, wherein the light-receiving portion is configured to detect second light that is reflected by irradiation of an object with the first light and configured to generate information based on the second light and transmit the information to the control portion, wherein the control portion is configured to generate a first signal based on the information and transmit the first signal to the first driver circuit, and wherein the first driver circuit is configured to perform, in accordance with the first signal, one of transmission of image signals to the first wiring and the second wiring, respectively, and transmission of the same image signal to the first wiring and the second wiring which are consecutive adjacent to each other.

2. The display apparatus according to claim 1, wherein the display portion further comprises a second display region and a second circuit region, wherein the second display region and the second circuit region overlap with each other, wherein the second display region comprises a plurality of display pixels comprising a third display pixel and a fourth display pixel, wherein the second circuit region comprises a second driver circuit, wherein the second driver circuit is electrically connected to a third wiring and a fourth wiring which are extended in the second display region, wherein the third display pixel and the fourth display pixel are electrically connected to the third wiring and the fourth wiring, respectively, wherein the control portion is electrically connected to the second driver circuit, wherein the control portion is configured to generate a second signal based on the information and transmitting transmit the second signal to the second driver circuit, wherein the second driver circuit is configured to perform, in accordance with the second signal, one of transmission of image signals to the third wiring and the fourth wiring, respectively, and transmission of the same image signal to the third wiring and the fourth wiring which are consecutive adjacent to each other, and wherein the number of display pixels to which one image signal is written in the first display region is different from the number of display pixels to which one image signal transmitted to the second display region is written in the second display region.

3. The display apparatus according to claim 1, wherein the first driver circuit comprises a transistor comprising silicon in a channel formation region, and wherein each of the plurality of display pixels in the first display region comprises a transistor comprising a metal oxide in a channel formation region.

4. The display apparatus according to claim 1, wherein each of the plurality of display pixels in the first display region comprises a light-emitting device comprising an organic EL material.

5. The display apparatus according to claim 1, wherein the first light and the second light are visible light, or the first light and the second light are infrared rays.

6. An electronic device comprising the display apparatus according to claim 1, and a housing, wherein the housing is shaped to be capable of being worn on a head of a user.

7. A display apparatus comprises:

a display portion;

a light-emitting portion;

a light-receiving portion; and a control portion, wherein the display portion comprises a first display region and a first circuit region, wherein the first display region and the first circuit region overlap with each other, wherein the first display region comprises a plurality of display pixels comprising a first display pixel and a second display pixel, wherein the first circuit region comprises a first driver circuit, wherein the first driver circuit is electrically connected to a first wiring and a second wiring which are extended in the first display region, wherein the first display pixel and the second display pixel are electrically connected to the first wiring and the second wiring, respectively, wherein the light-receiving portion is electrically connected to the control portion, wherein the control portion is electrically connected to the first driver circuit, wherein the light-emitting portion is configured to emit first light, wherein the light-receiving portion is configured to detect second light that is reflected by irradiation of an object with the first light and configured to generate information based on the second light and transmit the information to the control portion, wherein the control portion is configured to generate a first signal based on the information and transmit the first signal to the first driver circuit, and wherein the first driver circuit is configured to transmit an image signal to each of the first wiring and the second wiring at a first frame frequency corresponding to the first signal.

8. The display apparatus according to claim 7, wherein the display portion further comprises a second display region and a second circuit region, wherein the second display region and the second circuit region overlap with each other, wherein the second display region comprises a plurality of display pixels comprising a third display pixel and a fourth display pixel, wherein the second circuit region comprises a second driver circuit, wherein the second driver circuit is electrically connected to a third wiring and a fourth wiring which are extended in the second display region, wherein the third display pixel and the fourth display pixel are electrically connected to the third wiring and the fourth wiring, respectively, wherein the control portion is electrically connected to the second driver circuit, wherein the light-emitting portion is configured to emit second light, wherein the control portion is configured to generate a second signal based on the information and transmit the second signal to the second driver circuit, wherein the second driver circuit is configured to transmit an image signal to each of the third wiring and the fourth wiring at a second frame frequency corresponding to the second signal, and wherein the first frame frequency is different from the second frame frequency.

9. The display apparatus according to claim 7, wherein the first driver circuit comprises a transistor comprising silicon in a channel formation region, and wherein each of the plurality of display pixels in the first display region comprises a transistor comprising a metal oxide in a channel formation region.

10. The display apparatus according to claim 7, wherein each of the plurality of display pixels in the first display region comprises a light-emitting device comprising an organic EL material.

11. The display apparatus according to claim 7, wherein the first light and the second light are visible light, or the first light and the second light are infrared rays.

12. An electronic device comprising the display apparatus according to claim 7, and a housing, wherein the housing is shaped to be capable of being worn on a head of a user.

* * * * *